US006989750B2

(12) United States Patent
Shanks et al.

(10) Patent No.: US 6,989,750 B2
(45) Date of Patent: Jan. 24, 2006

(54) RADIO FREQUENCY IDENTIFICATION ARCHITECTURE

(75) Inventors: Wayne E. Shanks, Baltimore, MD (US); William R. Bandy, Gambrills, MD (US); Michael R. Arneson, Westminister, MD (US); Kevin J. Powell, Annapolis, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 285 days.

(21) Appl. No.: 10/072,984

(22) Filed: Feb. 12, 2002

(65) Prior Publication Data

US 2002/0167405 A1 Nov. 14, 2002

Related U.S. Application Data

(60) Provisional application No. 60/267,713, filed on Feb. 12, 2001.

(51) Int. Cl.
*G08B 13/14* (2006.01)

(52) U.S. Cl. .................................. 340/572.4; 340/572.1
(58) Field of Classification Search .............. 340/272.1, 340/272.4, 272.7; 327/536, 537; 341/53
See application file for complete search history.

(56) References Cited

U.S. PATENT DOCUMENTS

| 3,520,406 A | 7/1970 | Turner ........................ 209/576 |
| 3,689,885 A | 9/1972 | Kaplan et al. ............. 340/10.1 |
| 4,071,908 A | 1/1978 | Brophy et al. ......... 340/825.02 |

(Continued)

FOREIGN PATENT DOCUMENTS

| EP | 0 467 036 | 1/1992 |
| EP | 0 494 114 | 7/1992 |
| EP | 0 578 457 | 1/1994 |
| EP | 0 585 132 | 3/1994 |
| EP | 0 598 624 | 5/1994 |
| EP | 0 615 285 | 9/1994 |
| EP | 0 702 323 A2 | 3/1996 |
| EP | 0 702 324 A2 | 3/1996 |
| EP | 0 496 986 | 8/1996 |
| WO | WO 93/05485 | 3/1993 |
| WO | WO 99/26462 | 6/1999 |
| WO | WO 00/26993 | 5/2000 |

OTHER PUBLICATIONS

Plug and Play ISA Specification—Version 1.0a, *Intel Corporation and Microsoft Corporation*, May 5, 1994, pp. 1–65.
Copy of International Search Report issued Oct. 1, 2002 for Appln. No. PCT/US02/03989, 8 pages.
Wade, W., "Micron To Acquire ID Tech, ID Micro," *Today's Electronic News*, Gainers Publication, vol. 43, No. 2183, Sep. 1, 1997, p. 16.
Sze, S.M., "Physics of Semiconductor Devices," John Wiley & Sons, pp. 438–445 (1981).

*Primary Examiner*—Van T. Trieu
(74) *Attorney, Agent, or Firm*—Sterne, Kessler, Goldstein & Fox PLLC

(57) ABSTRACT

A radio frequency identification (RFID) architecture is described. RFID tags are interrogated by a reader, which may be located in a network of readers. The reader transmits symbols to the tags. Tags respond to the interrogations with symbols that each represent one or more bits of data. An RFID tag includes an antenna pad, a receiver, a state machine, and a modulator. The receiver is coupled to the antenna pad. The receiver receives a symbol from the antenna pad and outputs a received signal. The state machine is configured to determine a response symbol from the received signal and an operating state of the tag. The modulator is coupled to the antenna pad. The modulator is configured to backscatter modulate the received symbol with the response symbol. The modulator is configured to output the backscatter modulated symbol to the antenna pad.

21 Claims, 55 Drawing Sheets

U.S. PATENT DOCUMENTS

| | | | |
|---|---|---|---|
| 4,225,953 A | 9/1980 | Simon et al. | 340/825.49 |
| 4,418,411 A | 11/1983 | Strietzel | 340/870.16 |
| 4,471,345 A | 9/1984 | Barrett, Jr. | 340/572.1 |
| 4,495,496 A | 1/1985 | Miller, III | 340/10.2 |
| 4,533,871 A | 8/1985 | Boetzkes | 340/10.2 |
| 4,598,275 A | 7/1986 | Ross et al. | 340/573.4 |
| 4,636,950 A | 1/1987 | Caswell et al. | 340/10.42 |
| 4,656,463 A | 4/1987 | Anders et al. | 340/573.4 |
| 4,862,160 A | 8/1989 | Ekchian et al. | 340/10.32 |
| 4,931,788 A | 6/1990 | Creswick | 340/10.33 |
| 5,030,807 A | 7/1991 | Landt et al. | 235/375 |
| 5,124,699 A | 6/1992 | Tervoert et al. | 340/572.3 |
| 5,214,409 A | 5/1993 | Beigel | 340/572.1 |
| 5,245,534 A | 9/1993 | Waterhouse et al. | 340/5.91 |
| 5,266,925 A | 11/1993 | Vercellotti et al. | 340/505 |
| 5,271,793 A | 12/1993 | Seifert et al. | 343/700 MS |
| 5,289,372 A | 2/1994 | Guthrie et al. | 340/5.92 |
| 5,313,052 A | 5/1994 | Watanabe et al. | 235/375 |
| 5,339,073 A | 8/1994 | Dodd et al. | 340/5.61 |
| 5,356,516 A | 10/1994 | Ashby et al. | 428/332 |
| 5,365,551 A | 11/1994 | Snodgrass et al. | 504/206 |
| 5,390,360 A | 2/1995 | Scop et al. | 340/10.2 |
| 5,410,315 A | 4/1995 | Huber | 340/10.32 |
| 5,420,577 A | 5/1995 | Kim et al. | 340/825.52 |
| 5,430,441 A | 7/1995 | Bickley et al. | 340/10.2 |
| 5,434,572 A | 7/1995 | Smith | 342/44 |
| 5,434,775 A | 7/1995 | Sims et al. | 705/8 |
| 5,444,223 A | 8/1995 | Blama | 235/435 |
| 5,446,447 A | 8/1995 | Carney et al. | 340/572.4 |
| 5,469,142 A | 11/1995 | Bergman et al. | 340/572.3 |
| 5,478,991 A | 12/1995 | Watanabe et al. | 235/375 |
| 5,479,416 A | 12/1995 | Snodgrass et al. | 714/785 |
| 5,489,908 A | 2/1996 | Orthmann et al. | 340/10.32 |
| 5,499,017 A | 3/1996 | Beigel | 340/572.1 |
| 5,500,650 A | 3/1996 | Snodgrass et al. | 342/42 |
| 5,515,053 A | 5/1996 | Hecht et al. | 340/10.2 |
| 5,517,399 A | 5/1996 | Yamauchi et al. | 363/89 |
| 5,519,381 A | 5/1996 | Marsh et al. | 340/572.7 |
| 5,528,222 A | 6/1996 | Moskowitz et al. | 340/572.7 |
| 5,528,232 A | 6/1996 | Verma et al. | 340/825.49 |
| 5,537,105 A | 7/1996 | Marsh et al. | 340/10.32 |
| 5,539,394 A | 7/1996 | Cato et al. | 340/10.32 |
| 5,539,775 A | 7/1996 | Tuttle et al. | 375/145 |
| 5,541,928 A | 7/1996 | Kobayashi et al. | 340/825.52 |
| 5,550,547 A | 8/1996 | Chan et al. | 342/42 |
| 5,557,280 A | 9/1996 | Marsh et al. | 342/44 |
| 5,566,441 A | 10/1996 | Marsh et al. | 29/600 |
| 5,576,692 A | 11/1996 | Tompkins et al. | 340/571 |
| 5,583,819 A | 12/1996 | Roesner et al. | 340/10.51 |
| 5,583,850 A | 12/1996 | Snodgrass et al. | 370/342 |
| 5,591,951 A | 1/1997 | Doty | 340/10.3 |
| 5,602,538 A | 2/1997 | Orthmann et al. | 340/10.2 |
| 5,627,517 A | 5/1997 | Theimer et al. | 340/572.1 |
| 5,627,544 A | 5/1997 | Snodgrass et al. | 342/42 |
| 5,640,151 A | 6/1997 | Reis et al. | 340/572.1 |
| 5,646,607 A | 7/1997 | Schürmann et al. | 340/10.2 |
| 5,648,765 A | 7/1997 | Cresap et al. | 340/10.4 |
| 5,648,767 A | 7/1997 | O'Connor et al. | 340/928 |
| 5,673,037 A | 9/1997 | Cesar et al. | 340/10.32 |
| 5,680,459 A | 10/1997 | Hook et al. | 705/65 |
| 5,686,888 A | 11/1997 | Welles, II et al. | 340/539.13 |
| 5,686,902 A | 11/1997 | Reis et al. | 340/10.2 |
| 5,689,239 A | 11/1997 | Turner et al. | 340/10.3 |
| 5,719,586 A * | 2/1998 | Tuttle | 343/726 |
| 5,742,618 A | 4/1998 | Lowe | 714/797 |
| 5,771,021 A * | 6/1998 | Veghte et al. | 343/700 MS |
| 5,774,876 A | 6/1998 | Woolley et al. | 340/10.5 |
| 5,798,693 A | 8/1998 | Engellenner | 340/10.33 |
| 5,856,788 A | 1/1999 | Walter et al. | 340/10.2 |
| 5,887,176 A | 3/1999 | Griffith et al. | 340/10.33 |
| 5,912,632 A | 6/1999 | Dieska et al. | 340/10.5 |
| 5,917,422 A | 6/1999 | Adamec et al. | 340/10.52 |
| 5,959,568 A | 9/1999 | Woolley | 342/42 |
| 5,963,133 A | 10/1999 | Monjo | 340/572.1 |
| 6,002,344 A | 12/1999 | Bandy et al. | 340/572 |
| 6,025,780 A | 2/2000 | Bowers et al. | 340/572.3 |
| 6,057,756 A | 5/2000 | Engellenner | 340/505 |
| 6,058,374 A | 5/2000 | Guthrie et al. | 705/28 |
| 6,097,347 A | 8/2000 | Duan et al. | 340/572.7 |
| 6,100,804 A | 8/2000 | Brady et al. | 340/572.7 |
| 6,130,602 A | 10/2000 | O'Toole et al. | 340/10.33 |
| 6,147,605 A * | 11/2000 | Vega et al. | 340/572.7 |
| 6,215,401 B1 | 4/2001 | Brady et al. | 340/572.7 |
| 6,243,013 B1 | 6/2001 | Duan et al. | 340/572.7 |
| 6,286,762 B1 | 9/2001 | Reynolds et al. | 235/472.01 |
| 6,354,493 B1 | 3/2002 | Mon | 235/380 |
| 6,366,206 B1 | 4/2002 | Ishikawa et al. | 340/573.1 |
| 6,388,569 B1 | 5/2002 | Engellenner | 340/505 |
| 6,433,671 B1 * | 8/2002 | Nysen | 340/10.41 |
| 6,463,039 B1 | 10/2002 | Ricci et al. | 370/277 |
| 6,549,064 B2 * | 4/2003 | Bandy et al. | 327/536 |

* cited by examiner

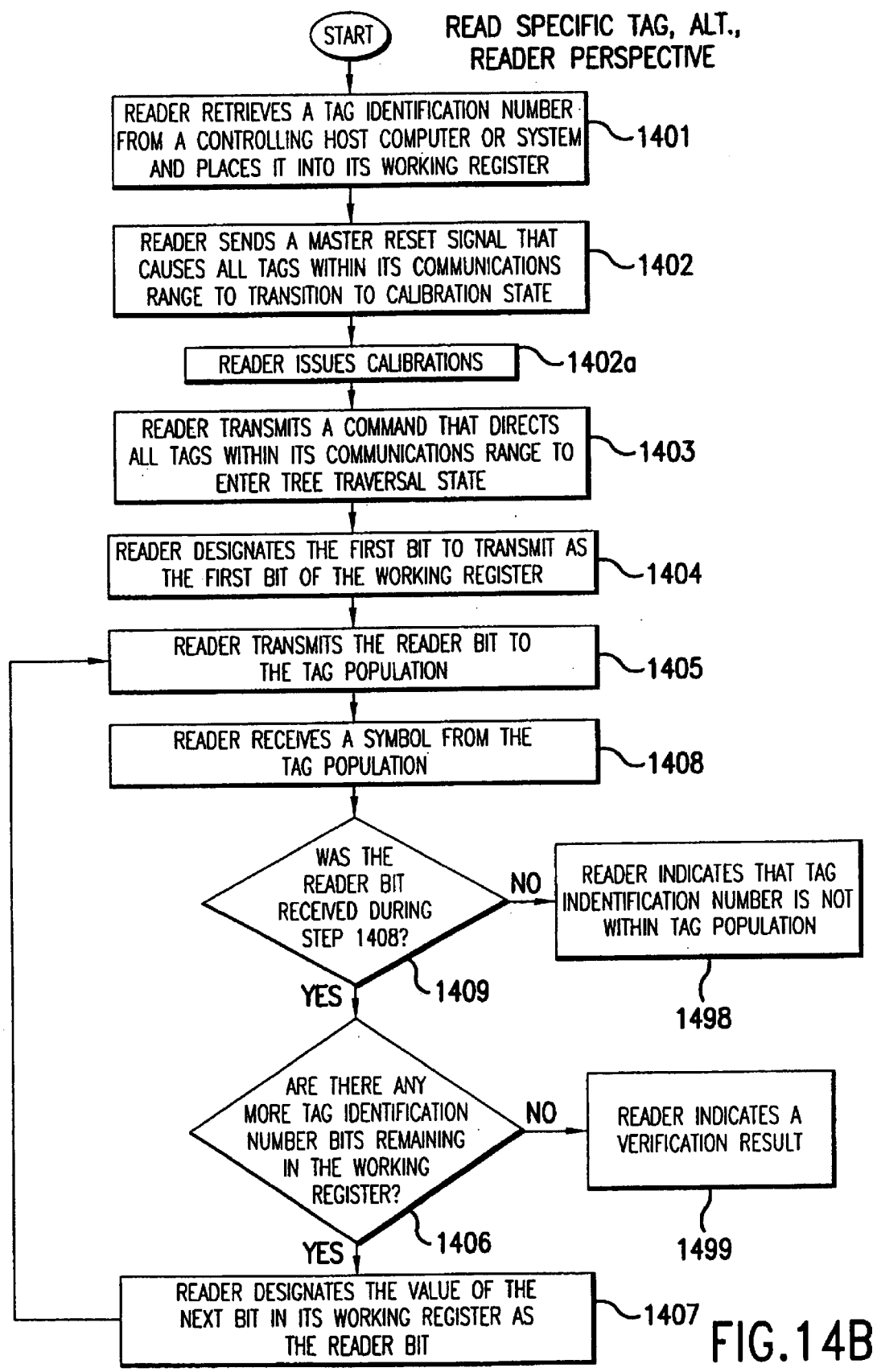

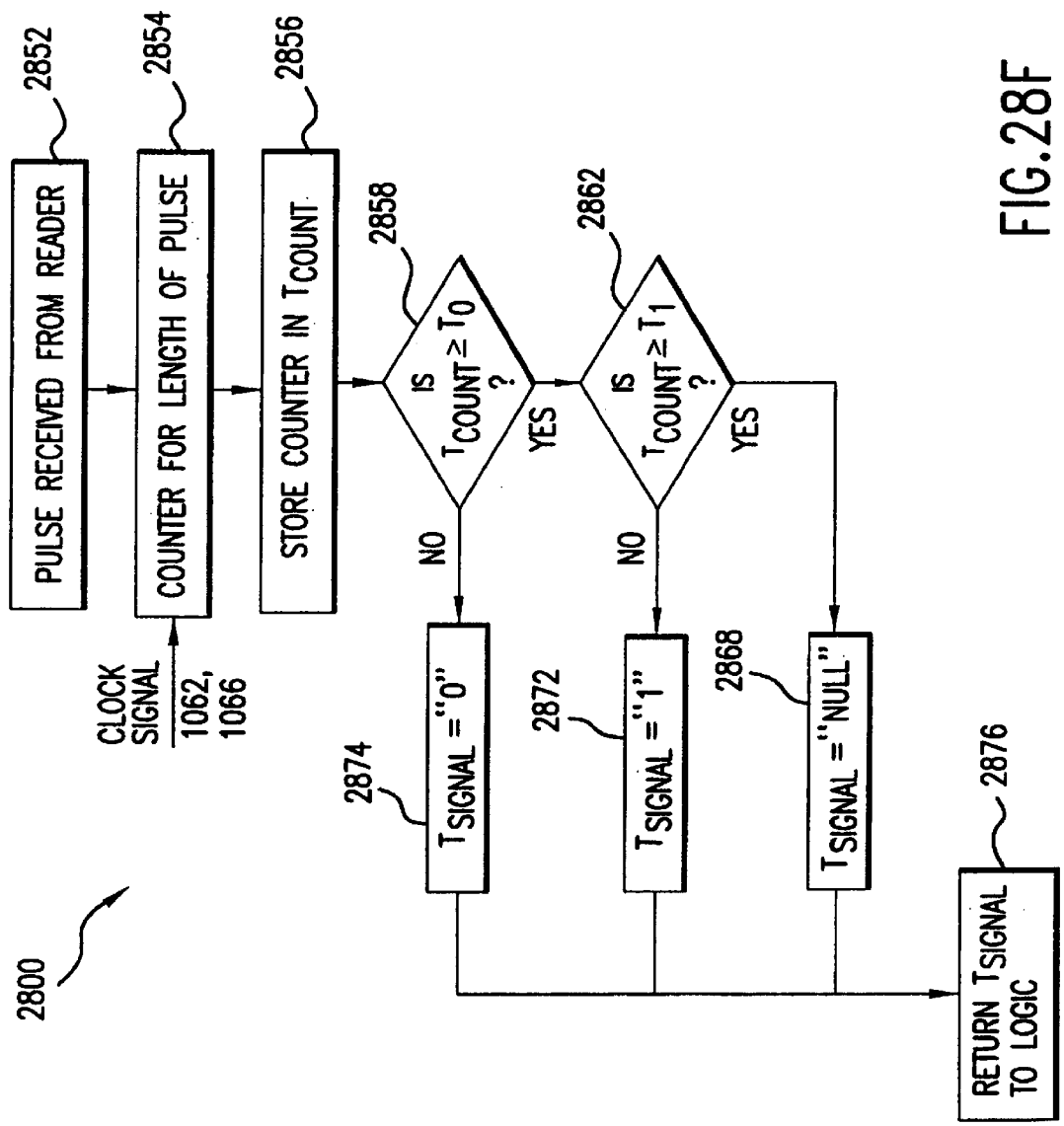

RADIO FREQUENCY IDENTIFICATION ARCHITECTURE

This application claims the benefit of U.S. Provisional Application No. 60/267,713, filed Feb. 12, 2001, which is herein incorporated by reference in its entirety.

BACKGROUND OF THE INVENTION

1. Field of the Invention

The present invention relates generally to radio frequency identification (RFID) tags.

2. Description of the Related Art

Many product-related and service-related industries entail the use and/or sale of large numbers of useful items. In such industries, it may be advantageous to have the ability to monitor the items that are located within a particular range. For example, within a particular store, it may be desirable to determine the presence of inventory items located on the shelf, and that are otherwise located in the store.

A device known as an RFID "tag" may be affixed to each item that is to be monitored. The presence of a tag, and therefore the presence of the item to which the tag is affixed, may be checked and monitored by devices known as "readers." A reader may monitor the existence and location of the items having tags affixed thereto through one or more wired or wireless interrogations. Typically, each tag has a unique identification number that the reader uses to identify the particular tag and item.

Currently available tags and readers have many disadvantages. For instance, currently available tags are relatively expensive. Because large numbers of items may need to be monitored, many tags may be required to track the items. Hence, the cost of each individual tag needs to be minimized. Furthermore, currently available tags consume large amounts of power. Currently available tag power schemes, which include individually tag-included batteries, are inefficient and expensive. These inefficient power schemes also lead to reduced ranges over which readers may communicate with tags in a wireless fashion. Still further, currently available readers and tags use inefficient interrogation protocols. These inefficient protocols slow the rate at which a large number of tags may be interrogated.

Hence, what is needed is a tag that is inexpensive, small, and has reduced power requirements. Furthermore, what is needed are more efficient tag interrogation techniques, that operate across longer ranges, so that greater numbers of tags may be interrogated at faster rates.

SUMMARY OF THE INVENTION

The present invention is directed to an RFID architecture where a reader or network of readers may interrogate and/or power tags at data rates, distances, and reliability levels that are greater than those currently attainable in the RFID industry for similarly classified tags. The present invention is also directed to RFID tags that may be produced at costs lower than those of similarly classified tags that are currently available. These features are the result of a unified design approach, where the attainment of higher data rates and increased communication distances are correlated with the realization of a lower tag cost.

In particular, the tag of the present invention has the advantages of lower cost and reduced power consumption. The reduction of power consumption in turn increases the possible communication range between a reader and a tag. The connection between the reduction of cost and power consumption is based at least in part on the principle that the power consumption of an electronic device is directly proportional to (1) the number of transistors in the device, and (2) the frequency at which circuits of the device operate. The tags of the present invention operate according to efficient algorithms, such as binary traversal communications protocols, that require reduced logic processing. The reduction in logic processing promotes the use of fewer transistors. Furthermore, the use of fewer transistors promotes reduced power consumption and reduced circuit sizes. Reduced circuit sizes lower the cost of producing the one or more chips that host the circuits, which may be application specific integrated circuits (ASIC), for example.

The present invention utilizes the reduction in power consumption to increase the range at which a reader and a tag may communicate. Tags of the present invention may incorporate charge pump circuitry and an energy storage capacitor to convert RF energy received from readers into an operational voltage and current. This conversion occurs at a greater distance from the reader than currently existing tags allow. By reducing the tag's power consumption requirements, the present invention enables a tag to communicate with a reader across greater distances, where the magnitude of RF energy received from the reader is insufficient to power conventionally designed tags.

The high data rates provided by the present invention are the result of simplified algorithms. Conventional algorithms interrogate RFID tags with highly complex algorithms that are less efficient. Furthermore, the use of conventional algorithms often involves two or more RF transmissions colliding. When collisions occur, further RF transmissions are required to resolve the collisions. Collision resolution consumes time without conveying data, and mandates complexity in algorithms, circuit design, and transistor count. In contrast, the present invention employs simple, efficient algorithms, such as binary traversal protocols, that enable a population of tags to be interrogated in a collision free environment.

This collision free environment is based on a set of communications symbols that allows multiple symbol values to be transmitted simultaneously without interference between, or destruction of any of these symbols.

These simplified algorithms do not require complex circuitry and intense processing. Therefore, in addition to promoting increased data rates, these efficient algorithms also promote lower transistor counts, lower tag costs, and lower power consumption (which increases the range at which a reader and tag may communicate).

A method, system, and apparatus for a RFID integrated circuit (IC) is described herein. The RFID IC is implemented in an RFID tag device. In one aspect of the present invention, the RFID IC is configured to receive a signal from an antenna. The RFID IC includes an antenna pad, a receiver, a state machine, and a modulator. The receiver is coupled to the antenna pad. The receiver receives a symbol from the antenna pad and outputs a received signal. The state machine is configured to determine a response symbol from the received signal and an operating state of the tag. The modulator is coupled to the antenna pad. The modulator is configured to backscatter modulate the received symbol with the response symbol. The modulator is configured to output the backscatter modulated symbol to the antenna pad.

In another aspect of the RFID IC of the present invention, the RFID IC is configured to receive signals from multiple antennas that are configured to receive the symbol from reader. The RFID IC includes a first antenna pad, a second antenna pad, a first receiver, a second receiver, a first modulator, a second modulator, and a state machine. The first receiver is coupled to the first antenna pad. The first receiver receives a first symbol from the first antenna pad and outputs a first received signal. The second receiver is coupled to the second antenna pad. The second receiver receives the second symbol from the second antenna pad and outputs a second received signal. The state machine is configured to receive the first received signal and the second received signal, and to generate a response symbol. The first modulator is coupled to the first antenna pad. The first modulator is configured to backscatter modulate a first symbol received from the first antenna pad with the response symbol. The first modulator is configured to output the backscatter modulated first symbol to the first antenna pad. The second modulator is coupled to the second antenna pad. The second modulator is configured to backscatter modulate a second symbol received from the second antenna pad with the response symbol. The second modulator is configured to output the backscatter modulated second symbol to the second antenna pad.

BRIEF DESCRIPTION OF THE DRAWINGS

The present invention will be described with reference to the accompanying drawings. In the drawings, like reference numbers generally indicate identical, functionally similar, and/or structurally similar elements.

The drawing in which an element first appears is indicated by the leftmost digit(s) in the reference number.

FIGS. 14A and 14B are flowcharts that illustrate example specific read interrogation operations from the perspective of a reader, according to embodiments of the present invention.

FIGS. 28A–28F show flowcharts providing steps for performing data symbol calibration and interpreting received data symbols, according to embodiments of the present invention.

DETAILED DESCRIPTION OF THE PREFERRED EMBODIMENTS

Figure 1:
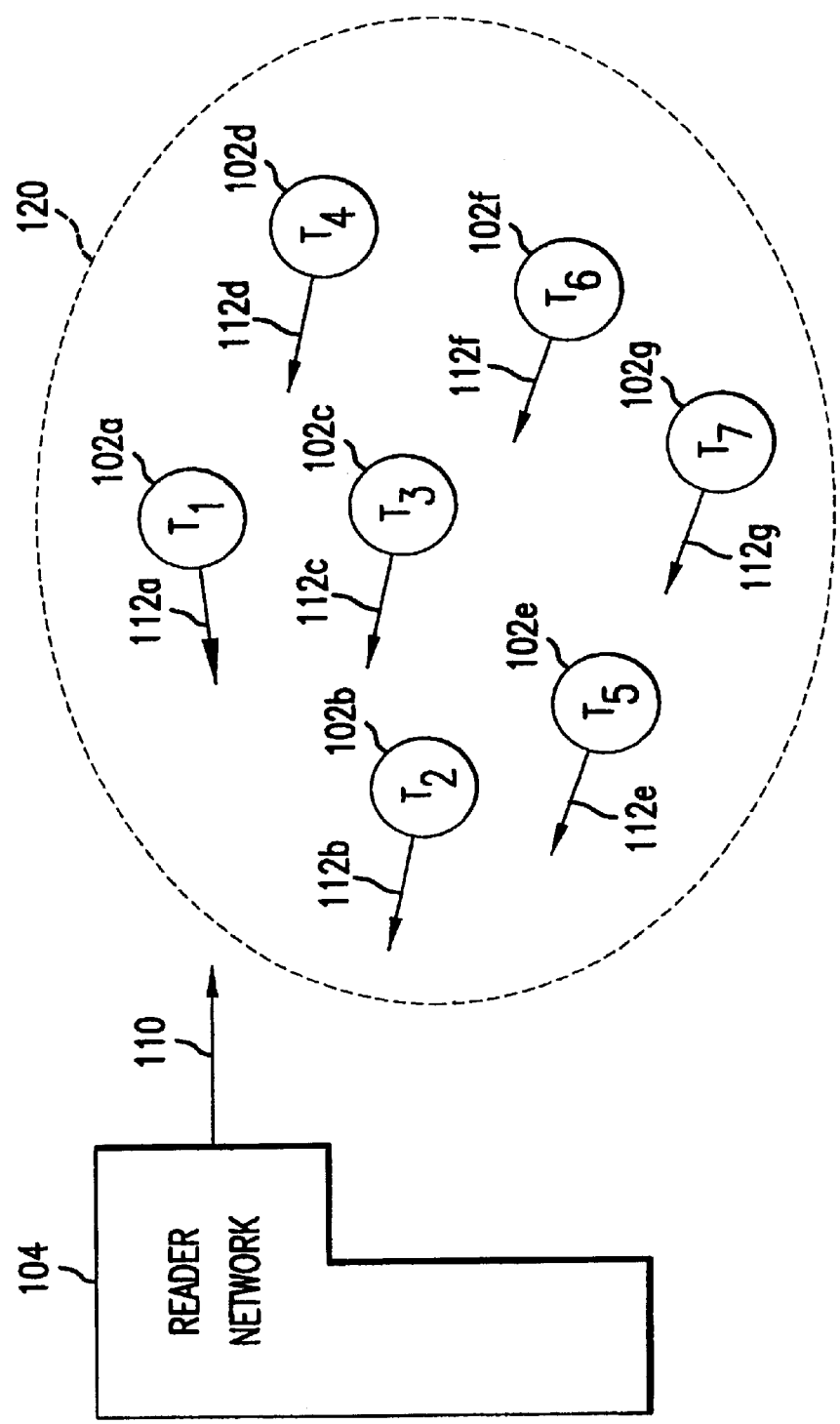
FIG. 1 is a block diagram of an environment where an RFID tag reader network communicates with one or more RFID tags, according to an embodiment of the present invention.

1. Architectural Embodiments of the Present Invention 1.1 Tag Interrogation Environment Before describing the invention in detail, it is helpful to describe an example environment in which the invention may be implemented. The present invention is particularly useful in radio frequency identification (RFID) applications. FIG. 1 illustrates an environment where an RFID tag reader network 104 communicates with an exemplary population of RFID tags according to the present invention. As shown in FIG. 1, the population of tags includes a first tag 102a, a second tag 102b, a third tag 102c, a fourth tag 102d, a fifth tag 102e, a sixth tag 102f, and a seventh tag 102g. These seven tags 102 are shown in the population of tags 120 for exemplary purposes. According to embodiments of the present invention, a population of tags 120 may include any number of one or more tags 102. In some embodiments, very large numbers of tags 102 may be included in a population of tags 120, including hundreds, thousands, or even more tags 102.

As shown in FIG. 1, one or more interrogation signals 110 are transmitted from reader network 104 to the population of tags 120. One or more response signals 112 are transmitted from RFID tags 102 to reader network 104. For example, as shown in FIG. 1, first tag 102 a transmits a first response signal 112a, second tag 102b transmits a second response signal 112b, third tag 102c transmits a third response signal 112c, fourth tag 102d transmits a fourth response signal 112d, fifth tag 102e transmits a fifth response signal 112e, sixth tag 102f transmits a sixth response signal 112f, and seventh tag 102g transmits a seventh response signal 112g.

According to the present invention, signals 110 and 112 are exchanged between reader network 104 and tags 102 according to one or more interrogation protocols. An exemplary protocol is the binary traversal protocol that is described below. The binary traversal protocol, in combination with other features of the present invention as described herein, efficiently avoids collisions between signals transmitted by tags 102 so that communications bandwidth is conserved and interrogation times are minimized. However, other interrogation protocols may be employed. Examples of such alternative protocols are described in U.S. Pat. No. 6,002,344 issued Dec. 14, 1999 to Bandy et al., entitled "System and Method for Electronic Inventory," which is incorporated herein by reference in its entirety.

Signals 110 and 112 are wireless signals, such as radio frequency (RF) transmissions. Upon receiving a signal 110, a tag 102 may produce a responding signal 112 by alternatively reflecting and absorbing portions of signal 110 according to a time-based pattern. The time-based pattern is determined according to information that is designated for transmission to reader network 104. This technique of alternatively absorbing and reflecting signal 110 is referred to herein as backscatter modulation. Tags 102 may employ various approaches to perform backscatter modulation. In one such approach, tags 102 vary the impedance characteristics of onboard receive circuitry, such as one or more antennas and/or other connected electronic components.

Each tag 102 has an identification number. In certain embodiments, each of tags 102 has a unique identification number. However, in other embodiments, multiple tags 102 may share the same identification number, or a portion thereof. During the aforementioned communications with tags 102, reader network 104 receives identification numbers from tags 102 in response signals 112. Depending on the protocol employed for such communications, the retrieval of identification numbers from tags 102 may involve the exchange of signals over multiple iterations. In other words, the receipt of a single identification number may require reader network 104 to transmit multiple signals 110. In a corresponding manner, tags 102 will respond with respective signals 112 upon the receipt of each signal 110, if a response is appropriate.

Alternatively or in addition to identification numbers, reader network 104 may send other information to tags 102. For example, reader network 104 may store a unit of information in one or more of tags 102 to be retrieved at a later time. Depending upon the design of tags 102, this could be volatile or non-volatile information storage and retrieval.

Reader network 104 may also obtain information generated by sensors that are included in tags 102. When provided to reader network 104, this sensor information may include information regarding the operational environments of tags 102, for example.

A variety of sensors may be integrated with tags 102. Exemplary sensors include: gas sensors that detect the presence of chemicals associated with drugs or precursor chemicals of explosives such as methane, temperature sensors that generate information indicating ambient temperature, accelerometers that generate information indicating tag movement and vibration, optical sensors that detect the presence (or absence) of light, pressure sensors that detect various types of tag-encountered mechanical pressures, tamper sensors that detect efforts to destroy tags and/or remove tags from affixed items, electromagnetic field sensors, radiation sensors, and biochemical sensors. However, this list is not exclusive. In fact, tags 102 may include other types of sensors, as would be apparent to persons skilled in the relevant arts.

Each of tags 102 is implemented so that it may be affixed to a variety of items. For example a tag 102 may be affixed to airline baggage, retail inventory, warehouse inventory, automobiles, and other objects. An exemplary tag implementation is described below with reference to FIG. 10.

Thus, reader network 104 may monitor the existence of, and the location of items having tags affixed thereto, through one or more interrogations using the protocols referenced herein.

Figure 2:
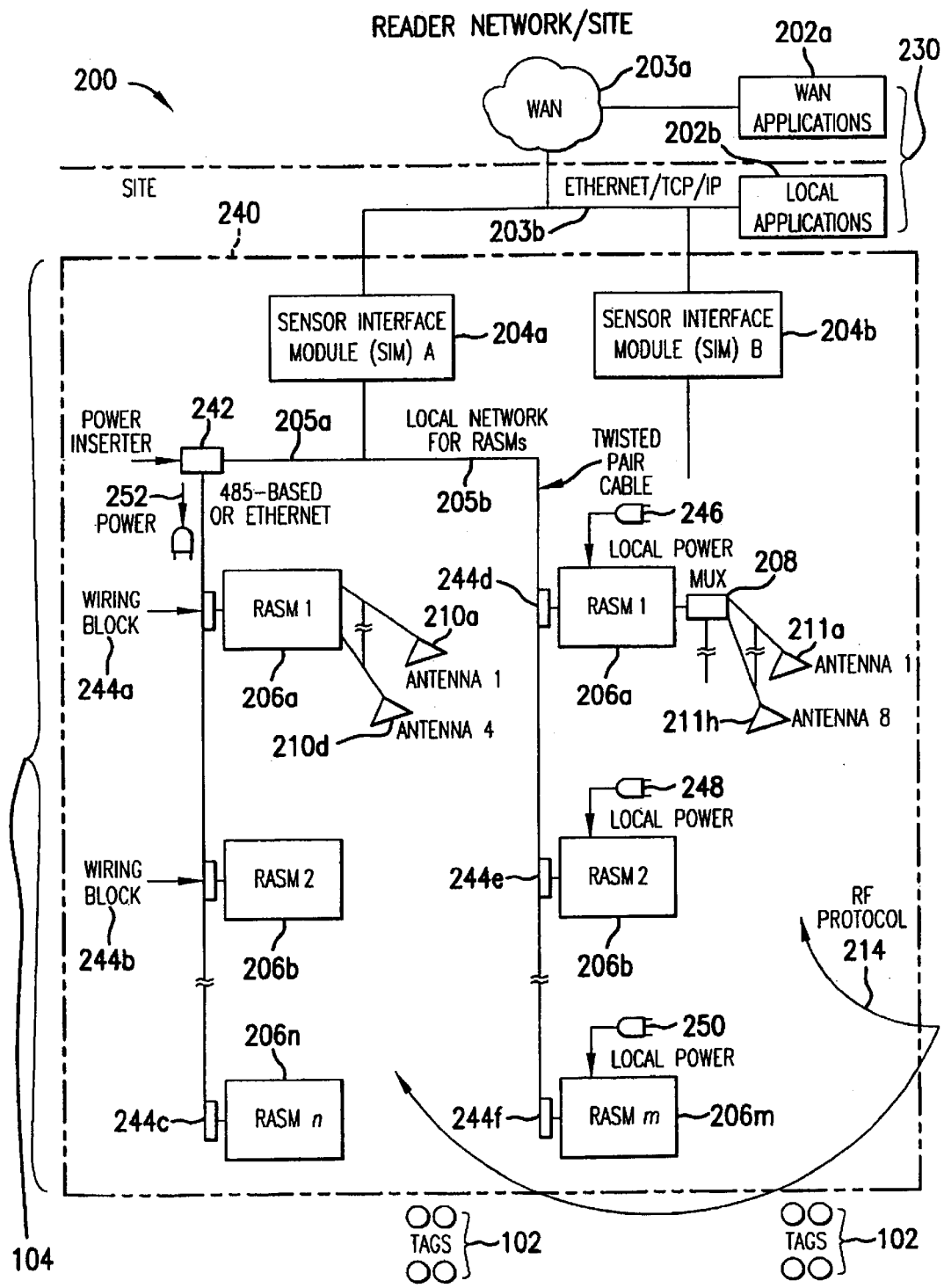
FIG. 2 is a block diagram illustrating an architectural overview of communications between a reader network and a tag, according to an embodiment of the present invention.

FIG. 2 is a block diagram of an example reader architecture 200 providing communications between reader network 104 and tags 102, according to an embodiment of the present invention. Reader architecture 200 includes a user application domain 230, a reader network 104, and one or more tags 102. These components are described in further detail as follows. Note that the invention is applicable to a single reader that is communicating with tags 102, as well as to a plurality of reader coupled in a network, as in reader network 104 shown in FIG. 2. Hence, although "reader network 104" is often referred to herein, it should be understood that the present invention is applicable to any number of readers, including a single reader and multiple readers coupled in a network, as is required by a particular application.

At a high level, reader network 104 receives requests regarding one or more of tags 102 from user application domain 230. Reader network 104 communicates with one or more of tags 102 regarding the requests via a protocol 214. In other words, reader network 104 transmits one or more requests 110 to tags 102, and tags 102 respond by transmitting one or more responses 112 to reader network 110, using protocol 214. Protocol 214 is typically one of the binary traversal protocols further described elsewhere herein.

User application domain 230 may include any number of one or more user applications. For example, user applications of user application domain 230 may include host systems such as personal computers, servers, hand-held processing devices, cell phones, and other wired or wireless network accessible devices. In the embodiment of FIG. 2, user application domain 230 includes wide area network (WAN) applications 202a (remote) and local applications 202b (local). WAN and local applications 202a and 202b each include user applications that use reader network 104 to access one or more of tags 102.

User applications on any number of one or more networks may communicate with reader network 104. The networks may be of an industry standard format and/or may be non-standard networks. In FIG. 2, applications 202a and 202b are respectively coupled to a WAN 203a and a local area network (LAN) 203b. In the embodiment of FIG. 2, WAN 203a and LAN 203b are coupled together, but in alternative embodiments, they may be isolated. In the embodiment shown in FIG. 2, LAN 203b services the physical connection from both of applications 202a and 202b to reader network 104.

Reader network 104 includes one or more sensor interface modules (SIMs) and a remote access sensor module (RASM) domain 240. In the embodiment of FIG. 2, reader network 104 includes first and second SIMs 204a and 204b. RASM domain 240 includes one or more RASMs 206.

Any number of one or more SIMs in reader network 104 may be used to couple external networks to reader network 104. Accordingly, each SIM includes an applicable hardware and/or software interface for coupling the networks. As shown in FIG. 2, first SIM 204a couples LAN 203b to reader network 104.

Each SIM 204 connects to one or more RASMs 206 in reader network 104 via one or more RASM network connections. RASMs 206 are readers that each include hardware and/or software as necessary to interface with a RASM network connection. As shown in FIG. 2, a first RASM network 205a couples SIM 204a to a number "n" of RASMs 206, and a network 205b couples SIM 204a to a number "m" of RASMs 206. Such networks may carry only data, as in network 205b, or may carry data and power, as in network 205a. One or more wiring blocks, such as wiring blocks 244a, 244b, 244c, 244d, 244e, and 244f may be used to provide a connection point from networks 205a and 205b to a respective RASM. A wiring block 244 may be an industry standard wiring block, or non-standard type. A modified wiring block, shown as wiring block 242, may be used to inject power onto a wire or cable of one of more of networks 205a and 205b. Operating power is provided to the RASMs 206 by one or more power supplies, such as by power supplies 246, 248, 250, and 252, which may or may not be the same device.

A RASM 206 communicates with a tag 102 via one or more antenna(s) 210. Accordingly, each RASM 206 includes one or more transmitters and receivers that are coupled antennas 210. The transmitters and receivers may be of any variety of types. A variety of antenna configurations are available. In an embodiment, RASM 206a, which is coupled to network 205a, is directly connected to up to four antennas (e.g., antennas 210a–210d, shown in FIG. 2). In an alternative embodiment, a RASM is coupled to and controls a multiplexer. For example, as shown in FIG. 2, RASM 206a, which is coupled to network 205b, is couple to multiplexer 208. A multiplexer allows for a greater number of antennas to be switched to a single antenna port of RASM 206b. As shown in FIG. 2, multiplexer 208 connects a single antenna port of RASM 206b to eight antennas (e.g., antennas 211a–211h, shown in FIG. 2). In this manner, RASM 206b may accommodate up to 32 antennas. Such a configuration would require three additional multiplexers 208 to be connected to antenna ports of RASM 206b. RASMs 206 are able to communicate to RFID tags 102 via radio frequencies using one or more protocols 214.

Furthermore, in an embodiment, each RASM 206 includes logic that determines data values for symbols received from one or more tags 102 that are modulated according to backscatter modulation techniques described herein. For example, the logic may determine that a received backscatter symbol represents a first logical value (i.e., a "0" or a "1" bit) when the backscatter frequency of the received backscatter symbol is determined to include a first frequency, and determines that the received backscatter symbol represents a second logical value when the backscatter frequency of the received backscatter symbol is determined to include a second frequency. In alternative embodiments, the functions of the logic may be incorporated in other components of reader network 104.

An object of reader architecture 200 is to provide a reasonably priced RFID system to the commercial marketplace in large volumes. In an embodiment, the architecture performs a batch type of operation. In a batch type of operation, a reader network 104 scans item-level assets at entry and exit points in a given space. This provides information as to a history of the asset, but does not provide confirmed information about the actual asset at the time of inquiry (real time information). Devices operating according to the present invention are designed such that as an industry converts to real time mode, the space to be controlled becomes covered by a reader network 104/antenna 210, 211 for real time information. In such an environment, there may be many RASMs 206/antennas 210,211 at the entrance and exit points to a given space. Thus, a design goal may be to reduce cost as much as possible at the RASM 206 level. According to the present invention one or more functions are removed from the RASM 206 level, and included in the relatively smaller number of one or more SIMs 204. The SIMs 204 exist at a higher architecture level, and their cost may be amortized across large numbers of RASMs.

Additionally, devices according to the present invention are required to be compatible with legacy systems and applications at a very high architecture level. This allows these devices to be standardized on one version for all uses. However, this may also introduce a burden on the implementation to add functionality, memory, processing power, etc., in order to present information to the highest OSI model layers. Currently, the industry stipulates that a reader include an XML presentation layer connection (item 203b), with substantial buffering and filtering capabilities. Conventional reader products attempt to add this functionality into each reader. However, the approach of the present invention is to add this functionality only once at a gateway device, SIM 204, so that the cost of implementation is not multiplied by each RASM 206 read point.

Hence, in embodiments of the present invention, RASM 206 is responsible for converting digital network requests into RF signals for communication with RFID tags 102. To further reduce cost, in an embodiment, each RASM 206 is configured to handle up to 4 input/output ports for antennas 210, 211, which are also referred to as "read points." The cost per read point is reduced to about 25% of the cost of single read point devices. In other embodiments, more or fewer antennas may be present as required by the specific application and costs.

Furthermore, in embodiments of the present invention, SIM 204 is coupled to, and controls a plurality of RASMs. For example, a single SIM 204 may be coupled to 50 RASMs 206. This may be done through multiple RASM networks 205a and 205b coupled to SIM 204a. SIM 204 implements the high-level protocol visibility layer, adds reasonable buffers, and implements logic to filter out any undesirable conditions for a given application. SIM 206 is coupled to industry standard networking as depicted in item 203b (e.g., Ethernet & TCP/IP), and connects to local and remote applications in their native level, such as XML.

1.2 Wireless Interface (Protocol Domain)

1.2.1 Reader Transmitted Signals

In an embodiment, reader network 104 transmits signals, such as signal 110, to tags 102 as amplitude modulated (AM) signals. For example, the transmitted signals may be narrowband AM signals. According to this approach, reader network 104 varies the amplitude of a carrier signal over a specific period of time that is a function of the information that it is transmitting. In alternative embodiments, other modulation schemes known by persons skilled in the relevant arts may be used by reader network 104 to communicate with tags 102.

Figure 3:
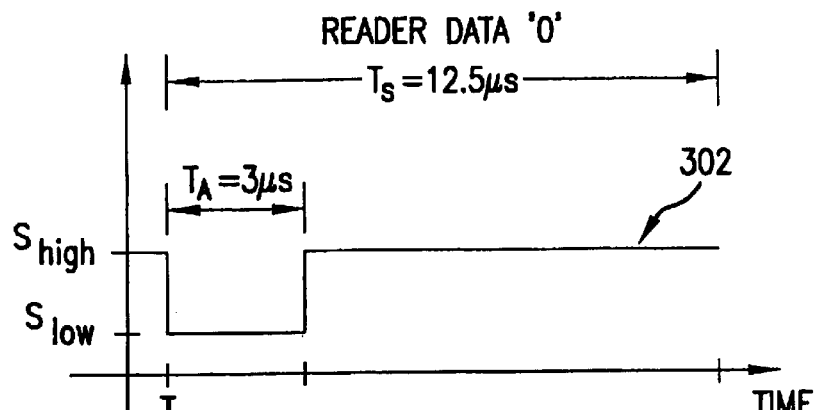
FIGS. 3–5 are plots of example data symbols transmitted by a reader, according to embodiments of the present invention.
Figure 4:
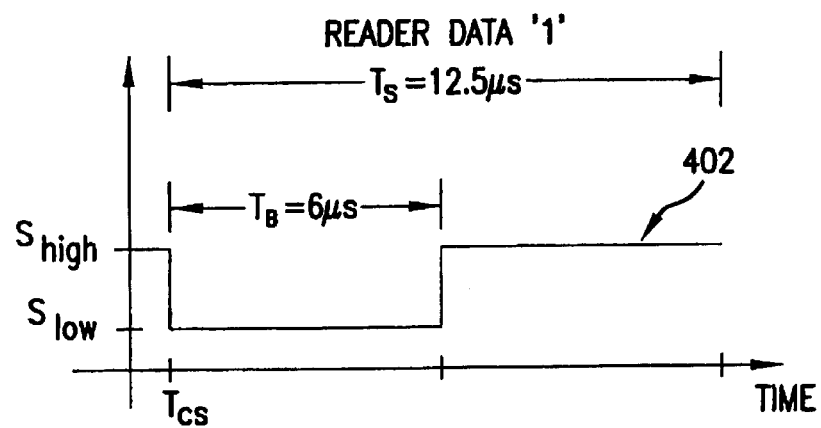
Figure 5:
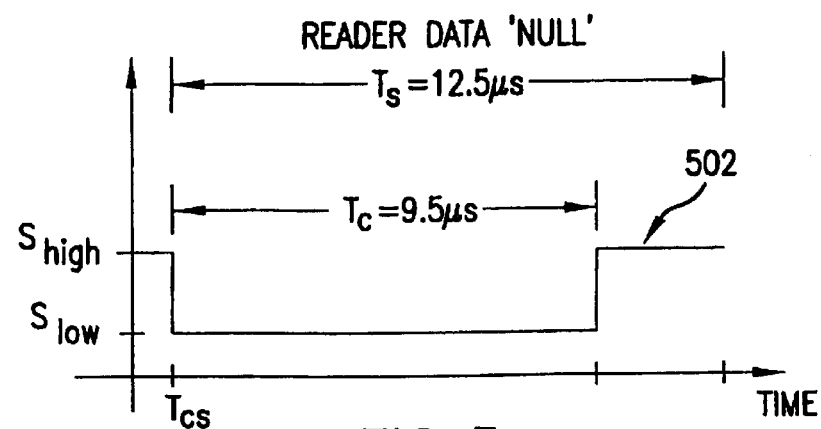

Reader network 104 conveys this information in the form of one or more symbols that are each selected from a symbol set. FIGS. 3, 4, and 5 each illustrate a plot of a symbol of an exemplary symbol set that includes three symbols. In particular, FIG. 3 illustrates a plot of a symbol 302 that represents a logical "0," FIG. 4 illustrates a plot of a symbol 402 that represents a logical "1," and FIG. 5 illustrates a plot of a symbol 502 that represents a "NULL" symbol. The "NULL" symbol may be used in performance of certain calibration procedures, as well as to affect or reset the operational states of tags 102. Further details regarding the use of "NULL" symbols are provided below.

For each of symbols 302, 402, and 502, reader network 104 varies the amplitude of a transmitted carrier signal between two values. These values are shown in FIGS. 3, 4, and 5 as $S_{high}$ and $S_{low}$. This variation in amplitude between $S_{high}$ and $S_{low}$ occurs over an amount of time that is referred to herein as a symbol exchange period, $T_S$. FIGS. 3, 4, and 5 show $T_S$ being 12.5 microseconds. However, embodiments of the present invention may employ other values of $T_S$, which may be provided either statically or dynamically (i.e., "on the fly").

The beginning of each symbol exchange period is referred to herein as a clock start time, $T_{CS}$. The clock start time designates when reader network 104 changes the amplitude of its carrier signal from $S_{high}$ to $S_{low}$ (referred to herein as a "falling edge"). Thus, $T_{CS}$ signifies the beginning of a period of time when the carrier signal amplitude is $S_{low}$. This period of time ends when reader network 104 changes the value of the carrier amplitude from $S_{low}$ to $S_{high}$ (referred to herein as a "rising edge"). For the symbol set of symbols 302, 402, and 502, reader network 104 designates the duration of this time period according to the symbol that is being transmitted.

For instance, FIG. 3 shows that when transmitting a logical "0" symbol 302, reader network 104 maintains its carrier signal amplitude at $S_{low}$ for a time duration of $T_A$. However, when transmitting a logical "1" symbol 402, FIG. 4 shows that reader network 104 maintains the carrier amplitude at $S_{low}$ for a time duration of $T_B$. FIG. 5 shows that when transmitting a "NULL" symbol 502, reader network 104 maintains the carrier amplitude at $S_{low}$ for a time duration of $T_C$. Exemplary values for $T_A$, $T_B$, and $T_C$ are 3.0 microseconds, 6.0 microseconds, and 9.5 microseconds, respectively. However, the use of other values is within the scope of the present invention.

According to the present invention, various amplitude levels for $S_{high}$ and $S_{low}$ may be employed. For example, In one implementation, $S_{low}$ is 70% of $S_{high}$. In other words, $S_{low}$ is not necessarily a 0 V amplitude signal, but can have other amplitude values. This provides reader network 104 with the capability to provide tags 102 with more RF energy at times when it is transmitting its carrier signal at $S_{low}$ than a 0% $S_{low}$ implementation (i.e., strictly on/off keying). The invention is also applicable to other relative percentages for $S_{high}$ and $S_{low}$, including a 0% $S_{low}$ implementation.

Tags 102 employ various timing parameters to decode symbols transmitted by reader network 104. To aid in decoding the symbol set shown in FIGS. 3, 4, and 5, each tag 102 employs three timing parameters (also referred to herein as timing points) that are referred to herein as timing points T0, T1, and T2. Examples of timing points T0, T1, and T2 are shown in FIG. 26B. In a preferred embodiment, timing points T0, T1, and T2 are provided to tag 102 by reader network 104 during a process referred to as data calibration, as described below.

T0 and T1 correspond to points in time after the clock start time, $T_{CS}$, that are used to distinguish between different symbol values. In particular, T0 is set by reader network 104 to the midpoint of the elapsed time before the rising edge associated with a logical "0" symbol 302 (i.e., $T_A$) and the elapsed time associated with the rising edge of a logical "1" symbol 402 (i.e., $T_B$). T1 is set by reader network 104 to the midpoint of the elapsed time before the rising edge of a logical "1" symbol 402 (i.e., $T_B$) and the elapsed time before the rising edge of a "NULL" symbol 502 (i.e., $T_C$). In an embodiment, T2 corresponds to the moment in time where tags 102 need to stop their transmissions and return to a listening state to reader network 104. T2 is preferably set by reader network 104 to a point in time slightly before the next $T_{CS}$ from the reader.

In an embodiment, tag 102 employs these time parameters, which may be sent by the reader during a calibration sequence, to determine the identity of a data symbol received from reader network 104 in the following manner: First, tag 102 initializes a counter or timer upon the occurrence of a falling edge on a received signal. This initialization coincides with a $T_{CS}$ for a transmitted symbol. Next, the timer increments with the passage of time until tag 102 detects a rising edge in the received signal. After the rising edge is detected, the tag 102 performs a comparison between the timer value and the timing points. Namely, tag 102 detects a logical "0" symbol 302 when a rising edge occurs before the timer reaches T0. However, if a rising edge occurs on or after the timer reaches T0, but before it reaches T1, tag 102 detects a logical "1" symbol 402. Alternatively, if a rising edge occurs on or after it reaches T1, tag 102 detects a "NULL" symbol 502. This approach dynamically accommodates variations in timing between different tags 102 that would cause communication errors in other more exacting timing schemes.

1.2.2 Tag Transmitted Signals

As described above, tags 102 may send information to reader network 104 in the form of backscatter modulated signals. Backscatter modulation refers to the technique of alternatively absorbing and reflecting the signal transmitted by reader network 104. These backscatter modulated signals may convey symbols that are each transmitted in response to a corresponding symbol transmitted by reader network 104. Thus, each tag 102 may transmit one or more backscatter symbols that are each selected from a backscatter symbol set. An example of a backscatter symbol set is described herein with reference to FIGS. 6, 7, 8, and 9. This symbol set uses two frequencies as a basis for sub-modulating backscatter energy. One frequency is used to transmit a logical "0" bit, while the other frequency is used to transmit a logical "1" bit. Note that in alternative embodiments, two different phase delays, two different signal amplitudes, or a single frequency or phase delay used during two different time periods, may also be used to represent different logical bit values according to backscatter modulation techniques.

The backscatter symbol set that is shown in FIGS. 6, 7, 8, and 9 operates with the reader transmitted symbol set described above with reference to FIGS. 3, 4, and 5. In particular, this backscatter symbol set provides for the modulation of the latter portion of these reader transmitted symbols. As described above, these latter portions have a magnitude of $S_{high}$.

Figure 6:
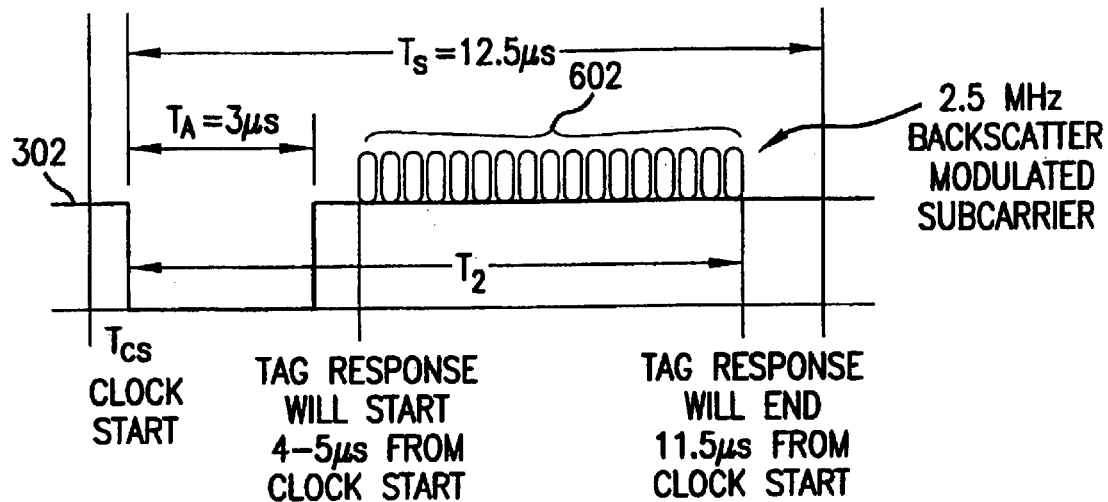
FIGS. 6–9 are plots of example backscatter symbols sent from a tag to a reader, according to embodiments of the present invention.
Figure 7:
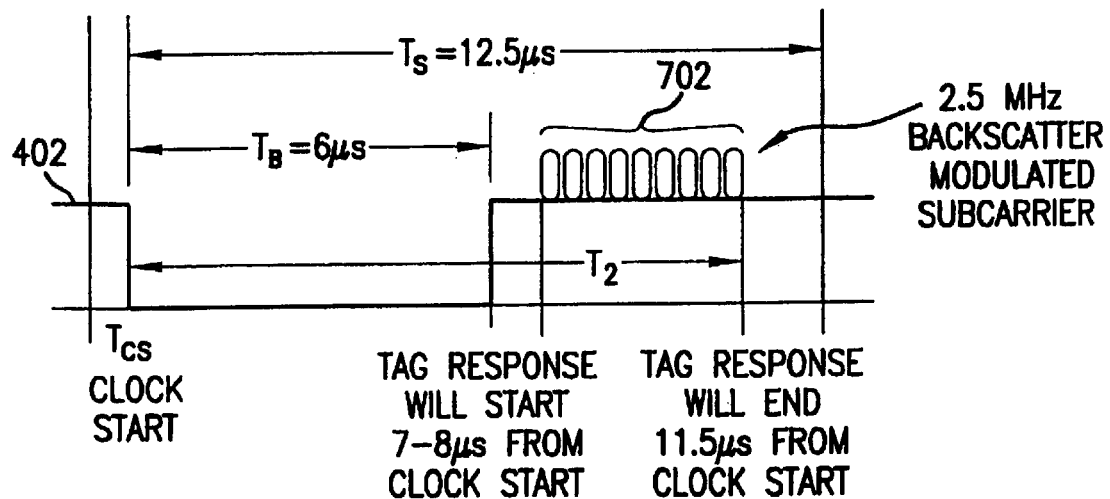

FIGS. 6 and 7 illustrate backscatter symbols that each represent a logical "0" bit transmitted from tag 102 in modulated backscatter. In particular, FIG. 6 illustrates a backscatter transmitted logical "0" symbol 602 from tag 102 responding to a reader-originated logical "0" symbol 302. FIG. 7 illustrates a backscatter transmitted logical "0" symbol 702 from tag 102 responding to a reader-originated logical "1" symbol 402. Each of these symbols includes a series of pulses occurring at a certain frequency. As shown in FIGS. 6 and 7, the pulses for each of these backscatter symbols 602 and 702 continue until the end of the symbol exchange period, $T_s$. However, each of backscatter symbols 602 and 702 starts at a distinct time.

These distinct start times occur because the reader transmitted "0" and "1" symbols 302 and 402, as described above with reference to FIGS. 3 and 4, each have a distinct rising edge time. Namely, the rising edge associated with a reader-originated "0" symbol 302 occurs at $T_A$ (e.g., 3 microseconds), while the rising edge associated with a reader-originated "1" symbol 402 occurs at $T_B$ (e.g., 6 microseconds).

Figure 8:
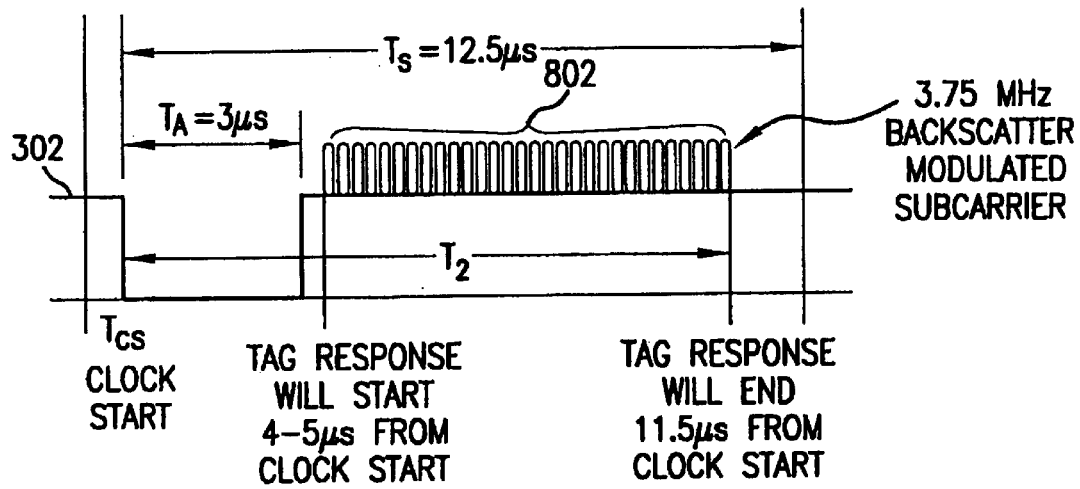
Figure 9:
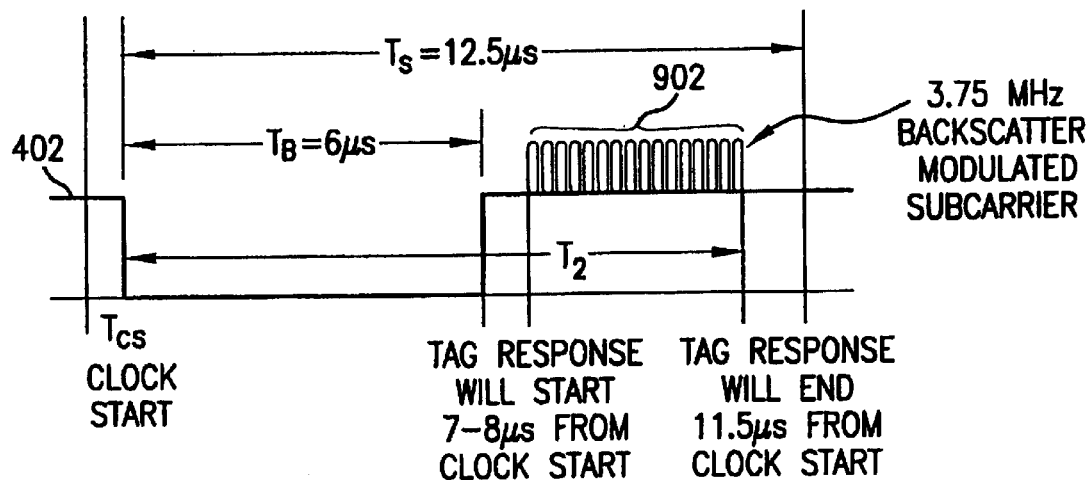

FIGS. 8 and 9 illustrate symbols that each represent a logical "1" bit transmitted from tag 102 in modulated backscatter. In particular, FIG. 8 illustrates a backscatter transmitted logical "1" symbol 802 from tag 102, which is responding to a reader-originated logical "0" symbol 302. In contrast, FIG. 9 illustrates a backscatter transmitted logical "1" symbol 902 from tag 102, which is responding to a reader-originated logical "1" symbol 402. Each of backscatter symbols 802 and 902 includes a series of pulses occurring until the end of the symbol exchange period, $T_s$. These pulses repeat at a frequency that is different than the frequency used for the logical "0" backscatter symbols 602 and 702 of FIGS. 6 and 7.

Note that in FIGS. 6 and 7, the frequency of 2.5 MHz is used to provide backscatter modulation for logical "0" symbols 602 and 702, and in FIGS. 8 and 9 the frequency of 3.75 MHz is used to provide backscatter modulation for logical "1" symbols 802 and 902. These frequencies are provided by illustrative purposes, and the present invention is applicable to the use of alternative frequencies for backscatter modulation.

Backscatter symbols 802 and 902 shown in FIGS. 8 and 9 each start at distinct times. These distinct start times are attributable to the distinct rising edge times (i.e., $T_A$ and $T_B$) associated with the reader-originated "0" and "1" symbols described above with reference to FIGS. 3 and 4.

Accordingly, note that when the description below refers to the transmission from tag 102 of "0" and "1" bits, signals, or symbols during binary traversals, these refer to the transmission of "0" and "1" backscatter symbols 602, 702, 802, and 902 as described above. Furthermore, when the description below refers to transmission from reader network 104 of "0" and "1" bits, signals, or symbols during binary traversals, these refer to the transmission of "0" and "1" symbols 302 and 304 as described above.

In a preferred embodiment of the present invention, the reader signal "NULL" symbol 502 shown in FIG. 5 is not defined to have backscatter present in the $S_{high}$ state due to tag 102. In alternative embodiments, tag 102 may introduce backscatter in response to a "NULL" signal.

Reader network 104 determines the value of the bit or symbol that was backscatter modulated by tag 102. Reader network 104 samples a received signal for backscatter modulation produced by one or more tags 102 of the population of tags 120. In a preferred embodiment, reader network 104 samples the received signal at a timing point $T_{BS}$ to determine whether a backscatter modulated symbol was received. FIG. 26B shows the relative spacing of timing points T0, T1, T2, $T_A$, $T_B$, $T_C$, and $T_S$, to timing point $T_{BS}$. As shown in FIG. 26B, timing point $T_{BS}$ is preferably located between timing points $T_C$ and T2. $T_{BS}$ should be located at a point after $T_C$ in the received symbol where backscatter modulation has begun, and has time to propagate through the necessary components of the receiver of reader network 104 to be detected. $T_{BS}$ should also be located at a point before T2 so that the received backscatter modulated symbol has not finished, and such that the length of received symbols can be as short as possible to increase the read rate of tags 102.

1.2.3 Storage of Timing Points

Reader network 104 creates and coordinates timing points T0, T1, T2, $T_A$, $T_B$, $T_C$, $T_S$, and $T_{BS}$. Timing points $T_A$, $T_B$, $T_C$, $T_S$, and $T_{BS}$ are shown in FIG. 26B relative to timing points T0, T1, and T2. As described above, timing points T0, T1, T2, $T_A$, $T_B$, $T_C$, $T_S$, and $T_{BS}$ relate to various timing characteristics of the present invention, as described above. The timing points are stored so they may be used to maintain consistent timing during communication between reader network 104 and tag 102. In an embodiment, reader network 104 stores the timing points, and conveys one or more of them to tags 102, as described elsewhere herein.

In a preferred embodiment, all of timing points T0, T1, T2, $T_A$, $T_B$, $T_C$, $T_S$, and $T_{BS}$ are dynamic and adjustable by the reader network 104 and tags 102, subject to the requirements of the particular environment.

For example, in embodiments, a first reader in a reader network 104 may use timing characteristics different from those used by a second reader in the same or different reader network 104 operating in the same locality to communicate with one or more of the same tags 102. For example, the first reader may lengthen the duration of one or more of $T_A$, $T_B$, and $T_C$ to give tag 102 more time to read symbols in a noisy environment. Conversely, the first reader may shorten the duration of one or more of $T_A$, $T_B$, and $T_C$ to allow for the faster reading of a large number of tags 102, relative to the second reader. After a binary traversal performed by the first reader network 104 is complete, the second reader may change the duration of one or more $T_A$, $T_B$, and $T_C$ before performing a binary traversal of tag 102.

Furthermore, according to embodiments, timing characteristics for a particular tag 102 used for communication with a first reader network 104 may be different from those used for communication with a second reader network 104. For example, according to processes described below, the first reader network 104 may provide longer values of one or more of T0, T1, and T2 to tag 102 to allow tag 102 to be able to read longer symbols in a noisy environment. Conversely, the first reader network may provide shorter values for one or more of T0, T1, and T2 so that tag 102 is able to read shorter symbols, and hence can receive symbols more rapidly. After a binary traversal performed by the first reader network 104 is complete, the second reader network 104 may provide different values of one or more of T0, T1, and T2 to the tag 102 before performing a binary traversal of tag 102.

In another embodiment, once a binary traversal has begun, but has not completed, a reader network 104 may adjust one or more of timing points $T_A$, $T_B$, $T_C$, $T_S$, and $T_{BS}$. Such an adjustment may be performed as necessary to accommodate a noisy RF environment and other concerns that reader network 104 may have at the time. Reader network 104 may also provide different values for one or more of timing points T0, T1, and T2 to tag 102 to reconfigure timing characteristics of tag 102 in the midst of a binary traversal, as necessary.

Figure 10:
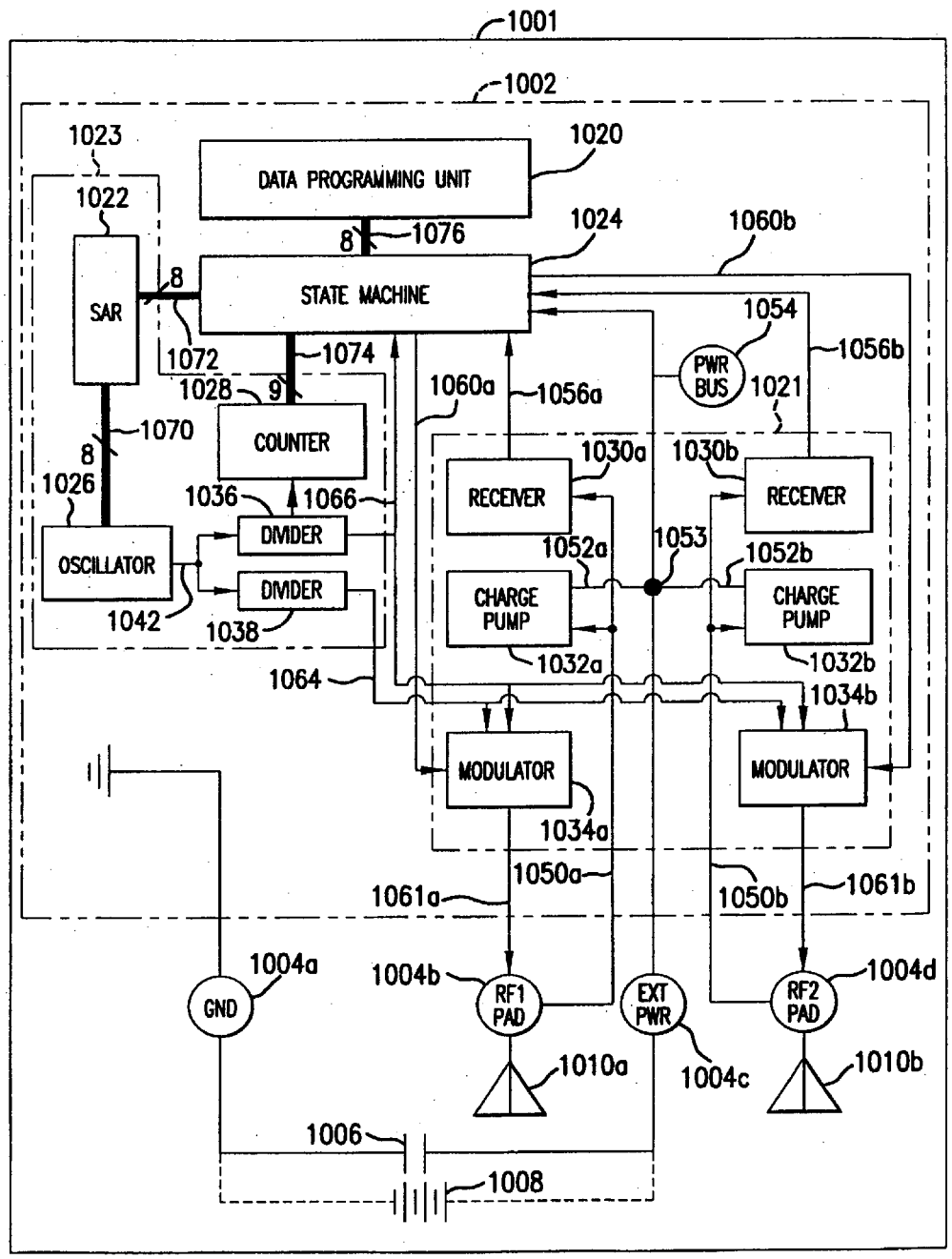
FIGS. 10 and 11 are block diagrams illustrating functional implementations of RFID tags, according to embodiments of the present invention.

2. Tag Embodiments According to the Present Invention 2.1 Structural Description of a Tag 2.1.1 Structural Overview FIG. 10 is a block diagram of a tag 102, according to an embodiment of the present invention. Tag 102 includes an integrated circuit 1002, a plurality of pads 1004a, 1004b, 1004c, and 1004d, a capacitor 1006, an optional battery 1008, a first antenna 1010a and a second antenna 1010b. These components are mounted or formed on a substrate 1001. These components are described in further detail below.

Pads 1004 provide electrical connections between integrated circuit 1002 and other components related to tag 102. For instance, RF pad 1004b establishes a connection between integrated circuit 1002 and first antenna 1010a. Similarly, RF pad 1004d provides a connection between integrated circuit 1002 and second antenna 1010b.

2.1.2 Capacitor/Battery

External power pad 1004c and ground pad 1004a establish connections to provide integrated circuit 1002 with an operating voltage. As shown in FIG. 10, a capacitor 1006 is coupled between pads 1004c and 1004a. Capacitor 1006 stores operating voltage and power obtained through power harvesting circuitry within integrated circuit 1002. This power harvesting circuitry converts low-voltage oscillating RF energy that integrated circuit 1002 receives through antennas 1010a and 1010b into a higher voltage direct current (DC) signal. Further details regarding such power harvesting techniques are provided below.

An optional battery 1008 or other power source may also be coupled between pads 1004c and 1004a. The use of battery 1008 makes the presence of capacitor 1006 optional. In other words, capacitor 1006 may either be absent or coupled in parallel with battery 1008 (i.e., between pads 1004c and 1004a). When present, battery 1008 provides integrated circuit 1002 with an operating voltage that is independent of the performance of its power harvesting circuitry. Power harvesting circuitry typically generates a DC voltage and current that is dependent on the level of available RF energy. Thus, as the physical distance between tag 102 and reader network 104 increases, the DC voltage level that is obtainable through power harvesting techniques decreases.

Accordingly, when integrated circuit 1002 relies solely on power harvesting techniques for operational power, it may be possible for tag 102 to receive information signals from reader network 104 that lack adequate energy to provide tag 102 with a sufficient operating voltage. However, such information signals may have a signal-to-noise ratio (SNR) that would be large enough for decoding if integrated circuit 1002 were operational. When employed, battery 1008 provides such an operational voltage. Therefore, the use of battery 1008 enables tag 102 to communicate with reader network 104 at greater distances, and/or in challenging RF environments. Battery 1008 may be of a variety of types, both in chemical composition and form factor, including types that can be printed directly on tag substrate 1001. A less expensive discharge-only type of battery will have a certain useful life before becoming unable to supply enough operating power to tag 102. Alternatively, a small rechargeable battery may support the operation of tag 102 while in challenging RF environments. The rechargeable battery could also be recharged in an RF environment sufficient to drive the power harvesting function of tag 102. In embodiments, alternative sources for harvesting energy from the environment include, but are not limited to solar cells, piezoelectric materials that convert vibration to voltage, and other sources known to persons skilled in the relevant arts.

Figure 11:
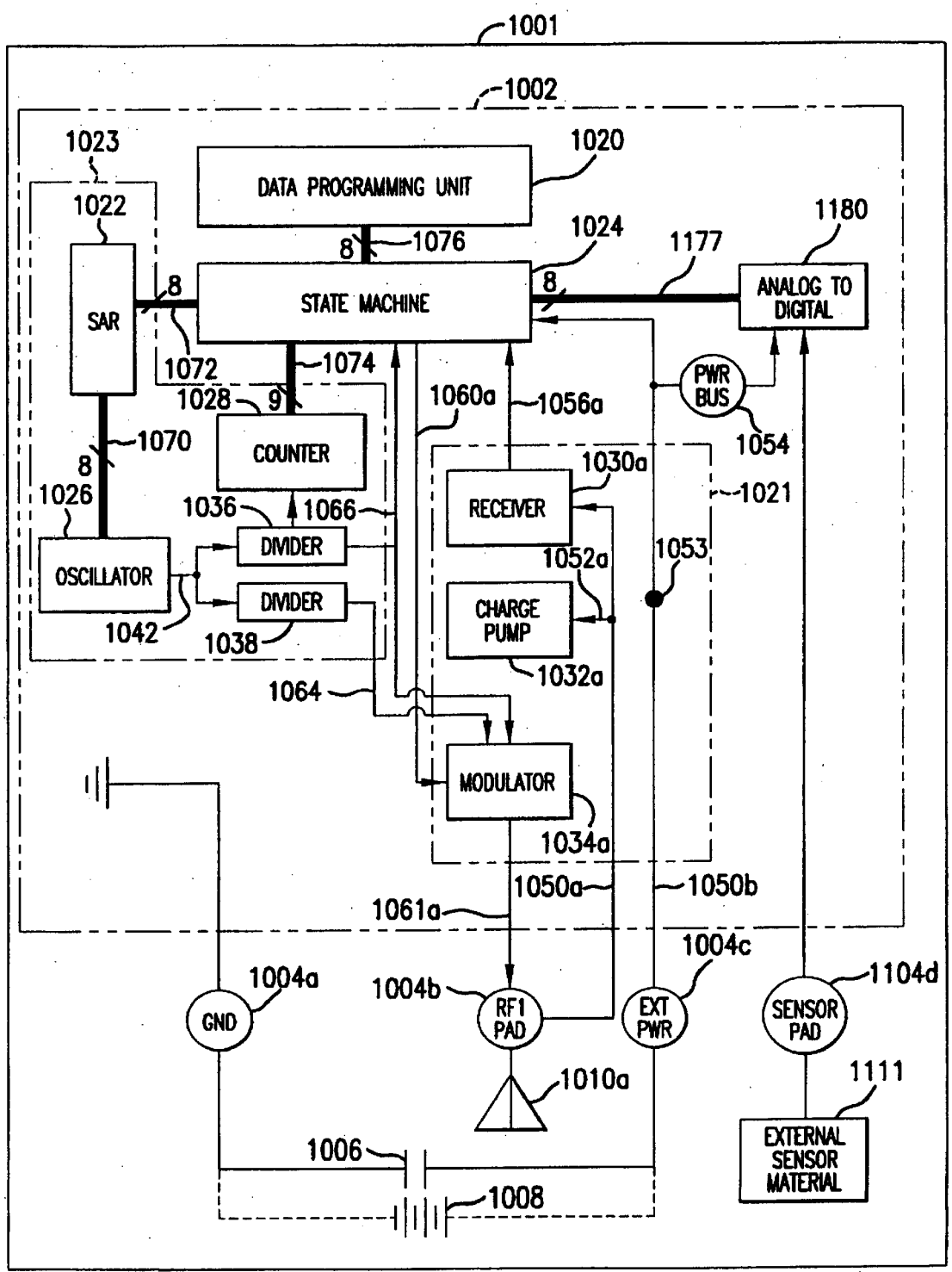

In an alternative embodiment, as illustrated in FIG. 11, tag 102 may include components used to receive information from at least one sensor 1111. In an embodiment, an analog to digital converter (A/D) 1180 receives an analog sensor signal from sensor 1111, and converts the analog sensor signal to digital. Sensor 1111 may be internal or external to integrated circuit 1002. If sensor 1111 is external to integrated circuit 1002, sensor 1111 will couple to a connection pad 1104d, which is coupled to A/D 1180, as shown in FIG. 11. Power bus 1054 provides power to A/D 1080. As shown in FIG. 11, a single RF pad, RF1 pad 1004b, is present for coupling with antenna 1010a, and a single connection pad 1104d is present for coupling with sensor 1111. In further embodiments, one or more additional connection pads may be present to couple with sensor 1111, and/or with additional sensors. Additional antenna pads may also be present. Furthermore, when present battery 1008 or capacitor 1006 may be internal to integrated circuit 1002, and therefore, ground pad 1004a and power pad 1004c may not be present. When sensor 1111 is internal to integrated circuit 1002, sensory pad 1104d may not be present. The present invention is applicable to any combination of these antenna and sensor configurations.

2.1.3 Orientation Insensitivity

The strength of RF signals received from reader network 104 is dependent upon the design of the antenna that collects the energy from the RF environment. Current antenna design theory and practice show that energy received is in part a function of the gain and the width of reception (beam width). Gain is inversely proportional to beam width in that as antennas are adjusted to receive from broader directions, they receive at lesser gain, or lesser power as a result. Conversely, as antennas are adjusted for receipt of maximum power or gain, the power will only be attainable at a very specific orientation with respect to the transmitting antenna. This may result in an orientation sensitivity for a tag antenna with respect to a reader antenna that can greatly reduce the operational distance for a non-optimum orientation.

This fundamental problem has long existed with respect to RFID technology, and a solution has been desired. Resultingly, an industry goal is to determine how to maintain a maximum read distance (which is directly related to antenna gain) while minimizing or removing altogether sensitivity to tag antenna orientation (i.e., the direction of the tag antenna with respect to the reader antenna). Currently available devices exhibit reasonable read ranges, but only in certain tag orientations. This is not desirable to the majority of markets looking for RFID products.

An advantage of the present invention is the ability of integrated circuit 1002 to handle multiple antenna inputs. For example, in the preferred embodiment shown in FIG. 10, first and second antenna pads 1004b and 1004d are present to accommodate first and second antennas 1010a and 1010b, respectively. This allows multiple standard directional antennas to be oriented on substrate 1001 such that the average gain over all orientations is increased with respect to each antenna separately. In a preferred embodiment, antenna 1010a is oriented such that its maximum gain is in a direction that correlates with the minimum gain of antenna 1010b. For example, when using standard dipole designs, antenna 1010a would be oriented at a 90 degree angle with respect to antenna 1010b on the same substrate (Z axis remains constant).

Another such use of multiple antenna inputs would be to simplify wide band receiving antennas. Again, a similar problem exists in that the wider frequency agility of a given antenna design will reduce the gain, or collected energy of a single antenna. Allowing multiple antennas to be designed each for their own distinct frequency bands allows tag 102 to function in the overall wide band with more power in each of the distinct frequencies than a more complicated single wide band antenna design would allow. It is desired that RFID products are capable of operating worldwide. Distinctly different frequency bands may be present in each country to operate in a license free environment. Hence, the ability to use multiple antenna designs for multiple frequency bands is an advantage of the present invention.

2.1.4 Tag Substrate

Integrated circuit 1002 may be implemented across more than one integrated circuit chip, but is preferably implemented in a single chip. The one or more chips of integrated circuit 1002 are created in one or more wafers made by a wafer fabrication process. Wafer fabrication process variations may cause performance differences between chips. For example, the process of matching inductances of a chip may be affected by fabrication process differences from wafer-to-wafer, lot-to-lot and die-to-die.

Integrated circuit 1002 is mounted to substrate 1001. First and second antennas 1010a and 1010b are printed on substrate 1001. In an embodiment, the materials used for substrate 1001 are 3–5 Mil Mylar or Mylar-like materials. The Mylar related materials are preferably used because of their relatively low dielectric properties, as well as their beneficial printing properties. Conductive inks used to print an antenna design are cured at very high temperatures. These high temperatures can cause standard polymers to degrade quickly as well as become very unstable to work with.

An antenna design is printed on substrate 1001 with the conductive inks. In an embodiment, the conductive inks are primarily silver particles mixed with various binders and solvents. For example, binders and solvents currently manufactured by Dupont Corporation may be used. The conductive inks can have different silver particle loads, which allows creation of the desired level of conductivity. Once an antenna is printed, the resistance or "Q" may be determined from the antenna design. A matching circuit may then be determined that allows a match of the surface of antennas 1010a and 1010b to first and second antenna pads 1004b and 1004d, respectively, providing an effective read range for tag 102. In alternative embodiments, antenna substrates of any type or manufacture may be used. For example, subtractive processes that obtain an antenna pattern by etching, or by removing material from a coated or deposited substrate may be used. In a further alternative embodiment, the antenna substrate may be eliminated altogether, and the antenna(s) may be incorporated directly into the integrated circuit.

Note that conductive materials by their own nature tend to oxidize, resulting in an oxide material forming on a surface of the conductive material. The oxide material can be conductive or non-conductive. Non-conductive oxides are detrimental to RF (UHF) performance, as they can significantly cause an antenna to detune. Therefore, in a preferred embodiment, a conductive material may be chosen that tends to oxidize with a conductive oxide. For example, the conductive material may be silver, nickel, gold, platinum, or other Nobel metal, as opposed to copper or aluminum, which tend to oxidize in a non-conductive fashion. However, in alternative embodiments, any suitable material may be used for the conductive ink, including conductive materials that tend to oxide in a non-conductive fashion, such as those listed above.

2.1.5 Integrated Circuit

As shown in FIG. 10, integrated circuit 1002 includes a data programming unit 1020, a state machine 1024, a timing subsystem 1023, and an RF interface portion 1021. In an embodiment, data programming unit 1020 permanently stores information, such as a tag identification number as well as other data. Alternatively, the information may be stored temporarily. The storage of information in data programming unit 1020 may be performed using a variety of techniques. For example, many types of laser programming techniques are available and may be used. Focused ion beam (FIB) techniques are also available and applicable to the present invention. Each of these exemplary techniques typically is used during or soon after production of integrated circuit 1002. In an embodiment, redundant structures for storing bits of information using the laser programming techniques can be used to reduce the effect of single cell programming process errors. Similarly, in another embodiment, dual cells of a programming bit can be implemented in such a fashion that would require a cell to be programmed with all cases of '0' or '1' bits to allow for a reduced power detection circuitry and/or an end of variable ID length detection. Other techniques for the permanent storage of an identification number in integrated circuit 1002 are also within the scope of the present invention.

State machine 1024 may include logic, a processor, and/or other components that controls the operation of RFID tag 102. In an embodiment, state machine 1024 is implemented with digital circuitry, such as logic gates. Further details regarding state machine 1024 are provided below with reference to FIG. 12A.

RF interface portion 1021 is coupled to first and second antennas 1010a and 110b to provide a bi-directional communications interface with reader network 104. In an embodiment, RF interface portion 1021 includes components that modulate digital information symbols into RF signals, and demodulate RF signals into digital information symbols. Furthermore, RF interface portion 1021 includes components that convert a wide range of RF power and voltage levels in the signals received from first and second antennas 1010a and 1010b into usable signals. For example, the signals may be converted to the form of transistor usable direct current (DC) voltage signals that may have substantially higher or lower levels than output by first and second antennas 1010a and 1010b.

FIG. 10 shows that RF interface portion 1021 features two sets of the same components. RF interface portion 1021 includes a first and a second receiver 1030a and 1030b, a first and a second charge pump 1032a and 1032b, and a first and a second modulator 1034a and 1034b. Each of these components is coupled to a respective one of first and second antennas 1010a and 1010b. First receiver 1030a, first charge pump 1032a, and first modulator 1034a are each coupled to first antenna 1010a. Second receiver 1030b, second charge pump 1032b, and second modulator 1034b are each coupled to second antenna 1010b.

First and second charge pumps 1032a and 1032b operate to provide integrated circuit 1002 with an operational voltage. As shown in FIG. 10, first charge pump 1032a receives first RF signal 1050a from first antenna 1010a. First charge pump 1032a converts first RF signal 1050a into a first DC voltage signal 1052a. Similarly, second charge pump 1032b receives second RF signal 1050b from second antenna 1010b and produces a second DC voltage 1052b. First and second DC voltage signals 1052a and 1052b are combined at a node 1053. Node 1053 produces an operational voltage signal/power bus 1054, which provides power to integrated circuit 1002. Although FIG. 10 shows operational voltage signal 1054 only being sent to state machine 1024, power bus 1054 is preferably a bus that provides power to one or more of the other components within integrated circuit 1002 as required.

Further details regarding implementations of first and second receivers 1030a and 1030b and first and second charge pumps 1032a and 1032b are provided below.

First and second modulators 1034a and 1034b are coupled to first and second antennas 1010a and 1010b, respectively.

In an embodiment, each of first and second modulators 1034a and 1034b includes a switch, such as a single pole, single throw (SPST) switch. The switch changes the return loss of the respective one of first and second antennas 1010a and 1010b. The return loss may be changed in a number of ways. For example, when the switch is in its 'on' condition, the RF voltage at the respective antenna may be set lower than the RF voltage at the antenna when the switch is in its 'off' condition by predetermined percentage (e.g., 30 percent). This may be accomplished by a variety of methods known to persons skilled in the relevant arts.

Each of first and second modulators 1034a and 1034b may drive its corresponding switch at the frequency of clock signal 1064 or at the frequency of clock signal 1066. Modulation with either of these clock signals creates upper and lower side bands in the energy that is reflected by the respective antenna. Thus, when receiving a signal from reader network 104, tag 102 backscatters energy in frequencies that are not transmitted by reader network 104. This feature enables the first frequency to designate a logical "1" bit and the second frequency to designate a logical "0" bit. Integrated circuit 1002 includes a frequency selector 1040. Frequency selector 1040 outputs two or more possible frequencies on a frequency signal 1040. First and second modulators 1034a and 1034b receive frequency signal 1040. Frequency signal 1040 determines at which frequency first and second modulators 1034a and 1034b operate.

As shown in FIG. 10, two sets of modulator, charge pump, and receiver components are present in RF interface portion 1021: first and second modulators 1024a and 1024b, first and second charge pumps 1032a and 1032b, and first and second receivers 1030a and 1030b. Note that the present invention is applicable to any number of one or more sets of these components, and related antennas. Accordingly, the present invention allows for a single RF signal to be received and processed, and for any number of two or more RF signals to be simultaneously received and processed. The ability to receive multiple RF input signals facilitates a unique method of the present invention that allows for insensitivity to the orientation of a responding tag 102, as further described elsewhere herein.

As shown in FIG. 10, first and second charge pumps 1032a and 1032b output electricity onto power bus 1054. In an embodiment, when power bus 1054 receives two DC voltages at node 1053, the DC voltages do not conflict. Instead, the higher voltage of the two DC voltages dominates, and supplies more power to capacitor 1006 and other components requiring power in integrated circuit 1002.

First receiver 1030a outputs a first received signal 1056a to state machine 1024, and second receiver 1030 outputs a second received signal 1056b to state machine 1024. In such an embodiment where RF interface portion 1021 includes two sets of components, a logical 'OR'ing function may be applied to first and second received signals 1056a and 1056b in state machine 1024. As a result, only one of first and second receivers 1030a and 1030b is required to output an edge on first and second received signals 1056a and 1056b to indicate that data has been received. The detection of two or more edges reinforces the duplicate received information. In an embodiment, state machine 1024 processes the first of first and second received signals 1056a and 1056b that provides an edge. Hence, in the present invention, multiple simultaneously received signals are logically 'OR'ed into a single signal, with the first signal being considered dominant.

State machine 1020 accesses data processing unit 1020 over data processing unit bus 1076 to determine whether a logical "1" or "0" is to be transmitted by tag 102. More specifically, state machine 1020 accesses one or more bits of the identification number stored in data processing unit 1020. The one or more accessed bits allow state machine 1020 to determine whether reader network 104 is addressing this particular tag 102 during the present portion of the current binary traversal, and what response, if any, is appropriate. Accordingly, state machine 1024 outputs a frequency selection signal on first and second control signals 1060a and 1060b. The frequency selection signal indicates which of a "0," a "1," or other backscatter symbol is to be transmitted from tag 102. First and second modulators 1034a and 1034b receive first and second control signals 1060a and 1060b, respectively. In the embodiment of FIG. 10, first and second control signals 1060a and 1060b direct first and second modulators 1034a and 1034b to perform one of at least the following three actions: (1) perform backscatter modulation using the frequency of clock signal 1064, (2) perform backscatter modulation using the frequency of clock signal 1066, or (3) do nothing. For (1) and (2), first and second modulators 1034a and 1034b preferably perform modulation in tandem at the selected frequency. Hence, the frequency selection signal of first and second control signals 1034a and 1034b may be the same physical signal. Accordingly, in a preferred embodiment, first and second antennas 1010a and 1010b perform backscatter at the same frequency.

In a two-antenna embodiment for tag 102, one of first and second antennas 1010a and 1010b may be positioned in a better orientation for power than the other antenna, relative to reader network 104. This antenna will typically provide more backscatter energy for the antenna of reader network 104 to detect. Hence, the better oriented antenna of tag 102 will typically transmit signals that prevail over signals transmitted from the other antenna of tag 102. Note that this principle is also applicable to greater numbers of antennas for tag 102 than just two.

As shown in FIG. 10, timing subsystem 1023 includes an oscillator 1026, a successive approximation register (SAR) 1022, a counter 1028, a first divider 1036, and a second divider 1038. Oscillator 1026 generates a master clock signal 1062 having a master clock frequency, such as 7.5 MHz. Master clock signal 1062 is received by first divider 1036 and by second divider 1038. First and second dividers 1036 and 1038 each divide the frequency of master clock signal 1062, and output first and second clock signals 1066 and 1064, respectively.

First and second clock signals 1066 and 1064 each have a frequency that is less than the frequency of master clock signal 1062. For instance, first divider 1036 may divide the frequency of master clock signal 1062 by a factor of two. Hence, the frequency of second clock signal 1064 is one-half of the frequency of master clock signal 1062. Second divider 1038 may divide the frequency of master clock signal 1062 by a factor of three. Hence, the frequency of first clock signal 1066 is one-third of the frequency of master clock signal 1062. Accordingly, when the frequency of master clock signal 1062 is 7.5 MHz, the frequency of second clock signal 1064 is 3.75 MHz and the frequency of first clock signal 1066 is 2.5 MHz.

Clock signals 1064 and 1066 are received by various components of integrated circuit 1002. In an embodiment, first clock signal 1066 is used as the system clock signal for integrated circuit 1002. First clock signal 1066 is lower in frequency, and therefore promotes lower power usage by components of tag 102. In an embodiment, first clock signal 1066 is received by counter 1028. Counter 1028 increments an internal register at a rate that corresponds to the frequency of first clock signal 1066, to generate a count value. FIG. 10 shows counter 1028 as a nine bit binary counter. However, counter 1028 may have different bit widths and configurations as dictated by the particular application.

The count value of counter 1028 may be cleared upon the occurrence of certain conditions. For example, counter 1028 may be cleared during data calibration procedures. Data calibration procedures are described in greater detail below with reference to FIGS. 26–28D.

Oscillator 1026 is coupled to SAR 1022 by a control interface 1070. Successive approximation register 1022 sends a control signal to oscillator 1026 across interface 1070 to adjust (i.e., to calibrate) the frequency of master clock signal 1062, and hence to adjust the frequency of first clock signal 1066. FIG. 10 shows control interface 1070 having eight parallel control signals. However, any number of one or more control signals may be used for interface 1070. The operation of SAR 1022 and oscillator 1026 is described in greater detail below with reference to FIGS. 18–25C.

2.2 Functional Description of a Tag 2.2.1 Operational States of a Tag

Tag 102 can exist in various operating states. Each of these operating states describes a mode of operation for tag 102. Upon the occurrence of certain events, tag 102 can transition from one operating state to another. For example, upon occurrence of an event, tag 102 can transition from a present operating state, which is the operating state that tag 102 is operating in when the event occurs, to a new operating state, as dictated by the combination of the present operating state and the event. In an embodiment, these events can be classified in two categories: Data events and time-based events. Data events are triggered by the detection of edges from transmissions of reader network 104, such as the transition from $S_{low}$ to $S_{high}$ and vice versa. Time-based events are derived from a passage of a certain period of time, such as may be indicated by a counter overflow. In a preferred embodiment, a timer or counter is reset (e.g., the timer or counter outputs a zero count) upon detection of a data event. Time-based events may be considered to be indications that no data events have occurred over a particular period of time.

Figure 12A:
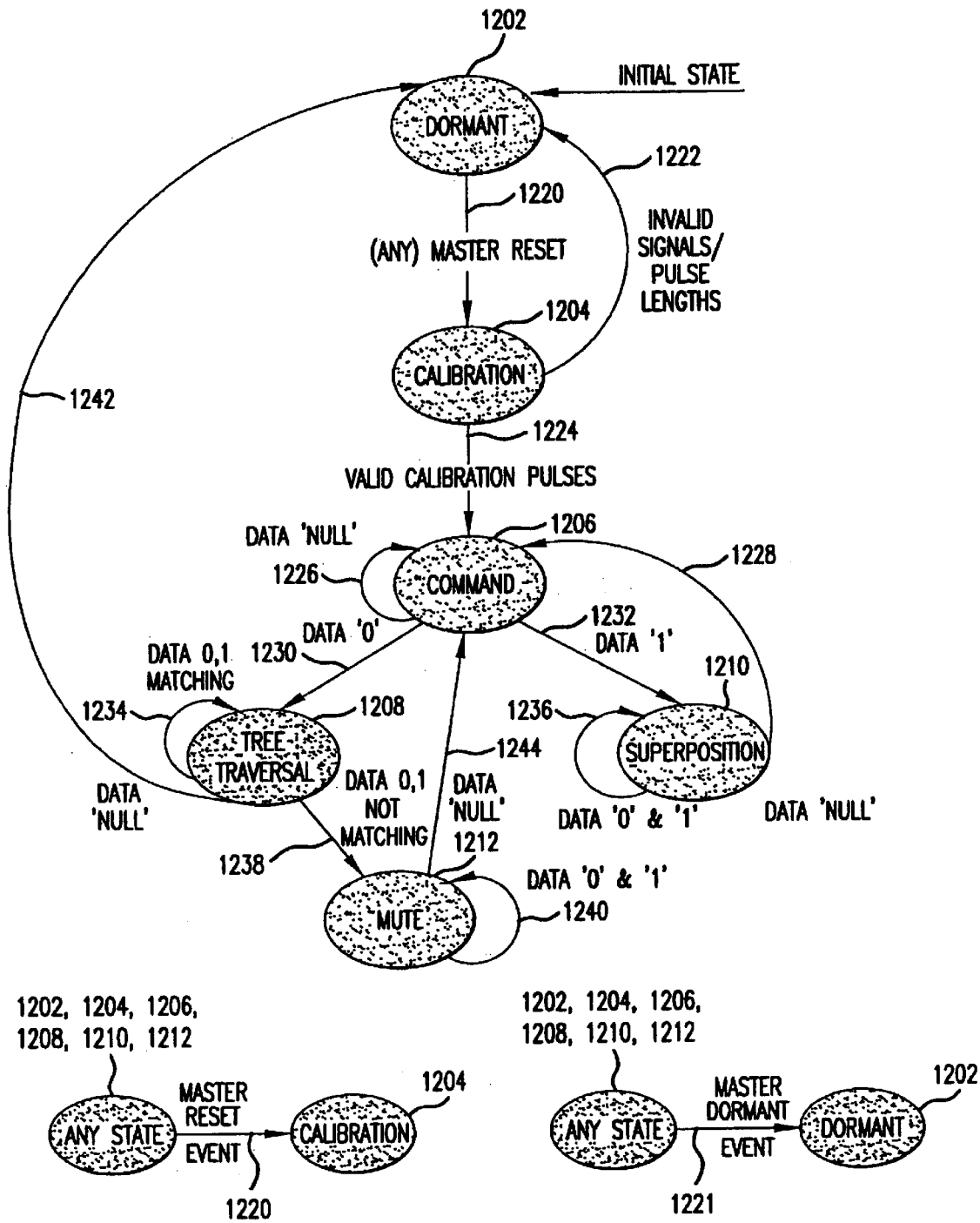
FIG. 12A is a state diagram illustrating various operating states of an RFID tag, according to an embodiment of the present invention.
Figure 12B:
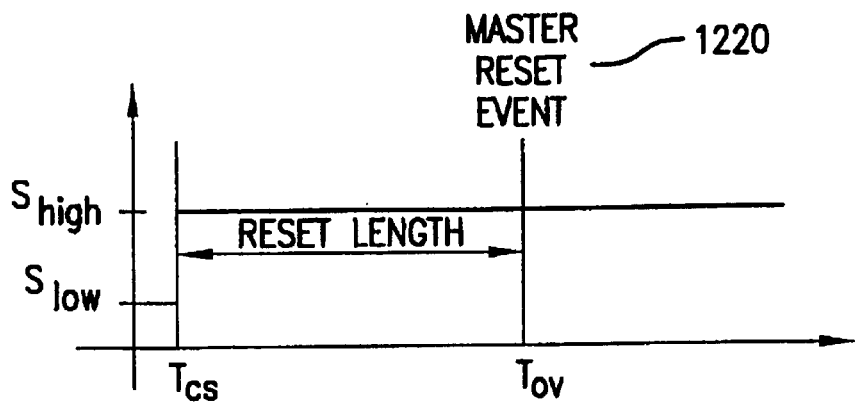
FIGS. 12B–12D are signal representations of master reset and master dormant signal conditions, according to embodiments of the present invention.
Figure 12C:
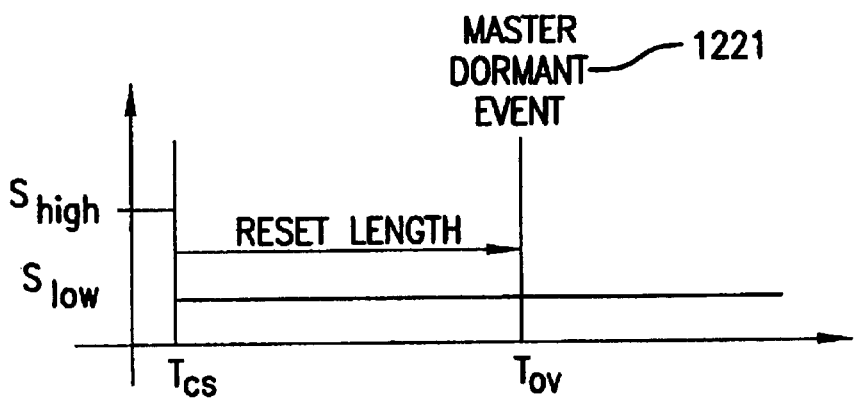
Figure 12D:
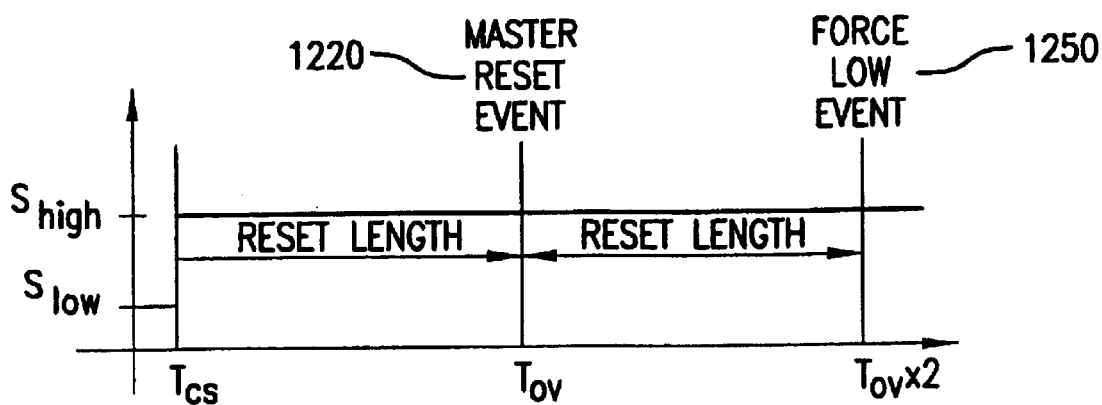

In FIGS. 12B, 12C, and 12D, possible combinations of time-based and data based events are shown. In FIG. 12B, a data transition from $S_{low}$ to $S_{high}$ resets the counter or timer to zero at time $T_{CS}$. At the end of a period of time indicated by Tov, where the counter overflows to trigger an elapsed time event, the event is considered a master reset event 1220. Master reset event 1220 occurs on a timer or counter overflow when the data is in an $S_{high}$ state. In FIG. 12C, a data transition from $S_{high}$ to $S_{low}$ also resets the timer to zero at time $T_{CS}$. At the end of the period of time indicated by Tov, a time-based event occurs, which is considered a master dormant event 1221. This occurs because the data value has remained in the $S_{low}$ state, as opposed to transitioning to the $S_{high}$ state, as shown in FIG. 12B. In an embodiment, this event is applicable to battery powered tags. Power drawn from the battery of battery powered tags may be reduced after the master dormant event 1221 occurs as shown in FIG. 12C.

FIG. 12D shows a preferred embodiment of the present invention that allows for the conservation of battery power for tag 102 when in an inactive mode due to the input data remaining in the $S_{high}$ state. For example, a constant level of ambient noise on a received signal may appear to be an $S_{high}$ state in certain situations, and therefore could activate tag 102. In another example, a reader network 104 may inadvertently enter a state where it is outputting an RF transmission with no modulation (e.g., a constant wave (CW) emission). FIG. 12D shows a force low event 1250 that will force the state of the data line to be considered as $S_{low}$. In a preferred embodiment, data events will be suppressed while the data line is being forced low after force low event 1250. However, the counter or timer will be reset to allow the event shown in FIG. 12C to be generated. If no additional edges are detected in the signal received from reader network 104, then the condition shown in FIG. 12C will generate a master dormant event 1221, thereby placing tag 102 into a power conservation mode.

It is also important to note the time length of the time period Tov, which represents the length of time for an overflow of counter 1028. As a tag 102 initially powers up, and the frequency of the oscillator driving the timer function is not calibrated, the actual time period of Tov may vary between tags by +−50%. This variation is due to variations in fabrication processes and due to ambient environmental conditions such as temperature. In a preferred embodiment, Tov is ideally equal to 400 µS. Under real operating conditions, this value for Tov may vary between 200 and 600 µS. This variation does not include the time necessary for tag 102 to power up and begin counting.

Receipt of a master reset event 1220 (i.e., received signal of length greater than Tov) may be used to cause a tag 102 to enter a calibration mode, for example. In an embodiment, the length Tov for a particular tag 102 is multiplied four times after the receipt of the first master reset event 1220. This adjustment of Tov by tag 102 enables reader network 104 to initiate a new calibration procedure at any time with a new tag 102 that enter its communications range without affecting existing tags 102. For example, a new calibration procedure is preferably initiated after reader network 104 has already interrogated all tags 102 within its communications range. Thus, when new tags 102 enter the communication range of reader network 104, reader network 104 may re-transmit the shorter type of master reset signal. This retransmission of the shorter master reset signal initiates calibration procedures and subsequent protocol exchange with the new tags 102. The existing tags 102 do not re-enter calibration mode, because they now require the longer master reset signal to enter calibration mode.

FIG. 12A illustrates various operating states in a state diagram for tag 102, according to an embodiment of the present invention. In FIG. 12A, each operating state is shown as an oval, and transitions between operating states are shown as connections between the ovals. The transitions are annotated with text that describes a corresponding event. Located at the bottom of FIG. 12A are two disjoint state transitions that are indicative of the interrupting time-based master reset and master dormant events. Note that the two disjoint state transitions are not shown integrated into the state diagram to aid the readability of the state diagram. The two disjoint state transitions are transition options that are available at each state, to transition from any state to the final target state.

The paragraphs below describe the operating states and the respective transitions shown in FIG. 12A. These particular states and transitions are presented by way of example only. Additional and alternative operating states, transitions, and transition causing events can be employed without departing from the spirit and scope of the present invention.

The first state is a dormant state 1202. During dormant state 1202, tag 102 is largely inactive. Therefore, power is conserved during dormant state 1202. Tag 102 enters dormant state 1202 upon powering up, after receipt of a master dormant event, and at other times described below. When tag 102 is in dormant state 1202, first and second receivers 1030a and 1030b and first and second charge pumps 1032a and 1032b are coupled to first and second antennas 1010a and 1010b, respectively, to receive energy and data from reader network 104.

For example, while in dormant state 1202, first and second charge pumps 1032a and 1032b supply power that is used to charge capacitor 1006. The power is generated from RF transmissions received by first and second antennas 1010a and 1010b. The RF transmissions may originate from reader network 104 while it is performing interrogation operations unrelated to tag 102. The RF transmissions may also originate from other sources of RF energy. The charging of the capacitor 1006 enables tag 102 to achieve an operating voltage. When this operating voltage is reached, tag 102 has the capability to function in the manner described herein.

As shown in FIG. 12A, tag 102 transitions from dormant state 1202 into a calibration state 1204 upon the master reset event described in FIG. 12B. Additionally, tag 102 may transition from other states to calibration state 1204. This transition is shown in FIG. 12A as master reset event 1220. In an embodiment, dormant state 1202 is only able to transition to calibration state 1204. No other data events will result in a transition from dormant state 1202. In alternative embodiments, events may cause transitions from dormant state 1202.

In calibration state 1204, tag 102 initializes its timing circuitry. In an embodiment, in calibration state 1204, tag 102 will not generate data events "0," "1," and "NULL," as they have not yet been defined. Instead, in calibration state 1204, tag 102 performs an oscillator calibration procedure and a data calibration procedure. The oscillator calibration procedure involves tag 102 receiving multiple oscillator calibration pulses from reader network 104, defined herein as edge transition (data) events. Specific timing is provided between the edge transition events. Similarly, the data calibration procedure involves tag 102 receiving multiple data calibration pulses from reader network 104. The data calibration pulses are also defined as edge transition events with specific timing. Example data calibration and oscillator calibration techniques are described in further detail below.

Before tag 102 completes the oscillator calibration procedure, the system timer or counter operates at an uncalibrated rate. As described above, the uncalibrated rate may be within a +/−50% tolerance of a calibrated system timer rate. This variation may be in part due to process variations of standard integrated circuit manufacturing and to ambient environmental conditions such as temperature. Accordingly, an overflow period used to designate master reset signals is within a predetermined tolerance. For example, in an embodiment, reader network 104 provides a reset signal causing a master reset event 1220 that is of a duration of time 50% greater than a center time duration. In a preferred embodiment, the center time duration may be 400 µS, so that the 50% greater time duration that occurs due to master reset event 1220 is 600 µS. Hence, reader network 104 ensures that tags 102 recognize a master reset signal 1220, regardless of their process variations, ambient temperature, and oscillator tolerances.

As shown in FIG. 12A, tag 102 may transition from calibration state 1204 to dormant state 1202 upon the occurrence of event 1222. In an embodiment, event 1222 is defined by the reception of a signal that are not representative of timing signals expected by tag 102. For instance, in a preferred embodiment, oscillator calibration signals are defined as 8 pulses of equal length. If the oscillator calibration pulses received by tag 102 are significantly unequal or not within an expected range of lengths, the pulses may be considered invalid, causing occurrence of an event 1222. Hence, when tag 102 receives signals that do not cause successful oscillator calibration or data calibration procedures, this causes an event 1222 to occur.

After successful completion of the oscillator calibration procedure, which results in a tuned oscillator, and the data calibration procedure, which results in defined data symbols, tag 102 transitions from calibration state 1204 to a command state 1206. This transition is shown in FIG. 12A as transition or event 1224. After data calibration, tag 102 expects to receive defined data symbols from reader network 104. The data symbols are defined as data "0," data "1," and data "NULL." Master reset and master dormant events may occur at any time, and are immediately processed after occurring.

During command state 1206, tag 102 expects a command from reader network 104 in the form of a data symbol. Such a command directs tag 102 to enter either a tree traversal state 1208 or a superposition state 1210. In a preferred embodiment, the command is a single bit. For example, receipt of a logical "0" symbol 302 from reader network 104 may direct tag 102 to enter tree traversal state 1208. However, receipt of a logical "1" symbol 402 from reader network 104 may direct tag 102 to enter superposition state 1210. The transition from command state 1206 to tree traversal state 1208 is shown in FIG. 12A as event 1230, while the transition from command state 1206 to superposition state 1210 is shown as event 1232. In an embodiment, the receipt of a logic "NULL" symbol 502, as shown in FIG. 5, does not effect the state of tag 102 in command mode. This is shown as event 1226 in FIG. 12A.

When operating in tree traversal state 1208, tag 102 transmits its identification number to reader network 104 according to a binary traversal protocol that enables reader network 104 to quickly interrogate a population of tags 120. The binary traversal protocol is described in greater detail below with reference to FIGS. 13–16.

Tag 102 may enter a mute state 1212 from tree traversal state 1208. This is shown in FIG. 12A as transition 1238. In mute state 1212, tag 102 receives data from reader network 104. However, when in mute state 1212, tag 102 will provide no response until a data "NULL" signal is received by tag 102. The data "NULL" signal returns tag 102 to command state 1206 via event 1244. The mute state 1212 disables a tag 102 from responding to a particular request for an ID from a population of tags 120. In a preferred embodiment, reader network 104 does not directly address a tag 102, or population of tags 120, in an effort to disable them from communicating to reader network 104. Tag 102 determines whether it is acceptable to continue transmissions to reader network 104, and when it is necessary to enter mute state 1212. Information necessary to determine these actions is provided implicitly by reader network 104 to tag 102, as described herein.

Alternatively, tag 102 may return to dormant state 1202 from tree traversal state 1208. Tag 102 transitions from tree traversal state 1208 to dormant state 1202 upon receipt of a data "NULL" symbol 502 from reader network 104. In a preferred embodiment, receipt of the data "NULL" symbol 502 occurs after reader network 104 has determined that all desired information has been obtained from tag 102, and all other tags 102 of the tag population have transitioned into a state of inactivity (i.e., either dormant state 1202 or mute state 1212). Optionally, in an embodiment, tag 102 may also transition itself from tree traversal state 1208 to dormant state 1202 when tag 102 has completed transmission of its identification number to reader network 104. In another embodiment, tag 102 may transition to a deep dormant state at this point such that the amount of power used by tag 102 is at a minimal level necessary to maintain operation in the state. Hence, transmitted RF energy is allowed to pass by or through a tag 102 in the deep dormant state to other tags 102 in close proximity so that they can obtain more power for operation.

Note that during tree traversal operations, one or more tags 102 may find themselves active, and in state 1208, or temporarily inactive, and in state 1212. One or more other tags 102 that have been processed will be in dormant state 1202. Reader network 104 may then collectively address the full population of tags 120 by sending a data "NULL" symbol 502. Tags 102 that were active in state 1208 will then transition to the dormant state 1202 via event 1242, joining one or more tags 102 in dormant state 1202. However, one or more tags 102 that were temporarily inactive in mute state 1212 will transition back to active participation, in command state 1206. The transmission of a single logic symbol from the reader network 104 to the tag population 102 causes all of these actions. Accordingly, this is an example of an implicit instruction from reader network 104.

When operating in superposition state 1210 shown in FIG. 12A, tag 102 receives information from reader network 104. Tag 102 responds to reader network 104 when designated portion(s) of its identification match the information received from reader network 104. Superposition state 1210 allows acquisition of information regarding the entire population of tags 120 that is within communications range of reader network 104. In a preferred embodiment, this information is used by reader network 104 to quickly ascertain the most efficient tag interrogation algorithm to use for the particular tag environment. With respect to a tag 102, the differences between tree traversal state 1208 and superposition state 1210 are at least two-fold. First, information received from reader network 104 and information to be transmitted by tag 102 is compared to determine whether to transmit the information. Second, if the information does not match, tag 102 does not enter into mute state 1212, but just 'skips' this one particular piece of information.

The receipt by tag 102 of a data "NULL" symbol 502 from reader network 104 affects the operation of tag 102. A data "NULL" symbol 502 is defined according to the particular operating state in which tag 102 is operating. In particular, tag 102 recognizes the data "NULL" symbol 502 when it is operating in one of command state 1206, tree traversal state 1208, superposition state 1210, and mute state 1212. An exemplary data "NULL" symbol 502 is described above with reference to FIG. 5.

Tag 102 may transition between various operating states upon the receipt of a data "NULL" signal. For instance, when tag 102 is operating in superposition state 1210, receipt of a data "NULL" symbol 502 causes tag 102 to transition to command mode 1206. This transition is shown in FIG. 12A as event 1228. However, when tag 102 is operating in tree traversal mode 1208, a data "NULL" causes tag 102 to transition to dormant state 1202. FIG. 12A illustrates this transition as event 1242. When tag 102 is operating in mute state 1212, receipt of a data "NULL" causes tag 102 to transition to command state 1206. This transition is shown in FIG. 12A as event 1244. Hence, although reader network 104 issues a data "NULL" symbol 502, it is the responsibility of the population of tags 120 to interpret this symbol and act appropriately according to the current state of each tag 102. Accordingly, this is another example of the implicit command set issued by reader network 104, according to a preferred embodiment of the present invention.

3. Communications Protocols According to the Present Invention 3.1 Binary Traversal Protocol When operating in tree traversal state 1208, tag 102 communicates with reader network 104 according to a binary traversal protocol. This protocol enables reader network 104 to rapidly retrieve information that is associated with every tag 102, such as an identification number, within its communications range.

In the description below, reader network 104 transmits logical symbols to tag 102 from the symbol set of logical "0" symbol 302, logical "1" symbol 402, and "NULL" symbol 502, which are respectively described above with respect to FIGS. 3–5. Furthermore, in the description below, tag 102 is described as responding to reader network 104 using backscatter symbols. The backscatter symbols are included in the backscatter symbol set of "0" backscatter symbol 602, "0" backscatter symbol 702, "1" backscatter symbol 802, and "1" backscatter symbol 902, which are respectively described above with respect to FIGS. 6–9. In the text below, note that the particular backscatter symbol used by tag 102 to respond depends on the symbol received from reader network 104, and is chosen from this set of backscatter symbols, as described above.

Figure 13:
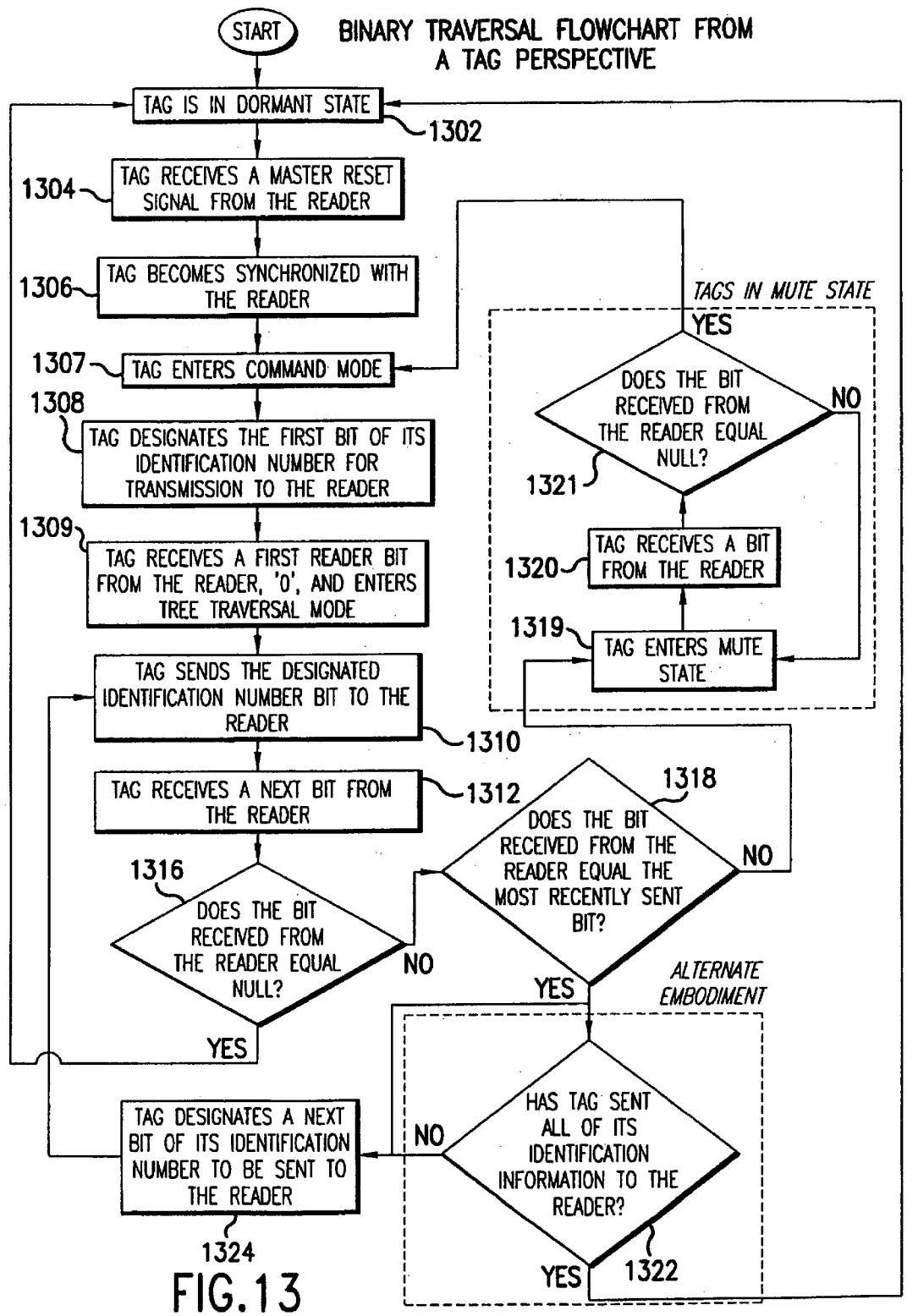
FIG. 13 is a flowchart that illustrates an operation of a binary traversal protocol from the perspective of a single tag, according to an embodiment of the present invention.

FIG. 13 provides a flowchart illustrating an example operation of the binary traversal protocol from the perspective of a single tag 102, according to an embodiment of the present invention. By operating according to the flowchart of FIG. 13, tag 102 responds to signals from reader network 104 with a reduced level of required processing. Hence, tags 102 require fewer transistors, thereby consuming less power and occupying less space, which reduces integrated circuit costs.

As shown in FIG. 13, the flowchart begins with step 1302. In step 1302, tag 102 is in dormant state 1202.

In step 1304, tag 102 receives a master reset signal from reader network 104. Upon receipt of this signal, tag 102 moves from dormant state 1202 to calibration state 1204, and operational flow proceeds to step 1306.

In step 1306, tag 102 is synchronized with reader network 104. Accordingly, in step 1306, tag 102 performs oscillator calibration with reader network 104, and performs data calibration with reader network 104. These procedures are further described below.

In step 1307, tag 102 enters command state 1206 and operation proceeds to a step 1308.

In step 1308, tag 102 initializes the data to be transmitted. The data is retrieved from data programming unit 1020 shown in FIG. 10. Tag 102 prepares to send the first bit.

In step 1309, tag 102 receives a command from reader network 104 to enter tree traversal state 1208. In a preferred embodiment, the command is a single bit, such as a logical "0" symbol 302.

In step 1310, tag 102 sends the designated identification number bit to reader network 104. Accordingly, step 1310 may include tag 102 sending a backscatter modulated symbol to reader network 104, such as one of the symbols described above with reference to FIGS. 6, 7, 8, and 9. As described below with reference to FIGS. 14 and 15, reader network 104 receives the identification bit and determines which tag 102 (or tags 102) to address next. This determination involves reader network 104 transmitting a bit value (i.e., either a "0" or a "1") that it considers valid. With reference to tag 102 shown in FIG. 10, step 1310 may include state machine 1024 referencing a least significant (LSB) tag bit pointer to the designated identification number bit stored in data programming unit 1020 in FIG. 10.

In step 1312, tag 102 receives a next bit from reader network 104.

In step 1316, the tag determines if the bit received from the reader network 104 in step 1312 is a data "NULL" symbol 502. If the bit is a data "NULL" symbol 502, reader network 104 instructs tag 102 to discontinue operations until the next reset, and operation passes to step 1302. However, if the bit is not a data "NULL" symbol 502, operation passes to step 1318.

In step 1318, tag 102 compares the bit sent in step 1310 and the bit received from reader network 104 during prior step 1312. If the bits do not match, operation passes to step 1319. This is an example of the implicit nature of the present invention. Transmitting a single data symbol from reader network 104 causes each tag 102 in the population of tags 120 to contextually switch to one of several possible states. This implicit operation contrasts with conventional "explicit" protocols. In explicit protocols, a command from a reader specifically addresses a population or subset population of tags. Hence, only the addressed population or subset population of tags moves to a directed state. Subsequent commands are required to address the remaining tags. Thus, multiple operations are required by the reader to accomplish what the implicit approach of the present invention can accomplish in a single operation.

In step 1319, tag 102 enters mute state 1212, where backscatter transmissions are suspended. However, tag 102 keeps track of data symbols being sent by reader network 104.

In step 1320, tag 102 receives a data symbol from reader network 104.

In step 1321, after receipt of a symbol from reader network 104 in step 1320, tag 102 determines if the symbol is a data "NULL" symbol 502. If it is not, operation passes to state 1319.

Upon receipt of a data "NULL" signal in step 1321, operation passes to step 1307, where tag 102 transitions to command state 1206.

If the bit received from reader network 104 during step 1312 matches the bit sent by tag 102 during the prior step 1310, tag 102 remains in tree traversal state 1208. Operation then may proceed to an optional step 1322, when present. If step 1322 is not present, operation proceeds to step 1324.

In optional step 1322, tag 102 determines whether it has sent all desired information (e.g., identification information) to reader network 104. If all desired information has been sent, tag 102 has been completely read (i.e., interrogated), and operation passes to step 1302. If tag 102 determines in step 1322 that all desired information has not been sent to reader network 104, operation proceeds to step 1324.

In step 1324, tag 102 designates a next bit of its identification number to be sent to reader network 104. For example, the designated next bit may be the next significant bit to the previously selected bit (i.e., either the bit next to the bit initially designated in step 1308, or the bit selected most recently in step 1324). Thus, step 1324 may include state machine 1024 incrementing its tag bit pointer to the next most significant bit position in data programming unit 1020 shown in FIG. 10.

After completion of step 1324, operation passes to step 1310. In step 1310, tag 102 transmits the bit designated in step 1324 to reader network 104 as a backscatter symbol.

During traversal sequences, such as the traversal sequence described above with reference to FIG. 13, reader network 104 may employ various traversal termination techniques that each cause tag 102 to enter dormant state 1202. That is, such termination techniques will cause operation of tag 102 to return to step 1302.

The ability to cause tag 102 to enter dormant state 1202 when desired enables reader network 104 to interrupt an ongoing traversal and immediately proceed to a new traversal. A first termination technique involves reader network 104 sending a data "NULL" symbol 502, such as the data "NULL" symbol 502 described above with reference to FIG. 5. As shown in the state diagram of FIG. 12A, the receipt of a data "NULL" symbol 502 causes tag 102 to enter dormant state 1202. Hence, receipt of a data "NULL" symbol 502 causes operation in the flowchart of FIG. 13 to pass to step 1302.

Once in dormant state 1202, reader network 104 may initiate a new binary traversal by causing steps 1304–1309 of FIG. 13 to be performed. In other words, reader network 104 may initiate a binary traversal by transmitting a master reset signal, performing calibration procedures with tag(s) 102, and transmitting a command for tag(s) 102 to enter tree traversal state 1208.

In a second termination technique, tags may implicitly place themselves into dormant state 1202 using optional step 1322. In this embodiment, tags 102 will automatically enter their dormant state 1202 after transmitting the last bit of data to reader network 104, as indicated in step 1322. Hence, using this termination technique, reader network 104 reads bits from tags 102 until they stop responding. Hence, reader network 104 can read one or more tags 102 having variable data lengths without having prior knowledge of their variable data lengths. Once tags 102 no longer respond, reader network 104 knows all tags 102 have been read regardless of their respective data lengths.

Reader network 104 may utilize additional termination techniques to relatively quickly eliminate one or more subsets of a population of tags 120. For example, subsets of a population of tags 120 may be defined by a classification number. The classification number may be located within the first bits of the ID number of each tag 102. A particular classification number may be identified by a traversal that only traverses the bit pattern corresponding to the particular classification number. Once such a distinct bit pattern is identified, reader network 104 may terminate its current traversal by issuing a data "NULL." The subset of tags 102 matching the classification number can then be eliminated from the current tag population search by reader network 104.

The subset of tags 102 may be eliminated as follows: By issuing the data "NULL," all tags 102 that are assigned the particular classification number would be in state 1208 (binary traversal) after addressing these few bits of the distinct bit pattern. Tags 102 that did not match this particular classification number would have at some point during the traversal followed steps 1318, 1319, 1320, and 1321 into 'mute' state 1212. Thus, when reader network 104 issues the data "NULL," tags 102 in state 1208 will implicitly place themselves into dormant state 1202 by leaving step 1316 via the 'Yes' branch, passing to step 1302. Tags 102 in dormant state 1202 will remain dormant until the next master reset is issued. When the remaining tags 102 receive the data 'null,' they will follow the 'yes' branch from step 1321 to step 1307. Hence, they will be re-initialized to start another traversal with the first bit of their ID, which in the current embodiment is the first bit of their particular classification number. Hence, using the ability of tags 102 to act implicitly, reader network 104 may relatively quickly remove specific populations of tags from responding to traversals until the next master reset signal.

In a similar termination technique, reader network 104 may choose to address a subset of the population of tags 120, ignoring other tags that may respond. In the preceding example, tags 102 are each assigned classification numbers in their identification numbers, and the bits of these are first transmitted to the reader network 104. Reader network 104 may direct a binary traversal along a path such that tags 102 having a particular classification will follow steps 1302–1318, 1322, and 1324, and back to step 1310. Tags 102 that match the classification number will be in state 1208, or in binary traversal. Tags 102 that do not match the classification number will follow steps 1302–1318, at some point not matching a bit sent by reader network 104. Hence, operation of these tags 102 will pass to steps 1319, 1320, and 1321, where tags 102 are in mute state 1212. However, reader network 104 may elect not to disable these tags 102 as in the preceding termination example, but instead may continue following a binary traversal. However, in this example, only the subset of tags 102 that match the classification number actively respond, and will remain in state 1208. Tags 102 that do not match the classification number will be in mute state 1212. These tags 102 will not respond to the reader network 104 until the next data "NULL," as shown in the 'yes' branch of step 1321 that passes to step 1307. In this manner, reader network 104 may specifically address a subset of the population of tags matching the particular classification number. Reader network 104 ignores the responses of those tags 102 having a different classification number. The ignored tags 102 will not enter a dormant state 1202 as in the preceding example, but instead will remain in mute state 1212.

For example, this ability to identify subsets of tags 102 may be applied to identify classes of objects to which tags 102 are attached. In an example application involving retail inventory, items belonging to a particular class of goods (e.g., jeans, CD players, overnight shipments, etc.) are each affixed with a tag 102 having a bit pattern in its identification number. The bit pattern uniquely corresponds to the class of goods. Reader network 104 may identify whether items of one or more of these particular classes exist by using a binary traversal algorithm to determine whether the particular bit patterns of the classifications exist in the identification numbers of these tags 102. Note that in embodiments, variations in the bit pattern may correspond to different levels in a package hierarchy. The bit pattern variations may be used to distinguish, for, example, an item tag, a box tag, a carton tag, a tote tag, and a pallet tag, etc., from each other. Thus, a reader network 104 could, for example, read only the pallet tag even if the pallet contains numerous cartons of numerous boxed items that have corresponding tags.

In addition to identifying subsets of tags 102, reader network 104 may use termination techniques to prevent the reading of additional information appended to a tag identification number. For instance, tags 102 may employ tag identification numbers that include an identifying portion and a sensor data portion, as shown in FIG. 11. The identifying portion identifies a tag 102. However, the sensor data portion provides information generated by a sensor within tag 102. If reader network 104 only needs identifying information, then reader network 104 may terminate interrogations before receiving the sensor data portion. For example, reader network 104 may issue a data "NULL" after receiving identification information but before receiving sensor information.

Note that FIGS. 12A and 13 do not indicate the exact bit lengths that reader network 104 collects or that tags 102 transmit. In a preferred embodiment, the binary traversal protocol of the present invention allows for a variable length protocol. Reader network 104 begins a binary traversal by issuing signals that step one or more tags 102 through steps 1302–1318, 1322, 1324, and back to step 1310. As previously noted, at any time during this process, reader network 104 may issue a data 'null,' which transitions tag 102 into dormant state 1202 via step 1316 using the 'yes' branch. The data "NULL" can be transmitted at any bit in the fall sequence of bits of an identification number. In a preferred embodiment (which does not include step 1322), tags 102 will continue to send out bits after all bits of its identification number have been sent and received by reader network 104. For example, without additional information to send, tag 102 will transmit logical "0" backscatter symbols. When tag 102 includes sensor information, such as shown in FIG. 11, sensor information bits that are available at that time are transmitted after the identification number, after which "0" backscatter symbols are transmitted. Accordingly, reader network 104 controls the number of bits collected, which ultimately determines the bit length of the population. In an embodiment, reader network 104 may know that tags 102 of a particular classification have a particular bit length of identification. Reader network 104 can determine "on the fly" when to stop reading identification bits and issue a data "NULL," so that it can collect the next tag 102, which may have a different identification number length. Hence, upward mobility for tags 102 having longer ID numbers is present, and is an advantage of the present invention.

Reader network 104 may employ the binary traversal protocol to interrogate a population of tags according to various techniques. A first example interrogation technique involves reading every tag 102 in a tag population that can be detected. This technique is referred to herein as a general read interrogation. During a general read interrogation, reader network 104 traverses through the tag population by exchanging symbols with the tag population. During this process, when reader network 104 receives two backscatter symbols simultaneously (such as a logical "0" and a logical "1") in response to a transmitted signal, it selects one of these symbols to transmit next. In doing so, the reader network 104 evoke responses from any tags 102 that match the transmitted symbol, and implicitly places the remaining, non-responsive undesired tags 102 into mute state 1212 shown in FIG. 12A. This may continue until no more responses are evoked from tags 102, or a predetermined number of bits have been traversed, or until reader network 104 has otherwise determined it has finished traversing tags 102. Embodiments for general read interrogations are described in greater detail below with reference to FIGS. 15A–B. Note that aspects of the algorithms shown in FIGS. 15A and 15B may be combined.

Figure 14A:
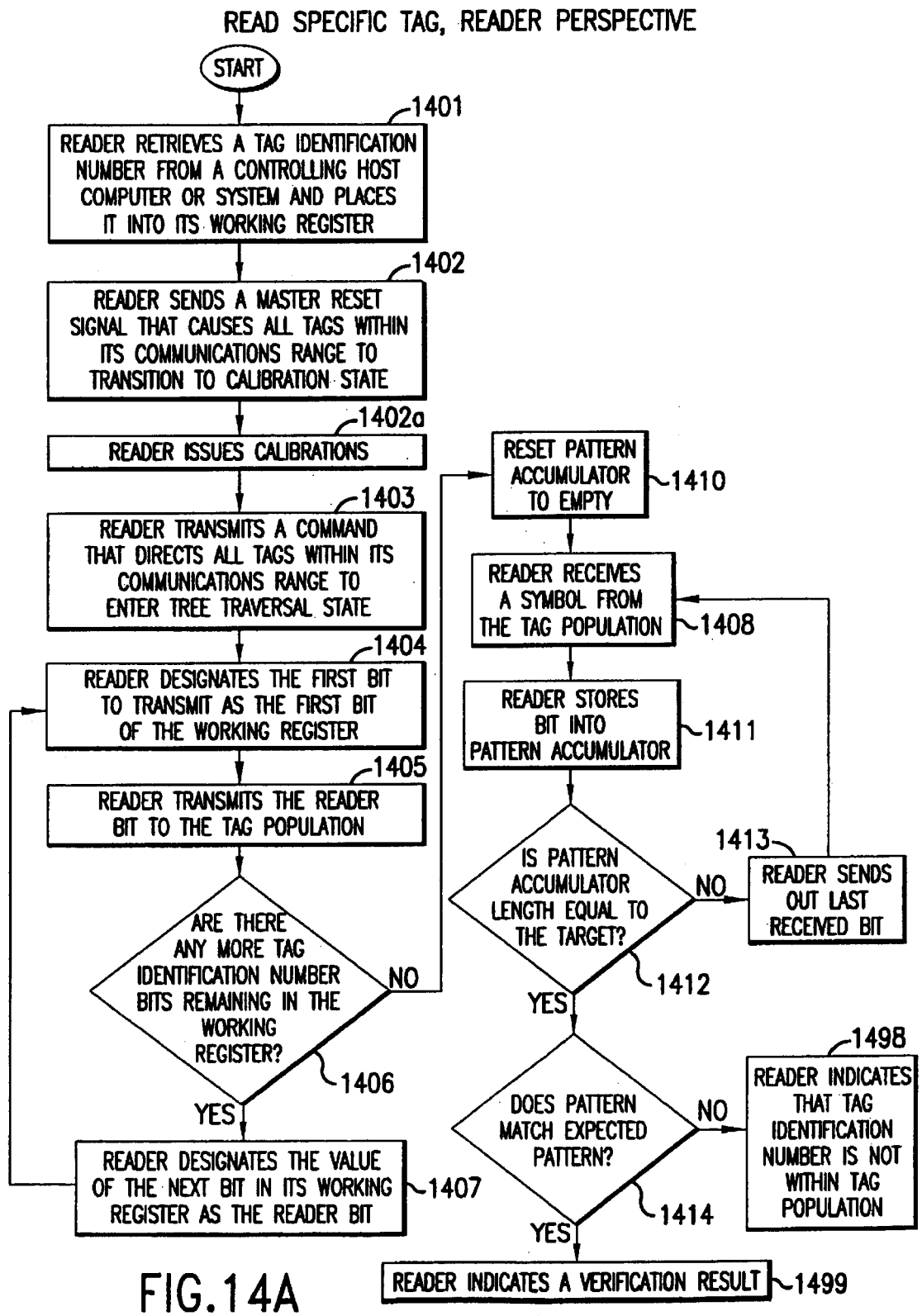

Another interrogation technique verifies that a particular tag 102 exists within its communications range. This technique is referred to herein as a specific read interrogation. During a specific read interrogation, reader network traverses though the tag population using a particular bit pattern. For example, the particular bit pattern matches the identification number of a particular tag 102. A preferred embodiment for a specific read interrogation technique is described in greater detail below with reference to FIG. 14A. FIG. 14B illustrates an alternative embodiment for the specific read interrogation technique.

Note that aspects of the algorithms shown in FIGS. 14A and 14B may be combined. For example, steps 1408, 1409, 1498 of FIG. 14B may be implemented into FIG. 14A. These steps would validate proper signals from the tag population on each bit, such that the algorithm of FIG. 14A would immediately exit when an expected symbol from the target tag is not received. This combined algorithm facilitates a faster exit from the algorithm when the target tag is not present.

Note that the general read and specific read interrogation techniques are similar. As described herein, reader network 104 determines which bit values (i.e., "0" or "1") it chooses to acknowledge. Thus, for the general and specific read interrogation techniques, reader network 104 controls which of tags 102 remain in tree traversal state 1208, and which tags 102 implicitly move to dormant state 1202.

Reader network 104 may also employ an interrogation technique that is a hybrid of the specific read and general read interrogation techniques. The hybrid technique is referred to herein as a group read interrogation. Group read interrogations enable reader network 104 to identify a predetermined subset of tags 102 within a tag population, if the predetermined subset exists.

When conducting a group read interrogation, reader network 104 initially performs a specific read operation. However, the specific read operation is conducted only for a partial predetermined sequence of tag identification bits. If one or more tags 102 respond to the partial predefined sequence, then reader network 104 continues the group read interrogation by performing a general read interrogation on the remaining tag identification bits. In this fashion, reader network 104 addresses only a particular subset of tags 102. This is accomplished by selectively ignoring the responses of the rest of the population of tags 120. This is different than specifically addressing and disabling particular subsets of the population of tags 120. The protocol implemented by tags 102 allows specific and non-specific tag addressing, without modification of tag 102, or modification of the manner in which the identification number is established or programmed into tag 102.

Further details on general read and specific read interrogations are provided in the sub-sections below for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

3.1.1 Specific Read Interrogation Protocol Embodiments

In a preferred embodiment, the approach that reader network 104 uses to isolate and determine that a particular tag 102 exists is detailed in FIG. 14A. The process involves two stages. In the first stage, the full identification number of a particular chosen tag 102 is sent out. Because this identification number is unique, all other tags 102 that are within the communications range of reader network 104 are implicitly directed to enter into the mute state 1212. These tags 102 no longer communicate with reader network 104. In the second stage, a pattern is acquired from the chosen tag 102. Because the chosen tag 102 is the only one of the population of tags 120 that can be in tree traversal state 1208, if reader network 104 detects a valid pattern from a tag, the chosen tag 102 exists. Otherwise, if no valid pattern is detected, reader network 104 presumes that the chosen tag 102 does not exist within its communications range. Note that this embodiment has an advantage of greater noise immunity because a greater number of bits are acquired and verified from the tag.

The example steps shown in the flowchart of FIG. 14A will now be described in detail. The flowchart of FIG. 14A begins with step 1401. In step 1401, reader network 104 starts its processing by receiving a tag identification number from a host system. Reader network 104 is directed to validate the identification number.

In step 1402, reader network 104 activates all tags 102 within its communications range with a master rest signal.

In step 1402a, reader network 104 calibrates the tags 102.

In step 1403, reader network 104 issues a command to place tags 102 into tree traversal state 1208.

In steps 1404–1407, reader network 104 transmits each bit of the identification number received by the host system until all bits are transmitted. In a preferred embodiment, reader network 104 is not listening or paying attention to signals received from the tag population 102 during these steps. Reader network 104 merely insures that all but the intended tag 102 (if present) are implicitly transitioned into mute state 1212. This completes the first stage of the algorithm.

In step 1410, reader network 104 clears an accumulator buffer to receive a pattern of bits/symbols from tag 102.

In step 1408, a backscatter symbol is received from the population of tags 120 as a result of the last iteration of steps 1405 and 1406.

In steps 1411–1413, and passing back to step 1408, the accumulator receives a predetermined number of bits from the receiver section of reader network 104 that were received from tag 102. These bits are desirably a transmission of a pre-defined bit pattern from tag 102 that matches the desired identification number requested by the host system. The match is verified in the following steps:

In step 1414, after receiving the bits, reader network 104 compares the bits received from tag 102 and stored in the accumulator with the desired pre-defined bit pattern. If the bit patterns do not match, the presumption is false, and sought-after tag 102 is presumed not to exist within range. This pattern of bits that were received may actually have been noise or were noise affected. In either case, the desired tag was not verified in the current environment. Control then passes to step 1498. If the bit patterns do match, control passes to step 1499.

In step 1498, the host system is notified by reader network 104 that the desired tag was not verified. The process then ends.

In step 1499, the host system is notified by reader network 104 that the desired tag was verified. The assumption is that the bits received by reader network 104 in steps 1408 and 1411–1413 were from a valid tag with valid signals overriding any noise in the environment. This assumption has a chance of error, of course, and is determined statistically upon the randomness of noise. As such, the longer the bit pattern, the less chance that noise created this pattern. For example, a single-bit pattern may be considered to have a 1 in 2 chance of being generated by noise, which is not generally acceptable in industry. An 8-bit pattern may be considered to have a 1 in 256 (i.e., $2^8$) chance of being randomly generated by noise, and so on. Choosing patterns that do not have just 0's or just 1's, which can be the pattern generated by systematic noise, can eliminate systematic noise as a factor in the pattern.

In an alternative embodiment for the just described algorithm for verifying the existence of a particular tag, reader network 104 can receive information from the population of tags 120 at the same time it is transmitting the identification bits of the particular desired tag 102. FIG. 14B shows a flowchart providing example steps for this approach, according to an embodiment of the present invention. The flowchart of FIG. 14B is described as follows:

In step 1401, similarly to the just described algorithm, reader network 104 receives the identification number from a host system.

In steps 1402 and 1402a, similarly to the just described algorithm, the population of tags 120 are calibrated by sending reset and synchronization pulses in steps 1402, 1402a.

In step 1403, reader network 104 places tags 102 into tree traversal state 1208.

In step 1404, reader network 104 selects the first bit to be sent from the working register. Reader network 104 enters the process loop of steps 1405, 1408, 1049, 1406, and 1407. Each bit of the desired identification number is processed during each trip around the loop.

In step 1405, reader network 104 transmits the next bit in the identification number.

In step 1408, reader network 104 receives a backscatter symbol bit from the tag population.

In step 1409, unlike the process shown in FIG. 14A, it is determined whether the desired bit signal is received from the tag population during step 1408. If the bit signal is not received, operation proceeds to step 1498. Otherwise, reader network 104 prepares to process the next bit, and operation proceeds to step 1406.

In step 1498, a determination is made that the desired tag does not exist, and the determination is reported to the host system.

In step 1406, it is determined whether there are any more tag identification number bits in the working register. If there are no more bits, operation proceeds to step 1499. If there are more bits, operation proceeds to step 1407.

In step 1499, it is presumed that the desired tag exists, and this presumption is reported to the host system.

In step 1407, reader network 104 designates the value of the next bit in its working register as the next bit of the desired identification number. Operation proceeds to step 1405.

The process shown in the flowchart of FIG. 14B does not require a bit pattern to be returned to reader network 104 by the desired tag 102. However, this process may be more affected by RF noise in the environment.

3.1.2 General Read Interrogation Protocol Embodiments

A difference between a specific read interrogation and a general read interrogation is that for specific read interrogations, reader network 104 responds to pre-selected "0"s' and "1"s'. In contrast, for general read interrogations, reader network 104 responds to received bits from tags 102 according to a particular preference for the received bit signals. The preference may be determined by a variety of different algorithms. In a preferred embodiment, reader network 104 has a preference for a stronger received signal. An example of this embodiment is illustrated in a flowchart in FIG. 15A. In an alternative, reader network 104 has a preference based on a particular signal or bit value. An example of this embodiment is illustrated in a flowchart in FIG. 15B.

Figure 15A:
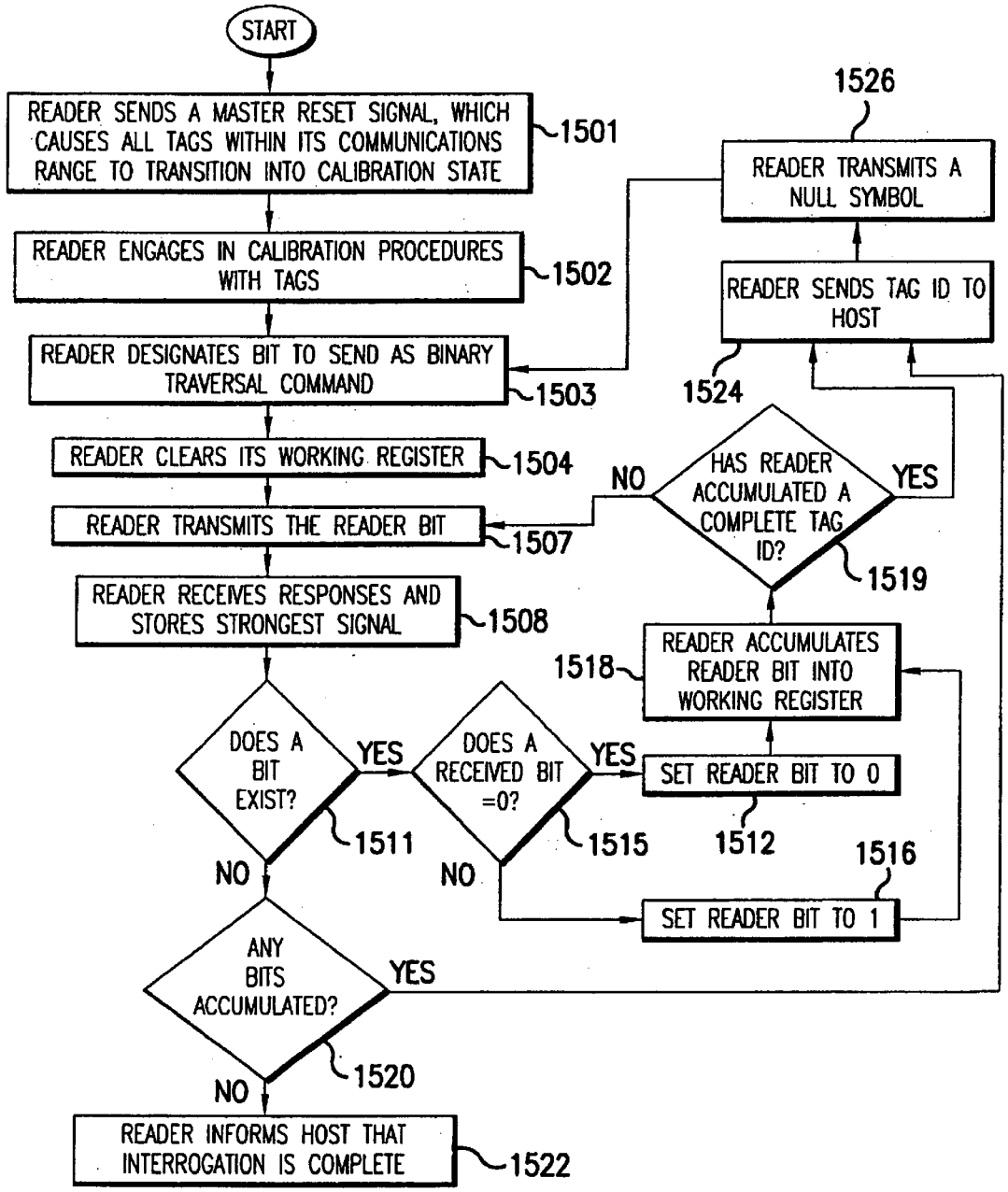
FIGS. 15A and 15B are flowcharts illustrating example general read interrogation operations from the perspective of a reader, according to embodiments of the present invention.

In a preferred embodiment for a general read interrogation, reader network 104 has a preference for the strongest (i.e., relatively higher amplitude) received signal, as illustrated in FIG. 15A. For example, during a general read interrogation, reader network 104 checks to determine whether received signals are strong enough (i.e., high enough amplitude) to consider as valid responses from a population of tags 120. Reader network 104 then checks to determine whether the strongest received signal represents a "0" or a "1" logical value. An advantage of this approach is that reader network 104 traverses the strongest received signals first, and causes tags 102 that transmit these strongest signals to transition into dormant state 1202 after reading their identification numbers. Hence, while reading the population of tags 120, the first of tags 102 that are read will be less affected by noise (i.e., due to their stronger transmitted signal strength), thus increasing the efficiency of reader network 104. As reader network 104 reads and eliminates the tags 102 transmitting stronger signals, and works its way towards tags 102 transmitting weaker signal, the effect of noise on the received signals may begin to increase. In a preferred embodiment, the noise can be detected using a cyclic redundancy check (CRC) code, which is a protocol common to data communications industries. Using the CRC code to detect noise as opposed to a valid tag response affords a reader network 104 the opportunity to force tags 102 that may currently be in tree traversal state 1208 to transition into mute state 1212. These tags may then be cycled back to command state 1206 by the use of a data "NULL" symbol 502, without disabling any of tags 102 that have not yet completely transmitted their entire identification number. Note that the protocol of the present invention allows a reader network 104 to receive a single symbol, e.g., the strongest, as in FIG. 15A, or all symbols simultaneously, as in FIG. 15B.

Figure 15B:
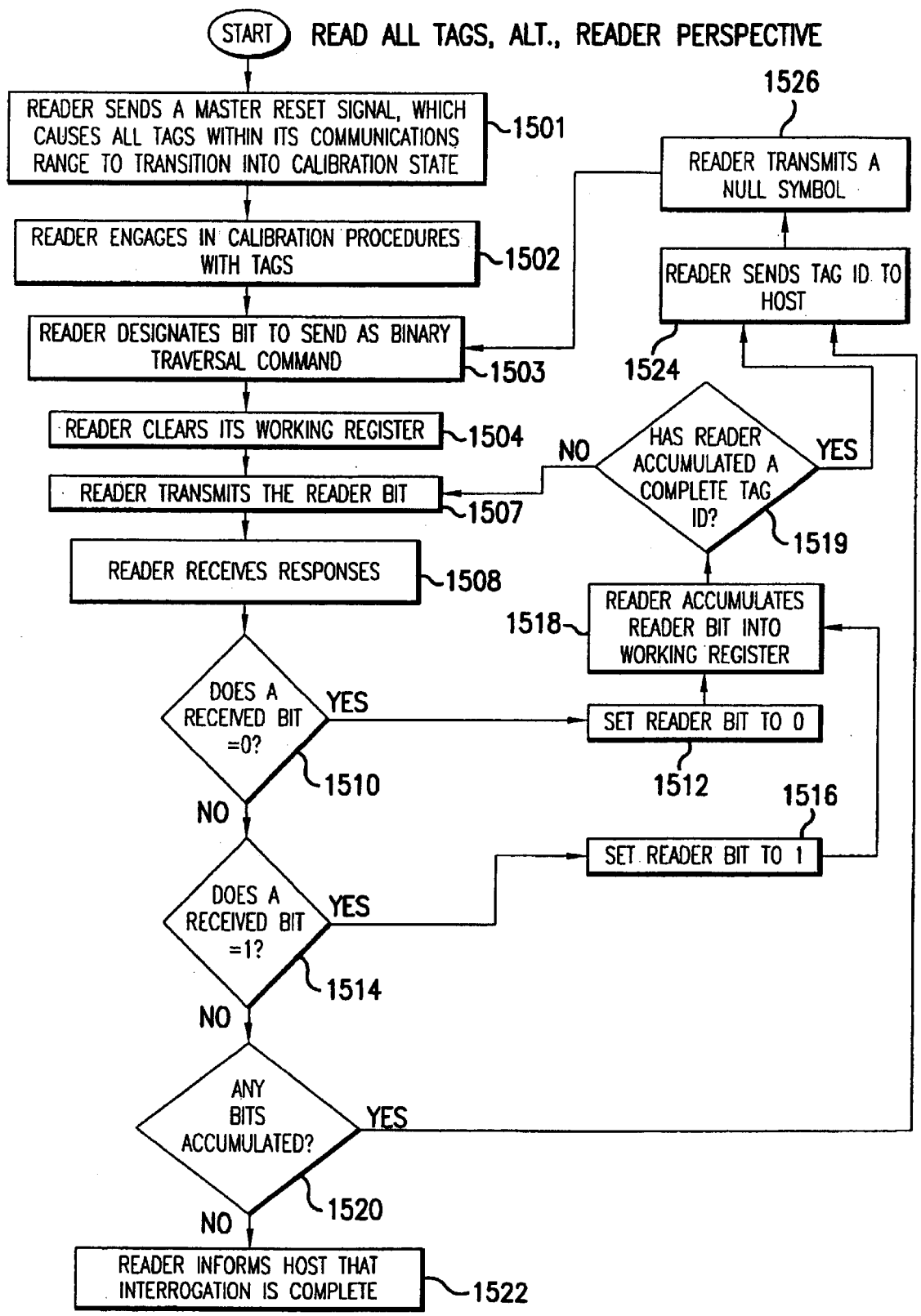

The embodiment shown in FIG. 15B is similar to that shown in FIG. 15A. However, there is a difference in which binary signal reader network 104 will prefer to receive from the population of tags 120. This preference leads to the response of reader network 104. For example, during a general read interrogation, reader network 104 may have a preference for "0." Thus, if reader network 104 receives a "0" from one or more tags 102, reader network 104 responds by transmitting a "0." This response causes tags 102 that have transmitted a "1" to reader network 104 to transition to mute state 1212. For example, this transition may occur when operation passes from step 1318 to step 1319, as shown in FIG. 13. Note that the protocol may alternatively be adapted to prefer a "1."

As described above, reader network 104 may use various termination techniques to interrupt an ongoing traversal. Upon such a termination, reader network 104 may immediately proceed to a subsequent traversal. For instance, reader network 104 may terminate a general read interrogation after one or more subsets of identification numbers are determined to exist in a population of tags 120.

For example, if each of a plurality of tags 102 in a tag population has an identification number having 130 bits, reader network 104 may perform a general read interrogation on only 10 of the 130 bits. In performing such an interrogation, reader network 104 may not determine exactly which unique tags 102 are in range. However, in performing such an interrogation, reader network 104 is capable of learning that one or more tags 102 exist in range. For instance, reader network 104 may gain knowledge (i.e., within a few bit reads) of the existence of a particular subset of tags 102. This may allow for useful applications, such as the identification of bits that identify special inventory items, including one or more express packages located within a large number (e.g., thousands or more) of standard delivery packages.

FIG. 15A is a flowchart illustrating an operational sequence of a preferred embodiment of a general read interrogation from the perspective of reader network 104. Thus, FIG. 15A illustrates an algorithm that reader network 104 may use to implement a general read interrogation of all tags 102 of a tag population within its communication range. This algorithm demonstrates how reader network 104 can retrieve identification numbers from one or more tags 102 without prior knowledge of particular identification numbers within the tag population. Note that some steps shown in the flowchart of FIG. 15A do not necessarily have to occur in the order shown.

The flowchart of FIG. 15A begins with step 1501. In step 1501, reader network 104 transmits a master reset signal. The master reset signal causes tags 102 within range to transition to calibration state 1204, shown in FIG. 12A.

In step 1502, reader network 104 calibrates tags 102. For example, reader network 104 and tags 102 undergo oscillator and data calibration operations, as described elsewhere herein. After completing calibration, tags 102 transition to command state 1206.

In step 1503, reader network 104 designates the first bit of a binary traversal, a command bit, to send to tags 102. The bit directs tags 102 to transition into tree traversal state 1208.

In step 1504, reader network 104 clears its working register so that tag identification number bits may be stored therein as they are received from tags 102 during the present binary traversal. For example, one or more bits will be received from a particular tag 102 that is currently unknown.

In step 1507, reader network 104 sends the designated bit to the population of tags 120.

In step 1508, reader network 104 receives one or more backscatter symbol responses from the population of tags 120. For example, the responses transmitted by tags 102 may be transmitted in accordance with step 1310 shown in FIG. 13.

After receiving the responses from tags 102, reader network 104 determines which binary traversal path (e.g., a "0" or a "1") will be taken. To make this determination, reader network 104 has a preference for a particular signal. For instance, in the current example, reader network 104 has a preference for the strongest signal. Alternatively, as illustrated in FIG. 15B and described below, reader network 104 may have a preference for a particular bit value, such as a bit "0" or a bit "1."

In step 1511, reader network 104 checks for the existence of a valid signal in the responses received from the tag population during step 1508. In the current example, reader network 104 checks for the existence of a signal in a wide band, which may include the encoding of binary "0" and binary "1." If a valid signal exists, then operation proceeds from to step 1515. If a valid signal does not exist, operation proceeds to step 1520.

The condition where a valid signal does not exist in step 1511 may occur in a number of circumstances. For example, this condition occurs when there are no more tags 102 to read. Also, this condition may occur if a noisy transmission environment has taken reader network 104 through a series of bits that do not correspond to tag identification numbers of any tags 102. The condition may additionally occur if all tags 102 within the tag population have been successfully and fully read. In this case, each tag 102 within the tag population transitioned to dormant state 1202.

In step 1515, reader network 104 determines whether the value of the bit received according to the strongest received signal is a "0." If the received bit is a "0," operation proceeds to step 1512. If the received bit is not a "0," it is presumed to be a "1," and operation proceeds to step 1516. Note that although step 1515 as illustrated in FIG. 15A makes a decision based upon the presence or absence of a "0" bit, the decision may alternatively be based upon the presence or absence of a "1" bit, as both logic symbols are transmitted by the population of tags 120 without interference.

In step 1512, the reader bit is set to a "0," and operation proceeds to step 1518.

In step 1516, the reader bit is set to "1," and operation proceeds to step 1518.

In step 1518, reader network 104 accumulates the reader bit into its working register. During successive performances of step 1518, reader network 104 builds a current tag identification number bit stream in its working register.

In step 1520, reader network 104 determines whether there is information (i.e., bits) stored in its working register. If the working register does not contain any information, it is concluded that there are no more tags 102 within the tag population to read, and operation proceeds to step 1522. If reader network 104 determines that the working register contains information accumulated performance of the aforementioned steps, operation proceeds to step 1524.

In step 1522, reader network 104 informs the host system that the general read interrogation operation is complete. After performance of step 1522, operation may stop. However, reader network 104 may perform subsequent general read interrogations by returning to step 1501.

In step 1524, reader network 104 sends the accumulated information to the host system. During performance of step 1524, the host system may receive less than a full working register of information. This may occur in a noisy transmission environment. However, in the absence of such noise, the host should receive a fully requested identification number. However, either the host system or reader network 104 may check the number of bits sent to the host system to identify whether noise or other source a loss of one or more bits. In an embodiment, a partially full working register may not be transmitted the host system. In such an embodiment, step 1524 would be bypassed, and operation would proceed directly from step 1520 to step 1526.

The passage of operation from step 1520 to step 1524 may signify the transition of a tag 102 to mute state 1212. Such a transition may occur in an alternative algorithm after tag 102 has transmitted all of its bits. An example of such a transition is shown in the flowchart of FIG. 13, as the branch from step 1322 to step 1302.

In step 1526, reader network 104 transmits a "NULL" symbol 502. As shown in FIG. 12A, transmission of a "NULL" symbol 502 causes each tag 102 in mute state 1212 (i.e., not yet successfully read) to transition to command state 1206. Once in command state 1206, tags 102 are eligible for subsequent traversals. Performance of step 1526 causes a different result for any fully read tag(s) 102 that remained in tree traversal state 1208. As shown in FIG. 12A, receipt of the "NULL" symbol 502 causes any such tags 102 to enter dormant state 1202 (i.e., as also described with respect to the tag algorithm shown in FIG. 13, without executing optional step 1322). Thus, "NULL" symbol 502 issued by reader network 104 during step 1526 is an implicit command, a command that is interpreted differently depending upon the current state of each tag 102.

Accordingly, in a preferred embodiment, during general read interrogations, the responding tag population becomes smaller as tags 102 are successively read and identified. The fully read and identified tags 102 transition into dormant state 1202. This process continues until all responsive tags 102 in the tag population are identified and transition into dormant state 1202.

After each time that step 1526 is performed, operation proceeds to step 1503, where reader network 104 begins a next binary traversal by causing any tags 102 in command state 1206 to transition to tree traversal state 1208.

FIG. 15B illustrates flowchart providing a procedure for reader network 104 to determine which received signal type is preferred from the population of tags 120, according to an alternative embodiment of the present invention. The algorithm shown in FIG. 15B is similar to that of FIG. 15A, with the exception of steps 1508, 1510, and 1514.

In the example of FIG. 15B, the algorithm takes a preference for a binary symbol "0" from the population of tags 120. This is shown in FIG. 15B, where reader network 104 leaves step 1508 with one or more tag 102 backscatter symbol responses, as opposed to the algorithm shown in FIG. 15A, where reader network 104 leaves step 1508 with at most a single signal stored. Note that the algorithm alternatively may have a preference for a binary symbol "1."

In step 1510 of FIG. 15B, reader network 104 determines whether a binary symbol "0" was received in the responses of step 1508. If this symbol does exist, operation proceeds to step 1512. If a symbol "0" does not exist, operation proceeds to step 1514.

In step 1512, reader network 104 sets the reader bit to the "0" bit, and operation proceeds to step 1518.

In step 1514, the reader network 104 determines whether a symbol "1" was received in the responses of step 1508. If this symbol does exist, the reader network 104, operation proceeds to step 1516. However, if symbol "1" does not exist, operation proceeds to step 1520.

In step 1516, reader network 104 sets the reader bit to the "1" bit, and operation proceeds to step 1518.

For a description of the remaining steps, refer to the description above related to these steps in FIG. 15A. These example algorithms demonstrate many approaches to the control of reader network 104 over the population of tags. In fact, many different algorithms are applicable to reader network 104, that allow communication with a population of tags 120, and are compatible with algorithm described above in reference to FIG. 13. According to embodiments of the present invention, a variety of reader networks may be implemented that balance different degrees of costs and abilities to read tags 102 in a noisy environment, all while being compatible with the same tags 102 In other words, tags 102 do not require modification to be compatible with different embodiments of reader network 104, according to the present invention.

3.2 Traversal of an Exemplary Tag Population

Figure 16:
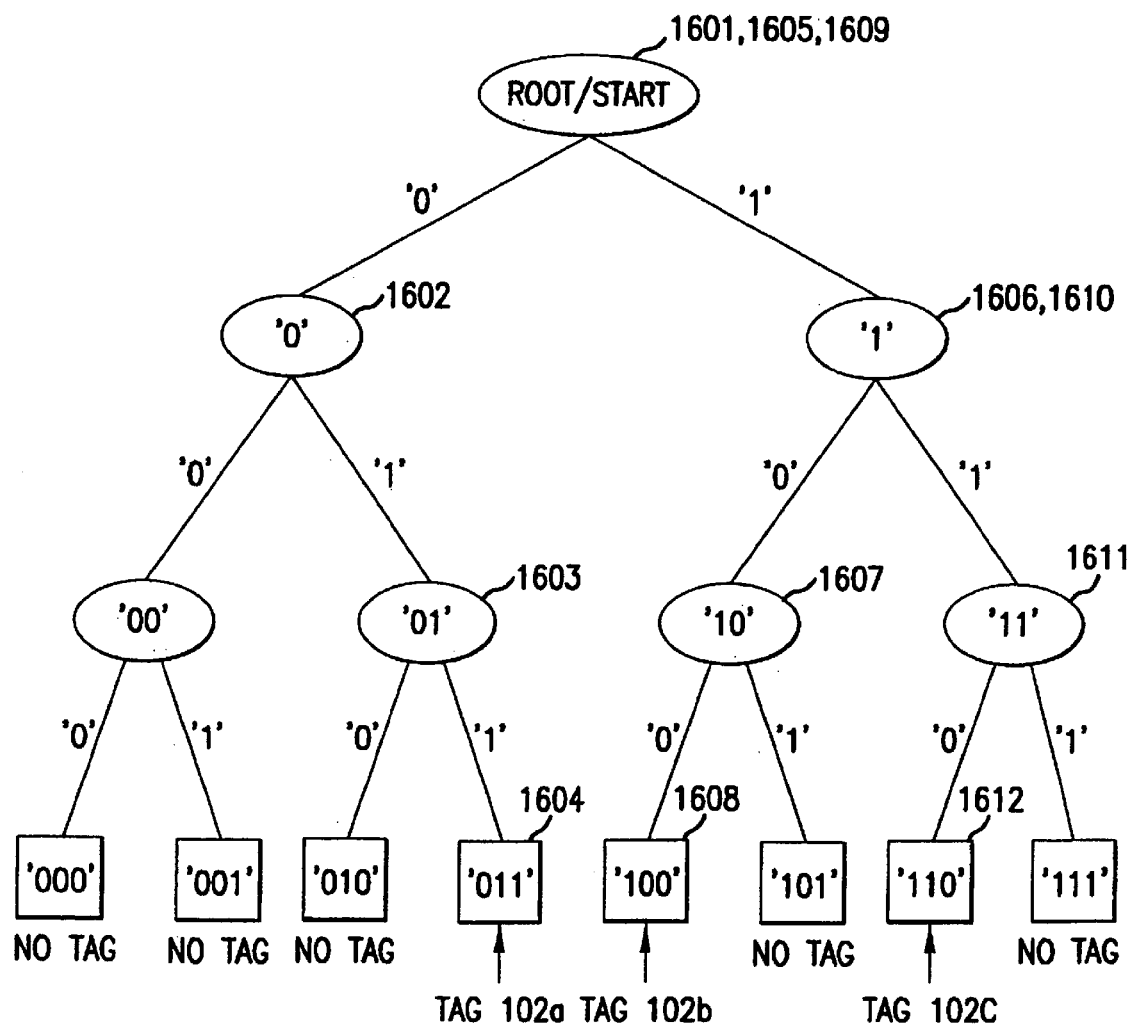
FIG. 16 illustrates a example tree diagram describing the binary traversal of a population of three tags, according to an embodiment of the present invention.

FIG. 16 is an illustration an exemplary population of tags 120, that includes a first, a second, and a third tag 102*a*, 102*b*, and 102*c*. FIG. 16 shows the traversal of tags 102*a–c* in a binary tree format. For exemplary purposes, each tag has a third bit long identification number. The binary tree shown in FIG. 16 has three levels, where each level corresponds to a bit in the three bit identification number. The first level of the binary tree, is the start level, which corresponds to steps 1401–1404 shown in FIG. 14A, and to steps 1501–1504 shown in FIG. 15A. The second level of the binary tree represents the first bit of the identification numbers of tags 102*a*, 102*b*, and 102*c* (reading from the left). The second level corresponds to steps 1405 and 1507 as shown in FIGS. 14 and 15, respectively.

In FIG. 16, the "0" branch of the binary tree descends towards the left, and the "1" branch descends towards the right. As described above with reference to FIG. 15A, reader network 104 may prefer a particular signal when performing a general read interrogation. For example, as shown in the flowchart of FIG. 15B, reader network 104 prefers "0" (i.e., descending towards the left in FIG. 16) on any combination of signals received. Each successive downward level in the binary tree diagram represents another bit read from tags 102. Each branch in the binary tree diagram represents a decision (i.e., a command) and a bit transmitted by reader network 104.

A first example shows how reader network 104 reads tag 102b through a specific read interrogation technique. For exemplary purposes, the bits are not inverted into a least significant bit (LSB) first format. Instead, for ease of illustration, the examples based on FIG. 16 flow from most significant bit (MSB) to LSB, as read from left to right. The operational sequence of FIG. 14B is followed. First, reader network 104 receives "100" from a host system, where the host system desires to confirm the existence of tag 102b. Reader network 104 performs steps 1401–1405 shown in FIG. 14A, and transmits bit "0" to tags 102, which is an instruction to enter tree traversal state 1208. In FIG. 16, these operations occur at point 1605.

At this point, tags 102a, 102b, and 102c are active, because these tags have reached step 1309 of FIG. 13. Tags 102a, 102b, and 102c then send their first bit, pursuant to step 1310. Accordingly, tag 102a transmits a "0" backscatter symbol 602 and tags 102b and 102c transmit "1" backscatter symbols 802.

Due to receiving the symbols from tags 102a–c, reader network 104 has received a plurality of signals (e.g., a "0" backscatter symbol and two "1" backscatter symbols). Operation proceeds through step 1409 (on the yes branch) as a bit "1" was received. Reader network 104 requires additional bits to be read, and thus operation proceeds through step 1406 to step 1407, which designates its target bit of "1" (i.e., the first bit of "100" received from the host) as the reader bit. Because, reader network 104 finds the target bit "1" in the received combination signal, this bit is transmitted to tags 102a–c, pursuant to step 1405. In FIG. 16, this is illustrated as a move down the logical "1" path from point 1605 to point 1606. Point 1606 represents storage of a bit "1."

Tags 102a–c receive the "1" symbol 402 transmitted by reader network 104. However, different responses occur among tags 102a–c. The bit "0" transmitted by tag 102a does not match the bit sent from reader network 104. Accordingly tag 102a transitions to mute state 1212, as shown as the path from 1318 to step 1319 in FIG. 13. Tag 102a now effectively awaits a data "NULL" signal, which would indicate a new binary traversal by reader network 104.

Since tags 102b and 102c each transmitted a "1" backscatter symbol that matched the bit transmitted by reader network 104, tags 102b and 102c load their next bit to be transmitted. Tag 102b loads a "0" bit, and tag 102c loads a "1" bit). Tags 102b and 102c transmit these bits as backscatter signals 702 and 902, respectively, to reader network 104 pursuant to steps 1316, 1318, 1324 and 1310. Reader network 104 loads the second bit of the tag identification number, "0," (step 1407), and receives a plurality of signals in step 1408 (i.e., the transmitted "0" and "1" backscatter symbols). In steps 1409 and 1406, reader network 104 determines that a "0" bit was received, and that there are additional bits to collect. Hence, operation of reader network 104 proceeds to step 1405, and transmits the "0" symbol 302. In FIG. 16, the transmission of the "0" symbol 302 by reader network 104 is illustrated as a move to point 1607. Hence, point 1607 represents receiving the bits of "10."

Tag 102c receives the "0" symbol 302 transmitted by reader network 104 (step 1312). However, tag 102c had last transmitted a "1" backscatter symbol (step 1310). Hence, because these bits do not match (step 1318), tag 102c transitions to mute state 1212 (step 1319), and therefore awaits the next binary traversal.

Tag 102b receives the "0" symbol 302, and because it had last transmitted a "0" backscatter symbol, the bits do match (step 1318). Operation proceeds to step 1310, where tag 102b transmits its next bit of "0" as backscatter symbol 602.

Reader network 104 loads the next target bit of "0" (step 1407), and receives the bit "0" transmitted by tag 102b (step 1408). These bits match, and operation therefore proceeds from step 1409 to step 1406. Reader network 104 determines that all 3 bits of the identification number are received, in step 1406. Reader network 104 may now report the match to the host system (step 1499). This result is illustrated in FIG. 16 as point 1608, where reader network 104 has stored "100." Thus, reader network 104 has successfully determined the existence of tag 102b.

In another example described as follows, reader network 104 reads all tags 102 in range, without prior knowledge of their existence. Thus, the example describes a general read interrogation. For this example, reader network 104 operates according to the flowchart shown in FIG. 15A, and tags 102 operate according to the flowchart shown in FIG. 13. Each pass of algorithm shown in FIG. 15A selects the strongest tag signal from the remaining members of the tag population. For this example, we will assume that tags 102a, 102b, and 102c are in the order of strongest to weakest transmitted signals.

The general read interrogation example begins with reader network 104 performing steps 1501–1504. In step 1507, reader network 104 selects a logical "0" bit as the reader bit and transmits this value to tags 102a–c. In FIG. 16, the steps are represented by point 1601.

Tags 102a, 102b and 102c receive this first transmitted reader bit from reader network 104, pursuant to step 1309. Pursuant to step 1310, each of tags 102a–c designates and sends their first identification number bit to reader network 104. Hence, reader network 104 receives a plurality of signals of a "0" backscatter symbol 602 (sent by tag 102a), and "1" backscatter symbols 802 (sent by tags 102b and 102c). In the exemplary flowchart of FIG. 15A, reader network 104 receives/selects the strongest signal in step 1508, which in the current example is from tag 102a. Because the received signal is a "0" backscatter symbol, reader network 104 stores the "0" bit value in its working register. Furthermore, reader network 104 transmits the "0" symbol 302, pursuant to steps 1511, 1515, 1512, 1518, 1519, and 1507.

Tags 102a, 102b and 102c receive the transmitted "0" symbol 302, pursuant to step 1312. However, in performing step 1318, tags 102b and 102c determine that this received bit does not match the bit they have most recently sent. Therefore, operation of tags 102b and 102c proceeds to step 1319, where they each transition to mute state 1212, and wait for the next binary traversal operation. In FIG. 16, these operations are represented by point 1602.

Unlike tags 102b and 102c, tag 102a determines (by performing step 1318) that the received "0" symbol 302 matches the prior bit transmitted by tag 102a. Therefore, pursuant to steps 1324 and 1310, tag 102a designates a next bit of its identification number (i.e., a "1") and sends this bit as a "1" backscatter symbol 802 to reader network 104.

Therefore, reader network 104 receives a single "1" backscatter symbol from the tag population (i.e., because tag 102b and 102c are in the non-transmitting mute state 1212). With reference to FIG. 15A, operation of reader network 104 proceeds from step 1511 upon the receipt of a valid signal, to step 1515. Because a "0" backscatter symbol was not received, operation of reader network 104 proceeds to step 1516, where the reader bit is set to the received "1" bit. Reader network 104 accumulates the reader bit in its working register (which now contains "01"), and transmits this bit "1" to tags 102a–c. In FIG. 16, these operations are represented by point 1603.

Tag 102a receives the transmitted "1" symbol 402, and by performing step 1318, determines that it matches the bit value most recently transmitted to reader network 104. Therefore, pursuant to steps 1324 and 1310, tag 102a designates the next bit of its identification number (i.e., a "1") and sends this designated bit as a "1" backscatter symbol 902 to reader network 104.

Reader network 104 receives the transmitted "1" backscatter symbol and performs step 1511, step 1515, and step 1516, where it determines that a "1" bit has been received. Reader network 104 accumulates this bit in its working register (which resultantly stores "011"). This is represented by point 1604 shown in FIG. 16. Hence, reader network 104 collected all bits of the identification number of tag 102a, and operation proceeds to step 1524. In step 1524, the identification number of tag 102a is sent to the host system.

As described above with reference to FIG. 13, tags 102 may perform alternative steps when bits are matched in step 1318. In one such alternative embodiment, tags 102 perform an optional step 1322. If tag 102a executes step 1322, it will determine that all of its identification number bits have been transmitted to reader network 104. Accordingly, operation of tag 102a proceeds to step 1302, where tag 102a transitions to dormant state 1202. As a result, none of tags 102a–c is operating in tree traversal state 1208. Therefore, reader network 104 receives no response from tags 102a–c. As a result, operation of reader network 104 proceeds to step 1520 where a determination is made that the working register of reader network 104 is not empty, because it has accumulated the identification number "011." In step 1524, reader network 104 sends this identification number to the host system.

If tag 102a does not perform optional step 1322, operation of tag 102a proceeds from step 1318 to step 1324, where a next bit of its identification number is designated for transmission. Because tag 102a has transmitted all of its identification number bits, it may designate an arbitrary bit. For instance, an arbitrary bit may be selected according to register rotation techniques employed by tag 102a during the performance of step 1324.

At this point, reader network 104 has completed the first binary traversal of the general read interrogation. Reader network 104 performs step 1526 by transmitting a "NULL" symbol 502. This "NULL" symbol 502 causes all tags that are in mute state 1212 to transition to command state 1206.

Pursuant to reader network 104 having transmitted the "NULL" symbol 502, the next binary traversal begins, represented by point 1605 in FIG. 16. Reader network 104, pursuant to steps 1503, 1504, and 1507, transmits a signal that causes tags 102b and 102c to transition from command state 1206 to tree traversal state 1208. Tag 102a, however, remains in dormant state 1202. Note that while reader network 104 performs step 1504, it clears its working register to allow accumulation of the next tag ID.

Tags 102b and 102c each send their first ID bit, which in this example is a "1" bit. Accordingly, reader network 104 receives a "1" backscatter symbol in step 1508, executes steps 1511 and 1515, and branches to step 1516. In step 1518, the "1" bit is accumulated into its working register. The "1" symbol 402 is transmitted by reader network 104 in step 1507. In FIG. 16, this interrogation process portion is illustrated as point 1606.

In response to the transmission of the "1" symbol 402, tags 102b and 102c each transmit their next identification number bit to reader network 104. Tag 102b transmits a "0" backscatter symbol 702 and tag 102c transmits a "1" backscatter symbol 902. As tag 102b's signal is stronger, reader network 104 executes steps 1508, 1511, 1515, 1512, and step 1518, where reader network 104 sets the reader bit to "0." In step 1507, reader network 104 transmits the "0" symbol 302 to tags 102a–c. This interrogation process portion is shown in FIG. 16 as point 1607.

After receipt of the "0" symbol 302, in step 1318, tag 102c determines that the received bit does not match the bit tag 102c previously transmitted. Thus, according to step 1319, tag 102c enters mute state 1212. However, tag 102b determines that the received "0" symbol 302 matches the bit tag 102b previously transmitted. Tag 102b executes steps 1318, 1324, and 1310, and transmits its last identification number bit (a "0" bit) as a "0" backscatter symbol 602 to reader network 104.

Reader network 104 receives the "0" backscatter symbol 602 from tag 102b and, in accordance with step 1518, accumulates the "0" bit into its working register. Thus, the working register stores the binary value of "100." Accordingly, in step 1519, reader network 104 determines that it has accumulated a complete tag identification number. Therefore, according to steps 1524 and 1526, reader network 104 transmits the stored identification number to the host system, and transmits a "NULL" symbol 502 to tags 102a, 102b, and 102c. The "NULL" symbol 502 transitions tag 102b to dormant state 1202 and tag 102c to command state 1206. Tag 102a remains in dormant state 1202.

Tag 102c is the final tag, and therefore is traversed next, in the same manner as the binary traversals that identified tags 102a and 102b. During this binary traversal, reader network 104 only receives and re-transmits bits transmitted by tag 102c, because tag 102c is the only tag in tree traversal state 1208. Accordingly, with reference to FIG. 16, reader network 104 will traverse through points 1609, 1610, 1611, and 1612. Upon reaching point 1612, reader network 104 (through performance of step 1519) determines that a complete tag identification number has been accumulated. In step 1524, reader network 104 transmits the identification number to the host system. Reader network 104 transmits a "NULL" symbol 502, which causes tag 102c to transition to dormant state 1202.

After transmitting the "NULL" symbol 502, reader network 104 performs steps 1503, 1504, 1507, and 1508. However, because tags 102a–102c are each in dormant state 1202, no responses are received in step 1508. Therefore, operation of reader network 104 passes through step 1511 to step 1520. In step 1520, reader network 104 determines that the accumulator is empty. Operation proceeds to step 1522, where reader network 104 informs the host system that the general read interrogation is complete.

Through the above-described example general read interrogation, reader network 104 determined the existence of three previously unknown tags, tags 102a–c, in an efficient manner. More particularly, reader network 104 performed only three binary traversals to collect the identification numbers of these tags.

As described above with reference to FIG. 15A, reader network 104 gathers identification number bits from a particular tag 102 until it determines (e.g., in step 1519) that it has accumulated a complete identification number. To support tag populations employing different size identification numbers, reader network 104 may adjust the number of received bits it requires to recognize a complete identification number.

In the example of binary traversal described above with reference to FIG. 16, reader network 104 collected identification number bits in decreasing order of significance. That is, the most significant bit (MSB) was retrieved first, and the least significant bit (LSB) was retrieved last. However, it is within the scope and spirit of the present invention to retrieve bits in any order of significance during a binary traversal. For example, bits may be retrieved in an increasing order of significance during a binary traversal. Retrieval of bits from one or more tags 102 in this order is useful for interrogating tag populations where one or more of the higher significant identification number bits are not used.

For example, consider a tag population where a seven-bit long identification number is used. In this population, there are three tags 102 having the following respective identification numbers: "0000011," "0000100," and "0000110." The four MSBs in each of these identification numbers is "0000." By determining this bit pattern characteristic of the identification number, reader network 104 may bypass retrieval of the four MSBs during a binary traversal, and use just the three LSBs to uniquely identify the tags 102. This bypass feature further streamlines interrogation operations. With reference to FIG. 15A, reader network 104 may implement this bypass feature in step 1519. For this exemplary tag population, reader network 104 may indicate in step 1519 that a complete identification number has been accumulated after the collection of just three out of the original seven bits.

To facilitate the bypass feature, many methods can be implemented. These include, but are not limited to: a single pre-scan by a reader network 104; multiple pre-scans by the reader network 104, and; an algorithmic approach based upon previous general read interrogations in particular circumstances calculated by the host system, where the host system provides instructions on how to perform the bypass operation to reader network 104. In a preferred embodiment of the bypass feature, reader network 104 causes a population of tags 120 to transition into superposition state 1210, and exchanges signals (i.e., performs a scan of) with the population of tags 120. During the exchange of signals, reader network 104 determines a range of identification numbers that exist in the population of tags 120. Accordingly, FIGS. 17A and 17B show flowcharts that illustrate this determination from the perspective of a particular tag 102 and a particular reader network 104, respectively.

3.3 Superposition Mode Communication Embodiments

Figure 17A:
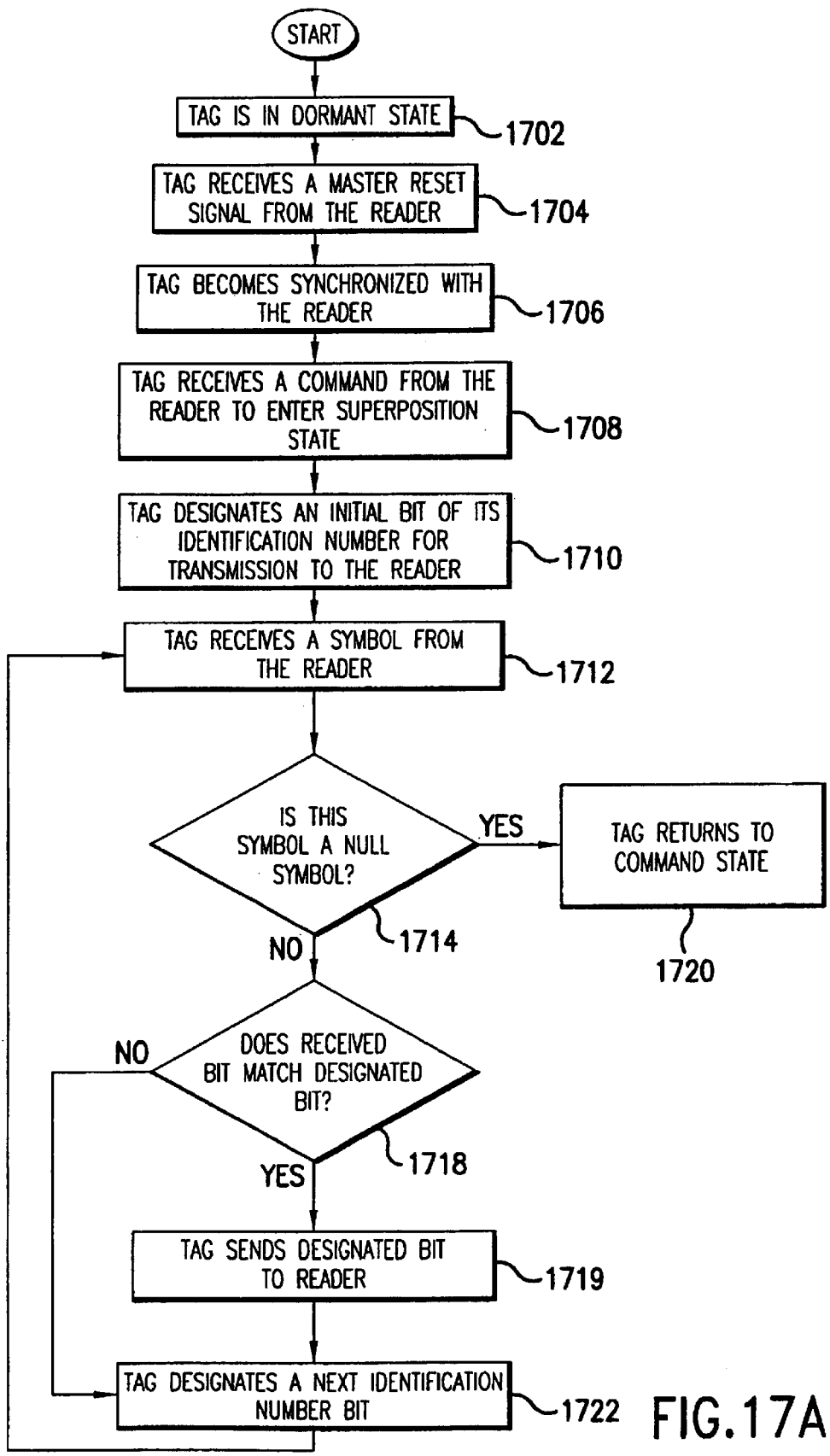
FIG. 17A is a flowchart that illustrates an operation of a superposition subset of the protocol from the perspective of a single tag, according to an embodiment of the present invention.
Figure 17B:
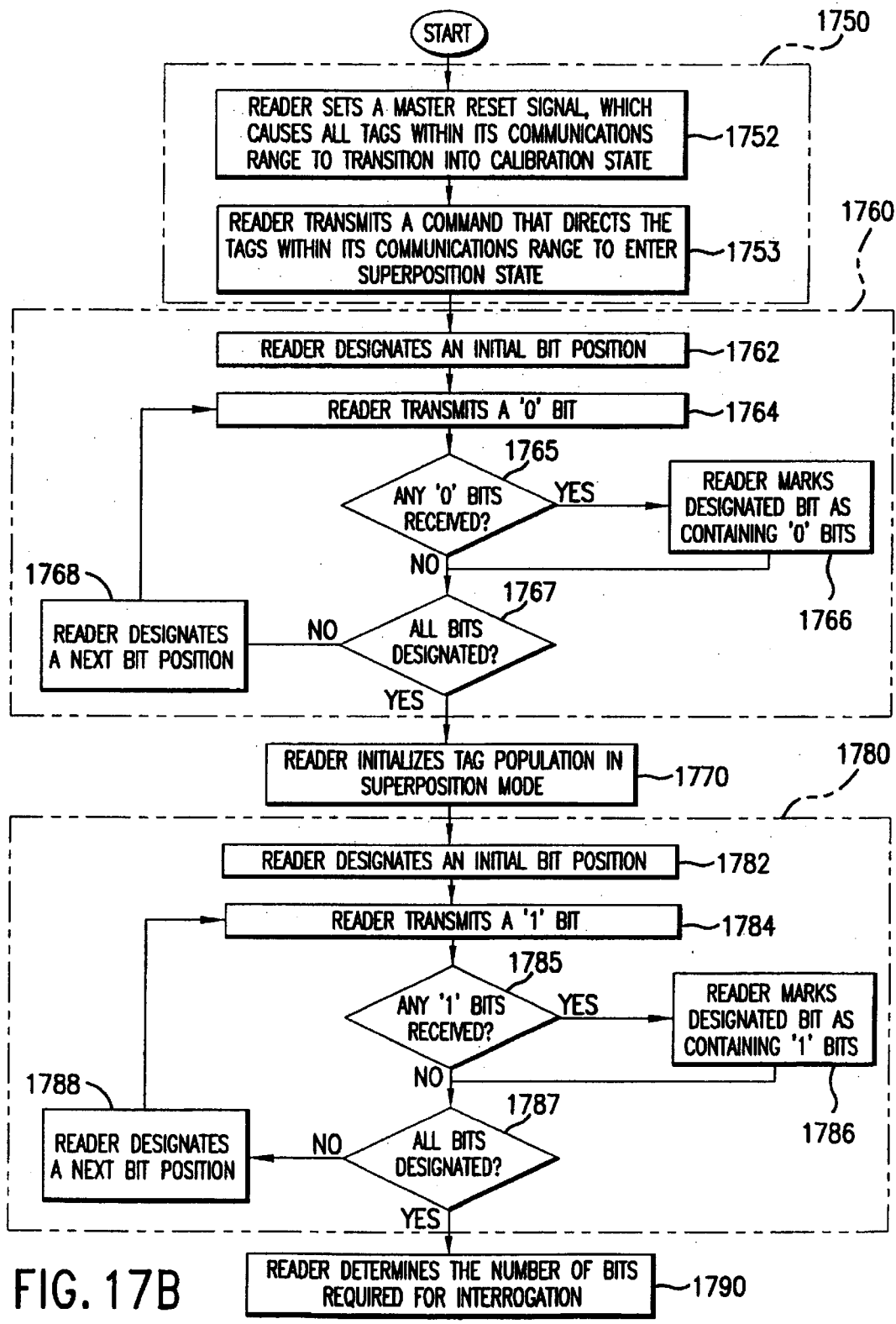
FIG. 17B is a flowchart that illustrates an operation of a superposition subset of the protocol from the perspective of a reader network, according to an embodiment of the present invention.

FIG. 17A shows a flowchart illustrating operation of a tag 102 in superposition state 1210. As shown in FIG. 17A, operation begins with step 1702. In step 1702, tag 102 is in dormant state 1202.

In step 1704, tag 102 receives a master reset signal from reader network 104. Upon receipt of this signal, tag 102 transitions from dormant state 1202 to calibration state 1204.

In step 1706, tag 102 is synchronized with reader network 104. Accordingly, oscillator calibration and data calibration procedures occur, that are further described below. After tag 102 becomes synchronized with reader network 104, it enters command state 1206.

In step 1708, tag 102 receives a command from reader network 104 that causes tag 102 to transition to superposition state 1210. As described above, the command may be a one or more bits, such as a single bit logical "1" symbol 402.

In step 1710, tag 102 designates an initial bit of its identification number for transmission as a backscatter symbol to reader network 104. This designated bit may be any bit of the identification number. For example, this designated bit may be either the MSB or the LSB of the identification number. This bit chosen assumes that each tag 102 in the tag population is encoded in the same manner, where tags 102 all implement MSB to LSB or all implement LSB to MSB. Operation of tag 102 proceeds to a loop that begins with step 1712.

In step 1712, tag 102 receives a symbol from reader network 104.

In step 1714, tag 102 determines whether the symbol received in step 1713 is a "NULL" bit. If the received symbol is a "NULL" bit, operation of tag 102 proceeds to step 1720. If the received symbol is not a "NULL" bit, operation of tag 102 proceeds to step 1718.

In step 1718, tag 102 determines whether the received bit matches the designated identification number bit. If the bits do not match, operation proceeds to step 1722. If the bits do match, operation proceeds to step 1719.

In step 1719, tag 102 sends the designated bit as a backscatter symbol to reader network 104. Operation proceeds to step 1722.

In step 1720, tag 102 transitions to command state 1206

In step 1722, tag 102 designates a next bit of its identification number for transmission to reader network 104. The next bit may be designated in any number of ways. For instance, if the initial bit designated in step 1710 is the LSB, then tag 102 may designate the identification number bit as the bit having the next highest significant bit position. Alternatively, if the initial bit designated bit in step 1710 is the MSB, then tag 102 may designate the identification number bit as the bit having the next lowest significant bit position. With reference to the exemplary tag architecture shown in FIG. 10, these features may be implemented in state machine 1024 through various register rotation techniques. After step 1722, operation of tag 102 proceeds to step 1712 for the next iteration of the loop. Tag 102 will exit the loop after receiving a "NULL" symbol 502 from reader network 104, and will transition to a command state 1206 via step 1720.

As described above, tag 102 eventually returns to command state 1206 in step 1720. From this step, tag 102 may enter tree traversal state 1208. Thus, operation of tag 102 may proceed from step 1720 to step 1308 in FIG. 13.

Thus, the flowchart of FIG. 17A shows that while in superposition state 1210, a population of tags 120 provide feedback to reader network 104 regarding the existence of identification number bits in the population. For example, by sending a stream of "0" symbols 302, reader network 104 can determine whether identification numbers containing a "0" bit at each particular transmitted bit position exist in the population of tags 120. In addition, reader network 104 can determine the position in the identification number of each of the these bits. This feature enables reader network 104 to determine an identification number range associated with a tag population. In essence, reader network 104 performs a logical bit wise "or" of the signals of the entire population of tags 120.

Accordingly, FIG. 17B shows a flowchart illustrating operation of a reader network 104 while information is being collected from a population of tags 120. Operation begins with step 1750. In step 1750, reader network 104 causes each tag in the population of tags 120 to transition into superposition mode 1210. As shown in FIG. 17B, step 1750 includes steps 1752 and 1753.

In step 1752, reader network 104 transmits a master reset signal, which causes all tags 102 in the population of tags 120 to transition to calibration state 1204. Reader network 104 engages in calibration procedure(s) with tags 102. These procedures may include oscillator and data calibration operations, as described herein.

In step 1753, reader network 104 transmits a command, such as a single bit, that causes each tag 102 in the population of tags 120 to enter superposition state 1210.

In step 1760, reader network 104 determines the position(s) of "0" bits in the identification numbers of the population of tags 120. FIG. 17B shows that step 1760 includes steps 1762–1768.

In step 1762, reader network 104 designates an initial bit position.

In step 1764, reader network 104 transmits a "0" symbol 302.

In step 1765, reader network 104 determines whether any "0" backscatter symbols were received in response from the population of tags 120. If one or more "0" backscatter symbols were received, operation proceeds to step 1766

In step 1766, reader network 104 marks the designated bit position as containing one or more "0" bits before returning control to step 1767.

In step 1767, reader network 104 determines whether it has designated all identification number bit positions. If all identification number bit positions have been designated, operation proceeds to step 1770. If all identification number bit positions have not been designated, operation proceeds to step 1768.

In step 1768, reader network 104 designates a next identification number bit. Operation proceeds to step 1764 to complete the processing loop.

In step 1770, reader network 104 ensures that the population of tags 120 is again initialized in superposition mode 1210, so that tags 102 will each designate their initial identification number bit. Thus, step 1770 may include the step where reader network 104 transmits a "NULL" signal to cause each tag 102 to transition to command state 1206, and transmits a command that transitions each tag 102 into superposition mode 1210. However, step 1770 is optional. For example, in embodiments where tags 102 perform circular register rotation techniques to designate and transmit identification number bits, each tag 102 may be designating its initial identification number bit upon completion step 1760.

In step 1780, reader network 104 determines the positions of "1" bits in the tag population's identification numbers, in a manner very similar to that described above for step 1760. As shown in FIG. 17B, step 1780 includes steps 1782–1788.

In step 1782, reader network 104 designates an initial bit position.

In step 1784, reader network 104 transmits a "1" symbol 402.

In step 1785, reader network 104 determines whether it received any "1" backscatter symbols in response to the "1" symbol 402 transmitted in step 1784. If a "1" backscatter symbol was received, operation proceeds to step 1786.

In step 1786, reader network 104 marks the designated bit position as containing one or more "1" bits, and operation proceeds to step 1787.

In step 1787, reader network 104 determines whether it has designated all identification number bit positions. If all identification number bit positions have been designated, operation proceeds to step 1790. If all identification number bit positions have not been designated, operation proceeds to step 1788.

In step 1788, reader network 104 designates a next identification number bit. After step 1788, operation proceeds to step 1784 to complete the processing loop.

In step 1790, reader network 104 determines the number of identification number bits required for interrogation. This step includes reader network 104 identifying the last read bit position (in the sequence of bit positions that reader network 104 receives tag identification number bits), where every identification number bit in the tag population collectively has multiple values, both "0" and "1."

For example, the determination step 1790 may include reader network 104 first collecting the LSB of an identification number, and proceeding to collect subsequent adjacent identification number bits in increasing order of significance. In an example, reader network 104 interrogates a population of tags 120 that have four 7-bit identification numbers: 0000100, 0000010, 0000111, and 0000101. In performing steps 1760 and 1780, reader network 104 determines that, for these four identification numbers, the four MSB positions include a single bit value of "0."

Therefore, reader network 104 identifies the third LSB position as the last bit position (in the sequence of bit positions that reader network 104 receives tag identification number bits) where every identification number bit in the population of tags collectively multiple values (i.e., "0" and "1" bit values). Accordingly, reader network 104 determines that only three bits need to be collected to uniquely identify tags 102 in this population. Reader network 104 stores the single signal values of the remaining 4 bits, hereby designated as the superposition mask. Thus, with reference to the flowchart shown in FIG. 15A, reader network 104 determines in step 1519 that a complete tag identification number is known after only three bits have been collected. Thus, reader network 104 can provide to the host system a complete tag ID in about 3/7 of the time required when the superposition function is not used.

A similar result occurs when reader network 104 interrogates a tag population having four 7-bit identification numbers: 1010100, 1010010, 1010111, and 1010101. In performing steps 1754 and 1758, reader network 104 determines that, for these identification numbers, the four most significant bit positions of the four identification numbers contain the same bit pattern of "1010." Accordingly, reader network 104 determines that only three bits must be collected to uniquely identify tags 102 in this population. Thus, as in the prior example, reader network 104 determines in step 1519 that a complete tag identification number is known after only the first three bits are collected.

As described above, reader network 104 may collect bits in any order. Accordingly, reader network 104 may also employ the techniques of FIG. 17B for any such order of bit collection. For example, reader network 104 may first collect an identification number's MSB and proceed to collect adjacent bits in decreasing order of significance. For each of these cases, reader network 104 may collect fewer than all of the interrogation bits when one or more of the LSBs are the same for the entire population of tags 120. According to the present invention, reader network 104 may collect bits in any sequence of "0" and "1" bits.

4. Timing Subsystem Embodiments of the Present Invention 4.1 Timing Subsystem Overview Structure and operation of timing subsystem 1023 shown in FIG. 10 is further described in this section. Timing subsystem 1023 provides system clocking and data timing functions for tag 102. As described below, timing subsystem 1023 provides a system clock for integrated circuit 1002. Timing subsystem 1023 also provides frequencies used by RF interface portion 1021 to generate backscatter modulated symbols. Timing subsystem 1023 also provides for oscillator calibration and for data calibration. These functions are further described below.

In the embodiment shown in FIG. 10, timing subsystem 1023 includes SAR 1022, state machine 1024, oscillator

1026, counter 1028, first divider 1036, and second divider 1038. Tag 102 of the present invention uses oscillator 1026 to serve as a system time reference for internal digital functions. Two additional frequencies are obtained from oscillator 1026 to be used for encoding data to be transmitted from tag 102, using first and second dividers 1036 and 1038. SAR 1022 is used during oscillator calibration. Counter 1028 is used for oscillator calibration, data calibration, and data timing. Example embodiments for oscillator 1026 are described in the next sub-section, followed by a description of a calibration procedure for oscillator 1026, and a description of a data calibration procedure.

4.2 Oscillator Configurations

The present invention requires an accurate oscillator signal to be used to control the operation of logic circuitry. The oscillator signal may also be used to produce two or more data frequencies for transmitted signals. For example, according to the present invention, a first frequency is used as a data frequency for transmitted "1" data bits. A second frequency is used as a data frequency for transmitted "0" data bits.

A benefit in having a relatively tight tolerance range for the source oscillator frequency is that it provides for relatively tight tolerances for the transmitted data frequencies from one tag 102 to another tag 102 in the population of tags 120. The frequency spectrum ranges for transmitted "1"s and "0"s from the population of tags 120 cannot overlap, or even be too close, or they may be confused for each other by a reader network 104. By increasing the accuracy of the source oscillator frequency, the respective frequency bands for transmitted "1"s and "0"s are narrower and therefore can be closer together without overlap. Furthermore, with narrower frequency bands, each frequency band can be closer to the carrier frequency without overlap. Hence, lower frequencies may be used, which can lead to less overall power consumption. Hence, the ability to calibrate the oscillator frequency such that it has a relatively tight tolerance range is desirable.

Crystal oscillators are very accurate, and may be used in some implementations for oscillator 1026. However, crystal oscillators are relatively large, expensive, and may not be practical for use in a small space. Preferably, oscillator 1026 is implemented as an oscillator circuit in a semiconductor technology such as CMOS. In this manner, oscillator 1026 may be incorporated "on chip" with other portions of the circuitry of the present invention, taking up relatively little area. Furthermore, CMOS is widely available and relatively inexpensive to manufacture. However, CMOS process variations can cause such an oscillator to have a frequency variation of +−50% from CMOS chip to CMOS chip.

Figure 18:
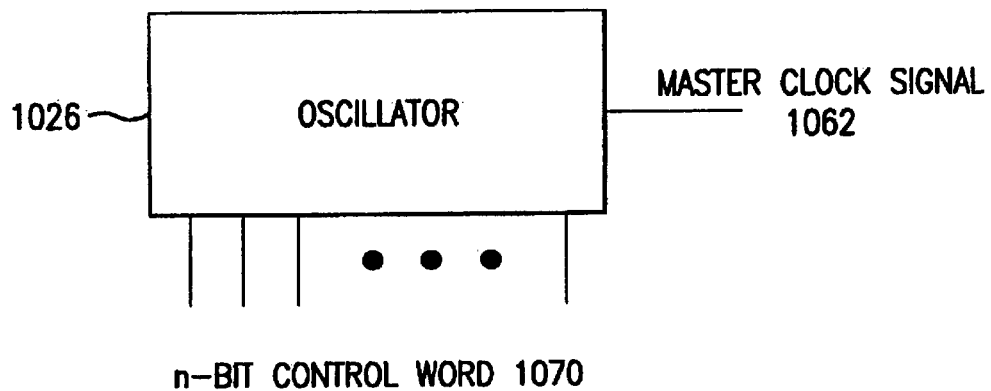
FIG. 18 illustrates a frequency selectable oscillator for use in a digital synchronous circuit driven by a master clock signal.

In a preferred embodiment, the oscillator of the present invention is a circuit implemented in CMOS. FIG. 18 shows an example adjustable oscillator 1026, according to an embodiment of the present invention. Oscillator 1026 receives a control word 1070 of a length of one or more bits, and outputs a master clock signal 1062. The frequency of master clock signal 1062 is determined by a base internal frequency of oscillator 1026, and by control word 1070. Adjustable oscillator 1026 outputs an oscillator frequency on master clock signal 1062 that is equal to the base internal frequency adjusted according to control word 1070. Hence, adjustable oscillator 1026 outputs an oscillator frequency on master clock signal 1062 that may be adjusted upward and/or downward according to control word 1070.

Figure 19:
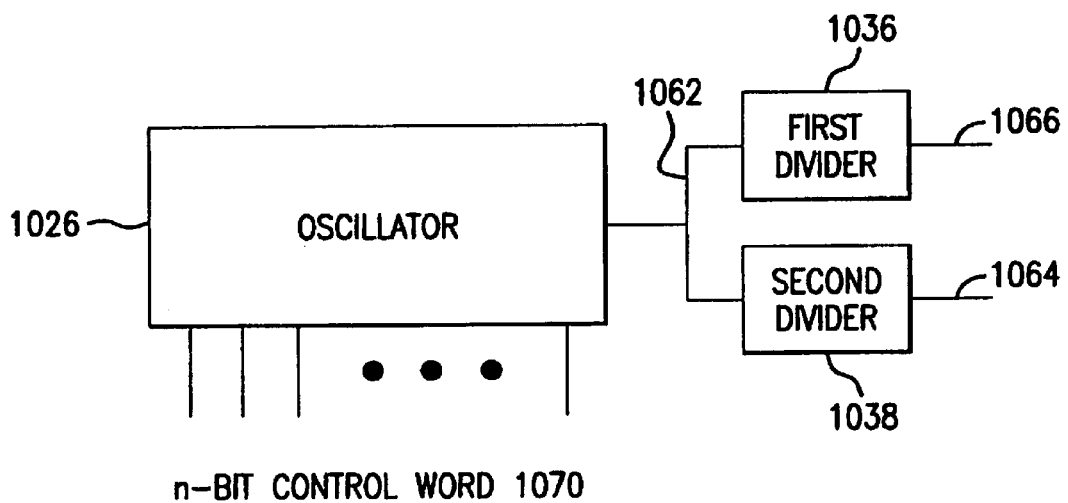
FIG. 19 shows an oscillator configuration that provides for multiple simultaneous oscillator frequencies, according to an embodiment of the present invention.

FIG. 19 shows an oscillator configuration that provides for multiple oscillator frequencies, according to an embodiment of the present invention. The oscillator configuration shown in FIG. 19 includes adjustable oscillator 1026, first divider 1036, and second divider 1038. First divider 1036 is a divide-by-three divider. Second divider 1038 is a divide-by-two divider. In an embodiment, adjustable oscillator 1026 outputs a frequency of 7.5 MHz on master clock signal 1062. First divider 1036 receives master clock signal 1062, and divides the frequency of master clock signal 1062 by 3. When master clock signal 1062 has a frequency of 7.5 MHz, first divider 1036 outputs a first clock signal 1066 having a frequency of 2.5 MHz. Second divider 1038 receives master clock signal 1062, and divides the frequency of master clock signal 1062 by 2. When master clock signal 1062 has a frequency of 7.5 MHz, second divider 1038 outputs a second clock signal 1064 having a frequency of 3.75 MHz. Hence, three frequencies are provided by the oscillator configuration of FIG. 19: 2.5 MHz, 3.75 MHz, and 7.5 MHz. The selection of these frequencies, according to a preferred embodiment, prevents harmonics from the 2.5 MHz band from intruding into the 3.75 MHz band, which could cause errors during symbol detection by reader network 104. Note that these frequency values are provided for purposes of illustration. The present invention is applicable to any suitable output frequency for oscillator 1026, and to alternative division values for first and second dividers 1036 and 1038.

Figure 20:
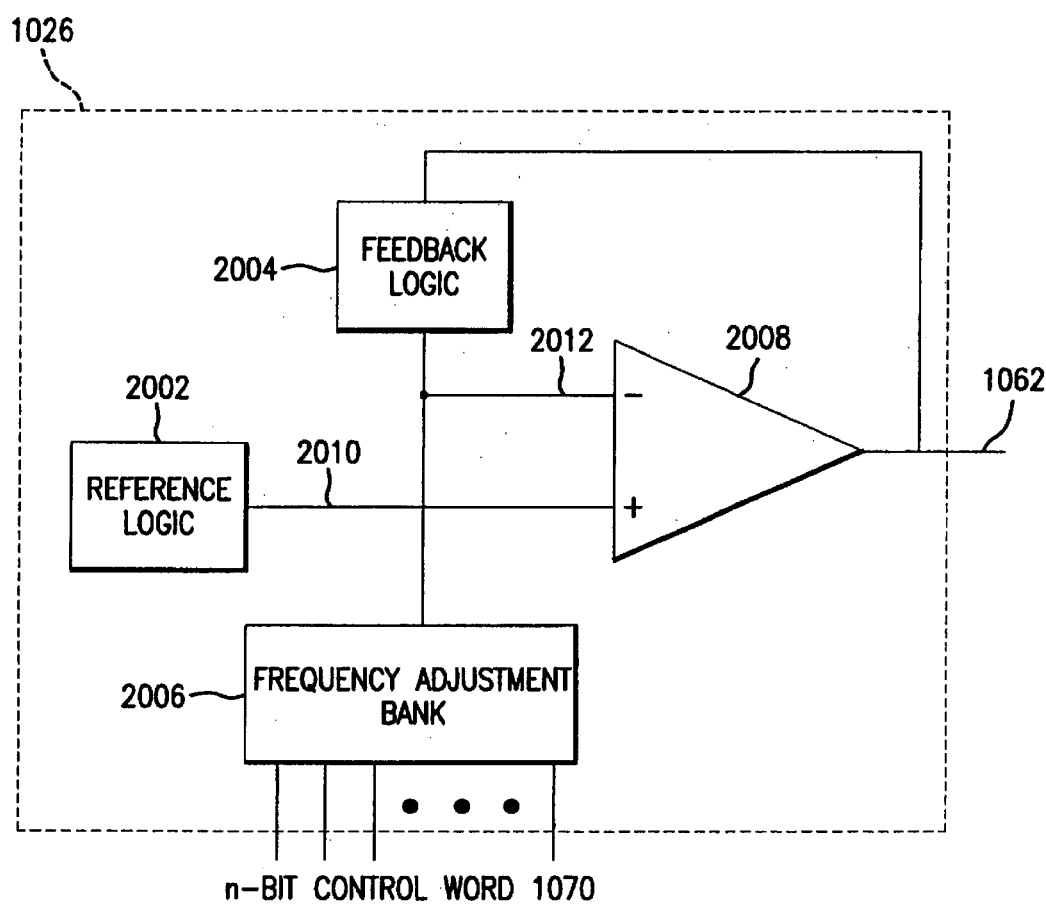
FIG. 20 illustrates an example block diagram of a frequency adjustable oscillator with tuning circuits, according to an embodiment of the present invention.

Adjustable oscillator 1026 may be implemented in any number of oscillator circuit configurations, including resistor-capacitor (RC) oscillator and ring oscillator configurations. RC oscillator, ring oscillator, and additional oscillator configurations that are adaptable to the present invention are well known to persons skilled in the relevant art(s). For illustrative purposes, an example RC oscillator is described at a high level as follows. In a RC oscillator circuit implementation, the oscillator frequency is determined by the values of one or more resistors and capacitors. The values of one or more of the resistors and/or capacitors may be altered to change the oscillator frequency. FIG. 20 illustrates an example block diagram of an RC oscillator implementation for adjustable oscillator 1026, according to an embodiment of the present invention. Adjustable oscillator 1026 includes a reference logic 2002, a feedback logic 2004, a frequency adjustment bank 2006, and a comparator 2008.

Comparator 2008 generates master clock signal 1062. Comparator 2008 compares the two signals at its inputs: a reference signal 2010 and a frequency adjustment signal 2012. If frequency adjustment signal 2012 is greater than reference signal 2010, comparator 2008 will output a logical low value for master clock signal 1062. If frequency adjustment signal 2012 is less than reference signal 2010, comparator 2008 will output a logical high value for master clock signal 1062.

Reference logic 2002 generates a relatively stable reference voltage that is output on reference signal 2010. Reference logic 2002 may include whatever passive or active elements are required to generate the reference, including transistors, resistors, capacitors, inductors, and amplifiers. The voltage value for the reference voltage is selected as required by the particular application.

Frequency adjustment bank 2006 includes a bank of one or more frequency adjustment elements that are switchable by corresponding bits of n-bit control word 1070. Frequency adjustment bank 2006 typically includes a base frequency adjustment element, used to determine a base frequency for adjustable oscillator 1026. The base frequency adjustment element may include one or more of capacitors and resistors used for at least a portion of the RC time constant for the base frequency of the RC oscillator implementation. Each additional element of the bank of frequency adjustment elements includes one or more resistors and/or capacitors that may be switched in parallel or series with the base frequency adjustment element to alter the base frequency. A switch controlled by a bit of n-bit control word 1070 may be used to switch in a particular frequency adjustment element. Frequency adjustment bank 2014 outputs a frequency adjustment signal 2012.

Feedback logic 2004 receives master clock signal 1062 and frequency adjustment signal 2012 from frequency adjustment bank 2006. Feedback logic 2004 includes one or more logical, active, and passive components to condition master clock signal 1062 as necessary. Feedback logic 2004 may include one or more capacitors that form a portion of the R-C time constant for the base frequency of the RC oscillator implementation. Feedback logic 2004 couples frequency adjustment signal 2012 to master clock signal 1062, so that frequency adjustment signal 2012 will ramp upwards and downwards depending on whether master clock signal 1062 is currently a high or a low logical level. Frequency adjustment signal 2012 will ramp upwards and downwards at a rate controlled by the current R-C time constant determined by frequency adjustment bank 2006 and feedback logic 2004.

When master clock signal 1062 is low, frequency adjustment signal 2012 will ramp downward until it ramps below the level of reference signal 2010. At this point, comparator 2008 will change its output to a high level. Frequency adjustment signal 2012 will then ramp upwards until is ramps above the level of reference signal 2010. When this happens, comparator 2008 will change its output to a low level, repeating the process. In this manner, master clock signal 1062 is an oscillating signal, and the frequency of the oscillation is controlled.

The oscillator embodiments provided above in this section are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

4.3 Oscillator Calibration

Variations in manufacturing and fabrication processes can cause variations in semiconductor characteristics that affect operation. Variations in semiconductor operation may occur due to variations in temperature, humidity, and other environmental factors, and due to manufacturing process variations, etc. For example, there may be variation between different semiconductor wafer lots, between different wafers within a particular lot, and in different areas of a single wafer. In CMOS, resistor and capacitor values may each have tolerances of ±25%, due to the above described variations. In an RC oscillator configuration, the combination of tolerance values can lead to an overall oscillator frequency tolerance range of ±50%. This is a relatively large tolerance range. Hence, it is desirable for adjustable oscillator 1026 to be able to be calibrated across an oscillator frequency tolerance range of ±50%.

According to a conventional calibration method, the oscillator frequency may be tested and adjusted once during the manufacturing process. However, such an adjustment accounts for process variations, not environmental variations. Therefore, because characteristics of the oscillator circuit may change over time due to environmental variations, the oscillator frequency may eventually drift outside an acceptable tolerance range. Hence, it would be beneficial to allow for calibration of the oscillator frequency at one or more times subsequent to manufacturing.

Figure 21A:
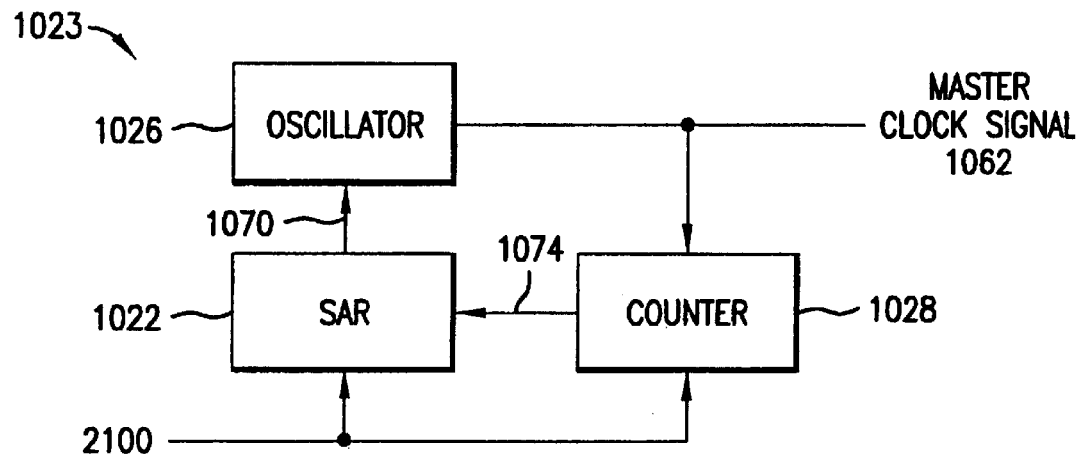
FIG. 21A shows an oscillator calibration circuit, according to an embodiment of the present invention.

The present invention allows for calibration of the oscillator frequency dynamically, during circuit operation, as often as is needed by the particular application. FIG. 21A shows a portion of timing subsystem 1023 of FIG. 10 used for oscillator calibration, according to an embodiment of the present invention. As shown in FIG. 21A, timing subsystem 1023 includes adjustable oscillator 1026, a successive approximation register (SAR) 1022, and a counter 1028. Timing subsystem 1023 allows for dynamic calibration of the oscillator frequency.

Timing subsystem 1023 is used to calibrate adjustable oscillator 1026 according to an input signal 2100. Input signal 2100 may be a signal that was received "off-chip" from an integrated circuit hosting timing subsystem 1023, in a wired or wireless fashion, or may also have been received "on chip." For example, input signal 2100 may be a data signal obtained from a signal received by tag 102. Input signal 2100 may be one or received signals 1050a and 1050b shown in FIG. 10, or a processed form of received signals 1050a and 1050b output by state machine 1024. In embodiments, timing subsystem 1023 calibrates adjustable oscillator 1026 such that for each cycle of input signal 2100, adjustable oscillator 1026 converges as close as possible to a predetermined frequency, measured by the number of cycles or pulses, that oscillator 1026 generates during a cycle of input signal 2100. For example, adjustable oscillator 1026 may ideally output a series of 255 pulses for every pulse received on input signal 2100. If more or less than 255 pulses are output by adjustable oscillator 1026 during a cycle of input signal 2100, the frequency of master clock signal 1062 is adjusted. In other words, timing subsystem 1023 calibrates oscillator 1026 to a frequency dictated by one or more signals transmitted by reader network 104, regardless of what the value of that frequency is.

Counter 1028 receives input signal 2100 and master clock signal 1062. Counter 1028 is a counter or timer that counts the number of cycles of master clock signal 1062 that occur during a cycle of input signal 2100. Counter 1028 outputs a count word 1074 equal to the number of cycles of master clock signal 1062 that occurred during a cycle of input signal 2100.

Successive approximation register (SAR) 1022 receives input signal 2100 and count word 1074. SAR 1022 monitors one or more bits of count word 1074. SAR 1022 alters control word 1070 if the monitored bit(s) indicates that too many or too few cycles of master clock signal 1062 occur during a cycle of input signal 2100. Each bit of control word 1070 may be adjusted according to a different reading of count word 1074. For example, SAR 1022 may successively adjust the bits of control word 1070, from highest order bit to lowest order bit, or vice versa, to adjust control word 1070 to an increasingly finer degree. State machine 1024 may aid in the operation of SAR 1022. As shown in FIG. 10, state machine 1024 may be coupled between counter 1028 and SAR 1022. When coupled between counter 1028 and SAR 1022, state machine 1024 receives count word 1074 and outputs processed count word 1072, which is received by SAR 1022.

Adjustable oscillator 1026 receives the altered control word 1070 from SAR 1022, and adjusts the frequency output on master clock signal 1062 accordingly. In this manner, timing subsystem 1023 calibrates adjustable oscillator 1026. Two or more iterations that adjust count word 1074 and correspondingly adjust control word 1070 may be used to increasingly fine tune the frequency output by adjustable oscillator 1026. Further details regarding oscillator calibration are provided in the following subsections.

Figure 21B:
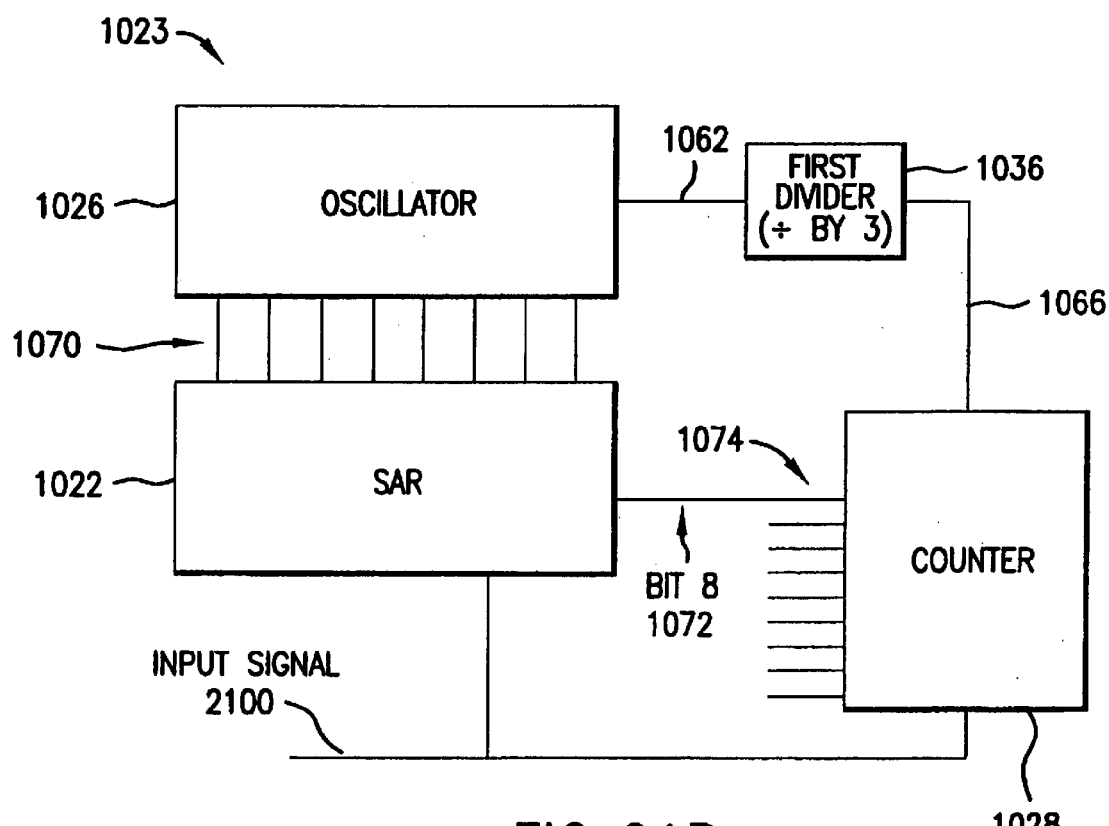
FIGS. 21B and 21C illustrate a more detailed block diagram of the calibration circuit of FIG. 21A, according to an embodiment of the present invention.

FIG. 21B illustrates a more detailed block diagram of timing subsystem 1023, according to an embodiment of the present invention. This embodiment is described in further detail as follows. In the description that follows, the base frequency for adjustable oscillator 1026 is 7.5 MHz.

Figure 23A:
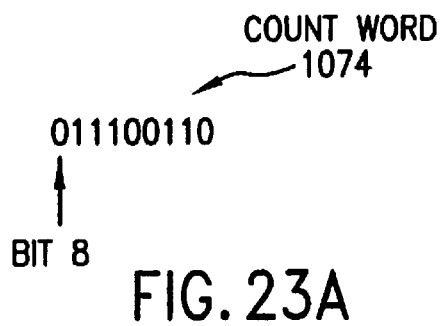
FIG. 23A shows an example value for a count word, according to an embodiment of the present invention.
Figure 23B:
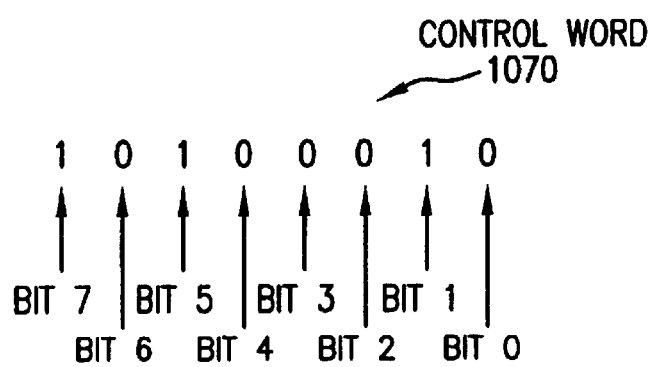
FIG. 23B shows an example value for a control word, according to an embodiment of the present invention.

As shown in FIG. 21B, adjustable oscillator 1026 receives control word 1070. Control word 1070 is shown as an 8 bit wide signal. FIG. 23B shows an example value for control word 1070. Each possible value for control word 1070 directs adjustable oscillator 1026 to output a corresponding frequency. For example, the minimum and maximum values for control word 1070 vary the output frequency of adjustable oscillator 1026 by +50% and −50%, respectively, from its base frequency. When control word 1070 is equal to 00000000, oscillator 1026 outputs its base frequency plus 50%, which is 11.25 MHz. When control word 1070 is equal to 11111111, oscillator 1026 outputs its base frequency, minus 50%, which is 3.75 MHz. Values for control word 1070 that are in between these cause oscillator 1026 to output corresponding frequencies in between 3.75 MHz and 11.25 MHz. For example, when control word 1070 is equal to 10000000 (i.e., a middle binary value), adjustable oscillator 1026 outputs its base oscillator frequency on master clock signal 1062 (i.e., 7.5 MHz).

First divider 1036 is optional. When present, first divider 1036 receives and divides master clock signal 1062, and outputs first clock signal 1066. In the embodiment shown in FIG. 21B, first divider 1036 is a divide-by-3 divider. Hence, when master clock signal 1062 is a frequency of 7.5 MHz, first clock signal 1066 outputs a frequency of 2.5 MHz.

Counter 1028 receives first clock signal 1066 and input signal 2100. First clock signal 1066 is used as the clock signal for the internal logic of counter 1028. Input signal 2100 is received by counter 1028. When a falling edge is received on input signal 2100, counter 1028 is cleared, such that a logical zero signal is output on count word 1074. After being cleared, counter 1028 may begin counting according to first clock signal 1066 from the zero initial state.

Figure 22A:
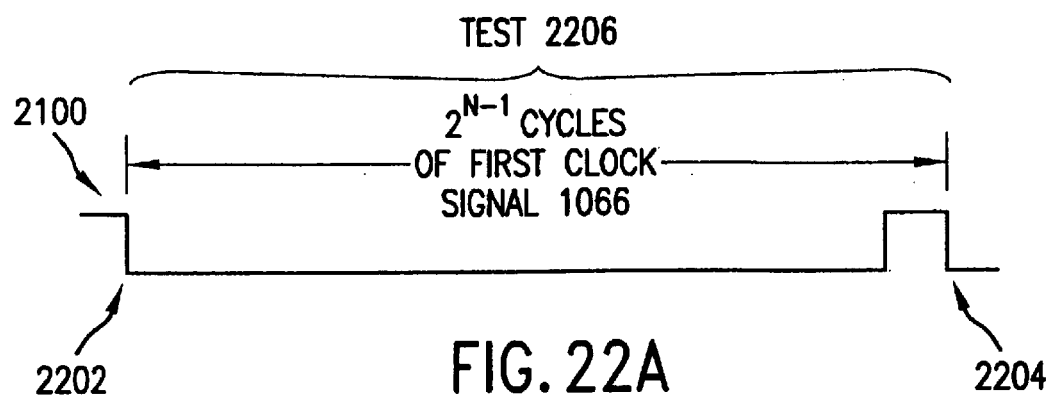
FIG. 22A shows an example waveform used for one of a series of calibration tests, according to an embodiment of the present invention.

FIG. 22A shows an example calibration waveform cycle for input signal 2100. At time 2202, input signal 2100 goes from a logical high level to a logical low level, which clears counter 1028. Hence, at time 2202, count word 1074 is forced to a logical zero state. After input signal 2100 transitions to a logical low at time 2202, counter 1028 counts from the zero state according to first clock signal 1066. When input signal 2100 transitions from a logical high level to logical low level at time 2204, count word 1074 is again cleared so that counter 1028 can again begin counting at zero.

Figure 22B:
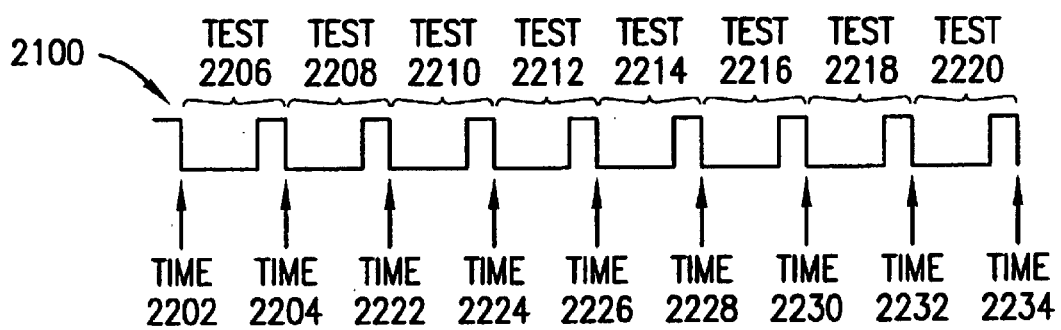
FIG. 22B shows an example series of test waveforms used for a full calibration, according to an embodiment of the present invention.

As shown in FIG. 22A, the time period between time 2202 and time 2204 is referred to as a calibration signal or test 2206. One or more of tests such as test 2206 are used to calibrate adjustable oscillator 1026, according to the present invention. Counter 1028 counts from zero starting at time 2202 until time 2204. At time 2204, SAR 1022 uses the count value in count word 1074 to adjust the output frequency of adjustable oscillator 1026. After test 2206 is complete, another test may occur to further adjust the output frequency of adjustable oscillator 1026. As many tests as are required may be used to adjust the output frequency of adjustable oscillator 1026 until it is within an acceptable tolerance range. For example, as shown in FIG. 22B, a series of eight calibration signals or tests may be used: first test 2206, a second test 2208, a third test 2210, a fourth test 2212, a fifth test 2214, a sixth test 2216, and a seventh test 2218. Each test may successively adjust the frequency of adjustable oscillator 1026 to a finer degree. For example, a first test 2206 may adjust the frequency of adjustable oscillator 1026 by 50% of the adjustable amount in one direction. The subsequent tests may adjust the frequency of adjustable oscillator 1026 by 25%, 12.5%, 6.25%, 3.125%, 1.563 %, 0.781%, and 0.391%.

In an embodiment, the duration of test 2206, which the is time period between falling edges on input signal 2100 at times 2202 and 2204, is ideally equal to $2^{j-1}-1$ cycles of first clock signal 1066, where j is the number of stages in counter 1028. In an embodiment, j is equal to 9, and hence the time period for test 2206 is:

$$(2^{j-1}-1) \times 1/f_{c1} = (2^8-1) \times 1/(2.5 \text{ MHz}) = 255 \times 1/(2.5 \text{ MHz}) = 102 \ \mu S$$

where $f_{c1}$ is equal to the desired frequency of first clock signal 1066. Because the frequency of master clock signal 1062 may vary due to temperature and process variations, the number of cycles of first clock signal 1066 that occur during this time period may be greater or less than 255. Hence, master clock signal 1062 will need calibration.

Figure 24:
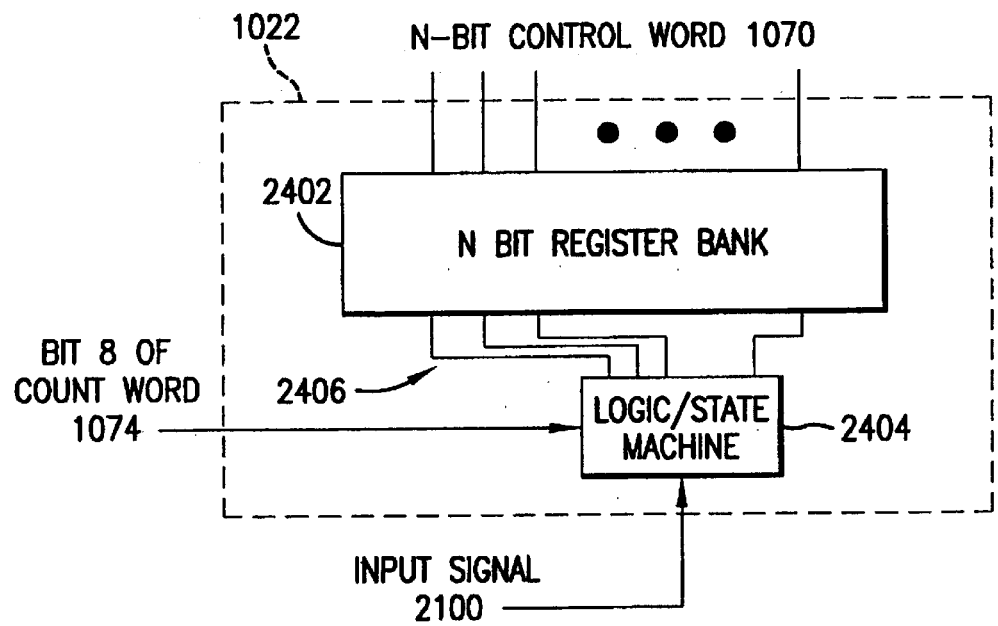
FIG. 24 shows a block diagram for an example successive approximation register, according to an embodiment of the present invention.

SAR 1022 receives one or more bits of count word 1074, and uses the received bit(s) to modify control word 1070. FIG. 24 shows a block diagram for an example SAR 1022, according to an embodiment of the present invention. SAR 1022 includes an n-bit register bank 2402 and a state machine 2404. The n-bit register bank 2402 stores control word 1070. In an embodiment, state machine 2404 initializes and sets or resets registers in n-bit register bank 2402 according to bit 8 of count word 1074 and input signal 2100. In alternative embodiments, one or more other bits of count word 1074 can be used by SAR 1022 in addition to, or instead of bit 8. In an alternative embodiment, state machine 2404 is a portion of state machine 1024.

Depending on the state of one or more bits of count word 1074, state machine 2404 adjusts one or more bits of control word 1070. As shown in FIG. 24, state machine 2404 receives bit 8 of count word 1074. Bit 8 of count word 1074 is an overflow bit. If bit 8 is equal to a one, this means that counter 1028 counted too fast, and therefore counted too high during the last cycle of input signal 2100. Hence, first clock signal 1066 would need to be slowed down. If bit 8 is equal to a zero, this means that counter 1028 either counted at the correct rate, or counted too slow, during the last cycle of input signal 2100. Hence, first clock signal 1066 would need to maintain the same rate, or increase the rate. State machine 2404 uses bit 8 and input signal 2100 to generate set/reset signals 2406 to n-bit register 2402. In an embodiment, state machine 2404 can set a bit of one of the registers of n-bit register 2402 to decrease the frequency of master clock signal 1062, or can reset a bit to increase the frequency. In alternative embodiments, multiple bits may be set or reset in n-bit register 2402 to increase or decrease the frequency of master clock signal 1062.

4.3.1 Embodiments for Configuring an RC Oscillator Calibration Circuit

Figure 21C:
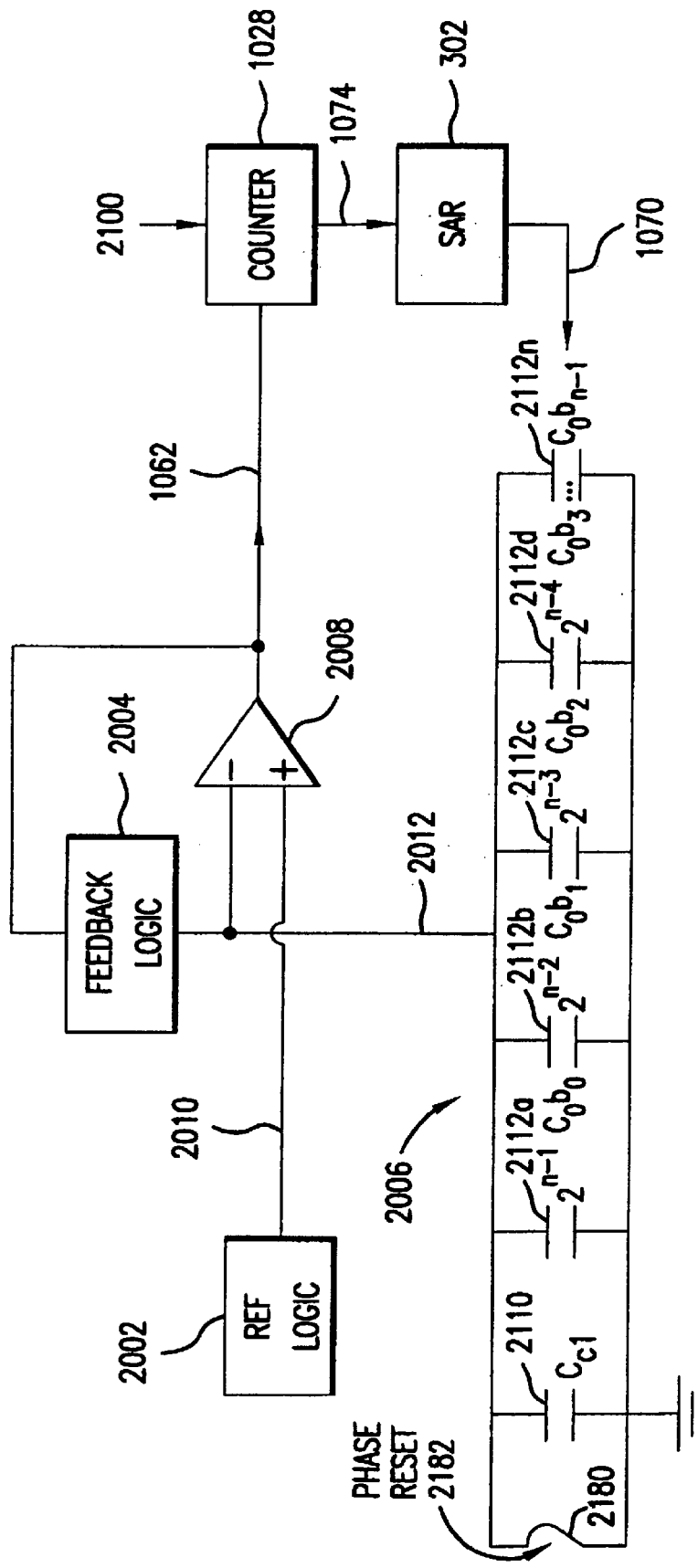

FIG. 21C illustrates a more detailed block diagram of timing subsystem 1023, according to an embodiment of the present invention. As shown in FIG. 21C, oscillator 1026 is implemented using an RC oscillator similar to the RC oscillator shown in FIG. 20. Furthermore, frequency adjustment bank 2006 is shown in more detail, according to an example embodiment of the present invention. As shown in FIG. 21C, frequency adjustment bank 2006 includes a first capacitor 2110, and n switchable capacitors 2112*a–n*, where all of the capacitors are coupled in parallel. Note that the present invention is applicable to alternative elements in frequency adjustment bank 2006.

FIG. 21C also shows a switch 2180 that receives a reset signal 2182, according to an embodiment of the present invention. When present, switch 2180 may be used to reset oscillator 1026 when desired, to control/synchronize the phase of master clock signal 1062. For instance, the phase of master clock signal 1062 in a particular tag 102 may be synchronized with the phase of a master clock signal located in a nearby tag 102. Reset signal 2180 may be derived from a signal received by tag 102 from reader network 104. When reset signal 2180 turns off switch 2180, capacitors 2110 and 2112a–n in frequency adjustment bank 2006 are shorted to ground. When reset signal 2180 subsequently turns on switch 2180, operation of oscillator 1026 begins, and master clock signal 1062 is initialized—i.e., capacitors 2110 and 2112a–n begin charging from a ground potential. Hence, a signal from reader network 104 may be used to simultaneously initialize a master clock signal in one or more tags 102 within communication range. In embodiments, the signal used to generate reset signal 2180 may be a calibration pulse or data symbol transmitted by reader network 104, for example.

Figure 21D:
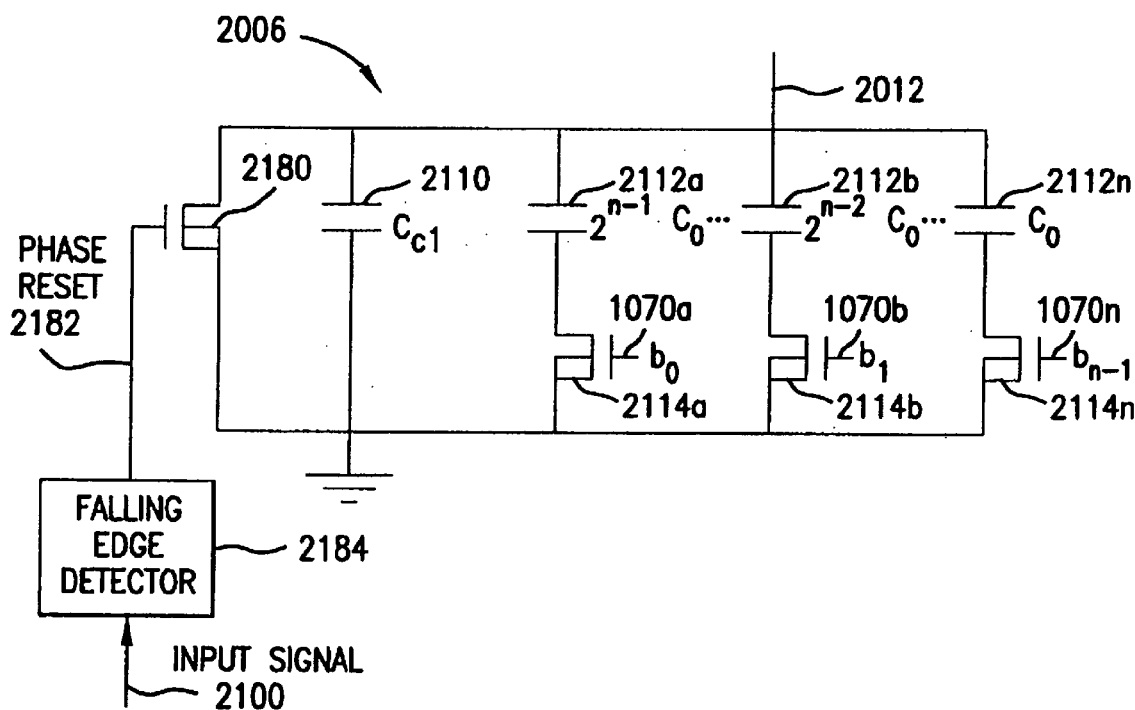
FIG. 21D illustrates a more detailed of a frequency adjustment bank, according to an embodiment of the present invention.

FIG. 21D shows additional detail for an example embodiment of frequency adjustment bank 2006. As shown in FIG. 21D, a MOSFET switch is coupled in series with each of the n switchable capacitors shown in FIG. 21C. For example, first switch 2114a is coupled in series with first switchable capacitor 2112a, second switch 2114b is coupled in series with second switchable capacitor 2112b, and an nth switch 2114n is coupled in series with nth switchable capacitor 2112n. Each switch is controlled by a corresponding bit of control word 1070. The corresponding bit of control word 1070 turns a switch on or off, to respectively switch in or out the corresponding switchable capacitor in parallel with the remaining capacitors. This creates a controlled capacitance for the RC oscillator of oscillator 1026, to in turn adjust the frequency output by oscillator 1026 on master clock signal 1062. Hence, a bit of control word 1070 that is a logical "1" value switches in a capacitor 2112, and oscillator 1026 oscillates at a lower rate. Conversely, a bit of control word 1070 that is a logical "0" value switches out a capacitor 2112, and oscillator 1026 oscillates at a higher rate. Note that in alternative embodiments, frequency adjustment bank 2006 may be configured such that a bit of control word 1070 that is a logical "1" value may cause oscillator 1026 to oscillate at a higher rate, and vice versa.

A process for configuring elements of this embodiment is described in further detail as follows. In particular, a process for determining values for first capacitor 2110, for switchable capacitors 2112a–n, and for the number n of bits in control word 1070, is provided.

In the description below: $f_0$=the oscillator frequency of master clock signal 1062; $t_c$=the period of a single calibration waveform sent from reader network 104, and; N=the value of count word 1074, where $N=f_0 t_c$. For $f_0=f_c$, where $f_c$ is the desired center frequency, the corresponding counter value is $N_c=f_c t_c$. Note that in the example shown in FIG. 21C, and described below, the frequency of master clock signal 1062 is directly applied to counter 1028, instead of being divided, as shown in FIG. 21B. The discussion below is applicable to the oscillator frequency being divided, as would be understood by persons skilled in the relevant art(s).

The value of count word 1074, N, may be expressed as:

$$N = \sum_{i=0}^{j-1} P_i 2^{j-1-i}$$

Where j=number of bits in count word 1074 of counter 1028, i=the bit number in count word 1074, where $0 \leq i \leq j-1$, and $P_i$=bit value, 0 or 1, where $P_o$ is the MSB, $P_{j-1}$ is the LSB Hence, the value of the ith bit position in count word 1074, $N_i$, is equal to:

$$N_i = P_i 2^{j-1-i}$$

The center value of count word 1074, Nc, is defined as:

$$N_c = \sum_{i=1}^{j-1} 2^{j-1-i}$$

$$= \sum_{i=0}^{j-2} 2^{j-2-i}$$

$$= 2^{j-1} - 1$$

for all Pi=1

The maximum value of count word 1074, $N_{max}$, is defined as:

$$N_{max} = \sum_{i=0}^{j-1} 2^{j-1-i}$$

$$= 2^j \cong 2N_c$$

for all $P_i=1$

The value of count word 1074 when the MSB=1, $N_0$, is defined as:

$$N_0 = \sum_{i=0}^{j-1} P_i 2^{j-1-i}$$

$$= 2^{j-1} = N_c + 1$$

with only $P_0=1$, all other $P_i=0$

Hence, $N_0$ represents the value of count word 1074 incremented once beyond the center value of count word 1074, $N_c$.

Therefore, for any oscillator frequency where $f_o > f_c$, $P_0=1$, and for any oscillator frequency where $f_o \leq f_c$, $P_0=0$. Hence, the value $P_0$ may be used to determine whether $f_o$ is greater than or less than $f_c$.

The values for capacitors in frequency adjustment bank 2006 may be calculated as follows. In FIG. 21C, the oscillator frequency, $f_o$, is inversely proportional to the total controlled capacitance, $C_{total}$:

$$f_o = \frac{a}{C_{total}}$$

Where:

a=a design constant.

$$C_{total} = C_{c1} + C_0 \sum_{m=0}^{n-1} b_m 2^{n-1-m} = C_{c1} + C_0 R$$

R=value stored in SAR 1022 n=number of stages of controlled capacitance corresponding to the number of bit stages in SAR 1022 m=bit number corresponding to a capacitor stage $b_m$=value of $m^{th}$ bit, determining whether a capacitor is either enabled ($b_m$=1) or not ($b_m$=0)

$C_0$ is a base capacitance value for the n controlled capacitors, the value of each of the n controlled capacitors being determined by the each term of the summation show in the above equation.

$C_{c1}$ is a fixed capacitor such that
$C_{total}=C_c$, corresponding to $f_c=a/C_c$, where $$C_c=C_{c1}+C_0R_0=C_{c1}+C_0 2^{n-1}$$

Where:

$$R_0 = \sum_{m=0}^{n-1} b_m 2^{n-1-m} = 2^{n-1}$$

for $b_0$=1, all other $b_m$=0

$C_c$ is the center value of $C_{total}$, where $f_o$ would equal $f_c$ if there are no process variations requiring calibration.

Setting:

$$C_c = \frac{a}{f_c}$$

Then the value for $C_{c1}$ is given by:

$$C_{c1} = \frac{a}{f_c} - C_0 2^{n-1}$$

A maximum possible capacitance value, $C_{max}$, for frequency adjustment bank 2006 is configured when all $b_m$=1 in the $C_{total}$ equation shown above:

$$C_{max}=C_{c1}+C_0 R_{max}=C_{c1}+C_0(2^n-1)$$

A minimum possible capacitance value, $C_{min}$, for frequency adjustment bank shown in FIG. 21C is configured when all $b_m$=0 in the $C_{total}$ equation shown above:

$$C_{min}=C_{c1}$$

A maximum capacitance range $\Delta C$ that can be accommodated by the adjustable bank of capacitors is:

$$\Delta C_{total}=C_{max}-C_{min}=C_0(2^n-1)$$

The change from $C_c$ to $C_{max}$ is:

$$\Delta C_+ = C_{max}-C_0=C_0(2^n-2^{n-1}-1)=C_0 2^{n-1}(2-1-2^{-n+1}) \cong C_0 2^{n-1}$$

The change from $C_{min}$ to $C_c$ is:

$$\Delta C_- = C_c - C_{min} = C_0 2^{n-1}$$

Note that:

$$f = \frac{a}{C_{total}}, f_{max} = \frac{a}{C_{min}}, f_{min} = \frac{a}{C_{max}}, f_c = \frac{a}{C_c}$$

and $$C_c = \frac{a}{f_c}, C_{min} = \frac{a}{f_{max}}, C_{max} = \frac{a}{f_{min}}$$

whereby $$\Delta C_- = C_c - C_{min} = \frac{a}{f_c} - \frac{a}{f_{max}} = C_0 2^{n-1}$$

Hence, $C_0$ may be determined as follows:

$$C_0 = a 2^{1-n} \left( \frac{1}{f_c} - \frac{1}{f_{max}} \right)$$

Accordingly, in an embodiment, a desired precision for tuning the oscillator frequency is equal to:

$$\partial p = \frac{\partial f}{f_c} = \frac{1}{2^n}$$

$$2^n = \frac{1}{\partial p},$$

n log 2=log($f_{max}-f_{min}$)–log $\Box$f $$n = \frac{\log\left(\frac{1}{\partial p}\right)}{\log 2}$$

Hence, the above described methodology may be used to determine capacitance values $C_{c1}$ and $C_0$ for the capacitors of frequency adjustment bank 2006 shown in FIG. 21C, and the value n. The present invention is also adaptable to alternative methodologies for configuring elements of data subsystem 1023.

As described above, FIG. 21C illustrates a switch 2180. Switch 2180 causes the output signal of oscillator 1026, master clock signal 1062, to be at a known phase. Switch 2180 is controlled by phase reset signal 2182. In a preferred embodiment, an edge or pulse on phase reset signal 2182 is triggered by every falling edge on the input signal 2100. The phase of the output signal of oscillator 1026 is reset at each data falling edge on input signal 2100. Hence, the phases of all tags 102 within operating range of reader network 104, such as is depicted in FIG. 1, are coordinated. Without the ability to reset the phase of oscillator 1026, the oscillators of one or more tags 102 may eventually become sufficiently out of phase such that the backscatter signals that are generated by tags 102 become out of phase with each other. When the backscatter signals become sufficiently out of phase, the may have the disadvantage of canceling each other, so that the backscatter signals will not be detected by reader network 104. Note that only some phase-critical applications may be affected by this problem, and as such switch 2180 is optional. In a further embodiment, as shown in FIG. 21D, a falling edge detector 2184 may also be present. Falling edge detector 2184 may be used to detect a rising (or falling) edge of input signal 2100 to generate phase reset signal 2182.

Switch 2180 in FIG. 21C may be used to reset the exemplary RC oscillator circuit shown in FIGS. 20 and 21C. Alternative circuits may be used to perform this function in alternative configurations for oscillator 1023 without departing from the spirit and scope of the present invention.

4.3.2 Operational Embodiments for Oscillator Calibration

Exemplary operational embodiments are presented in this section (and its subsections). The methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

In the following discussion, a series of eight calibration cycles or tests are performed on adjustable oscillator 1026. The eight bits of control word 1070 stored in n-bit register bank 2402 are checked one-by-one and potentially altered, in order from the highest order bit to the lowest order bit. In effect, the frequency of master clock signal 1062 is checked and altered by successively smaller frequency amounts, until it is within an acceptable tolerance range.

Operation of calibration circuit 2102 shown in FIG. 21B is described as follows. Count word 1074 is shown as a 9-bit wide signal (i.e., bits 0 through 8) and control word 1070 is an 8 bit wide signal. An example 9 bit value for count word 1074 is shown in FIG. 23A. SAR 1022 uses bit 8 of count word 1074 to determine whether an adjustment of the oscillator frequency is necessary. For example, if the value of bit 8 of count word 1074 is equal to a first state (i.e., a logical "1"), a bit of control word 1070 is set. If the value of bit 8 of count word 102 is equal to a second state (i.e., a logical "0"), a bit of control word 1070 is reset. The bit of control word 1070 that is selected to be set or reset depends on the amount of adjustment of the oscillator frequency required. In embodiments, a series of tests are performed that adjust the oscillator frequency according to an increasingly finer amount until it is within the desired tolerance range. Eight tests are performed, as show in the example of FIG. 22B, and are described as follows with respect to FIG. 25D and shown below in Table 1:

TABLE 1

| Test | SAR start value (control word 1070) | Bit 8 value Of count word 1074 | SAR end value (control word 1070) |
|---|---|---|---|
| 2206 | 10000000 | 1 | 10000000 |
| 2208 | 11000000 | 0 | 10000000 |
| 2210 | 10100000 | 0 | 10000000 |
| 2212 | 10010000 | 1 | 10010000 |
| 2214 | 10011000 | 0 | 10010000 |
| 2216 | 10010100 | 1 | 10010100 |
| 2218 | 10010110 | 1 | 10010110 |
| 2220 | 10010111 | 0 | 10010110 |

The first column of Table 1 indicates which test is being performed for a particular row. The second column of Table 1 shows the value for control word 1070 at the beginning of the test (for example, as set by steps 2522 and 2524 shown in FIG. 25D, and further described below). The third column of Table 1 shows example values for bit 0, $P_0$, (MSB) in count word 1074 received at the end of each test. The fourth column of Table 1 shows the corresponding change in control word 1070 after completion of that row's test (for example, as set by steps 2528 and 2530 shown in FIG. 25D, and further described below).

Prior to the beginning of test 2206, SAR 1022 is initialized, such that control word 1070 is the 8-bit word of 10000000 (as shown in the second column of Table 1 and determined by steps 2522 and 2524 shown in FIG. 25D, and further described below, for example). This value of control word 1070 is targeted to cause adjustable oscillator 1026 to output a base oscillator frequency (i.e., 7.5 MHz) from which it can be adjusted. In the current example, the tolerance range for the base oscillator frequency of adjustable oscillator 1026 is ±50%. By increasing or decreasing the value of control word 1070, the frequency of master clock signal 1062 may be correspondingly increased or decreased.

At time 2202, test 2206 is initiated by the falling edge of input signal 2100. Counter 1028 begins incrementing count word 1074 from a zero state according to first clock signal 1066. At time 2204, SAR 1022 receives the value of bit 0, $P_0$, (MSB) of count word 1074. If bit 0 of count word 1074 is a 1, this indicates that counter 1028 is counting too fast, and hence adjustable oscillator 1026 must be operating at too high of a frequency. Bit 0 (MSB) of control word 1070 would be kept at a 1 value, to keep the frequency of adjustable oscillator 1026 the same. If bit 0 of count word 1074 is a 0, this indicates that counter 1028 is counting at the proper rate, or too slowly. Bit 0 of control word 1070 would then be reset to a 0 value to increase the frequency of adjustable oscillator 1026. As shown in Table 1, for test 2206, bit 0 of count word 1074 is equal to a 1. When bit 0 is equal to a 1, this indicates that adjustable oscillator 1026 is operating too fast. Hence, SAR 1022 leaves bit 0 of control word 1070 in a 1 state, as shown in column 4 of Table 1.

At time 2204, test 2208 is initiated by the falling edge of input signal 2100. For test 2208, SAR 1022 retains the value for control word 1070 created during test 2206, and additionally sets bit 1 of control word 1070 to a logical high, according to operations 2534,2524. Setting bit 1 of control word 1070 causes adjustable oscillator 1026 to decrease the frequency of master clock signal 1062 (i.e., the frequency is decreased by half of the amount of the frequency achieved of the previous adjustment). Counter 1028 clears count word 1074, and then begins incrementing count word 1074 according to first clock signal 1066. At time 2222, SAR 1022 reads the value of bit 0 of count word 1074. As shown in Table 1, for test 2208, bit 0 of count word 1074 is equal to a 0. When bit 0 is equal to a 0, this indicates that adjustable oscillator 1026 is operating at the correct rate, or too slow. Hence, SAR 1022 resets bit 1 of control word 1070 to a 0 state, as shown in column 4 of Table 1, to cause adjustable oscillator 1026 to speed up.

At time 2222, test 2210 is initiated by the falling edge of input signal 2100. For test 2210, SAR 1022 retains the value for control word 1070 created by test 2208, and additionally sets bit 2 of control word 1070 to a logical high. Setting bit 2 of control word 1070 causes adjustable oscillator 1026 to decrease the frequency of master clock signal 1062 (although the frequency is decreased by half of the amount of the previous adjustment). Counter 1028 clears count word 1074, and then begins incrementing count word 1074 according to first clock signal 1066. At time 2224, SAR 1022 reads the value of bit 0 of count word 1074. As shown in Table 1, for test 2210, bit 0 of count word 1074 is equal to a 0. When bit 0 is equal to a 0, this indicates that adjustable oscillator 1026 is operating at the correct rate, or too slow. Hence, SAR 1022 resets bit 2 of control word 1070 to a 0 state, as shown in column 4 of Table 1, to cause adjustable oscillator 1026 speed up.

At time 2224, test 2212 is initiated by the falling edge of input signal 2100. For test 2212, SAR 1022 retains the value for control word 1070 created by test 2210, and additionally sets bit 3 of control word 1070 to a logical high. Setting bit 3 of control word 1070 causes adjustable oscillator 1026 to decrease the frequency of master clock signal 1062 (although the frequency is decreased by half of the amount of the previous adjustment). Counter 1028 clears count word 1074, and then begins incrementing count word 1074 according to first clock signal 1066. At time 2226, SAR 1022 reads the value of bit 0 of count word 1074. As shown in Table 1, for test 2212, bit 0 of count word 1074 is equal to a 1. When bit 0 is equal to a 1, this indicates that adjustable oscillator 1026 is operating too fast. Hence, SAR 1022 leaves bit 3 of control word 1070 in a 1 state, as shown in column 4 of Table 1, to keep adjustable oscillator 1026 at the tested frequency.

At time 2226, test 2214 is initiated by the falling edge of input signal 2100. For test 2214, SAR 1022 retains the value for control word 1070 created by test 2212, and additionally sets bit 4 of control word 1070 to a logical high. Setting bit 4 of control word 1070 causes adjustable oscillator 1026 to decrease the frequency of master clock signal 1062 (although the frequency is decreased by half of the amount of the previous adjustment). Counter 1028 clears count word 1074, and then begins incrementing count word 1074 according to first clock signal 1066. At time 2228, SAR 1022 reads the value of bit 0 of count word 1074. As shown in Table 1, for test 2214, bit 0 of count word 1074 is equal to a 0. When bit 0 is equal to a 0, this indicates that adjustable oscillator 1026 is operating at the correct rate, or too slow. Hence, SAR 1022 resets bit 4 of control word 1070 to a 0 state, as shown in column 4 of Table 1, to cause adjustable oscillator 1026 to speed up.

At time 2228, test 2216 is initiated by the falling edge of input signal 2100. For test 2216, SAR 1022 retains the value for control word 1070 created by test 2214, and additionally sets bit 5 of control word 1070 to a logical high. Setting bit 5 of control word 1070 causes adjustable oscillator 1026 to decrease the frequency of master clock signal 1062 (although the frequency is decreased by half of the amount of the previous adjustment). Counter 1028 clears count word 1074, and then begins incrementing count word 1074 according to first clock signal 1066. At time 2230, SAR 1022 reads the value of bit 0 of count word 1074. As shown in Table 1, for test 2216, bit 0 of count word 1074 is equal to a 1. When bit 0 is equal to a 1, this indicates that adjustable oscillator 1026 is operating too fast. Hence, SAR 1022 leaves bit 5 of control word 1070 in a 1 state, as shown in column 4 of Table 1, to keep adjustable oscillator 1026 at the tested frequency.

At time 2230, test 2218 is initiated by the falling edge of input signal 2100. For test 2218, SAR 1022 retains the value for control word 1070 created by test 2216, and additionally sets bit 6 of control word 1070 to a logical high. Setting bit 6 of control word 1070 causes adjustable oscillator 1026 to decrease the frequency of master clock signal 1062 (although the frequency is decreased by half of the amount of the previous adjustment). Counter 1028 clears count word 1074, and then begins incrementing count word 1074 according to first clock signal 1066. At time 2232, SAR 1022 reads the value of bit 0 of count word 1074. As shown in Table 1, for test 2218, bit 0 of count word 1074 is equal to a 1. When bit 0 is equal to a 1, this indicates that adjustable oscillator 1026 is operating too fast. Hence, SAR 1022 leaves bit 6 of control word 1070 in a 1 state, as shown in column 4 of Table 1, to keep adjustable oscillator 1026 at the tested frequency.

At time 2232, test 2220 is initiated by the falling edge of input signal 2100. For test 2220, SAR 1022 retains the value for control word 1070 created by test 2218, and additionally sets bit 7 (LSB) of control word 1070 to a logical high. Setting bit 7 of control word 1070 causes adjustable oscillator 1026 to decrease the frequency of master clock signal 1062 (although the frequency is decreased by half of the amount of the previous adjustment). Counter 1028 clears count word 1074, and then begins incrementing count word 1074 according to first clock signal 1066. At time 2234, SAR 1022 reads the value of bit 0 of count word 1074. As shown in Table 1, for test 2220, bit 0 of count word 1074 is equal to a 0. When bit 0 is equal to a 0, this indicates that adjustable oscillator 1026 is operating at the correct rate, or too slow. Hence, SAR 1022 resets bit 7 of control word 1070 to a 0 state, as shown in column 4 of Table 1, to cause adjustable oscillator 1026 to increase to its final adjusted value.

After test 2220, the calibration sequence is complete, and the value for control word 1070 shown in column 4 of Table 1 for test 2220 is the value selected to continue to control the frequency for adjustable oscillator 1026, until the next calibration sequence. Note that adjustable oscillator 1026 may be calibrated at any time, as required by the particular application. For example, oscillator 1026 may be calibrated each time that tag 102 is reset.

Hence, calibration circuit 2102 iteratively adjusts the frequency output by adjustable oscillator 1026 on master clock signal 1062 until it is within an acceptable tolerance range. Master clock signal 1062 may be adjusted by this calibration process over a range of $2^n-1$ values, wherein n is the width of control word 1070 and the number of tests or iterations. When control word 1070 is 8 bits wide, master clock signal 1062 may be adjusted over a range of $2^8-1$ values, or 255 values. For example, master clock signal 1062 may be adjusted from a base frequency upwards by 127 values, and downwards by 128 values. When the base frequency is equal to 7.5 MHz, and the tolerance range is ±50%, the base frequency of 7.5 MHz may be adjusted ±3.75 MHz, or over a span of 7.5 MHz. Hence, the base frequency may be adjusted upwards and downwards in increments of 7.5 MHz/255=29.4 KHz. This potentially leads to a tolerance range for master clock signal 1062 after calibration of $$29.4 \text{ KHz}/7.5 \text{ MHz} \times 100\% = 0.39\%.$$

Note that in some environments, worst case noise estimates could effectively negate the last bit or bits of calibration.

Note that not all available bits of control word 1070 must necessarily be tested during the above described calibration routine. In embodiments, a subset of the available bits of control word 1070 may be permanently pre-set during manufacturing or fabrication of the circuit. For example, circuits within a wafer may be tested during manufacturing. This can determine variations that will tend to occur across the wafer, that can be calibrated out. Bits may be pre-set by a variety of known processes, such as by hardwiring, by pre-programming, by laser make-link or break-link, by blowing traces, and by other known means. This may be accomplished in SAR 1022, oscillator 1026, or on the signal traces of control word 1070. By pre-setting one or more of the available bits of control word 1070, time may be saved during calibration, because the calibration routine will not need to test all available bits.

The calibration circuit embodiments provided above in this section are presented herein for purposes of illustration, and not limitation. For example, the invention is applicable to alternative bit widths for control word 1070 and count word 1074, to different frequencies than those discussed, and to different polarities of bits for count word 1074 and control word 1070, as would be understood by persons skilled in the relevant art(s) from the teachings herein. The invention is also applicable to alternative implementations for SAR 1022 than shown in FIG. 24. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 29:
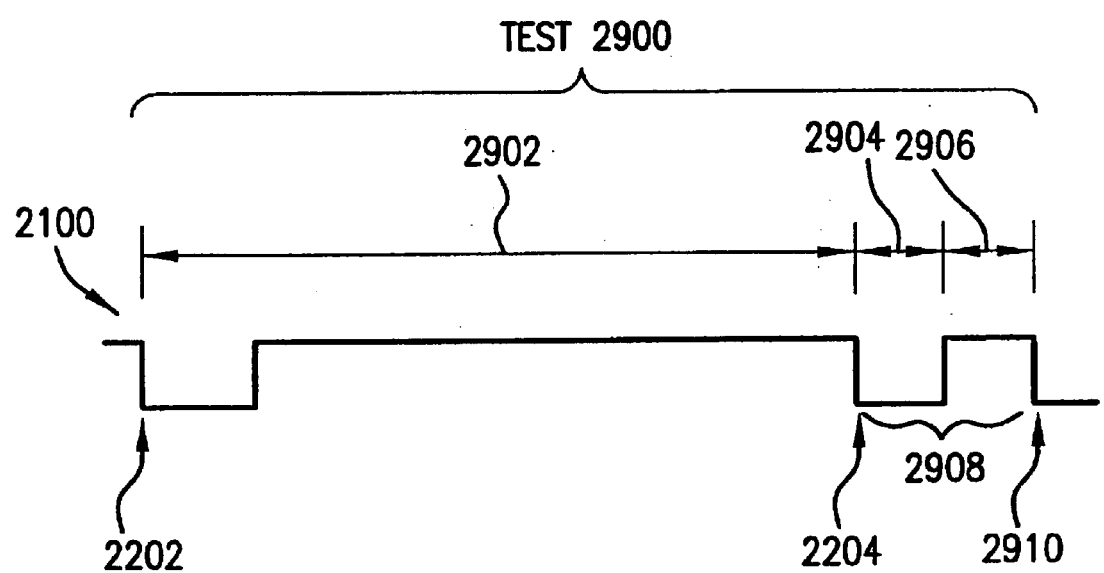
FIG. 29 shows a test waveform with additional spacing pulses that may be used instead of the test waveform shown in FIG. 22A to calibrate an adjustable oscillator, according to an embodiment of the present invention.

Furthermore, note that alternative calibration waveforms may be used, having alternative polarities, duty cycles, and additional cycles. For example, FIG. 29 shows a calibration or test waveform, test 2900, that may be used alternatively to the calibration waveforms described above, such as test 2206, to calibrate adjustable oscillator 1026. Test 2900 includes a calibration waveform cycle 2902, similar to that of test 2206. Furthermore, test 2900 includes a separation pulse 2908 that follows calibration waveform cycle 2902. Separation pulse 2908 may be used to provide separation between calibration waveform cycle 2902 and the subsequent calibration waveform, so that SAR 1022 and adjustable oscillator 1026 have time to adjust the oscillator frequency of master clock signal 1062 before the next calibration pulse. Separation pulse 2908 may be of any applicable length and duty cycle, including 3 $\mu$S high and 3 $\mu$S low.

Figure 25A:
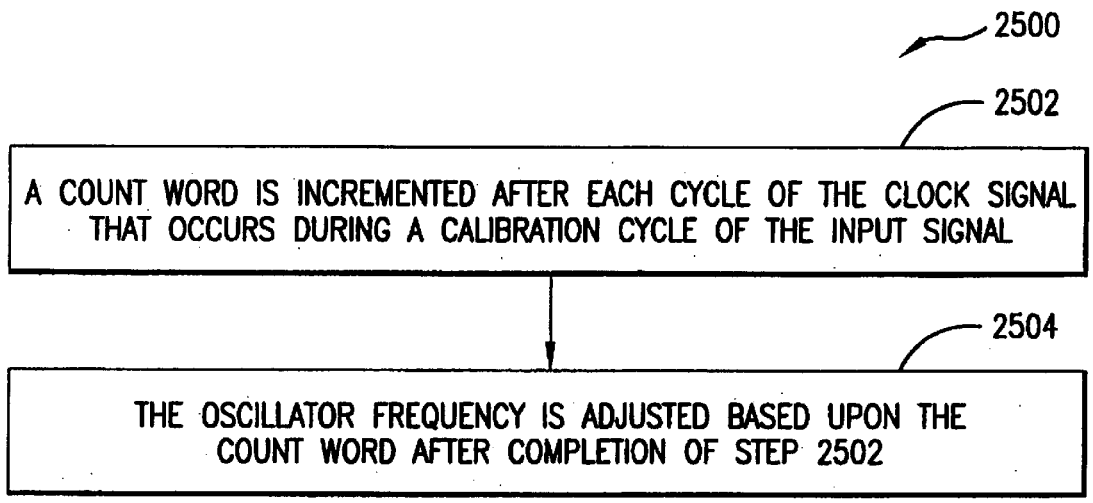
FIGS. 25A–25D show flowcharts providing steps for calibrating an oscillator frequency with an input signal, according to embodiments of the present invention.
Figure 25B:
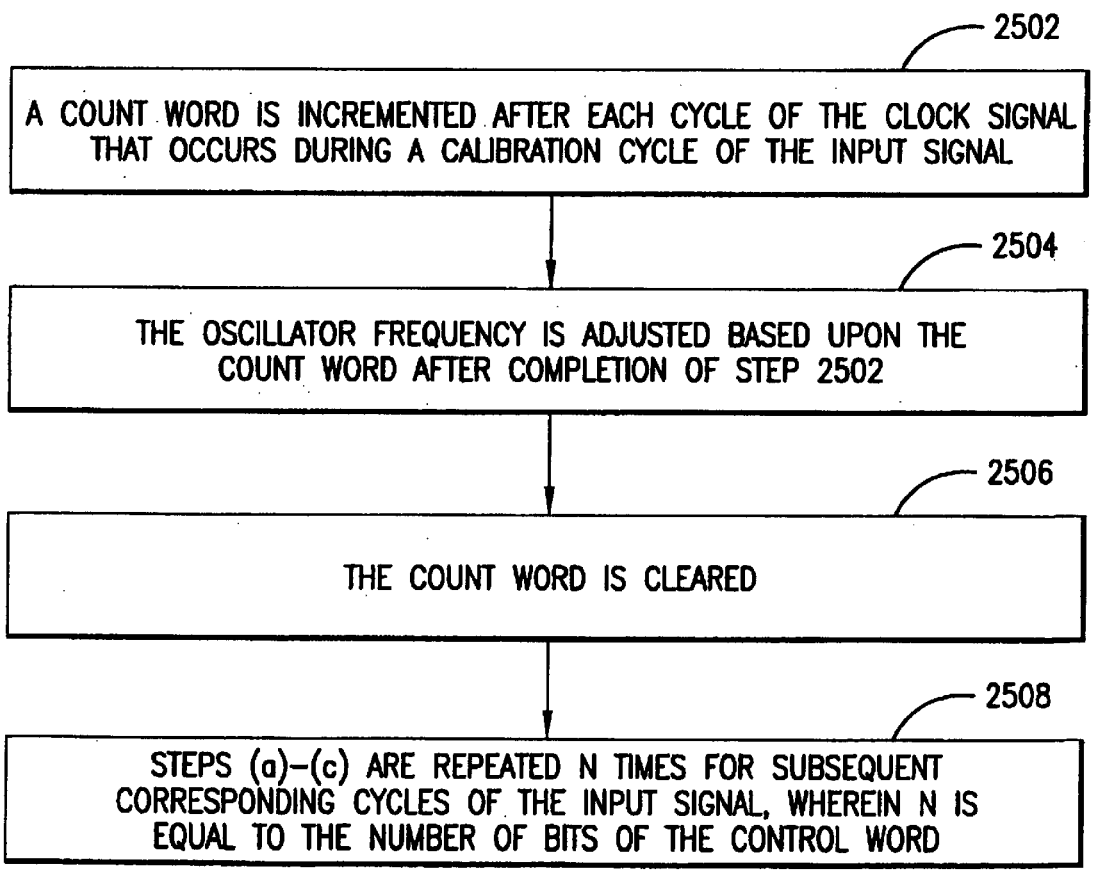
Figure 25C:
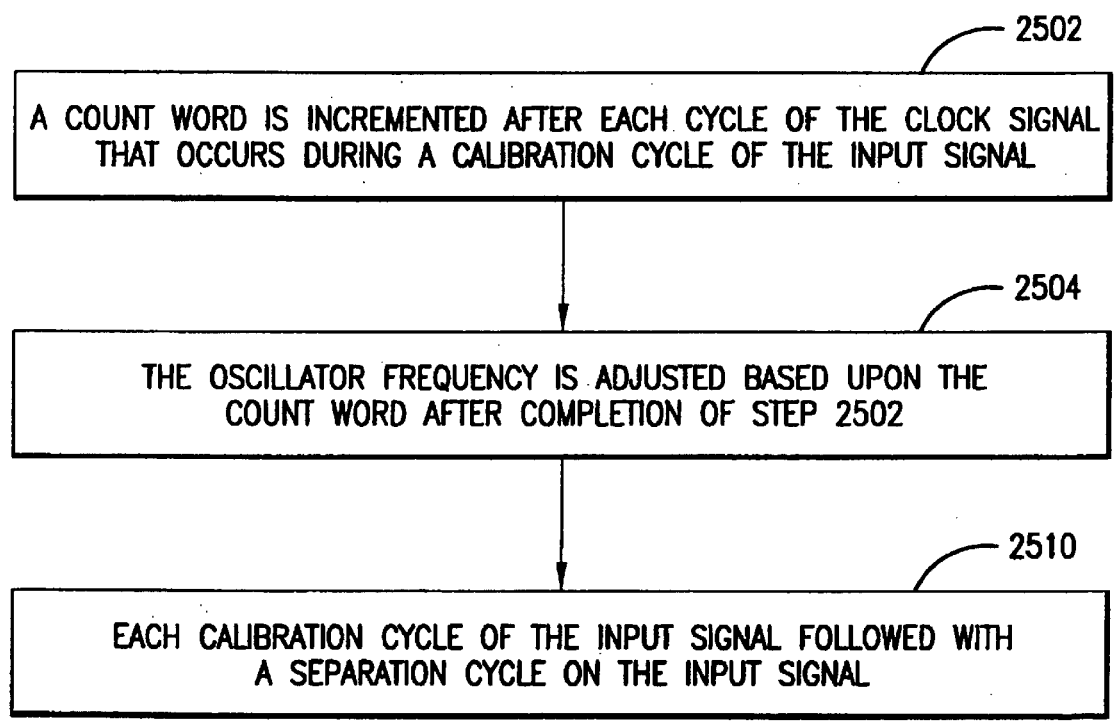

FIG. 25A shows a flowchart 2500 providing steps for calibrating an oscillator frequency with an input signal, according to embodiments of the present invention. FIGS. 25B–C provide steps according to further embodiments. The steps of FIGS. 25A–C do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

In the embodiments according to flowchart 2500, the oscillator frequency is calibrated according to an input signal. For example, the oscillator frequency is the frequency of master clock signal 1062, and the input signal may be input signal 2100. A clock signal is equal to the oscillator frequency divided by an integer amount. For example, the clock signal is clock signal 1066, which is generated from master clock signal 1062 by first divider 1036.

Flowchart 2500 begins with step 2502. In step 2502, a count word is incremented after each cycle of the clock signal that occurs during a calibration cycle of the input signal. For example, the count word is count word 1074, as shown in FIG. 23A, and output by counter 1028. Counter 1028 increments count word 1074 each cycle of clock signal 1066. Counter 1028 increments count word 1074 during a particular test, such as test 2206 shown in FIG. 22A, which is a calibration cycle waveform of input signal 2100.

In step 2504, the oscillator frequency is adjusted based upon the count word after completion of step 2502. For example, as shown in FIGS. 21A and 21B, SAR 1022 receives count word 1074, and outputs a control word 1070, which is used to adjust the output frequency of adjustable oscillator 1026.

For example, in an embodiment, step 2504 may include the step where the oscillator frequency is based on a control word. In other words, the output of adjustable oscillator 1026, master clock signal 1062, is based upon control word 1070. For example, adjustable oscillator 1026 outputs a base oscillator frequency, such as 7.5 MHz, for a middle value for control word 1070, such as 10000000. As control word 1070 is varied upward and downward, the frequency of adjustable oscillator 1026 will likewise vary. For example, the frequency of master clock signal 1062 may be varied by ±50% from the base frequency of 7.5 MHz.

In an embodiment, step 2504 may include the step where a bit of the control word is adjusted based upon the count word. For example, As described above, a bit of control word 1070 is adjusted during each calibration cycle, or test. The bit of control word 1070 is adjusted according to the value of count word 1074 in the example discussion provided above.

FIG. 25B illustrates additional steps for flowchart 2500, according to further embodiments of the present invention:

In step 2506, the count word is cleared. For example, when counter 1028 receives a falling edge on input signal 2100, it clears count word 1074.

In step 2508, steps (a)–(c) are repeated n times for subsequent corresponding cycles of the input signal, wherein n is equal to the number of bits of the control word. For example, as described above, for each test or calibration cycle on input signal 2100, a successive bit of control word 1070 in SAR 1022 is adjusted based upon the value of count word 1074, until all bits of control word 1070 have been adjusted. In alternative embodiments, a subset of the bits of control word 1070 are adjusted, instead of all bits.

In an embodiment, step 2508 may include the step where adjusting a different bit of the control word is adjusted each time that step (b)(2) is repeated, wherein the bit of the control word is adjusted according to at least one bit of the count word. For example, as described above, each bit of control word 1070 is adjusted according to the value of bit 8 of count word 1074. For example, this may include the steps where the bit of the control word is set if the at least one bit of the count word is equal to a first state, and the bit of the control word is reset if the at least one bit of the count word is equal to a second state. In the example provided above, a bit of control word 1070 is set if bit 8 of count word is 1 and the bit of control word 1070 is reset if bit 8 of count word 1074 is a 0. The present invention is applicable to one or more of any of the bits of count word 1074 being used by SAR 1022 to adjust control word 1070.

FIG. 25C illustrate an additional step for flowchart 2500, according to further embodiments of the present invention:

In step 2510, each calibration cycle of the input signal followed with a separation cycle on the input signal. For example, the separation cycle may be separation cycle 2908 as shown in FIG. 29.

Figure 25D:
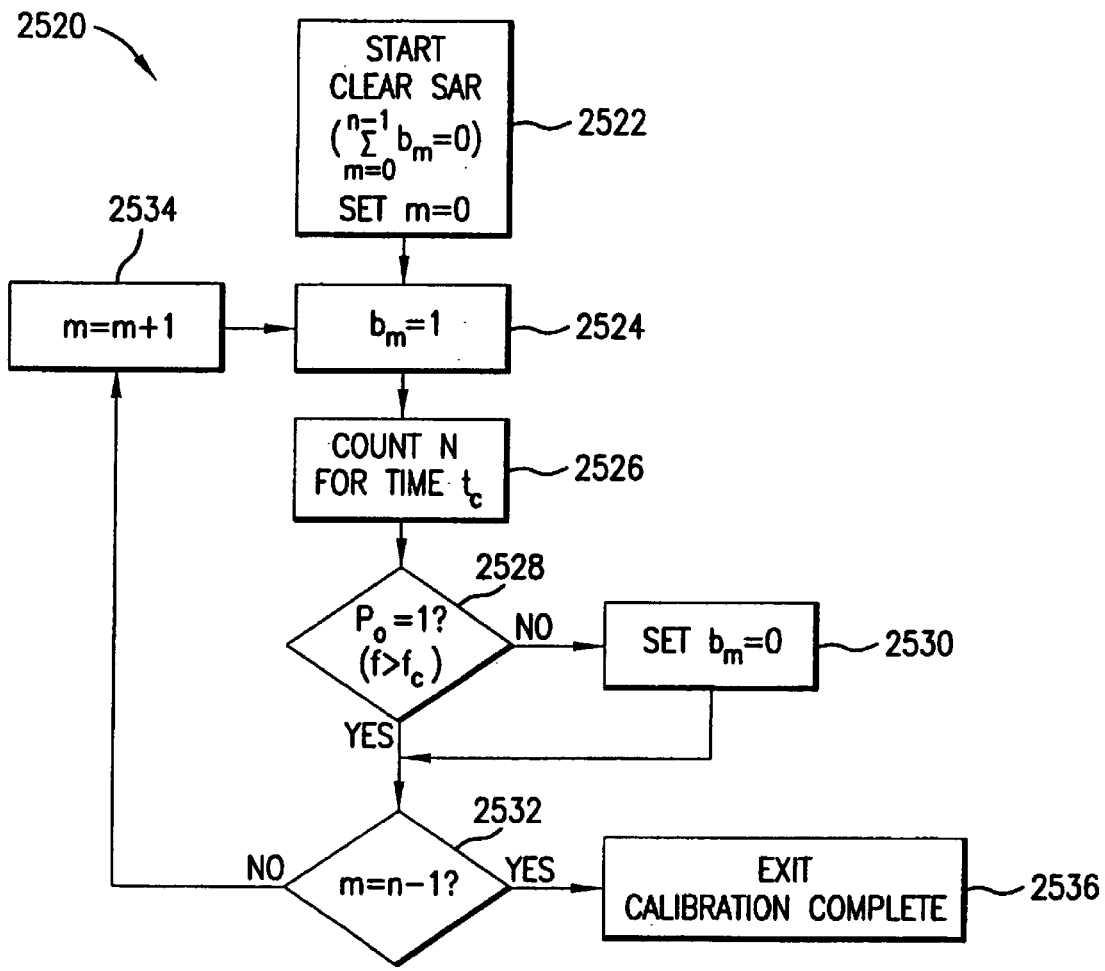

FIG. 25D shows a flowchart 2520 providing a algorithm for calibrating an oscillator frequency with an input signal, similar to that of FIGS. 25A–C, according to embodiments of the present invention. FIGS. 25B–C provide steps according to further embodiments. Other structural embodiments will be apparent to persons skilled in the relevant art(s) based on the following discussion. These steps are described in detail below.

In embodiment according to flowchart 2520, the oscillator frequency is calibrated according to an input signal. For example, the oscillator frequency is the frequency of master clock signal 1062, and the input signal may be input signal 2100. Input signal 2100 includes calibration or test waveforms of period $t_c$.

Flowchart 2520 begins with step 2522. In step 2522, operation of flowchart 2520 begins. During step 2522, the contents of SAR 1022, control word 1070, are cleared, and the bit position of interest "m" of SAR 1022 is set to the 0 bit position, which may be the MSB of SAR 1022, for example.

In step 2524, the value of bit position m in the contents of SAR 1022 is set equal to a "1" bit. For example, in the first iteration of flowchart 2520, the bit position of m=0 in SAR 1022 is set equal to a "1" bit. In subsequent iterations, subsequent bit positions will be set equal to a "1" bit in step 2524.

In step 2526, counter 1028 counts at its clock rate, which is the frequency of master clock signal 1062 as shown in FIG. 21C, or may a divided frequency of master clock signal 1062 such as first clock signal 1066 as shown in FIG. 21B. Counter 1028 counts for one cycle $t_c$ of the input signal 2100, which is one cycle of a calibration or test waveform as described above, to generate the value N on count word 1074.

In step 2528, the MSB of the counter word 1070, $P_0$, is checked to determine whether it equals a "1" bit. If $P_0$ equals a "1" bit, this means that oscillator 1026 is counting too fast (i.e., $f_o > f_c$), and operation proceeds to step 2532. If $P_0$ does not equal a "1" bit, this means that oscillator 1026 is counting at the proper rate, or too slow (i.e., $f_o \leq f_c$), and operation proceeds to step 2530.

In step 2530, bit m of the contents of SAR 1022 is set to a "0" bit, and operation proceeds to step 2532.

In step 2532, bit m is checked to determine whether the last bit position of interest "m" of SAR 1022 has been processed, where the last bit position in this example is the LSB of control word 1070. If the last bit has been processed, operation proceeds to step 2536. If the last bit has not been processed, operation proceeds to step 2534.

In step 2534, the bit position of interest "m" of SAR 1022 is incremented. For example, at the end of the first iteration of flowchart 2520, bit position "m" is incremented from a "0" bit to the "1" bit position. On the second iteration of flowchart 2520, bit position "m" is incremented from the "1" bit position to the "2" bit position of the contents of SAR 1022. On the last iteration of 2520, bit position "m" is incremented to the MSB bit position of SAR 1022. In this manner, all bit positions of SAR 1022 may be processed. Note that in alternative embodiments, only a portion of the bit positions of SAR 1022 may be processed.

In step 2536, the calibration process shown in flowchart 2520 is finished, and operation ends. Hence, the contents of SAR 1022 should be configured such that control word 1070 causes oscillator 1026 to output the desired oscillator frequency on master clock signal 1062.

4.4 Data Symbol Calibration

As discussed in section 1.2.1, reader network 104 transmits information in the form of one or more symbols that are each selected from a symbol set. Tag 102 receives the transmitted symbols, and determines what information the transmitted symbols represent. As shown in FIGS. 3–5, for example, a set of three symbol waveforms of varying duty cycles may be used to represent three different logical values. The three logical values that are represented by the waveforms of FIGS. 3–5 may be "0," "1," and "NULL," for instance.

According to the present invention, the duration or length of timing intervals of waveforms that define the data symbols are set during a calibration routine. According to an embodiment, reader network 104 transmits a series of pulse waveforms that are received by tag 102. Tag 102 uses the received pulse waveforms to set boundaries for timing intervals that define data symbols. After tag 102 sets the data symbols timing intervals, data waveforms subsequently received by tag 102 will be compared to these timing intervals, to determine which logical values the received data waveforms represent.

Note that in embodiments, a variety of characteristics of calibration waveforms received by a tag 102 from a reader network 104 may be used to define data symbols during the calibration routine. For example, in embodiments, in addition to using a length or duration of a pulse waveform to define data symbol timing intervals, amplitude, frequency, and phase of calibration waveforms transmitted by reader network 104 to tags 102 may be used to define data symbols by tags 102.

Figure 26A:
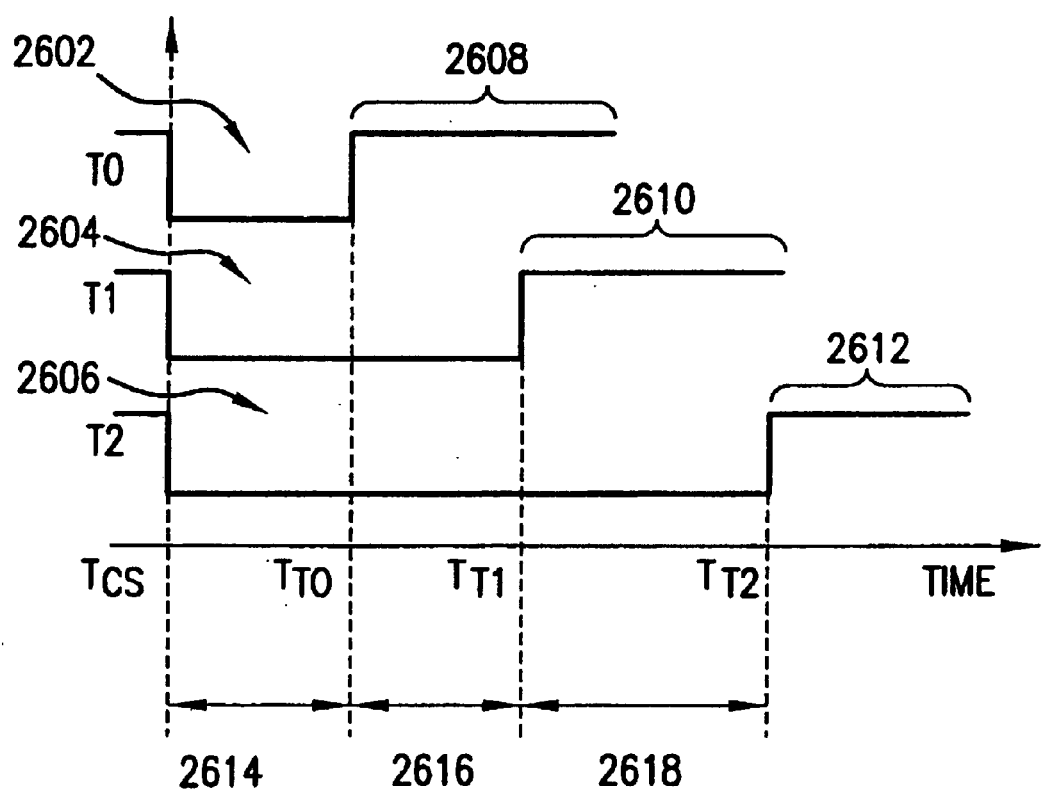
FIG. 26A illustrates example waveforms that may be received by a tag to calibrate data symbols, according to an embodiment of the present invention.
Figure 26B:
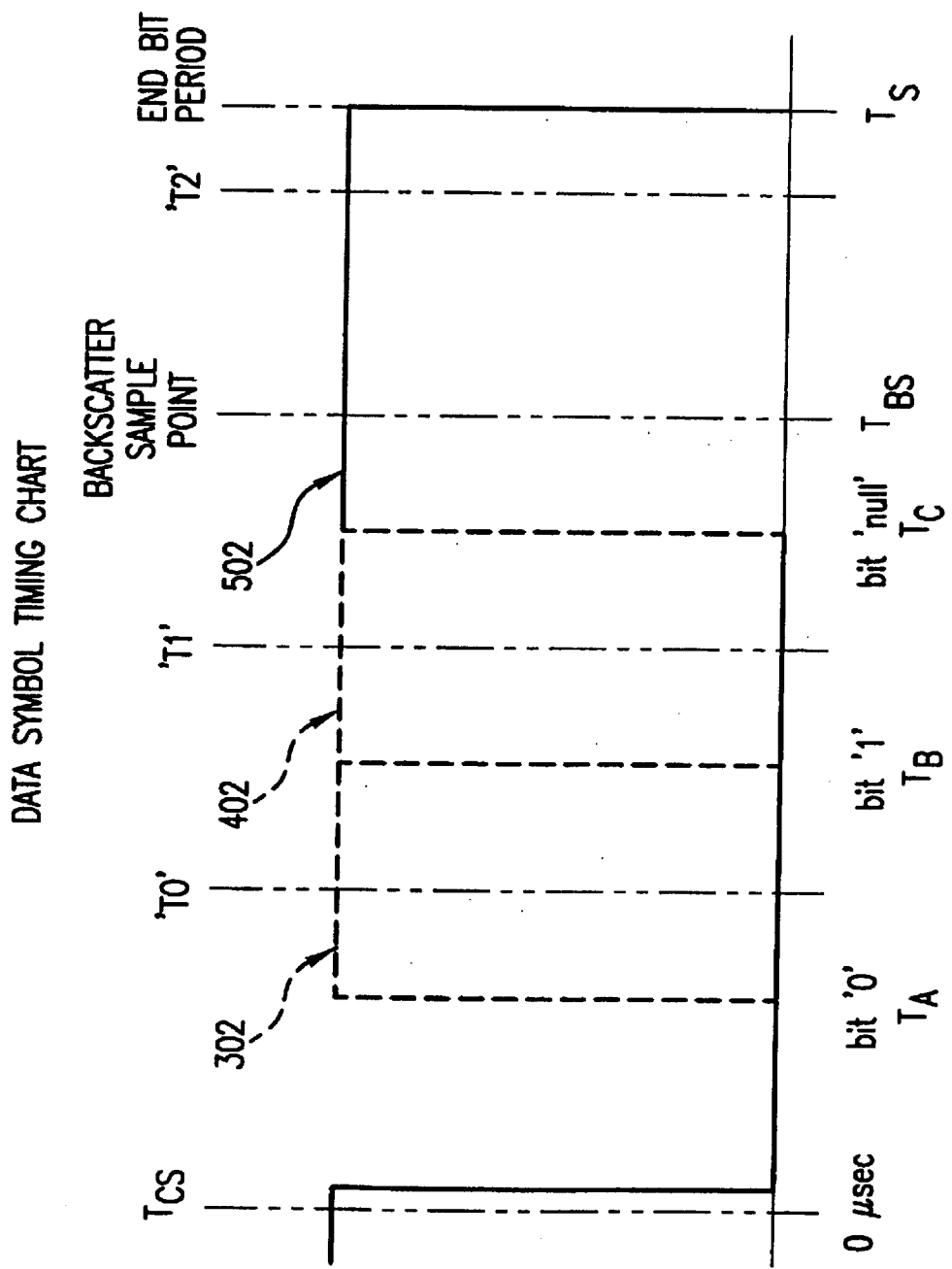
FIG. 26B is a full data symbol timing chart depicting interaction between RFID readers and tags on each symbol exchange according to embodiments of the present invention.

FIG. 26A illustrates example waveforms that may be received by tag 102 to calibrate data symbols, according to an embodiment of the present invention. FIG. 26A illustrates a first calibration waveform 2602, a second calibration waveform 2604, and a third calibration waveform 2606. First calibration waveform 2602 corresponds to the timing parameter T0, described above. Second calibration waveform 2604 corresponds to the timing parameter T1, described above. Third calibration waveform 2606 corresponds to the timing parameter T2, described above.

In an embodiment, first, second, and third calibration waveforms 2602, 2604, and 2606 are consecutively received by tag 102, and are used to calibrate data symbols. First calibration waveform 2602 is first received by tag 102. The duration or length of first calibration waveform 2602 is measured as the duration of the amount of time passing between the falling edge and rising edge of the pulse on first calibration waveform 2602. This is shown as $T_{T0}$ in FIG. 26A (assuming that $T_{CS}$ is equal to zero). This length is stored by tag 102. Second calibration waveform 2604 is next received by tag 102. The duration or length of the pulse on second calibration waveform 2604, shown as $T_{T1}$ in FIG. 26A, is also stored by tag 102. Third calibration waveform 2606 is lastly received by tag 102. The duration or length of the pulse on third calibration waveform 2606, shown as $T_{T2}$ in FIG. 26A, is also stored by tag 102. After the three waveform pulse lengths are stored, they may be referred to, to determine the logical values for received data symbols.

When the falling edge of a received data symbol pulse occurs (at $t_{cs}$), the logical value for the data symbol may be determined by examining the time period in which its trailing rising edge occurs. FIG. 26A shows a first time period 2614, a second time period 2616, and a third time period 2618. First time period 2614 is a time period between $T_{cs}$ and $T_{T0}$. Second time period 2616 is a time period between $T_{T0}$ and $T_{T1}$. Third time period 2618 is a time period between $T_{T1}$ and $T_{T2}$. When the trailing rising edge of a data symbol pulse occurs during first time period 2614, the data symbol will be interpreted as a logical "0" value. When the trailing rising edge of a data symbol pulse occurs during second time period 2616, the data symbol will be interpreted as a logical "1" value. When the trailing rising edge of a data symbol pulse occurs during third time period 2618, the data symbol will be interpreted as a logical "NULL" value.

Hence, $T_{T0}$ is a dividing line between logical "0" and logical "1" values. In an embodiment, $T_{T0}$ may be equal to 4.5 $\mu$S, but may also be equal to shorter or longer amounts of time. $T_{T1}$ is a dividing line between logical "1" and "NULL" values. In an embodiment, $T_{T1}$ may be equal to 7.75 $\mu$S, but may also be equal to shorter or longer amounts of time. Note that in an embodiment, $T_{T2}$ indicates a time at which tag 102 must stop transmitting data to a reader network 104. After $T_{T2}$, tag 102 prepares for the falling edge of the next data symbol. In an embodiment, $T_{T2}$ is equal to 11.5 µS, but may also be equal to shorter or longer amounts of time. For example, $T_{T2}$ may be equal to a longer time period such as 24 µS, which allows reader network 104 to decrease transmitted data rates in exchange for improved noise immunity.

Note that FIG. 26A also shows a first separator waveform portion 2608 of first calibration waveform 2602, a second separator waveform portion 2610 of second calibration waveform 2604, and a third separator waveform portion 2612 of third calibration waveform 2606. First, second, and third separator waveform portions 2608, 2610, and 2612 are optional, and provide time for tag 102 to store the received corresponding data symbol pulse, and to prepare for the next calibration/data pulse.

Examples of received data symbols are shown in FIGS. 3–5. As shown in FIG. 3, where the length $T_A$ of a received data symbol is less than $T_{T0}$, the corresponding data symbol is interpreted as a logical "0" value. As shown in FIG. 4, where the length $T_B$ of a received data symbol is greater than $T_{T0}$ and less than $T_{T1}$, the corresponding data symbol is interpreted as a logical "1" value. As shown in FIG. 5, where the length $T_C$ of a received data symbol is greater than $T_{T1}$ and less than $T_{T2}$, the corresponding data symbol is interpreted as a logical "NULL" value.

Figure 27:
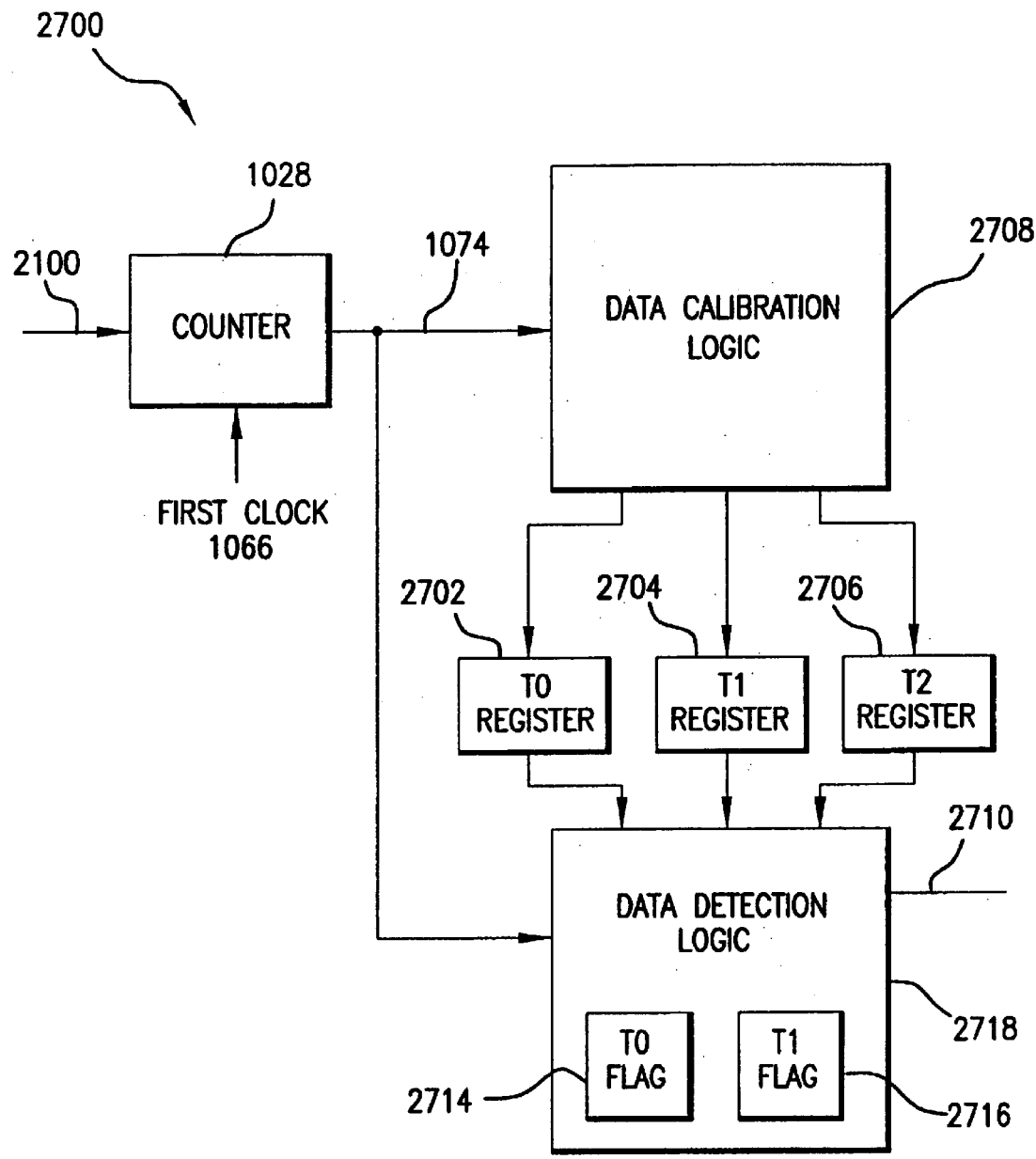
FIG. 27 shows a data calibration system in a tag, according to an embodiment of the present invention.

FIG. 27 shows a data calibration and detection system 2700 in tag 102, according to an embodiment of the present invention. Data calibration and detection system 2700 receives calibration signal pulses to perform data calibration, and also interprets received data symbols. Data calibration and detection system 2700 includes counter 1028, a T0 register 2702, a T1 register 2704, a T2 register 2706, a data calibration logic 2708, and a data detection logic 2718. T0 register 2702, T1 register 2704, T2 register 2706, data calibration logic 2708, and data detection logic 2718 may be included in state machine 1024, shown in FIG. 10, for example.

When performing data symbol calibration, counter 1028 measures lengths of three calibration waveform pulses consecutively received on input signal 2100, and stores the pulse lengths in registers T0 register 2702, T1 register 2704, and T2 register 2706. Counter 1028 measures the length of a calibration waveform pulse according to the number of clock cycles of first clock 1066 that occur between the falling and rising edges of the calibration waveform. The measured length is output on count word 1074 and received by data calibration logic 2708. Data calibration logic 2708 stores the received measured length in a respective register. The length of first calibration waveform 2602 is stored in T0 register 2702. The length of second calibration waveform 2604 is stored in T1 register 2704. The length of third calibration waveform 2606 is stored in T2 register 2706.

After data symbol calibration is completed, data symbols may be received on input signal 2100. When receiving a data symbol on input signal 2100, counter 1028 counts the length of the received data waveform according to first clock 1066. Counter 1028 begins counting when the received data waveform transitions from high to low, and finishes counting when the received data waveform transitions from low to high. Counter 1028 outputs count word 1074, which is received by data detection logic 2718. Data detection logic 2708 compares the length of the received data waveform to the calibration waveform lengths stored in T0 register 2702, T1 register 2704, and T2 register 2706, to determine the logical value of the received data. Data detection logic 2718 may determine the logical values by direct comparison of the received data waveform lengths to the stored calibration waveform values, or in other ways.

For example, in an embodiment after data calibration has been performed, data symbols may now be transmitted to from reader network 104 to tag 102. Data detection logic 2718 determines logical values for the data symbols. Data detection logic 2718 receives count word 1074. After a falling edge on input signal 2100 count word 1074 is incremented upward according to first clock signal 1066, for a duration of a received data symbol. When count word 1074 equals the value stored in T0 register 2702, data detection logic 2718 sets an internal T0 flag 2714. When count word 1074 equals the value stored in T1 register 2704, data detection logic 2718 sets an internal T1 flag 2716. After receiving a rising edge on input signal 2100, which indicates an end of the received data symbol, the logical value for the received data symbol is determined by examining flags 2714 and 2716. If T0 flag 2714 is not set, the data symbol is interpreted as a logical "0" value. If T0 flag 2714 is set, but T1 flag 2716 is not set, the data symbol is interpreted as a logical "1" value. If T0 and T1 flags 2714 and 2716 are both set, the data symbol is interpreted as a logical "NULL" value. The interpreted logical value for the received data symbol is output on interpreted data signal 2710. Note that after the falling edge of a data symbol occurs, flags 2714 and 2716 are reset or initialized to be used to interpret the data symbol being received.

Figure 28A:
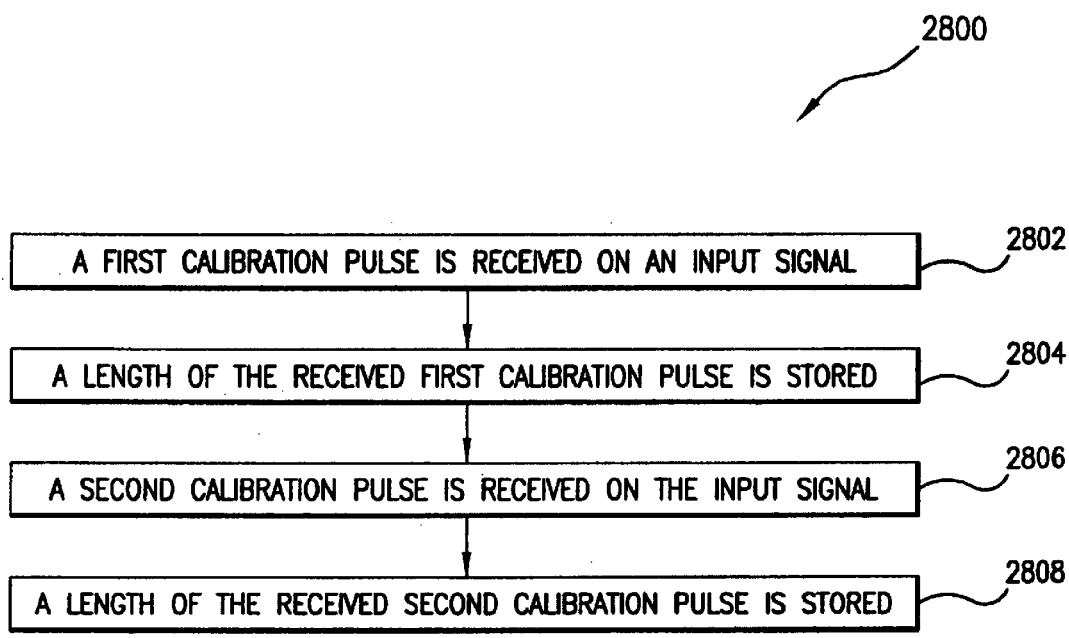
Figure 28B:
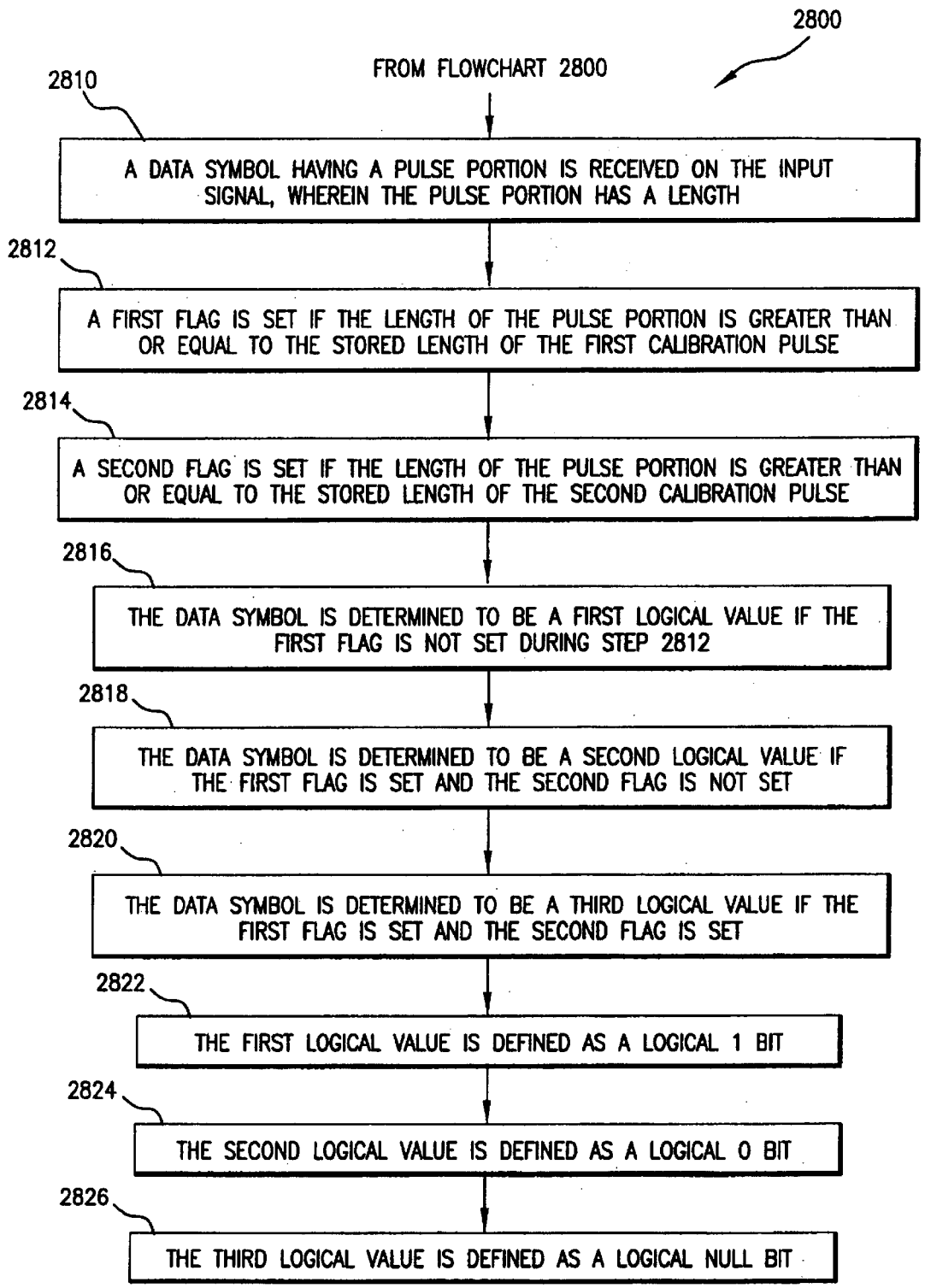
Figure 28C:
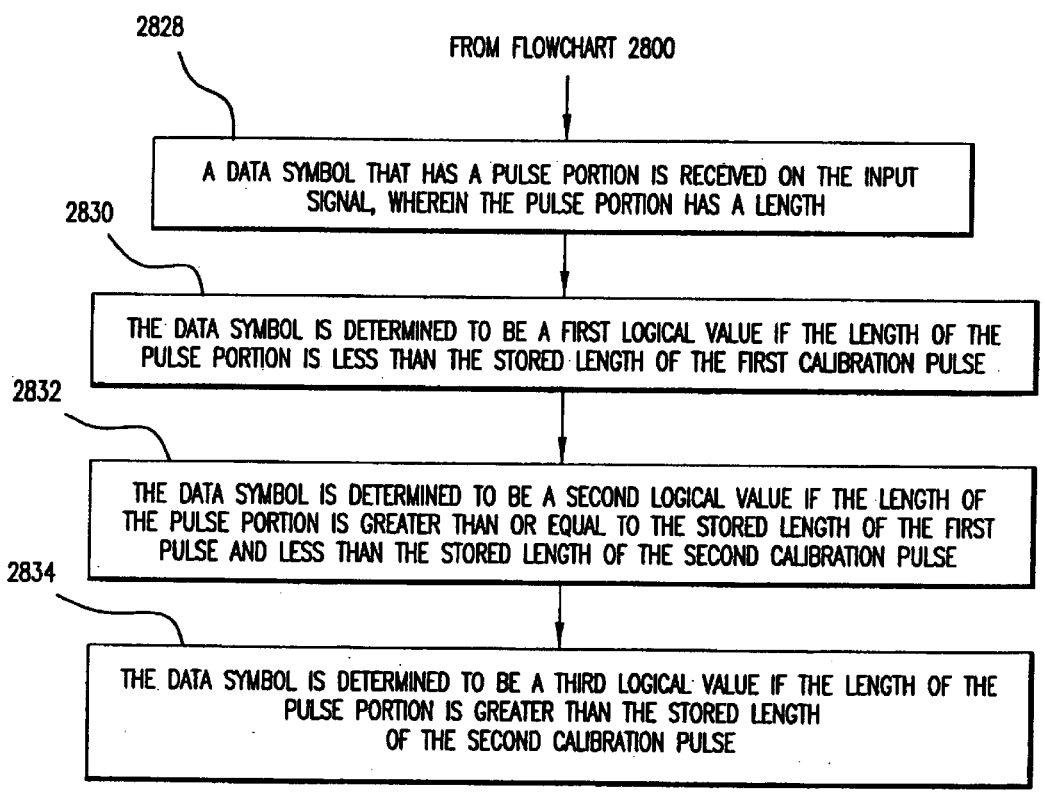
Figure 28D:
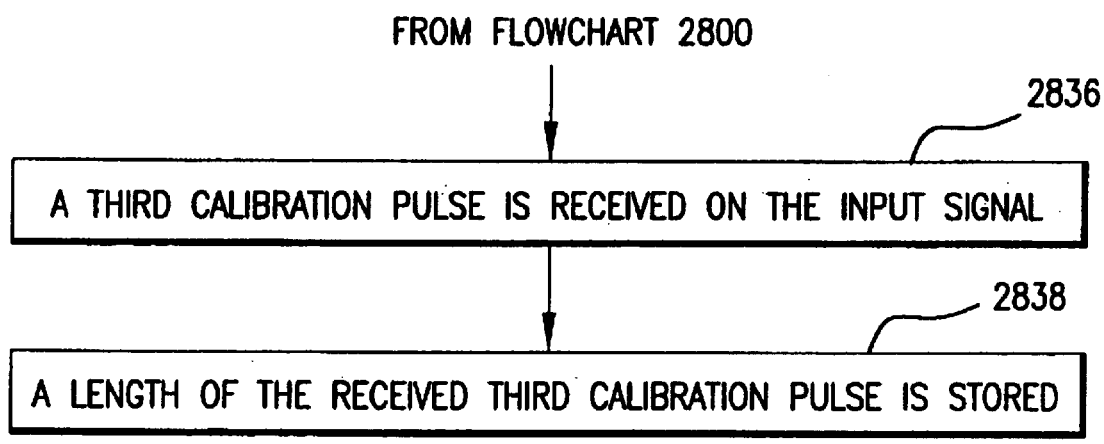

FIG. 28A shows a flowchart 2800 providing steps for performing data calibration, according to embodiments of the present invention. FIGS. 28B–D provide steps according to further embodiments. The steps of FIGS. 28A–D do not necessarily have to occur in the order shown, as will be apparent to persons skilled in the relevant art(s) based on the teachings herein. Additional structural embodiments for performing the steps of FIGS. 28A–D will be apparent to persons skilled in the relevant art(s) based on the following discussion. These steps are described in detail below.

Flowchart 2800 begins with step 2802. In step 2802, a first calibration pulse is received on an input signal. For example, the first calibration pulse is the pulse of first calibration waveform 2602, which is received on input signal 2100. The first calibration pulse may be received at counter 1028, as shown in FIG. 27.

In step 2804, a length of the first calibration pulse is stored. For example, counter 1028 determines the length of the pulse of first calibration waveform 2602, and outputs the length of the pulse on count word 1074. T0 register 2702 receives count word 1074, and stores the length of the pulse of first calibration waveform 2602.

In step 2806, a second calibration pulse is received on the input signal. For example, the second calibration pulse is the pulse of second calibration waveform 2604, which is received on input signal 2100. The second calibration pulse may be received at counter 1028.

In step 2808, a length of the second calibration pulse is stored. For example, counter 1028 determines the length of the pulse of second calibration waveform 2604, and outputs the length of the pulse on count word 1074. T1 register 2704 receives count word 1074, and stores the length of the pulse of second calibration waveform 2604.

FIG. 28B illustrates additional steps for flowchart 2800 of FIG. 28A, according to further embodiments of the present invention. In the embodiment described in reference to FIG. 28A, the data symbol calibration procedure receives and stores two data calibration pulses. FIG. 28B describes the detection of a received data symbol using the received and stored data calibration pulses.

In step 2810, a data symbol having a pulse portion is received on the input signal, wherein the pulse portion has a third length. For example, the data symbol may be one of the received data symbols shown in FIGS. 3–5. The pulse portion is the data symbol portion between falling and rising edges of the pulse of the respective waveform of FIGS. 3–5, such as $T_A$, $T_B$, and $T_C$. Hence, the length of the pulse portion of the data symbols shown in FIGS. 3–5 may be $T_A$, $T_B$, and $T_C$, respectively.

In step 2812, a first flag is set if the length of the pulse portion is greater than or equal to the stored length of the first calibration pulse. For example, the first flag may be T0 flag 2714 of data calibration logic 2708, as shown in FIG. 27. Data calibration logic 2708 performs a comparison of the incrementing value of count word 1074 to the contents of T0 register 2702, and sets T0 flag 2714 if they become equal. For illustrative purposes, for steps 2812 through 2820, $T_{T0}$ is assumed to be equal to 4.5 $\mu$S and $T_{T1}$ is assumed to be equal to 7.75 $\mu$S. In this example, T0 flag 2714 would become set during step 2812 when receiving the data symbols shown in FIGS. 4 and 5, which have respective lengths of 6 $\mu$S and 9.5 $\mu$S.

In step 2814, a second flag is set if the third length is greater than or equal to the stored length of the second calibration pulse. For example, the second flag may be T1 flag 2716 of data calibration logic 2708, as shown in FIG. 27. Data calibration logic 2708 performs a comparison of the incrementing value of count word 1074 to the contents of T1 register 2704, and sets T1 flag 2716 if they become equal. In the current example, T1 flag 2716 would become set when receiving the data symbol shown in FIG. 5, which has a length of 9.5 $\mu$S.

In step 2816, the third pulse is determined to be a first logical value if the first flag is not set during step 2812. In the current example, the data symbol shown in FIG. 3 is determined to be a first logical value because T0 flag 2714 was not set during step 2812.

In step 2818, the third pulse is determined to be a second logical value if the first flag is set and the second flag is not set. In the current example, the data symbol shown in FIG. 4 is determined to be a second logical value because T0 flag 2714 was set during step 2812, and T1 flag 2716 was not set during step 2814.

In step 2820, the third pulse is determined to be a third logical value if the first flag is set and the second flag is set. In the current example, the data symbol shown in FIG. 5 is determined to be a third logical value because T0 flag 2714 was set during step 2812, and T1 flag 2716 was set during step 2814.

In step 2822, the first logical value is defined as a logical "0" bit. In embodiments, the first logical value may alternatively be defined as a logical "1" bit, a "NULL" bit, or other logical value.

In step 2824, the second logical value is defined as a logical "1" bit. In embodiments, the second logical value may alternatively be defined as a logical "0" bit, a "NULL" bit, or other logical value.

In step 2826, the third logical value is defined as a logical "NULL" bit. In embodiments, the third logical value may alternatively be defined as a logical "0" bit, a logical "1" bit, or other logical value.

FIG. 28C illustrates additional steps for flowchart 2800 of FIG. 28A, according to further embodiments of the present invention. Similarly to the embodiment described in reference to FIG. 28B, the data symbol calibration procedure of FIG. 28C only requires two data calibration pulses to be received and stored:

In step 2828, a data symbol having a pulse portion is received on the input signal, wherein the pulse portion has a length. For example, the data symbol may be one of the received data symbols shown in FIGS. 3–5. The pulse portion is the data symbol portion between falling and rising edges of the pulse of the respective waveform of FIGS. 3–5, such as $T_A$, $T_B$, and $T_C$. Hence, the length of the pulse portion of the data symbols shown in FIGS. 3–5 may be $T_A$, $T_B$, and $T_C$, respectively.

In step 2830, the data symbol is determined to be a first logical value if the length of the pulse portion is less than the stored length of the first calibration pulse. For example, data calibration logic 2708 compares the length of the pulse portion to the value stored in T0 register 2702. If the length of the pulse portion is less than the value stored in T0 register 2702, the data symbol is determined to the first logical value. For illustrative purposes, for steps 2830 through 2834, $T_{T0}$ is assumed to be equal to 4.5 $\mu$S and $T_{T1}$ is assumed to be equal to 7.75 $\mu$S. In this example, when the data symbol is the data symbol shown in FIG. 3, which has a length of 3 $\mu$S, the data symbol would be determined to be the first logical value. This is because the length of the pulse shown in FIG. 3 is less than the length of the pulse of first calibration waveform 2602 (i.e., 4.5 $\mu$S), which is stored in T0 register 2702.

In step 2832, the data symbol is determined to be a second logical value if the length of the pulse portion is greater than or equal to the stored length of the first pulse and less than the stored length of the second calibration pulse. For example, data calibration logic 2708 compares the length of the pulse portion to the value stored in T0 register 2702 and the value stored in T1 register 2704. If the length of the pulse portion is greater than or equal to the value stored in T0 register 2702, and less than the value stored in T1 register 2704, the data symbol is determined to the second logical value. In this example, when the data symbol is the data symbol shown in FIG. 4, which has a length of 6 $\mu$S, the third pulse would be determined to be the second logical value. This is because the length of the pulse shown in FIG. 4 is greater than the length of the pulse of first calibration waveform 2602 (i.e., 4.5 $\mu$S), which is stored in T0 register 2702, and less than the length of the pulse of second calibration waveform 2604 (i.e., 7.75 $\mu$S), which is stored in T1 register 2704.

In step 2834, the data symbol is determined to be a third logical value if the length of the pulse portion is greater than the stored length of the second pulse. For example, data calibration logic 2708 compares the length of the pulse portion to the value stored in T1 register 2704. If the length of the pulse portion is greater than or equal to the value stored in T1 register 2704, the data symbol is determined to the third logical value. In this example, when the data symbol is the data symbol shown in FIG. 5, which has a length of 9.5 $\mu$S, the data symbol would be determined to be the third logical value. This is because the length of the pulse shown in FIG. 5 is greater than the length of the pulse of second calibration waveform 2604 (i.e., 7.75 $\mu$S), which is stored in T1 register 2704.

FIG. 28D illustrates additional steps for flowchart 2800, according to further embodiments of the present invention. The data symbol calibration procedure of FIG. 28D receives and stores three data calibration pulses:

In step 2836, a third calibration pulse is received on the input signal. For example, the third calibration pulse is the pulse of third calibration waveform 2606, which is received on input signal 2100. The third calibration pulse may be received at counter 1028, as shown in FIG. 27.

In step 2838, a length of the third calibration pulse is stored. For example, counter 1028 determines the length of the pulse of third calibration waveform 2606, and outputs the length of the pulse on count word 1074. T2 register 2706 receives count word 1074, and stores the length of the pulse of third calibration waveform. The value stored in T2 register 2706 may have a variety of uses. For example, in an embodiment, $T_{T2}$ indicates a time at which tag 102 must stop transmitting data to a reader network 104. After $T_{T2}$, tag 102 prepares for the falling edge of the next data symbol.

In embodiments, after performing steps 2836 and 2838 shown in FIG. 28D, data symbols may be received and evaluated to determine their logical values, as is described above.

Figure 28E:
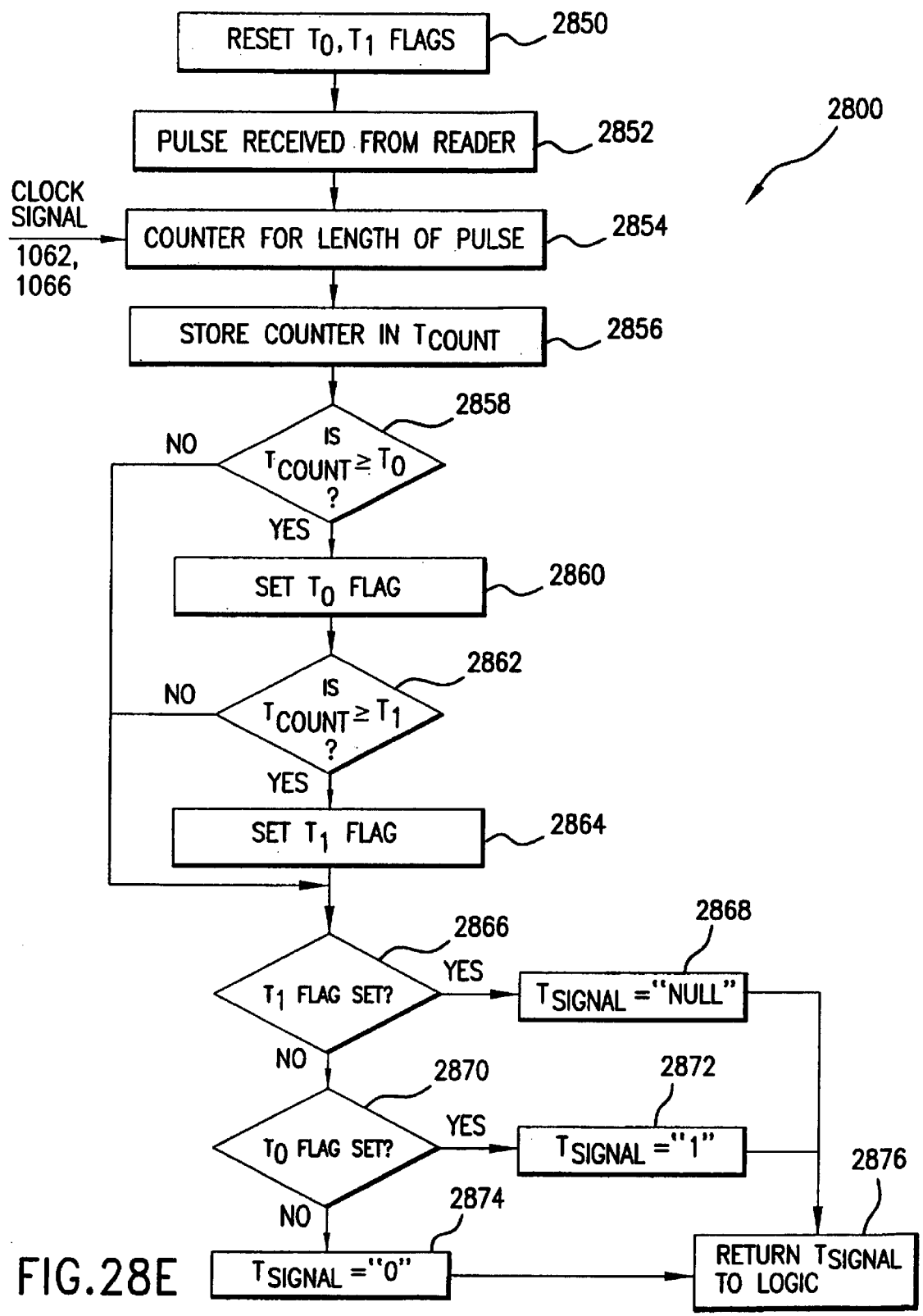

FIGS. 28E–F show flowcharts that provide more detailed exemplary steps for performing data detection as described in FIGS. 28B–C, according to embodiments of the present invention. The steps of FIGS. 28E–F do not necessarily have to occur in the order shown, as will be apparent to persons skilled in the relevant art(s) based on the teachings herein. Additional structural embodiments for performing the steps of FIG. 28E–F will be apparent to persons skilled in the relevant art(s) based on the following discussion. In particular, the embodiment shown in FIG. 28E shows more detail of flowchart 2800 as shown in FIG. 28B, while the embodiment shown in FIG. 28F shows more detail of flowchart 2800 as shown in FIG. 28C. A flowchart shown in FIG. 28E is described as follows:

In step 2850, a T0 flag and a T1 flag are reset. For example, the T0 flag is T0 flag 2714 and the T1 flag is T0 flag 2716.

In step 2852, a pulse, such as a data symbol pulse portion, is received from a reader in reader network 104.

In step 2854, the length of the pulse is counted by a counter. For example, counter 1028 counts the length of the pulse portion of a data symbol according to master clock signal 1062, first clock signal 1066, or second clock signal 1064.

In step 2856, the counter contents are stored in $T_{count}$. $T_{count}$ represents the length of the received data symbol pulse portion.

In step 2858, $T_{count}$ is compared to the stored value for T0. If $T_{count}$ is greater than or equal to T0, operation proceeds to step 2860, where the T0 flag is set, and operation proceeds to step 2862. If $T_{count}$ is not greater than or equal to T0, operation proceeds to step 2866.

In step 2862, $T_{count}$ is compared to the stored value for T1. If $T_{count}$ is greater than or equal to T1, operation proceeds to step 2864, where the T1 flag is set, and operation proceeds to step 2866. If $T_{count}$ is not greater than or equal to T1, operation proceeds to step 2866.

In step 2866, if the T1 flag is set, operation proceeds to step 2868, where the received signal is determined to be a "NULL" symbol. If the T1 flag is not set, operation proceeds to step 2870.

In step 2870, if the T0 flag is set, operation proceeds to step 2872, where the received signal is determined to be a "1" symbol. If the T0 flag is not set, operation proceeds to step 2874.

In step 2874, the received signal is determined to be a "0" symbol.

Operation proceeds from steps 2868, 2872, and 2874 to step 2876. In step 2876, the determined symbol is returned to logic in tag 102 for any applicable use.

FIG. 28F shows a flowchart similar to that shown in FIG. 28E, where steps 2860, 2864, 2866, and 2870 are not necessary.

Note that the above described embodiments refer to the data symbols and data calibration pulses as being "negative-going" pulses, which have a falling edge followed by a rising edge. However, the present invention is also applicable to the data symbols and data calibration pulses being "positive-going" pulses, having a rising edge followed by a falling edge. The present invention is also applicable to any combination of negative-going and positive-going pulse types for signals, including the data symbols and data calibration pulse signals.

The embodiments above describe the transmission of two and three calibration pulses to remotely program one or more tags 102 to interpret two or more data symbol types (e.g., logical "0," "1," and "NULL" data symbols). Furthermore, the present invention is applicable to the use of additional calibration pulses to remotely program one or more tags 102 to interpret any number of additional data symbol types. For example, calibration pulses may be transmitted to define the timing boundaries in one or more tags 102 for data symbols that represent multiple bits, such as "00," "01," "10," "11," "001," and for further data symbols.

5. Front End Embodiments of the Present Invention

Figure 30:
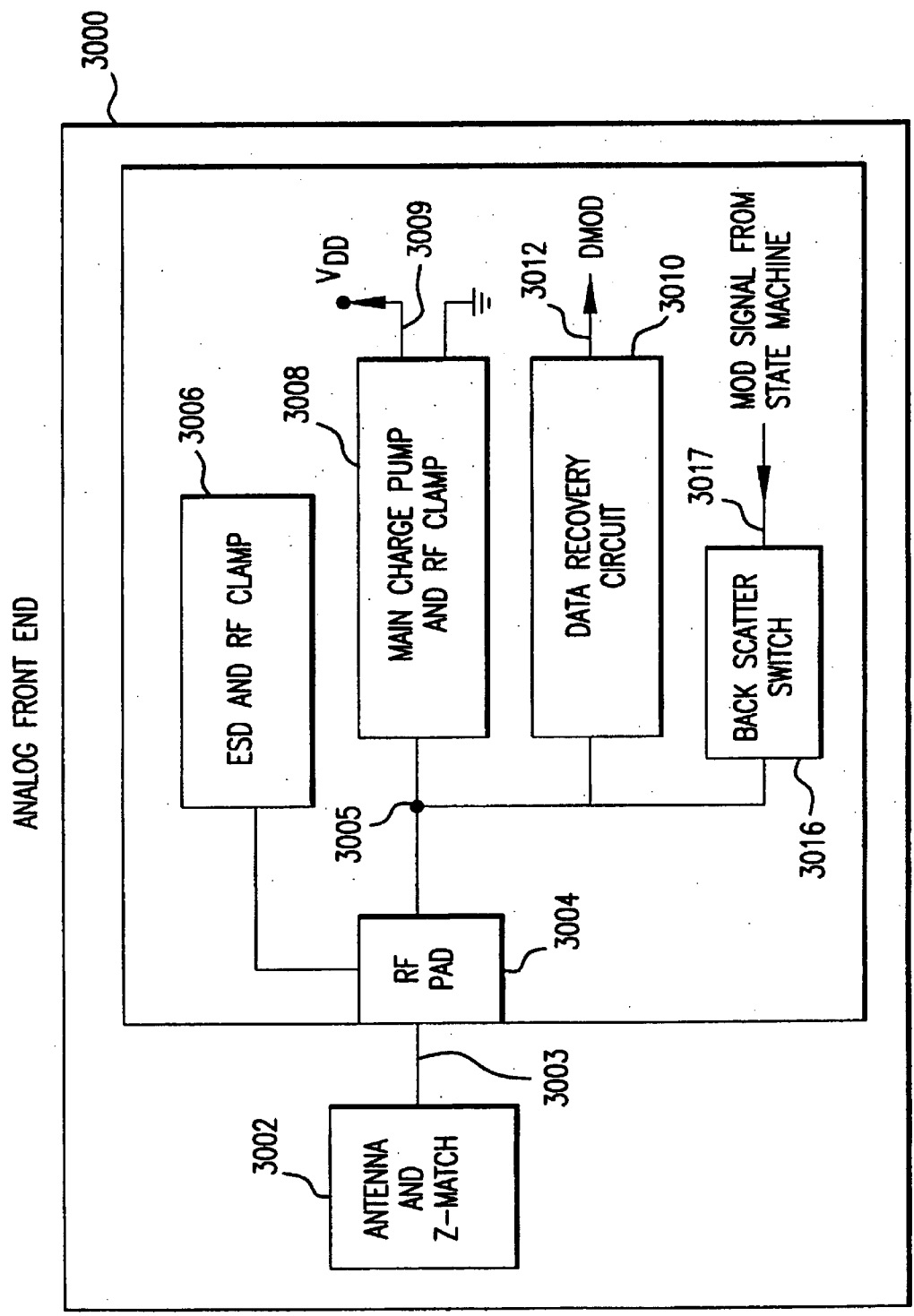
FIG. 30 illustrates an analog front-end of an exemplary RF tag, according to an embodiment of the present invention.

FIG. 30 illustrates an analog front-end 3000 of an exemplary RF tag described herein. The analog front 3000 includes an antenna 3002, an RF pad 3004, an electrostatic device (ESD) protection circuit 3006, a power charge pump 3008, a data recovery circuit 3010, and a backscatter switch 3016. The antenna 3002 receives a RF signal 3003 that is transmitted by the tag reader, and provides the RF signal 3003 to the RF pad 3004. The RF signal 3003 can be modulated to carry information, e.g. polling query, from the reader to the tag. As will be discussed further herein, the energy in the RF signal 3003 can also be harvested to power the analog front 3000 and the rest of the tag.

The ESD protection circuit 3006, the power charge pump 3008, and the data recovery circuit 3010 are connected to the RF pad 3004, and are arranged in-parallel with each other at node 3005. This enables the mentioned circuits to simultaneously process the RF signal 3003 for both data recovery and for power generation. The ESD protection circuit 3006 provides over-voltage protection for the analog front 3000, such as from static discharge. The ESD protection circuit 3006 also provides protection from RF signals 3003 that could damage the analog front 3000. For example, this can occur when a tag is very close, or adjacent to, a transmitting reader. The power charge pump 3008 converts the RF signal 3003 to a DC voltage VDD at an output terminal 3009. More specifically, the power charge pump 3008 rectifies the RF signal 3003, increases the voltage amplitude, and generates an output voltage VDD. The DC voltage VDD is sufficiently stable so that it can be used as a voltage supply for the analog front 3000, and also for the rest of the tag. The data recovery circuit 3010 process the RF signal 3003 in parallel with the power charge pump 3008 and generates a digital output signal at the output terminal 3012. The back scatter switch 3016 receives a modulated data signal at a terminal 3017, and gates the impedance of the antenna 3002 to transmit the modulated data signal back the reader. More specifically, the backscatter switch 3016 shorts the input impedance seen at the RF pad 3004, so that the RF signal 3003 is reflected back to the reader in accordance with the modulated data signal that is received at the terminal 3017.

The analog front-end 3000 in FIG. 30 can be related back to the tag 1001 that is shown in FIG. 10. More specifically, in one embodiment, the receiver 1030 is the data recovery circuit 3010. The modulator 1034 is the back scatter switch 3016. The charge pump 1032 is the main charge pump and RF clamp 3008. The RF pad 1004 is the RF pad 3004. The antenna 1010 is the antenna and Z-match 3002.

5.1 Power Charge Pump

Figure 31:
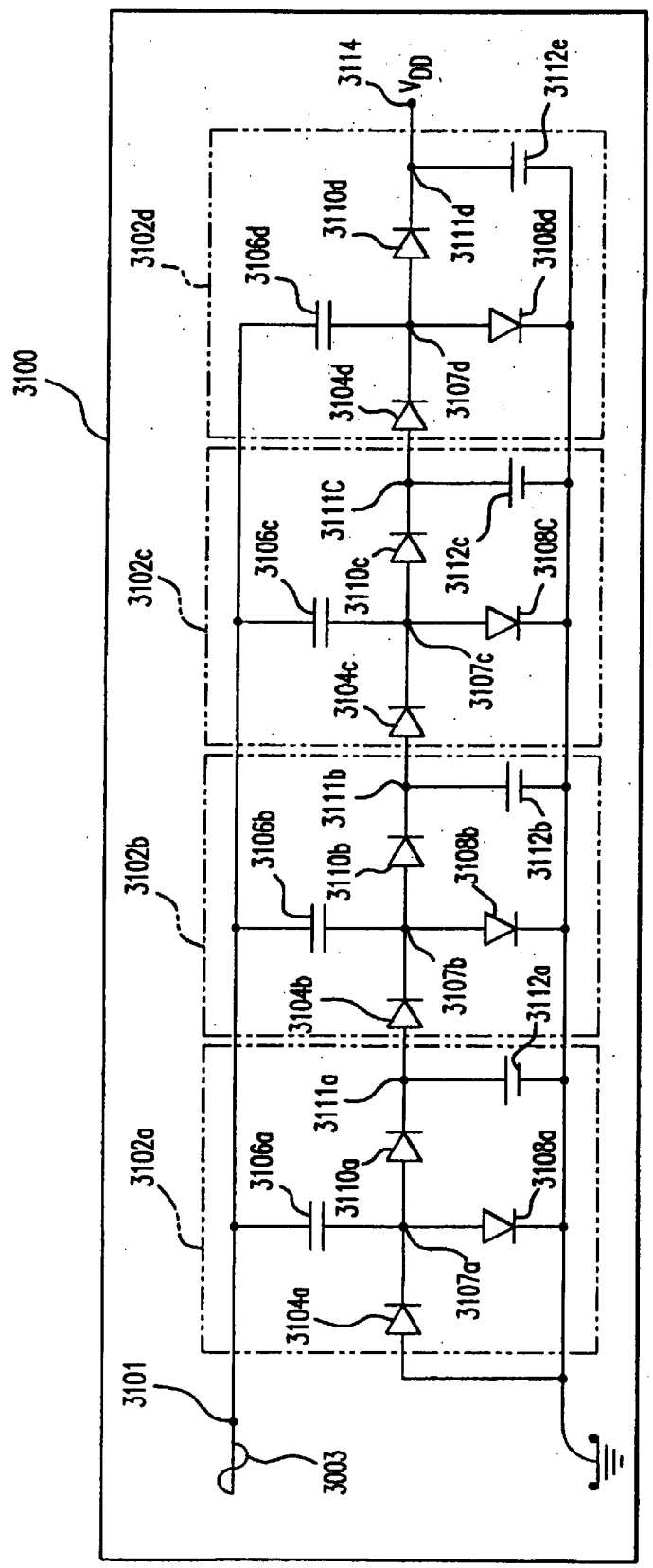
FIG. 31 illustrates a power charge pump that is an embodiment of the main charge pump of the analog front-end shown in FIG. 30.

FIG. 31 illustrates a power charge pump 3100 that is one embodiment of the power charge pump 3008 of the analog front-end 3000. The power charge pump 3100 rectifies the RF signal 3003 received at an input terminal 3101, increases the voltage amplitude, and generates the output DC voltage VDD at an output terminal 3114. The output voltage VDD is sufficiently stable that it can be used as a voltage supply for the rest of the tag, including the data recovery circuit 3010. More specifically, once a steady state voltage is reached, further increases in the power level of the RF signal 3003 produce smaller increases the output DC voltage VDD. This occurs because the efficiency of the charge pump 3100 is designed to intentionally decrease once the RF signal 3003 reaches a threshold power level.

The charge pump 3100 includes multiple stages 3102a–d. Any number of stages 3102 could be utilized, and four stages are shown in FIG. 31 for convenience of discussion only. Each stage 3102 includes a diode 3104, a diode 3108, a diode 3110, and a capacitor 3106. The capacitor 3106 in each stage is connected to a central node 3107 and to the input terminal 3101 so that each stage 3102 simultaneously receives the input signal 3003. The diodes 3104 and 3108 in each stage are connected between ground and the central node 3107. More specifically, the anode of the diode 3104 is connected to the node 3111 in the prior stage 3102 (expect for the first stage 3102 a where the anode of diode 3104a is connected directly to ground), and the cathode of the diode 3104 is connected to the central node 3107. The diode 3110 in each stage is connected between the node 3107 and a second node 3111, which connects to the following or adjacent stage 3102. More specifically, the anode of the diode 3110 is connected to the central node 3107, and the cathode of the diode 3110 is connected to the second node 3111.

Figure 32A:
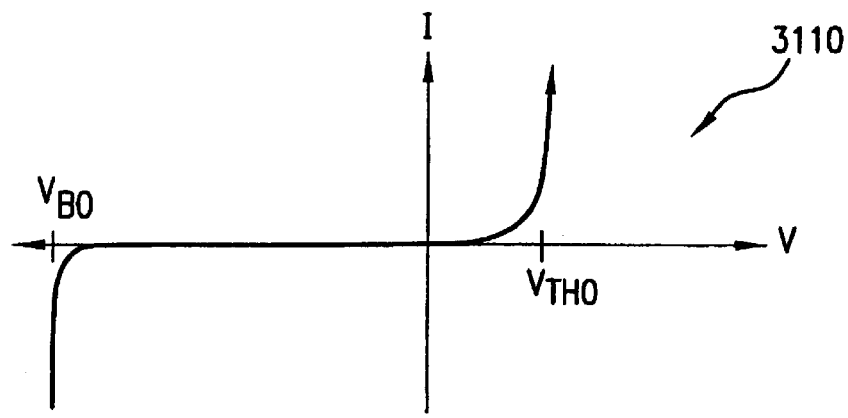
FIGS. 32A–32C illustrate diode curves associated with the diodes in the power charge pump 3100.
Figure 32B:
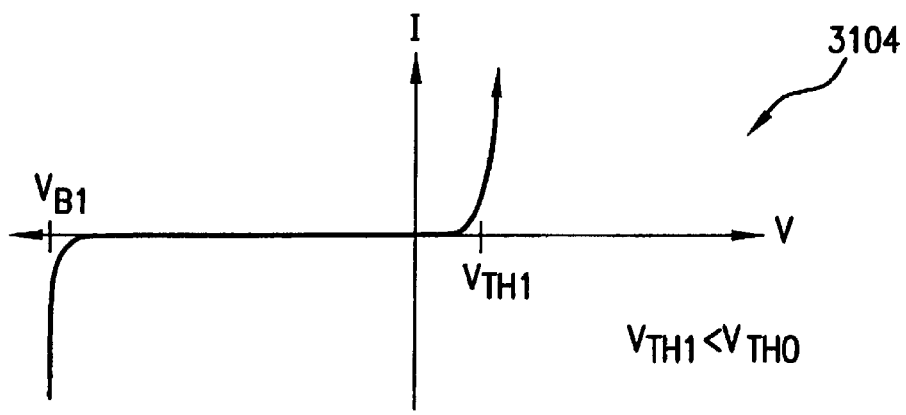
Figure 32C:
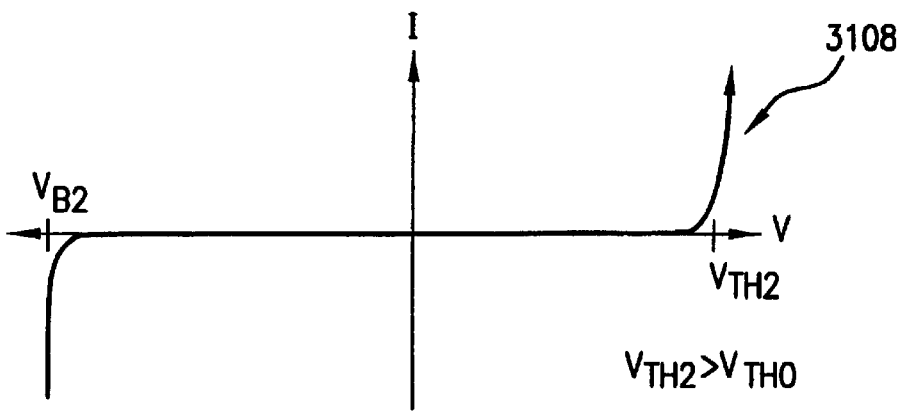

FIGS. 32A–32C illustrate the desired current voltage curves (i.e. IV curves) for the respective diodes 3110, 3104, and 3108. All the diodes 3110, 3104, and 3108 have respective forward threshold voltage $V_{TH0}$, $V_{TH1}$, and $V_{TH2}$, where the current begins to flow in the forward direction once the forward threshold voltage is reached. Comparing FIGS. 32A–32C, $V_{TH1} < V_{TH0} < V_{TH2}$. Therefore, the diodes 3104 should conduct before the diodes 3110 in a low power RF environment. As will be discussed further herein, the diodes 3108 are intended to bleed charge from the charge pump 3100 when the RF power level reaches a threshold level. Hence, the $V_{TH2}$ is set higher than $V_{TH0}$ or $V_{TH1}$, so the charge is not bled off too soon. Additionally, the diodes 3110, 3104, and 3108 have respective breakdown voltages $V_{B1}$, $V_{B2}$, and $V_{B3}$, where charge begins to flow in the reverse direction once the reverse breakdown voltage is reached.

As will be discussed further herein, the diodes 3104, 3108, and 3110 can be implemented using MOSFET equivalent diode structures that approximate the operation of a diode. In one embodiment, the traditional MOSFET device for the diodes 3110 and 3104 is modified to increase the conductivity of the diode, and to cause the diode to conduct at a lower RF signal level.

The operation of the charge pump 3100 is as follows. The RF signal 3003 is simultaneously applied to each stage 3102 through the capacitors 3106. During a positive cycle of the RF signal 3003, the capacitor 3106 in each stage transfers charge to the node 3107. The diode 3110 is forward biased by the charge on the node 3107, causing the diode 3110 to conduct and transfer the charge from the node 3107 to the node 3111. The charge on the node 3111 is stored on the capacitor 3112 until the next positive RF cycle. The diode 3104 is reversed biased during the positive cycle and therefore do not conduct any charge. The diode 3108 is forward biased, but does not conduct any charge unless the charge on node 3107 exceeds its increased threshold voltage. During the negative cycle of the RF signal 3003, the diode 3104 is forward biased and conducts charge from the node 3111 in one stage 3102 to the node 3107 in an adjacent stage 3102 (except for 3104a which also transfers charge from ground to node 3107a). Charge is also transferred from ground to the node 3111 through the capacitor 3112. The diodes 3110 and 3108 are reversed biased and do not conduct any charge. During the next positive cycle, the diode 3110 is again forward biased, moving charge from node 3107 to the node 3111 within each stage. The charge that is moved from the node 3107 to the node 3111 includes both the charge accumulated on the node 3107 during the positive cycle, but also the charge the accumulated on the node 3107 from the negative cycle. Over multiple cycles of the RF signal 3003, charge accumulates and increases as moves it through the stages 3102a–3102d, and the corresponding voltage is added in-series at the capacitors 3112. The accumulated charge at the output node 3112e is converted to a DC voltage $V_{DD}$ by the final capacitor 3112e. The DC voltage $V_{DD}$ can be tapped and used as voltage supply at the output terminal 3114.

As stated above, the charge steadily increases as it moves through the stages 3102a to 3102d to the output node 3114 because of the additional charge added by each stage 3102 during each full cycle of the RF signal 3003. Therefore, the charge at the node 3114 increases with the number of stages 3102, and causes the DC voltage $V_{DD}$ at the node 3114 to have a larger amplitude than the amplitude of the RF signal 3003. Theoretically, the DC voltage $V_{DD}$ would grow at infinitum with the number of stages 3102. However, parasitic resistance and capacitances of real circuit elements begin to become significant as more and more stages are added, reducing the overall efficiency of the charge pump. Furthermore, the overall circuit size also increases with the number of stages. Experiments have shown that four stages are an efficient design, but any number of stages could be utilized based on the specific circuit application.

It is desirable for the output voltage $V_{DD}$ to be relatively stable value since it is being used as a voltage supply for the rest of the tag. The charge that is accumulated at each stage 3102 is directly proportional to the power level of the RF signal 3003. In other words, the larger the amplitude of the RF signal 3003, the more charge is transferred to the nodes 3107 and 3111 in each stage 3102. Therefore, without regulation, large RF power levels could generate a DC voltage $V_{DD}$ that is sufficiently large to damage the components of the tag. However, the diodes 3108 prevent this from happening by conducting when the amplitude of the RF signal 3003 becomes so large that the voltage at the nodes 3107 exceeds the threshold voltage $V_{TH2}$ of the diodes 3108. The threshold voltage of the diodes is set so that these diodes conduct for a given RF power level. When the diodes 3108 conduct, then charge is removed or "bled" from the nodes 3107 to ground through the diodes 3108. The charge that is bled-off to ground does not make it to the output node 3114, and therefore does not increase the DC voltage at the output node 3114. Furthermore, once the diodes 3108 begin to conduct, a resistive RF ground is placed at the nodes 3107, causing an impedance mismatch at the input terminal 3101. The impedance mismatch de-tunes the antenna 3002 causing it to reflect some of the RF signal 3003 away. The result is that the overall efficiency of the charge pump 3100 begins to decrease once the diodes 3108 begin to conduct, regulating the output voltage $V_{DD}$ to a pre-determined voltage.

Figure 33A:
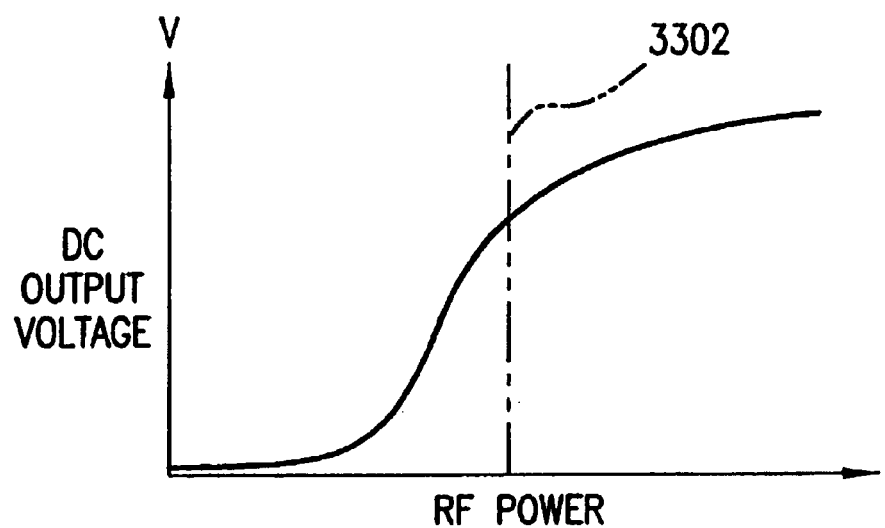
FIGS. 33A and 33B illustrate a DC output voltage and charge pump efficiency verses the RF input power when using diodes to limit the output voltage of the power charge pump 3100.
Figure 33B:
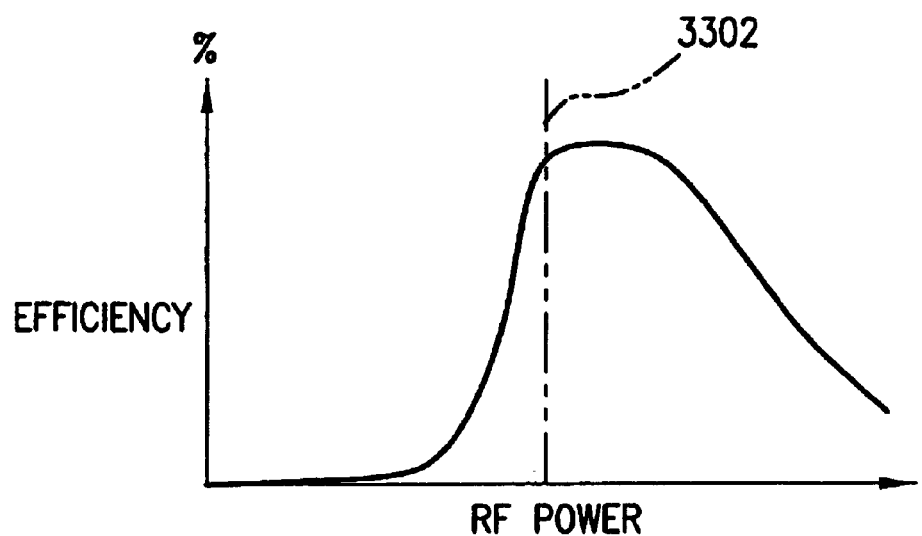

FIGS. 33A and 33B illustrate the DC output voltage and charge pump efficiency verses the RF input power when using the diodes to limit the output voltage of the charge pump 3100. FIG. 33B illustrates the efficiency vs. RF input power, and illustrates that the efficiency peaks at an RF power level 3302, and then rolls off for RF power that is greater than this. FIG. 33A illustrates the DC output voltage verses RF input power, given the efficiency curves in FIG. 33B. As shown in FIG. 33A, the output voltage rises non-linearly with the RF input power until the efficiency peak at 3302. At which point, the DC output voltage only increases at a much slower linear rate.

Figure 34A:
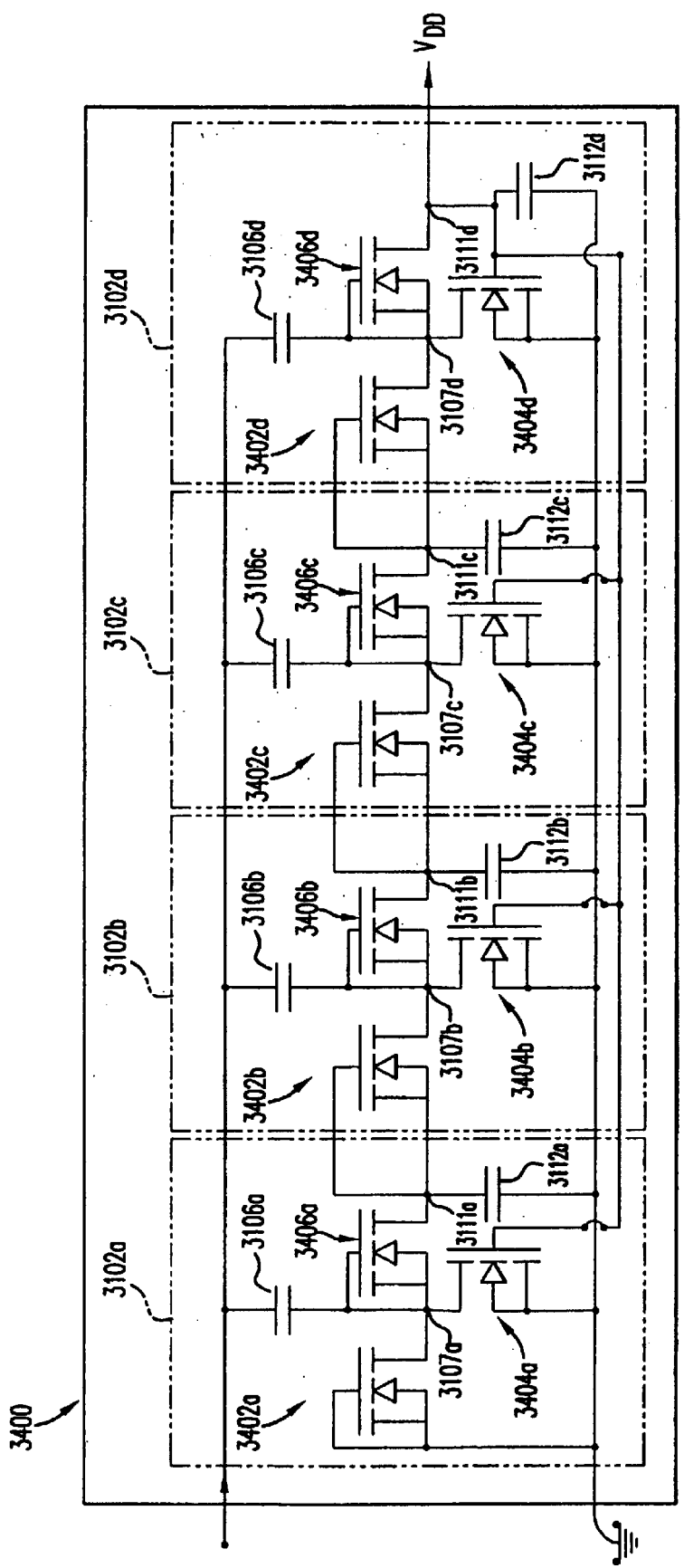
FIGS. 34A and 34B further illustrate charge pumps, according to embodiments of the present invention, where the diodes in each stage are replaced with metal oxide field effect transistors (MOSFET) that are configured as diode equivalents devices.

FIG. 34 further illustrates one embodiment 3400 for the charge pump 3100, where the diodes in each stage 3102 are replaced with metal oxide field effect transistors (MOSFET) that are configured as diode equivalents devices. For example, the diodes 3104 in each stage 3102 are configured as MOSFET diodes 3402, the diodes 3108 are configured as single or stacked MOSFET devices 3404, and the diodes 3110 are configured as MOSFET diodes 3406. The terminals of the MOSFETs diodes 3402 and 3406 are connected to produce diode equivalent circuits. Additionally, the terminals of the mentioned MOSFET diodes 3402 and 3406 are connected so as effectively reduce the threshold voltage of the MOSFET diodes. This improves the operation of the charge pump 3100 in a low power environment, such as when the tag is far away from the reader.

The threshold voltage for the MOSFET diodes 3402 and 3406 is reduced by connecting the body terminal, the source terminal, and gate terminal all together for each of the MOSFETs diodes. Whereas, in a conventional MOSFET diode configuration, the source and body terminals are connected together, but the gate terminal is connect to the drain terminal to create the two terminal diode circuit. By connecting the gate terminal with the source and drain terminals, the characteristics of the MOSFET diode are modified so that the threshold voltage of the MOSFET diode is lowered, which causes the MOSFET diode to conduct in a lower power environment than it normally would, and the MOSFET diode doesn't conduct in the reverse direction. As a result, the charge pump 3100 is able to generate a useful DC voltage at the output terminal 3114, even when the tag is located far away from the reader. The modified MOSFET diode structure is compared with a conventional diode structure below.

Figure 34B:
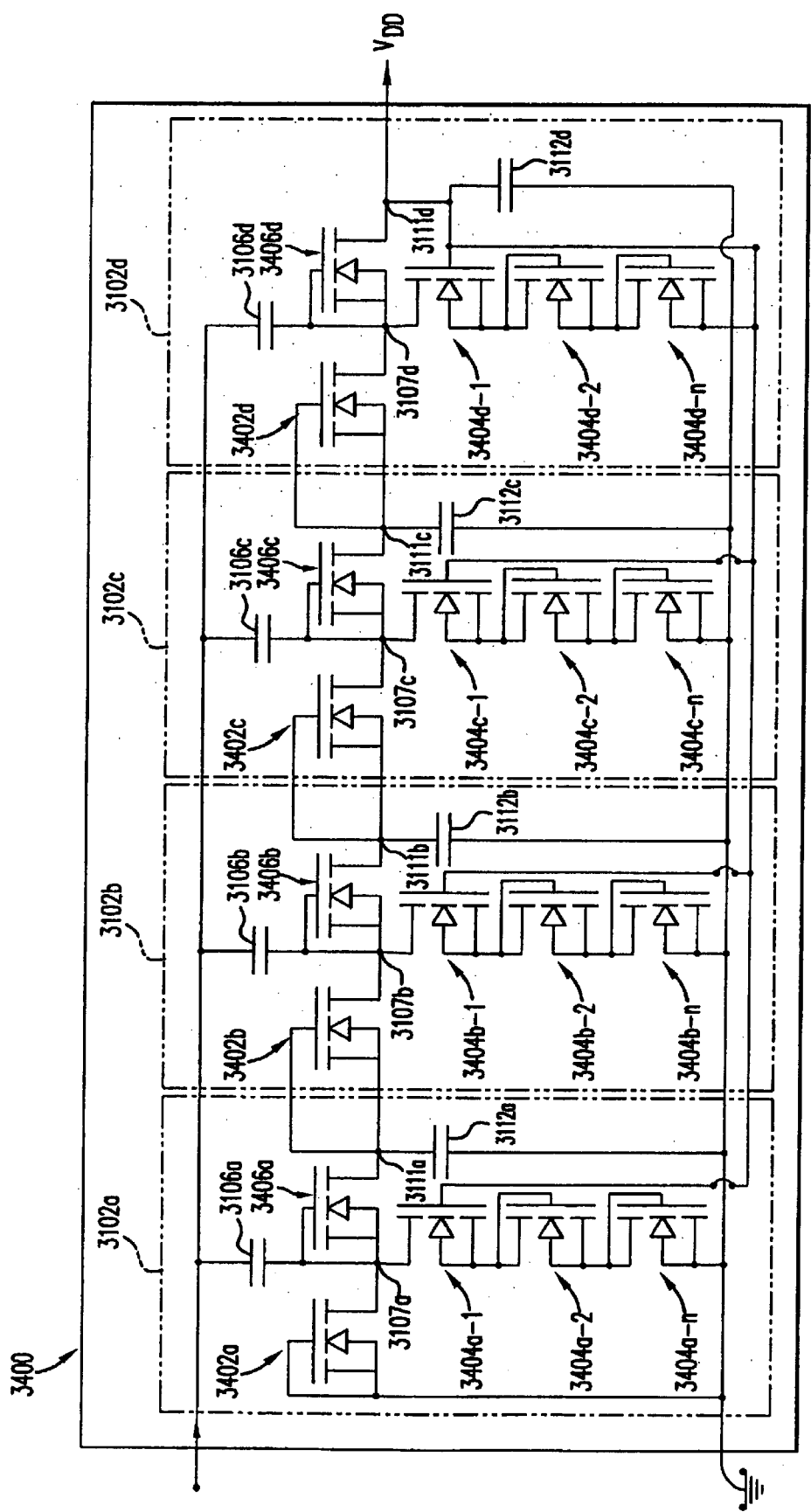

The terminals of the MOSFETs 3404 are connected to so the MOSFETs 3404 operate as regular MOSFET devices, as opposed to MOSFET diodes 3402 and 3406. More specifically, in the MOSFET devices 3404, the respective gate terminals are not connected to the body and source terminals, as in the MOSFETs diodes 3402 and 3406. The threshold of the devices 3404 is increased by either a fabrication process adjustment, or by stacking the devices as shown in FIG. 34B. However, in this configuration, the MOSFET devices 3404 conduct in the reverse direction (i.e. negative bias voltage), so the MOSFET device 3404 does not operate as a true diode. Further details regarding the IV curves for the MOSFETs diodes 3402 and 3404, and the MOSFET devices 3406 will be discussed herein.

Figure 35A:
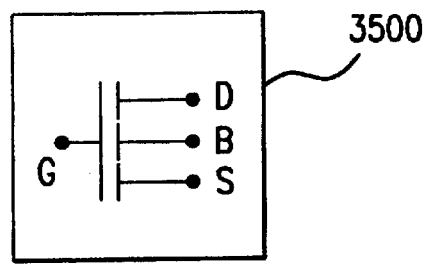
FIGS. 35A and 35B illustrate an unbiased MOSFET having a gate terminal, a drain terminal, a body terminal, and a source terminal.
Figure 35B:
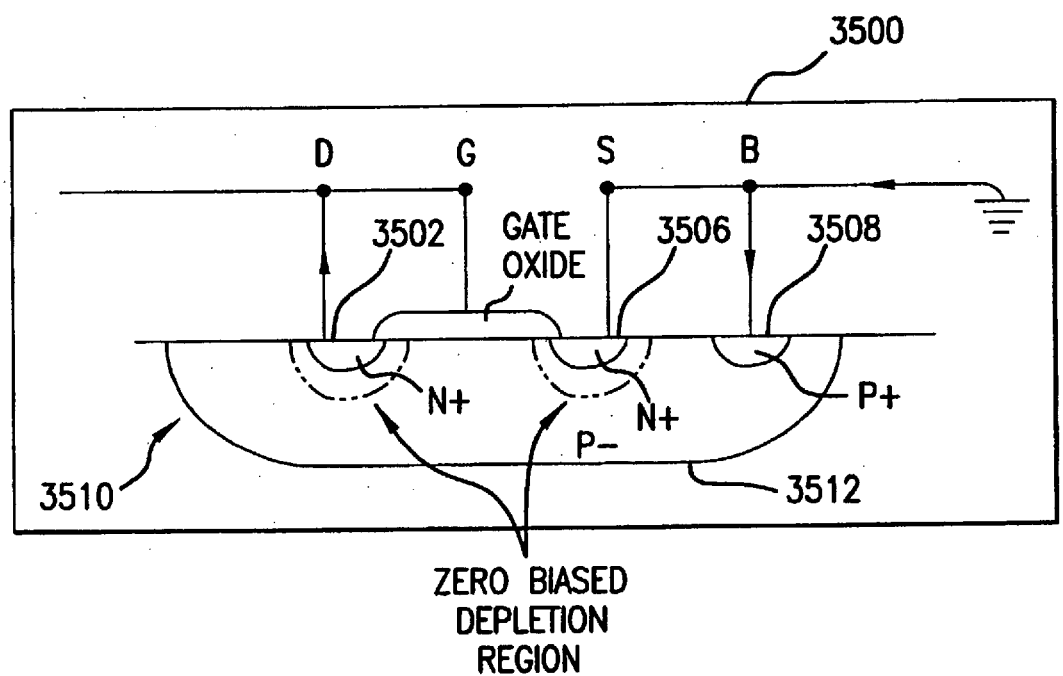

FIGS. 35A and 35B illustrate an unbiased MOSFET 3500 having a gate terminal, a drain terminal, a body terminal, and a source terminal. FIG. 35B illustrates a cross-sectional view a conventional MOSFET. Referring to FIG. 35B, an underlying substrate 3510 has a lightly p-doped well 3512. The p-doped well 3512 has two N+ regions 3502 and 3506, a P+ region 3508, and a gate oxide 3504 that is disposed on top of the p-doped well 3512. The gate terminal is connected to a conductive region 3503, such as aluminum, that is disposed on top of the gate oxide layer 3304. The drain and source terminals are connected to respective N+ layer 3502 and 3506, and the body terminal is connected to the P+ region 3508. It is noted that the drain and source designations are interchangeable, and these labels are only utilized for convenience of discussion. The source and drain of the MOSFET 3500 form N+/P diodes with the p-well 3512, where the depletion region extends mostly in the P⁻ well 3512, as is shown in the FIG. 35B.

Figure 36A:
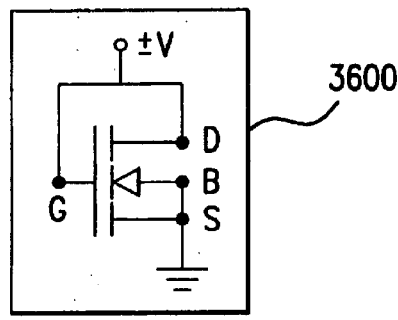
FIGS. 36A–36C illustrate a MOSFET biased as a conventional load device.
Figure 36B:
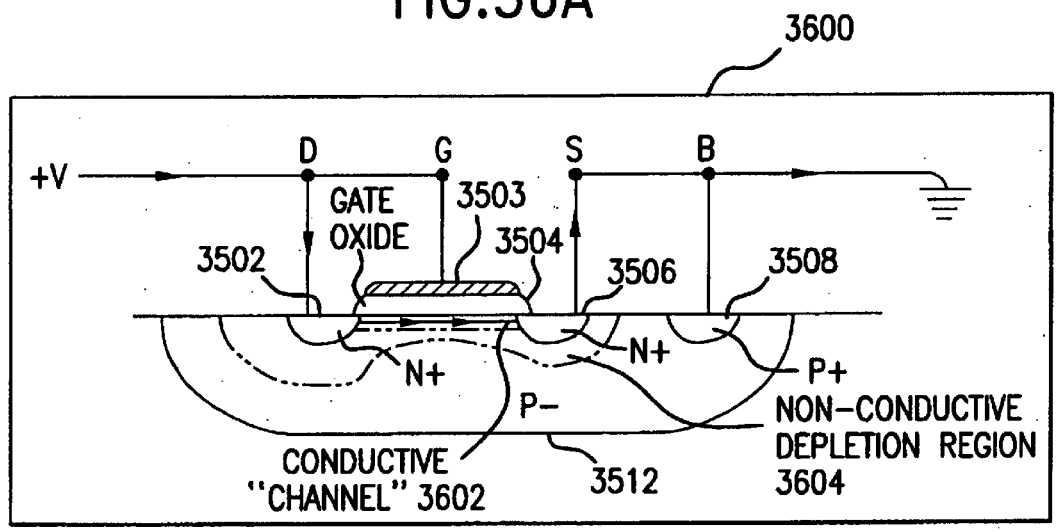
Figure 36C:
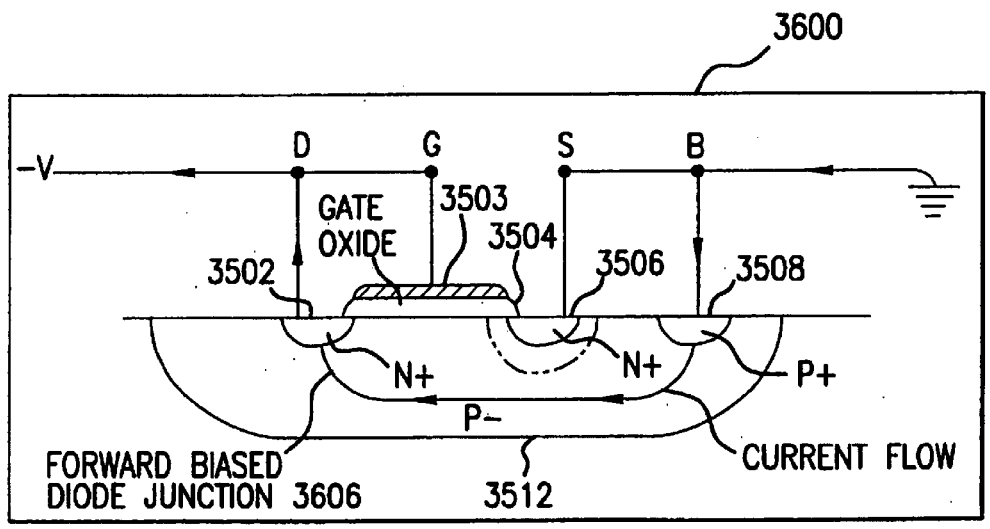

FIGS. 36A–36C illustrate a MOSFET 3600 biased as a conventional load device. Referring to FIG. 36A, the body and source of the MOSFET device 3600 are both connected to ground. The gate and drain are connected together, and are either normally connected to +V. FIG. 36B illustrates the conventionally biased MOSFET 3600 with a +V bias voltage on the drain and gate terminals. The +V bias voltage draws carriers toward the gate oxide 3504 to form a conductive inversion region 3602 that carries current from the drain 3502 to the source 3506. A depletion region 3604 is formed by the vacated carriers that form the conductive channel 3602. The depletion region is generally devoid of carriers since they are used to form the conductive channel 3602. FIG. 36C illustrates the conventionally biased MOSFET diode 3600 with a −V bias voltage on the drain and the gate terminals. The −V bias voltage drives away carriers from the underneath the gate region 3504, so that no channel is formed and no current flows from the drain to the source terminals. However, a reverse current does flow from the body terminal to the drain terminals because the P doped well 3512 and the N+ region 3502 form a forward biased PN junction 3606. The reverse current is significant for DC and low frequency voltage biases, preventing its use as an effective diode. But, as the frequency increases, the carrier response time in the depletion region starts to limit the reverse current and the device acts as a leaky diode.

Figure 37A:
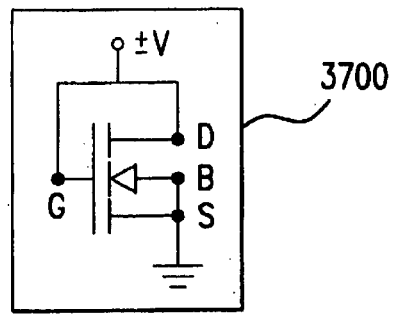
FIGS. 37A–37C illustrate a MOSFET diode biased according to the present invention so as to lower the threshold voltage of MOSFET diode configuration and to prevent reverse bias conduction.
Figure 37B:
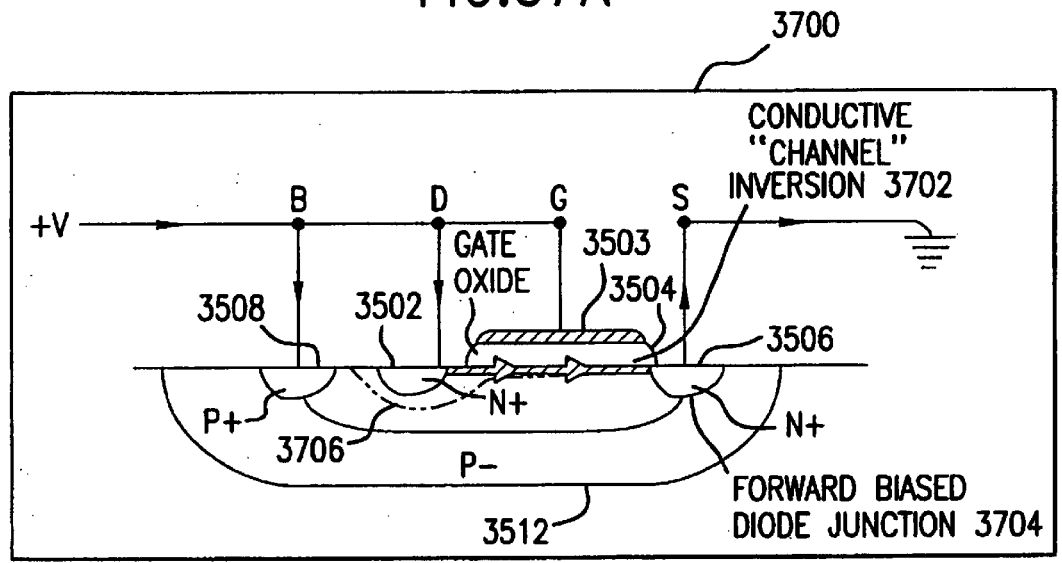
Figure 37C:
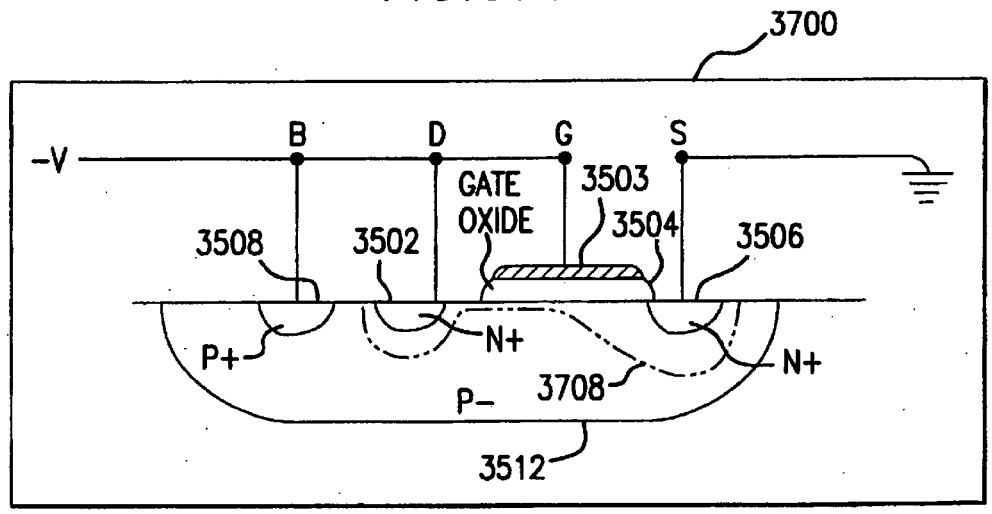

FIGS. 37A–C illustrates a MOSFET diode 3700 biased according to the present invention so as to lower the threshold voltage of MOSFET diode configuration and to prevent reverse bias conduction. Herein, this configuration is referred to as the "back-bias" effect. Referring to FIG. 37A, the drain, body, and gate terminals of the MOSFET 3700 are connected together and connected to the bias voltages +V and −V that turn the diode on or turn the diode off. The source terminal of the MOSFET 3700 is connected to ground. The terminal connections of the MOSFET 3700 are different from that of MOSFET 3600 because the body terminal in the MOSFET 3700 is biased to the same voltage potential as the gate terminal. Whereas, in the conventional MOSFET diode 3600, the body terminal is not connected to the gate terminal, but is connected to the source terminal. By biasing the body to the same potential as the gate, the characteristics of the MOSFET 3700 are changed so as to lower the threshold voltage of the diode, as will be discussed with reference to FIGS. 37B and 37C.

Referring to FIG. 37B, a +V bias voltage on the gate 3504 draws carriers toward the gate oxide 3504 to form a conducting inversion channel 3702 that carries current from the drain 3502 to the source 3506. A depletion region 3706 is formed by the vacated carriers that form the conductive channel 3702. The depletion region 3706 tapers off near the source 3506 because the body terminal 3508 and the p-doped well 3512 and the gate are biased to V+. The result of the reduced depletion region 3706 near the source 3506 is that the threshold voltage is reduced for the MOSFET diode 3700 through the "back bias effect". The "back bias effect" in MOSFETs is further in the "Physics of Semiconductor Devices", S. M. Sze, published by J. Wiley and Sons, 1981, pages 438–445, which is incorporated herein by reference. Therefore, the MOSFET diode 3700 begins to conduct for bias voltages +V, which equates to lower power RF signals in the tag environment. In addition to the conductive channel 3702, the +V bias voltage on the body terminal produces a forward biased junction 3704 because the p-doped well 3512 is forward biased relative to the source 3506, causing forward bias diode current to flow from the body terminal to the source terminal. This additional current is only responsive to low frequency or DC bias voltages, and responds poorly to high frequency RF signals because the diode junction carriers do not respond quickly enough to follow these higher frequencies.

FIG. 37C illustrates the MOSFET diode 3700 with a −V bias voltage applied to the body, drain, and gate terminals. The −V bias voltage drives away carriers from the underneath the gate region 3504 and generates an enlarged depletion region 3708. The enlarged depletion region 3708 prevents current from flowing between the drain terminal 3502 to the source terminal 3506. It is noticed that there is no reverse current flow between the body 3508 to the source 3506 because there is no forward biased junction between the P+ body 3508 and the N+ source 3506. In contrast, the conventional MOSFET device 3600 suffers a reverse current caused by the forward biased diode junction 3606. This reverse current is undesirable because it prevents true diode behavior.

Figure 38A:
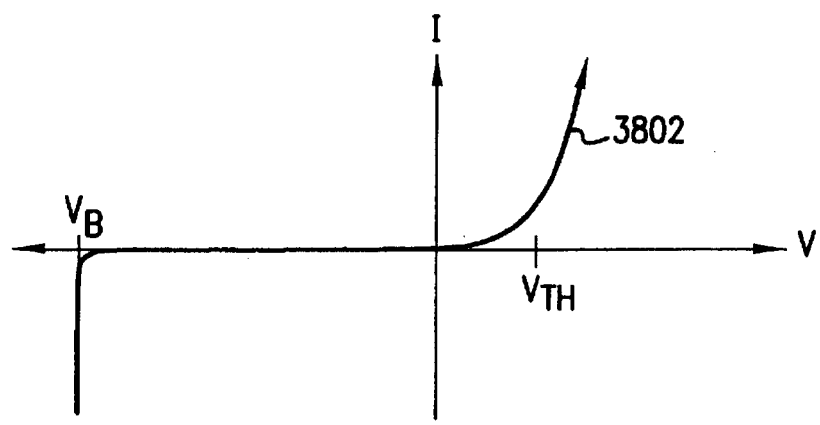
FIGS. 38A–38C illustrate a comparison of the IV curve for the MOSFET diode with the IV curve of a conventional MOSFET device, and with the IV curve of a Schottky diode.
Figure 38B:
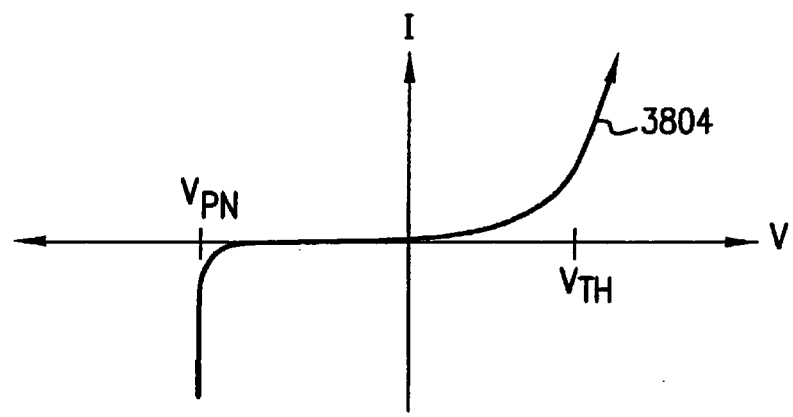
Figure 38C:
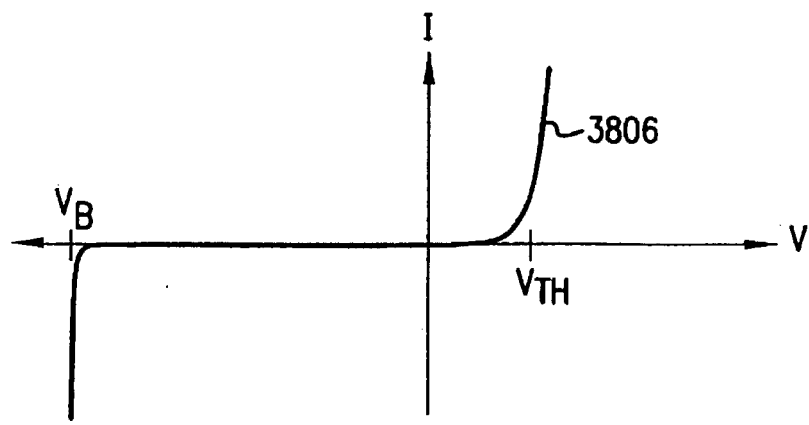

FIGS. 38A–C compare the IV curve for the MOSFET diode 3700 with the IV curve of the conventional MOSFET device 3600, and with the IV curve of a Schottky diode. More specifically, FIG. 38A illustrates an IV curve 3802 for the MOSFET diode 3700. FIG. 38B illustrates an IV curve 3804 for the MOSFET device 3600. Finally, FIG. 38C illustrates an IV curve 3806 for a Schottky diode. The IV curve 3806 for the Schottky diode has a fixed slope that is much steeper than the slope of the conventional MOSFET device 3600. The steeper slope of the Schottky is desirable as it equates to low-power conduction, but the Schottky performance is typically not attainable in a standard MOSFET process.

Comparing FIG. 38A to FIG. 38B, the IV curve 3802 for the MOSFET diode 3700 is steeper than the IV curve 3804 of the MOSFET device 3600. Furthermore, the threshold voltage ($V_{TH}$) for the MOSFET diode 3700 is lower than the corresponding threshold voltage ($V_{TH}$) for the MOSFET device 3600. These improvements are caused by the back bias effect and the forward biased diode configuration. The back bias reduces the threshold voltage for the MOSFET diode 3700 by the square root its value so the threshold continues decrease as the back bias is increased. The overall result is that the IV curve 3802 for the MOSFET diode 3700 is steeper the corresponding IV curve 3804 for the conventional MOSFET device 3600, but not as steep as the Schottky diode curve 3806. Accordingly, the MOSFET diode curve 3700 enables the charge pump 3400 to operate at a much lower RF power levels than that which can be achieved with a conventional MOSFET diode 3600 because the diode 3700 is more conductive.

The back bias is further described by the following equation:

$$I_D \cong [V-(V_{TH}-\partial\sqrt{V})]^2$$

where:

$\partial$ is a process constant with a value less than 1;

V is the bias voltage; and $V_{TH}$ is the threshold voltage.

As seen by the equation above, the back bias configuration effectively reduces the threshold voltage $V_{TH}$, by the factor $\partial\sqrt{V}$, where V is the bias voltage. Therefore, the effective threshold voltage decreases as the bias voltage increases, which causes the IV curve to steepen and increases current conduction.

Figure 39:
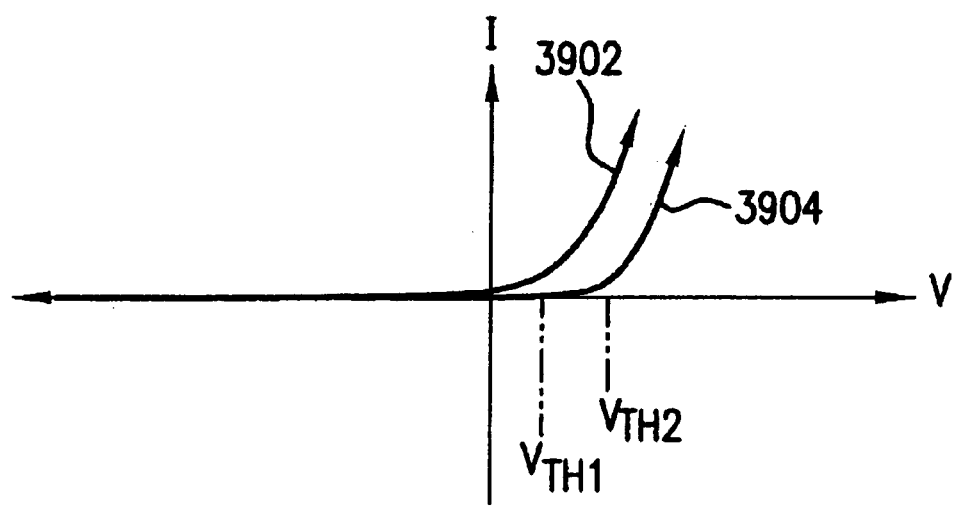
FIG. 39 illustrates the effect of lowering the threshold voltage for a conventional MOSFET by adjusting the doping levels.

In the charge pump 3400, the bias voltage for the MOSFET diode 3700 is the RF input signal 3003. Therefore, the bias voltage +V/−V varies with the sinusoidal cycle of the RF signal 3003 and with the amplitude (i.e. power level) of the RF 3003, which varies with relative location of the tag from the reader in the tag environment. Because of its dynamic threshold voltage, the leakage characteristics of the MOSFET diode 3700 are not degenerated in the reverse direction as they would be if the threshold voltage was permanently lowered by adjusting the semiconductor doping levels. For instance, FIG. 39 illustrates the effect of lowering the threshold voltage for the conventional MOSFET 3600 by adjusting the doping levels. The IV curve 3902 is associated with a first doping level, and the IV curve 3904 is associated with a second doping level. As shown, the IV curve 3902 has a lower threshold voltage than the IV curve 3904. However, the IV curve 3902 also has more leakage current in the reverse (i.e. negative voltage) direction than the IV curve 3904. Absent output limiting, this leakage current is generally undesirable because it reduces the efficiency of the charge pump 3400 since charge is leaked to ground. Referring back to FIG. 38, the MOSFET diode 3700 does not suffer from increased leakage current because the threshold voltage is dynamic as described above.

Figure 40A:
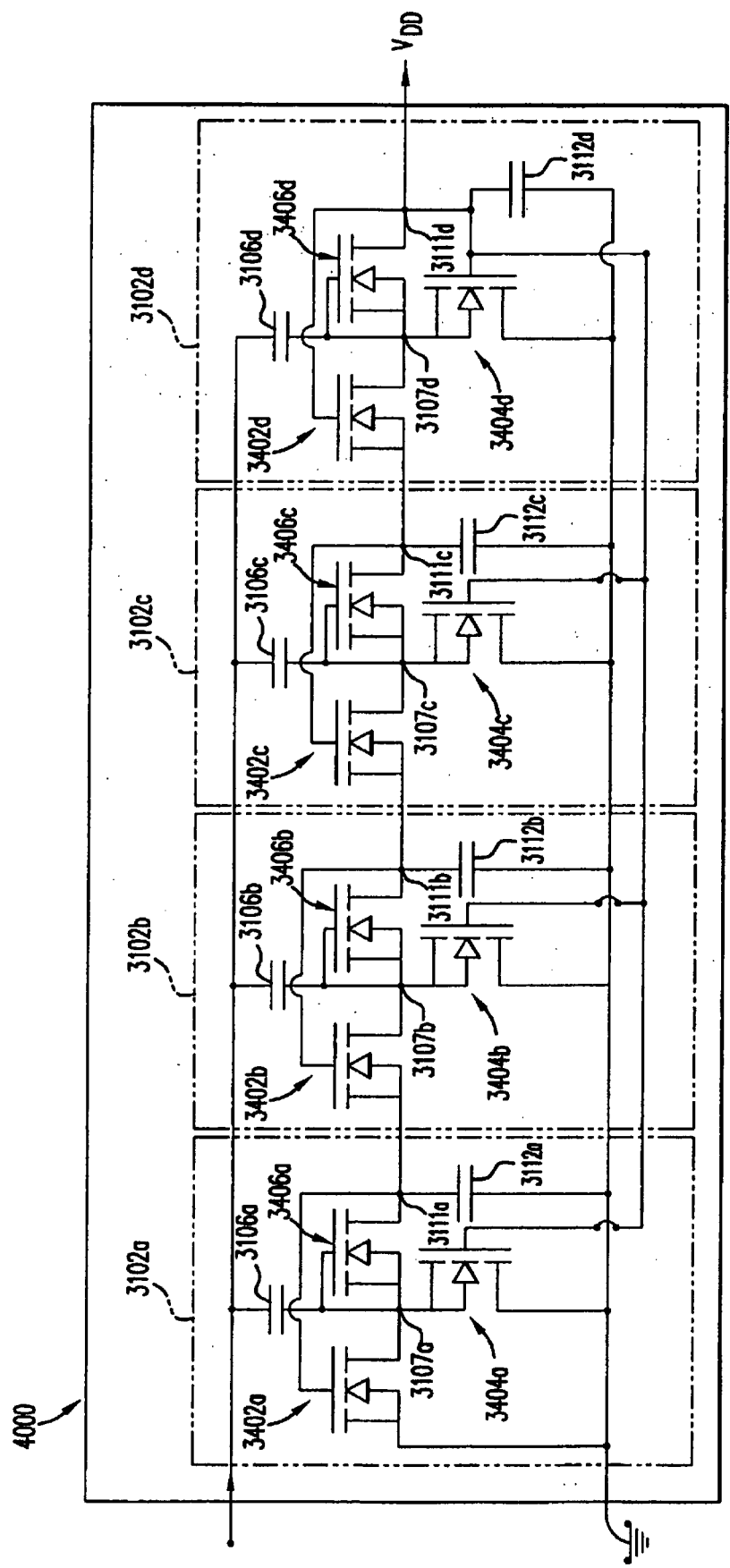
FIGS. 40A and 40B illustrate charge pumps according to further embodiments of the present invention, where the gate of one MOSFET diode is forward biased with the output of another MOSFET diode.
Figure 40B:
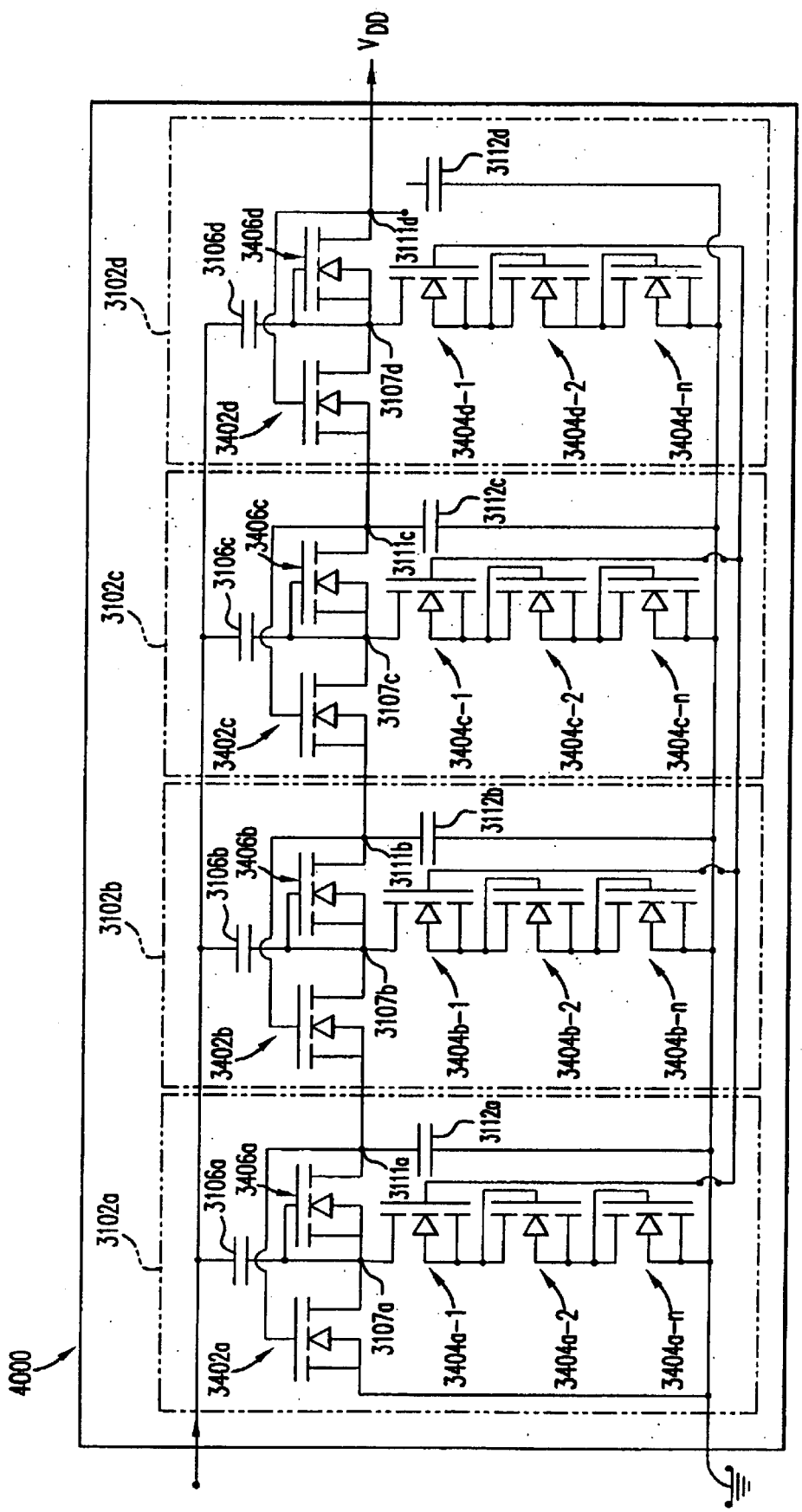

FIG. 40 illustrates a charge pump 4000 according to another embodiment of the present invention. The charge pump 4000 is similar to the charge pump 3400 except that at least one of the MOSFET diodes in each stage 3102 is forward biased. More specifically, the first series diode 3402 in each stage 3102 is forward biased with the output of the adjacent second series diode 3404. For instance, the gate of MOSFET 3402a is biased with the voltage on node 3111a, which is the output of the second diode 3404a. Node 3111a can be described as the output node of the first stage 3102a, or equivalently, node 3111a can be described as the input node of the second stage 3102b. Similarly, the gate of the MOSFET 3402b is biased with the voltage on the node 3111b, which is the output of the MOSFET diode 3404b, and so on for the remaining MOSFET diodes. To summarize, the gate of the series diode is forward biased with the output of the $(n+1)^{th}$ series diode, for n=odd. Stated another way, every other series diode has its gate forwarded biased with the output of the adjacent series diode that has a higher output voltage.

Still referring to FIG. 40, the charge and voltage in the charge pump 4000 accumulates along with the number of stages 3102 to produce the output voltage $V_{DD}$ at the output node 3111d. Therefore, using four stages 3102, the voltage should increase approximately by ¼ $V_{DD}$ at the output of each stage 3102. Therefore, by connecting the gate voltage of MOSFET 3402a with the output of the MOSFET 3404a, the gate voltage on the MOSFET 3402a is boosted by ¼ $V_{DD}$ greater than what it would otherwise be if it was connected to ground, as in charge pump 3400. A similar boost in gate voltage occurs for the MOSFET diodes 3404b, 3404c, and 3404d.

Figure 41A:
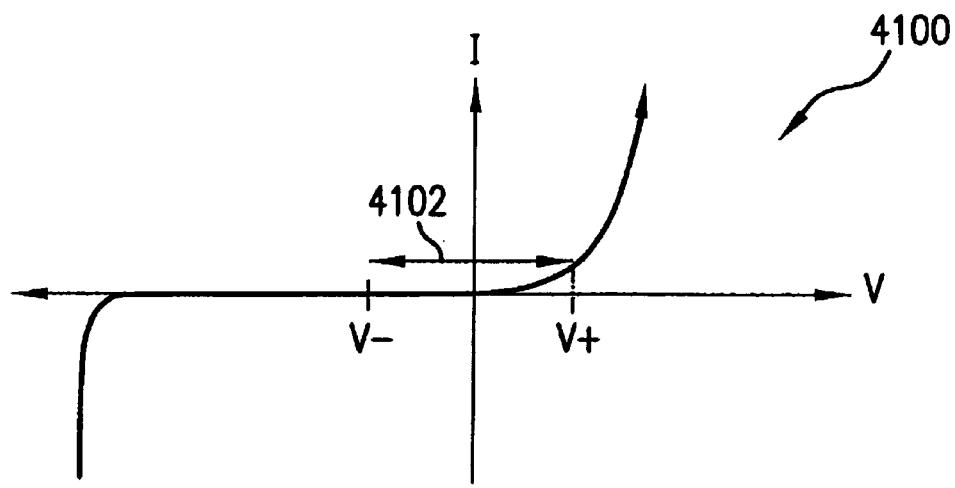
FIGS. 41A and 41B illustrate exemplary IV curves that illustrate forward biasing of a diode.
Figure 41B:
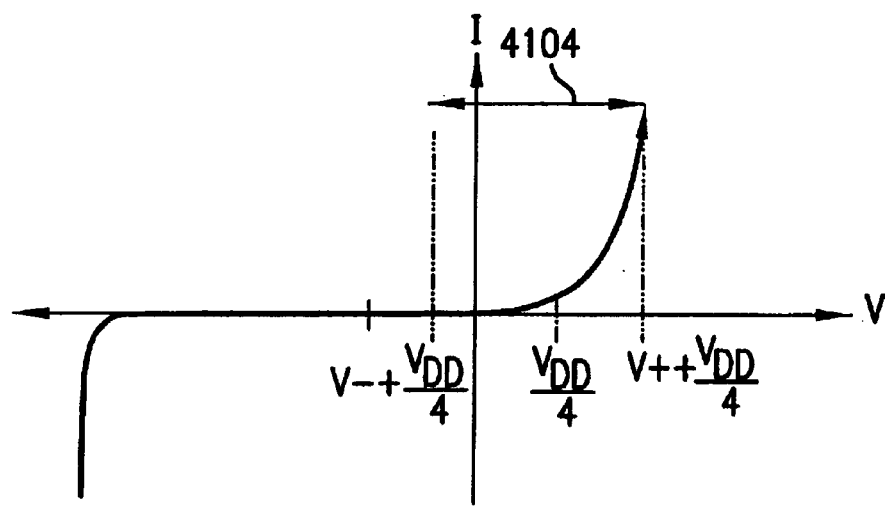

The effect of forward biasing the gate voltage on the series MOSFET diodes 3402 is to shift the operating point of these the diodes by $V_{DD}/4$ on their respective IV curves. FIGS. 41A and 41B illustrate an exemplary IV curve 4100 to illustrate this point. If the diode 3402 is operating over a bias voltage range 4102 (FIG. 41A) for a give RF signal level, then the forward biased gate will effectively move the operating bias voltage to an effective bias voltage 4104

(FIG. 41B) on the curve 4100. For example, the range 4104 can be shifted-up by $V_{DD}/4$, causing more conduction over range 4104 compared to range 4102. Therefore, a forward biased diode 3402 will be more conductive then it otherwise would be. Accordingly, the charge pump 4000 will operate with a lower RF input signal 3003 than it otherwise would. However, the diodes will be more leaky in the reverse direction, since during part of the negative voltage cycle of the sine wave, the diodes will still have positive gate bias, allowing current to flow. However, this can be used to limit the advantage of the charge to prevent over-voltage.

As discussed above, the charge pump 4000 is configured so that every other series diode is forwarded biased with the adjacent series diode. However, the invention is not limited to this configuration, as any number of series diodes (3402 or 3404) could have their gates forwarded biased with the output of another series diode (3402 or 3404). For instance, every series diode (3402 and 3404) could have its gate forwarded biased, if so desired. To generalize this embodiment, assuming the series diodes are numbered from 1-to-n for convenience, then the gate of the $1^{th}$ diode can be forwarded biased with the output of the $m^{th}$ diode, assuming that $1 < m \leq n$. These bias variations can change the performance of the charge pump.

To summarize, the charge pump 4000 has at least two features that improve the efficiency of the charge pump operation. First, the gate of each MOSFET diode is connected to the same voltage potential as the body and the source or drain of the MOSFET diode. By connecting using this configuration, the depletion layer of the MOSFET diode is modified so as to steepen the IV curve of each MOSFET diode, which improves the conductivity of the MOSFET diode. Second, the gate of at least one MOSFET diode is forward biased with the output of an adjacent MOSFET, thereby raising the gate voltage and improving the conductivity of the forward-biased MOSFET diode.

5. 2 Data Recovery

Figure 42:
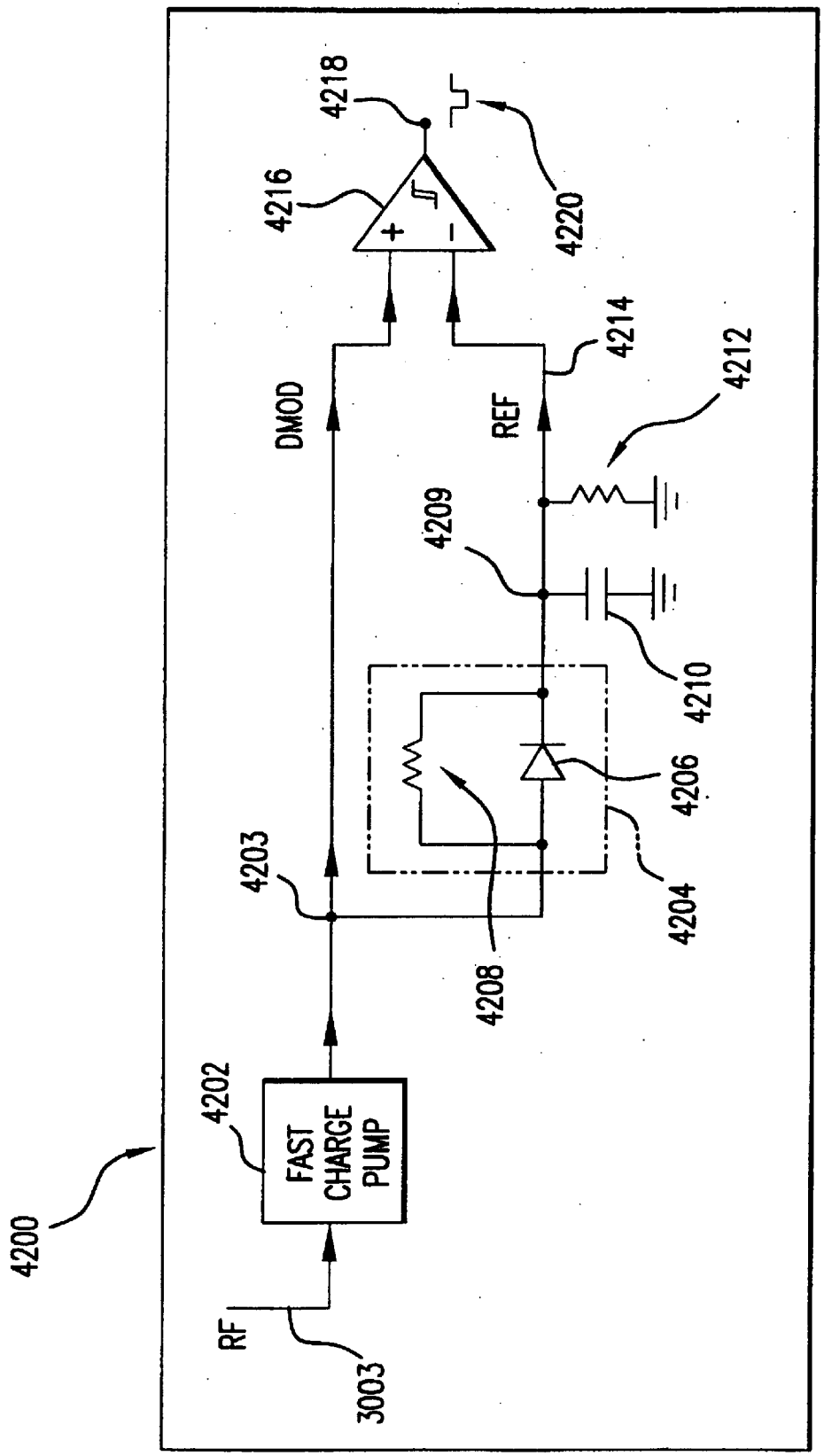
FIG. 42 illustrates a data recovery circuit that is an embodiment of the data recovery circuit shown in FIG. 30, according to the present invention.
Figure 43A:
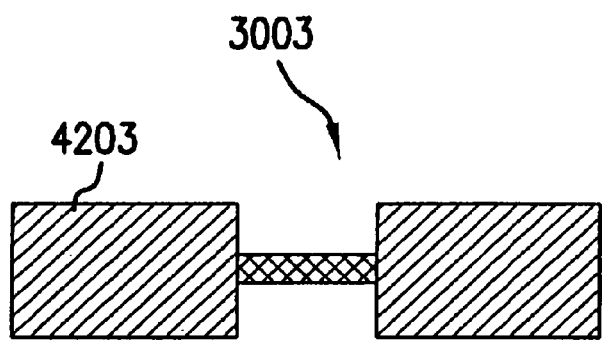
FIG. 43A illustrates an example RF signal that is amplitude modulated.

FIG. 42 illustrates a data recovery circuit 4200 that is one embodiment of the data recovery circuit 3010 in FIG. 30. The data recovery circuit 4200 processes the RF signal 3003 in parallel with the power charge pump, and demodulates any information that is carried by the RF signal 3003 to generate a digital output signal 4220 at the output terminal 4218. The data recovery circuit 3010 includes: a fast charge pump 4202; a peak detecting circuit 4204 having a diode 4206 and a resistor 4208; a capacitor 4210; a resistor 4212; and a comparator 4216. The fast charge pump 4202 receives the RF signal 3003 and detects the amplitude envelope of RF signal 3003, to generate a demodulated output 4203. For example, FIG. 43A illustrates an example RF signal 3003 that is amplitude modulated. The fast charge pump 4202 detects the amplitude envelope 4302 of the RF signal 3003, and generates the demodulated output signal 4203 that substantially tracks the amplitude envelope 4302 of the RF signal 3003. The demodulated output signal 4203 is further processed by the comparator 4216 to generate a digital output signal 4220 that represents the demodulated output signal 4203.

Figure 43B:
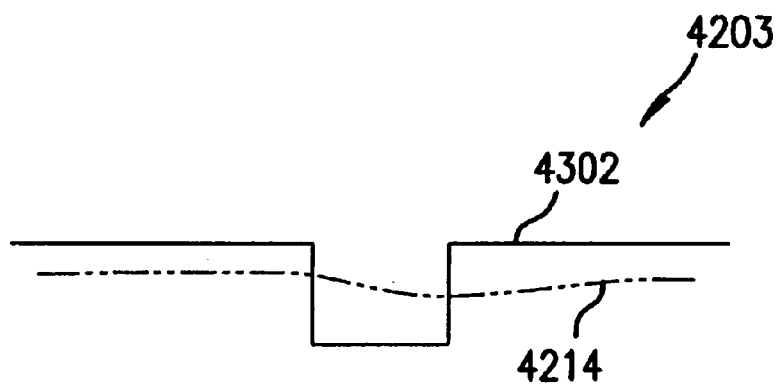
FIG. 43B shows how a reference voltage at a node generally follows and approaches the demodulated output signal.

The demodulated output signal 4203 is forwarded in parallel to the comparator 4216 and to peak detector 4204, where the peak detector 4204 generates a reference signal 4214 that is used as a threshold voltage by the comparator 4216. More specifically, the diode 4206 in the peak detector 4204 conducts when the demodulated output signal 4203 rises above the voltage at the node 4209, and the resulting charge is stored on the capacitor 4210. This typically occurs when there is a transition from a "0" to a "1" in the demodulated output signal 4203. When there is a transition from a "1" to a "0", then the demodulated output signal 4203 falls below the voltage at the node 4209, and the excess charge at the node 4209 is bled off through the resistors 4208 and 4212. As a result, reference voltage 4214 at node 4209 generally follows and approaches the demodulated output signal 4203, as shown in FIG. 43B, but with a much longer time constant. The reference signal 4214 if forwarded to the comparator 4216 and operates as a threshold voltage so that the comparator 4216 can detect data transitions in the demodulated output signal 4203. The comparator 4216 compares the amplitude of the demodulated output signal 4203 with that of the reference signal 4214, and generates digital output signal 4220 that is representative of the comparison.

The relative sizes of the capacitor 4210, resistors 4208, 4212, and the diode 4206 determine how closely the time constant of the reference voltage 4214 tracks the demodulated output signal 4203. If the reference voltage is too responsive, then the comparator 4216 will not be able to detect the desired data transitions (i.e. "0" to "1", and "1" to "0") in the demodulated output signal 4203 because the signals will be too close to each other. In one embodiment, an input voltage offset is implemented in the comparator 4216 to insure sufficient separation between the two signals so that a proper comparison can be made. For example, the voltage offset can be implemented by skewing the sizes of the input transistors in the differential inputs of the comparator 4216. In embodiments of the invention, the voltage offset is set to approximately 25 mV so as to insure sufficient separation between the demodulated output signal 4203 and the reference signal 4214.

Figure 44:
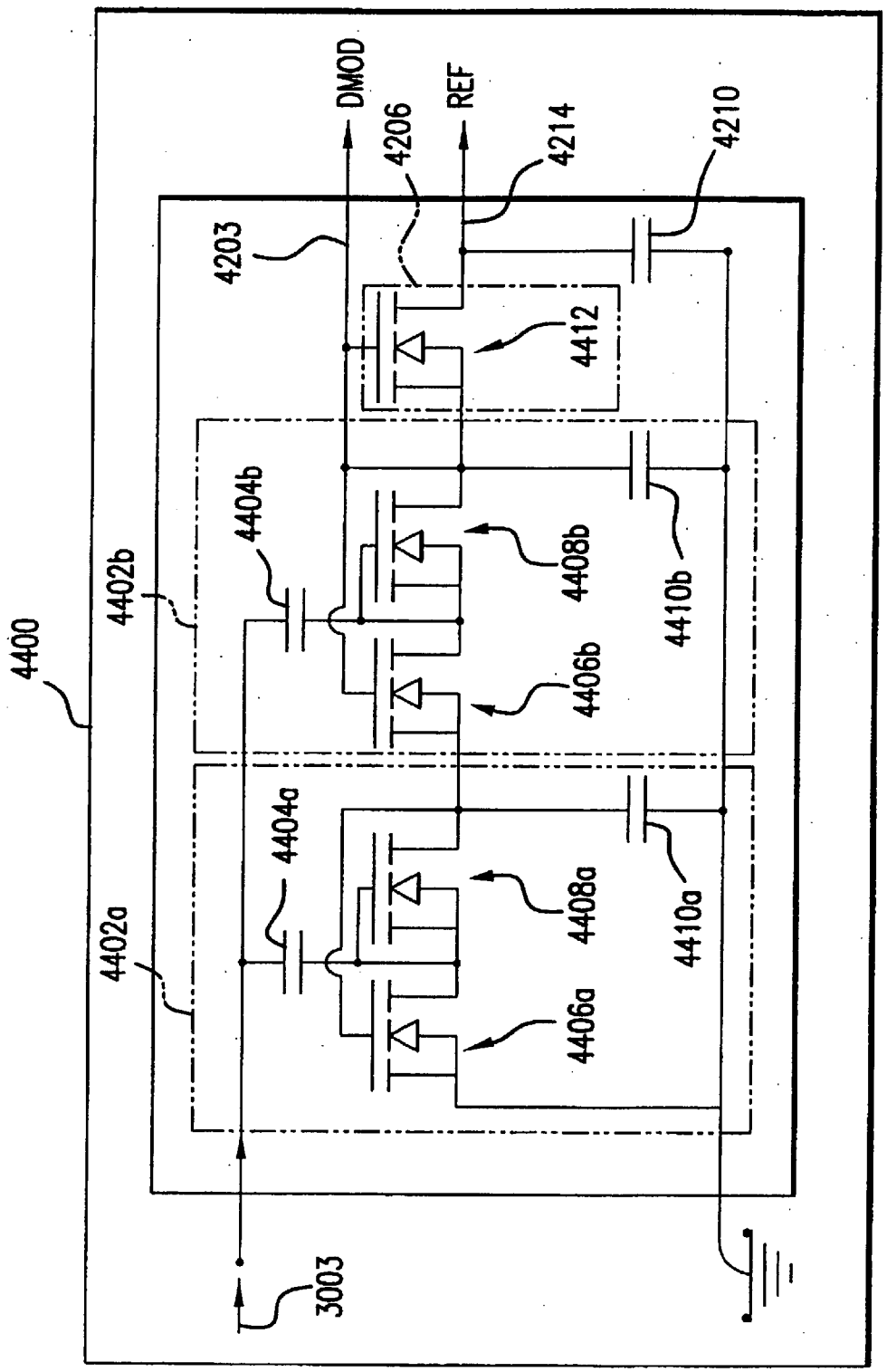
FIG. 44 illustrates a fast charge pump, according to an embodiment of the present invention.

FIG. 44 illustrates the fast charge pump 4202 according to one embodiment of the present invention. The fast charge 4202 includes two stages 4402a and 4402b, where each stage 4402 has a similar structure as the charge pump 4000, but without the voltage limiting shunt MOSFET devices to ground, (e.g. without the MOSFET devices 3404 in the charge pump 4000). The shunt MOSFET devices are not needed during data recovery, since the output 4203 is not being used as a voltage supply for other circuits. Furthermore, the voltage clamping effect of the power charge pump causes excessive RF energy to reflected away from the antenna, which will preclude the generation of a output voltage 4203 that is too large.

The fast charge pump 4400 is illustrated as having two stages 4402. However, the fast charge pump is not limited to two stages. The charge pump 4400 can have any number of stages as will be understood by those skilled in the relevant arts.

The components in the fast charge pump 4202 are configured so that the fast charge pump 4400 has sufficient bandwidth to track the modulation on the RF signal 3003. For instance, the MOSFET diodes 4406 and 4408 are sized smaller than the corresponding diodes in the power charge pump 4000. Smaller sized devices have smaller parasitic reactance and capacitances. Therefore, smaller sized devices are more responsive to higher bandwidth signals than that which can be achieved with larger devices. The capacitors 4404 and 4410 are also appropriately sized to provide sufficient bandwidth. As a result, the charge pump 4400 has sufficient bandwidth and is fast enough to track the modulation on the RF signal 3003, and generate the demodulated output signal 4203.

Furthermore, the charge pump 4400 includes the efficiency improvements discussed above for the charge pump 4000. Namely, the body terminals of the MOSFET diodes 4406 and 4408 are connected to the respective drain terminals of these devices, which improves the steepness of the respective IV curves of the MOSFET diodes 4406 and 4408 through back bias threshold reduction. Second, the gates of the diodes 4406 are forward biased to shift-up the operating point of these diodes on their respective IV curves.

As shown in FIG. 44, the fast charge pump 4400 also includes an extra MOSFET diode 4412 that is not needed in the generation of the demodulated output signal 4203. The MOSFET diode 4412 is the diode 4206 in the peak detector 4204, and is used to generate the reference signal 4214 that is fed to the comparator 4216. Therefore, the fast charge pump 4400 generates both the demodulated output signal 4203 and the reference signal 4214 that are used by the comparator 4216 for threshold detection.

Referring back to FIG. 30, the power charge pump 3008 and the data recovery circuit 3010 are configured in parallel and can operate simultaneously on the same RF signal 3003. Therefore, voltage generation and data recovery can occur simultaneously, which improves the response time of the tag.

To summarize the data recovery circuit, the basic charge pump design is used as a signal detector with the MOSFET diodes and the charge pump capacitors all sized approximately an order of magnitude smaller, so that the charge pump follows rapid changes in the modulated RF signal. Also, the clamping devices are removed to allow the charge pump output to follow the input signal strength variations of the modulated RF. In order for the charge pump to detect signal strength changes, a unique "self-reference" feature is added, by connecting the output through a MOSFET diode to a holding capacitor. The holding capacitor will follow a time integrated signal strength, whereby the charge output will follow the rapid changes of the modulated RF signal. By comparing the two, with a standard comparator circuit, signal detection is achieved.

5.3 Transmit Modulation

Figure 45:
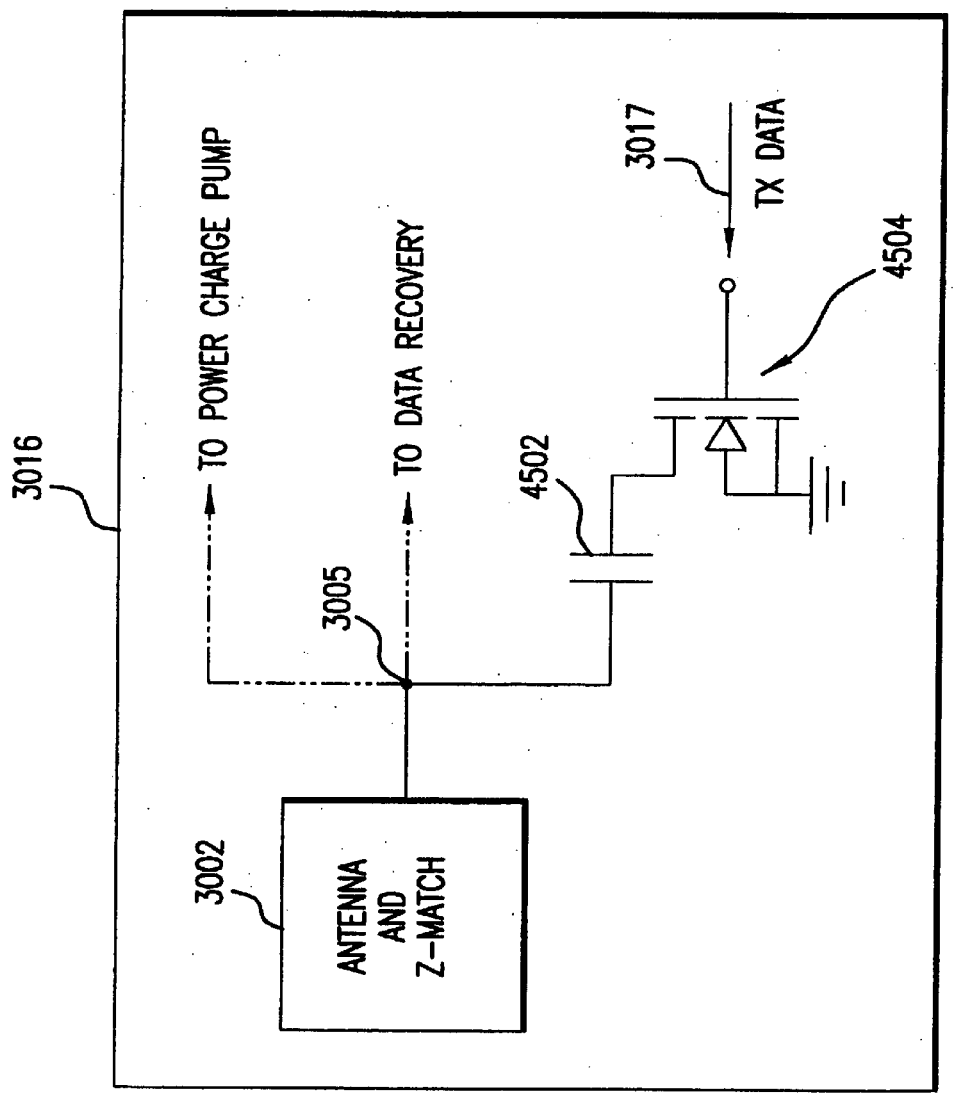
FIG. 45 further illustrates the backscatter switch shown in FIG. 30.

FIG. 45 further illustrates the backscatter switch 3016 in FIG. 30. The back scatter switch 3016 modulates the impedance of the antenna 3002 to transmit data back the reader. The backscatter switch 3016 includes a MOSFET transistor switch 4504 connected to the input of the antenna at the node 3005. The MOSFET switch 4504 has its drain connected to the input of the antenna 3002 through a DC blocking capacitor 4502, and its source connected to ground. The gate of the MOSFET switch 4504 is controlled by the transmit data 3017 so that the antenna 3002 is shorted to ground through the capacitor 4502 according the transmit data 3017. More specifically, the backscatter switch 3016 shorts the input impedance seen by the antenna 3002 at the RF pad 3004. Therefore, the RF signal 3003 is reflected back to the reader in accordance with the transmit data 3017.

6. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A radio frequency identification (RFID) integrated circuit (IC), comprising:
   a first antenna pad;
   a second antenna pad;
   a first modulator coupled to said first antenna pad, wherein said first modulator is configured to backscatter modulate a first symbol received from said first antenna pad with a response symbol, wherein said first modulator is configured to output said backscatter modulated first symbol to said first antenna pad;
   a second modulator coupled to said second antenna pad, wherein said second modulator is configured to backscatter modulate a second symbol received from said second antenna pad with the response symbol, wherein said second modulator is configured to output said backscatter modulated second symbol to said second antenna pad;
   a first charge pump coupled to said first antenna pad, said first charge pump configured to convert a first high frequency signal from said first antenna pad to a first substantially direct current (DC) voltage; and
   a second charge pump coupled to said second antenna pad, said second charge pump configured to convert a second high frequency signal from said second antenna pad to a second substantially direct current (DC) voltage.

2. The RFID IC of claim 1, further comprising:
   a first receiver coupled to said first antenna pad, wherein said first receiver receives said first symbol from said first antenna pad and outputs a first received signal; and
   a second receiver coupled to said second antenna pad, wherein said second receiver receives said second symbol from said second antenna pad and outputs a second received signal.

3. The RFID IC of claim 2, further comprising:
   a state machine configured to receive said first received signal and said second received signal and generate said response symbol.

4. The RFID IC of claim 3, further comprising:
   a data programming unit that stores a tag identification number.

5. The RFID IC of claim 4, wherein said state machine is configured to read said stored tag identification number, wherein said state machine is configured to generate said response symbol using said first received signal, said second received signal, and a bit of said read tag identification number.

6. The RFID IC of claim 1, further comprising:
   a node at which said first substantially DC voltage signal and said second substantially DC voltage signal are coupled together.

7. The RFID IC of claim 6, further comprising:
   a power bus coupled to said node to route power to one or more components of the RFID IC.

8. The RFID IC of claim 1, further comprising:
   means for storing a bit pattern.

9. The RFID IC of claim 1, further comprising:
   a first data recovery circuit coupled to said first antenna pad, said first data recovery circuit configured to demodulate said first high frequency signal to a first demodulated signal; and
   a second data recovery circuit coupled to said second antenna pad, said second data recovery circuit configured to convert said second high frequency signal to a second demodulated signal.

10. The RFID IC of claim 9, wherein said first data recovery circuit comprises a first demodulator circuit configured to detect an amplitude envelope of said first high frequency signal, and wherein said second data recovery circuit comprises a second demodulator circuit configured to detect an amplitude envelope of said second high frequency signal.

11. The RFID IC of claim 9, wherein said first demodulated signal and said second demodulated signal are combined according to a logical OR function to output a digital information signal.

12. The RFID IC of claim 9, wherein said first demodulated signal and said second demodulated signal are combined as analog signals.

13. A radio frequency identification (RFID) tag device, comprising:

a first antenna;

a second antenna;

a first receiver coupled to said first antenna, wherein said first receiver is configured to receive a first symbol from said first antenna, and wherein said first receiver is configured to generate a first received signal;

a first modulator coupled to said first antenna, wherein said first modulator is configured to backscatter modulate the received first symbol with a response symbol, wherein said backscatter modulated first symbol is output to said first antenna;

a first charge pump coupled to said first antenna, said first charge pump configured to convert a first high frequency signal from said first antenna to a first substantially direct current (DC) voltage;

a second receiver coupled to said second antenna, wherein said second receiver is configured to receive a second symbol from said second antenna, and wherein said second receiver is configured to generate a second received signal;

a second modulator coupled to said second antenna, wherein said second modulator is configured to backscatter modulate the received second symbol with the response symbol, wherein said backscatter modulated second symbol is output to said second antenna;

a second charge pump coupled to said second antenna, said second charge pump configured to convert a second high frequency signal from said second antenna to a second substantially direct current (DC) voltage; and a state machine coupled to said data programming unit and said first and said second receivers.

14. The RFID tag device of claim 13, wherein said state machine is configured to receive said first received signal from said first receiver and to receive said second received signal from said second receiver, wherein said state machine generates said response symbol.

15. The RFID tag device of claim 14, further comprising:

a data programming unit that stores a tag identification number.

16. The RFID tag device of claim 15, wherein said state machine is configured to read said stored tag identification number, wherein said state machine is configured to generate said response symbol using said received signal and a bit of said read tag identification number.

17. The RFID tag device of claim 13, further comprising:

a node at which said first substantially DC voltage signal and said second substantially DC voltage signal are coupled together.

18. The RFID tag device of claim 17, further comprising:

a power bus coupled to said node to route power to at least said state machine.

19. The RFID tag device of claim 17, further comprising:

means for communicating with a reader using a binary traversal algorithm, said binary traversal algorithm comparing bits within the bit pattern to symbols received from said reader.

20. The RFID tag device of claim 13, further comprising:

means for storing a bit pattern.

21. The RFID tag device of claim 13, further comprising:

a substrate having an input capable of receiving a high frequency signal;

wherein said first antenna and said second antenna are disposed on said substrate.

* * * * *